United States Patent
Kwon et al.

(10) Patent No.: US 11,327,616 B2
(45) Date of Patent: *May 10, 2022

(54) FLEXIBLE DISPLAY DEVICE

(71) Applicant: Samsung Display Co., Ltd., Yongin-si (KR)

(72) Inventors: Dohyun Kwon, Seongnam-si (KR); Choongyoul Im, Yongin-si (KR); Mi Jang, Seongnam-si (KR); Minjung Lee, Seoul (KR); Hyoungwook Jang, Anyang-si (KR); Kyuyoung Kim, Suwon-si (KR); Mugyeom Kim, Hwaseong-si (KR); Dongki Lee, Seongnam-si (KR); Junghun Lee, Hwaseong-si (KR); Jangdoo Lee, Seoul (KR)

(73) Assignee: Samsung Display Co., Ltd., Yongin-si (KR)

(*) Notice: Subject to any disclaimer, the term of this patent is extended or adjusted under 35 U.S.C. 154(b) by 0 days.

This patent is subject to a terminal disclaimer.

(21) Appl. No.: 17/007,204

(22) Filed: Aug. 31, 2020

(65) Prior Publication Data

US 2020/0401251 A1 Dec. 24, 2020

Related U.S. Application Data

(63) Continuation of application No. 16/234,603, filed on Dec. 28, 2018, now Pat. No. 10,761,664, and a
(Continued)

(30) Foreign Application Priority Data

Jun. 26, 2015 (KR) .................. 10-2015-0091392
Nov. 20, 2015 (KR) .................. 10-2015-0163510
(Continued)

(51) Int. Cl.
*G06F 3/044* (2006.01)
*H01L 27/32* (2006.01)
*H01L 51/52* (2006.01)

(52) U.S. Cl.
CPC ............ *G06F 3/0445* (2019.05); *G06F 3/044* (2013.01); *G06F 3/0446* (2019.05);
(Continued)

(58) Field of Classification Search
CPC combination set(s) only.
See application file for complete search history.

(56) References Cited

U.S. PATENT DOCUMENTS 7,636,085 B2 12/2009 Yang
8,502,444 B2 8/2013 Chu et al.
(Continued)

FOREIGN PATENT DOCUMENTS

CN 103748538 4/2014
JP 2010-140980 6/2010
(Continued)

OTHER PUBLICATIONS

Non-Final Office Action dated Feb. 7, 2020, in U.S. Appl. No. 16/234,603.
(Continued)

*Primary Examiner* — Deeprose Subedi
(74) *Attorney, Agent, or Firm* — H.C. Park & Associates, PLC

(57) ABSTRACT

A flexible display device including a display panel providing a base surface and a touch screen disposed on the base surface. The display panel may include a plurality of light emitting areas and a non-light emitting area disposed adjacent to the light emitting areas. A plurality of touch electrodes and a plurality of insulating layers of the touch screen may have a mesh shape through which openings correspond-
(Continued)

ing to the plurality of light emitting areas are defined. Accordingly, a flexibility of the flexible display device is improved, and the touch electrode is prevented from being cracked.

45 Claims, 99 Drawing Sheets

Related U.S. Application Data continuation of application No. 15/153,568, filed on May 12, 2016, now Pat. No. 10,168,844.

(30) Foreign Application Priority Data

| Dec. 28, 2015 | (KR) | 10-2015-0187755 |
|---|---|---|
| Jan. 8, 2016 | (KR) | 10-2016-0002740 |
| Jan. 22, 2016 | (KR) | 10-2016-0008197 |
| Jan. 22, 2016 | (KR) | 10-2016-0008200 |

(52) U.S. Cl.
CPC ......... *H01L 27/322* (2013.01); *H01L 27/323* (2013.01); *H01L 27/3279* (2013.01); *H01L 51/5256* (2013.01); *H01L 51/5284* (2013.01); *G06F 2203/04102* (2013.01); *G06F 2203/04112* (2013.01); *H01L 2251/5338* (2013.01)

(56) References Cited

U.S. PATENT DOCUMENTS

| 8,604,465 | B2 | 12/2013 | Song et al. |
| 8,624,868 | B2 | 1/2014 | Chang et al. |
| 8,766,299 | B2 | 7/2014 | Iwakasi |
| 8,963,138 | B2 | 2/2015 | Lim et al. |
| 8,970,108 | B2 | 2/2015 | Park et al. |
| 9,019,232 | B2 | 4/2015 | Kang et al. |
| 9,040,978 | B2 | 5/2015 | Sato et al. |
| 9,041,869 | B2 | 5/2015 | Kim et al. |
| 9,046,952 | B2 | 6/2015 | Kim et al. |
| 9,095,017 | B2 | 7/2015 | Yi et al. |
| 9,118,036 | B2 | 8/2015 | Kim |
| 9,239,654 | B2 | 1/2016 | Jang |
| 9,244,486 | B2 | 1/2016 | Kang et al. |
| 9,300,288 | B2 | 3/2016 | Kim et al. |
| 9,317,067 | B2 | 4/2016 | Choi et al. |
| 9,853,192 | B2 | 12/2017 | Huh et al. |
| 10,032,835 | B2 | 7/2018 | Min et al. |
| 2013/0021289 | A1 | 1/2013 | Chen et al. |
| 2013/0044384 | A1 | 2/2013 | Kim et al. |
| 2013/0113734 | A1* | 5/2013 | Cho ............... G06F 3/0446 345/173 |
| 2014/0078104 | A1* | 3/2014 | Lee ............... G06F 3/0412 345/174 |
| 2014/0353691 | A1* | 12/2014 | Lee ............... H01L 27/323 257/88 |
| 2014/0360855 | A1 | 12/2014 | Kim et al. |
| 2014/0361261 | A1 | 12/2014 | Choi et al. |
| 2015/0049030 | A1 | 2/2015 | Her |
| 2015/0115254 | A1 | 4/2015 | Choi et al. |
| 2015/0206926 | A1 | 7/2015 | Hong et al. |
| 2015/0229844 | A1 | 8/2015 | Yamazaki et al. |
| 2015/0346866 | A1* | 12/2015 | Kusunoki ............. G06F 3/0446 345/174 |
| 2016/0098140 | A1* | 4/2016 | Lee ............... G06K 9/0002 345/173 |
| 2016/0103531 | A1* | 4/2016 | Kimura ............. G02F 1/13338 345/174 |
| 2017/0147116 | A1* | 5/2017 | Lee ............... G06F 3/0412 |
| 2017/0280531 | A1* | 9/2017 | Tada ............... H01L 27/3206 |

FOREIGN PATENT DOCUMENTS

| JP | 4701971 | 6/2011 |
| JP | 2011-243525 | 12/2011 |
| JP | 5741046 | 9/2012 |
| JP | 2013-045100 | 3/2013 |
| JP | 2014-021522 | 2/2014 |
| JP | 2014-056564 | 3/2014 |
| JP | 2014-123727 | 7/2014 |
| JP | 2015-023023 | 2/2015 |
| JP | 2015-041481 | 3/2015 |
| JP | 5743237 | 7/2015 |
| KR | 10-0781708 | 12/2007 |
| KR | 10-2011-0138683 | 12/2011 |
| KR | 10-2012-0014786 | 2/2012 |
| KR | 10-2012-0126788 | 11/2012 |
| KR | 10-2013-0072635 | 7/2013 |
| KR | 10-2013-0134919 | 12/2013 |
| KR | 10-2014-0014685 | 2/2014 |
| KR | 10-2014-0025251 | 3/2014 |
| KR | 10-2014-0033966 | 3/2014 |
| KR | 10-1373044 | 3/2014 |
| KR | 10-2014-0055430 | 5/2014 |
| KR | 20140077550 A | 6/2014 |
| KR | 10-2014-0085306 | 7/2014 |
| KR | 10-2014-0117108 | 10/2014 |
| KR | 10-2014-0143631 | 12/2014 |
| KR | 10-2014-0143645 | 12/2014 |
| KR | 10-1468650 | 12/2014 |
| KR | 20150011231 A | 1/2015 |
| KR | 10-2015-0020929 | 2/2015 |
| KR | 10-2015-0060161 | 6/2015 |
| KR | 10-2015-0086763 | 7/2015 |
| WO | 2015072685 | 5/2015 |

OTHER PUBLICATIONS

Notice of Allowance dated Apr. 22, 2020, in U.S. Appl. No. 16/234,603.
European Search Report dated Nov. 7, 2016, for European Application No. 16175977.4.
Non-Final Office Action dated Mar. 7, 2018, in U.S. Appl. No. 15/153,568.
Notice of Allowance dated Aug. 15, 2018, in U.S. Appl. No. 15/153,568.

* cited by examiner

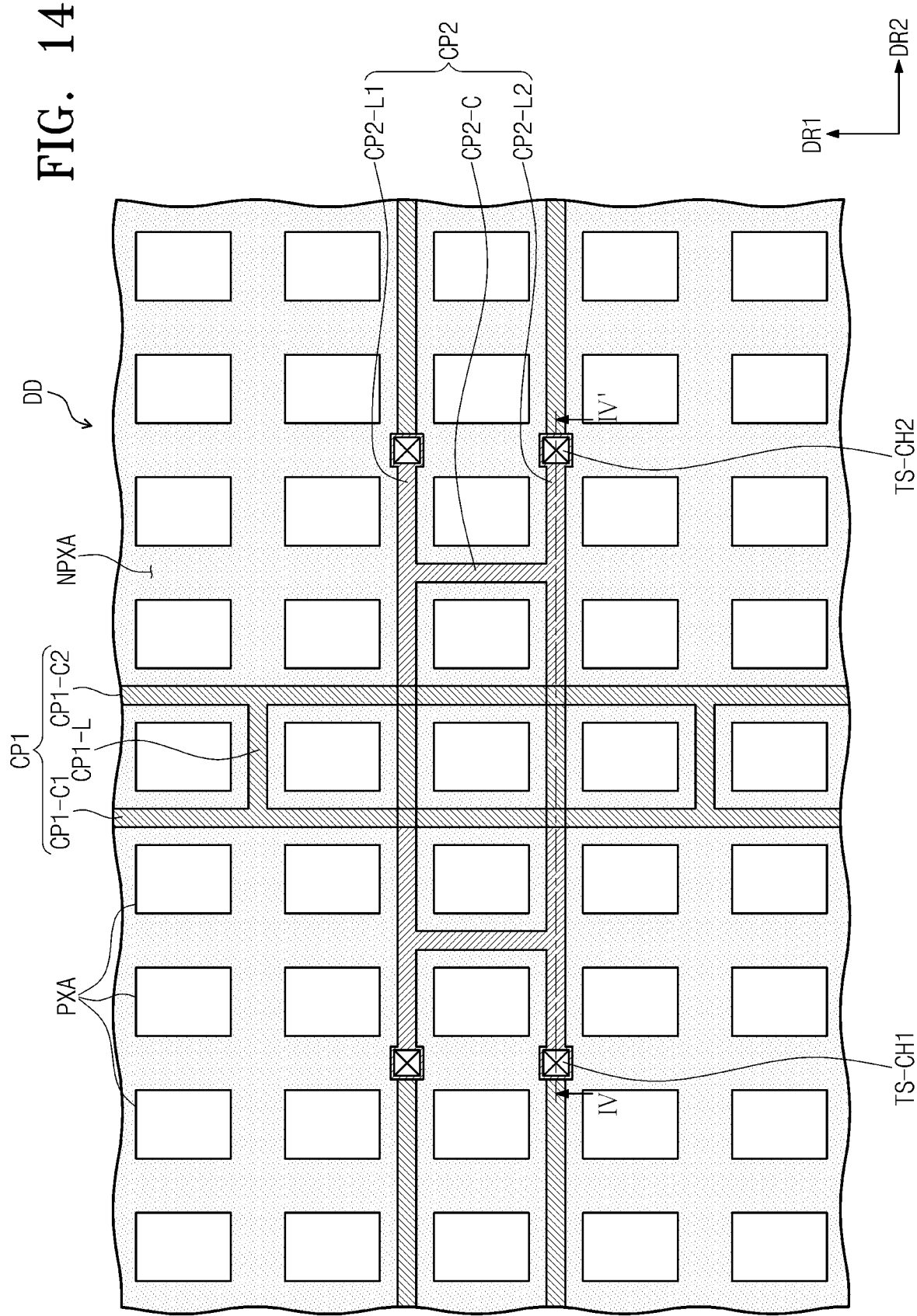

FLEXIBLE DISPLAY DEVICE

CROSS-REFERENCE TO RELATED APPLICATIONS

This application is a Continuation of U.S. patent application Ser. No. 16/234,603, filed on Dec. 28, 2018, which is a Continuation of U.S. patent application Ser. No. 15/153,568, filed on May 12, 2016, and claims priority from and the benefit of Korean Patent Applications Nos. 10-2015-0091392, filed on Jun. 26, 2015, 10-2015-0163510, filed on Nov. 20, 2015, 10-2015-0187755, filed on Dec. 28, 2015, 10-2016-0002740, filed on Jan. 8, 2016, 10-2016-0008200, filed on Jan. 22, 2016, and 10-2016-0008197, filed on Jan. 22, 2016, all of which are hereby incorporated by reference for all purposes as if fully set forth herein.

BACKGROUND

Field

Exemplary embodiments relate to a flexible display device. More particularly, the present disclosure relates to a flexible display device including functional members integrally formed in the flexible display device.

Discussion of the Background

Electronic devices, such as a smart phone, digital camera, notebook computer, navigation unit, and smart television set, have been developed. Each electronic device may include a display device to provide information.

In recent years, since electronic devices come in a variety of shapes, a shape of the display device is changed to correspond to the shapes of the electronic devices. The electronic devices generally include a flat panel display device. However, these electronic devices refrain having curved, bent, rollable display devices.

The above information disclosed in this Background section is only for enhancement of understanding of the background of the inventive concept, and, therefore, it may contain information that does not form the prior art that is already known in this country to a person of ordinary skill in the art.

SUMMARY

Exemplary embodiments provide a flexible display device having improved flexibility.

Additional aspects will be set forth in the detailed description which follows, and, in part, will be apparent from the disclosure, or may be learned by practice of the inventive concept.

An exemplary embodiment of the inventive concept provides a flexible display device including a display panel providing a base surface and including a plurality of light emitting areas and a non-light emitting area disposed adjacent to the plurality of light emitting areas and a touch screen disposed on the base surface. The touch screen includes a plurality of first conductive patterns, a first insulating layer, a plurality of second conductive patterns, and a second insulating layer. The plurality of first conductive patterns are disposed on the base surface and overlapped with the non-light emitting area. The first insulating layer is disposed on the base surface, covers the plurality of first conductive patterns, and includes a plurality of first openings defined to correspond to the plurality of light emitting areas. The plurality of second conductive patterns are disposed on the first insulating layer and overlapped with the non-light emitting area. The second insulating layer is disposed on the first insulating layer, covers the plurality of second conductive patterns, and includes a plurality of second openings defined to correspond to the plurality of light emitting areas.

An exemplary embodiment of the inventive concept provide a flexible display device including a display panel providing a base surface and including a plurality of light emitting areas and a non-light emitting area disposed adjacent to the plurality of light emitting areas and a touch screen disposed on the base surface. The touch screen includes a plurality of first conductive patterns disposed on the base surface and overlapped with the non-light emitting area, a first black matrix disposed on the base surface, covering the plurality of first conductive patterns, and including a plurality of first openings defined to correspond to the plurality of light emitting areas, a plurality of color filters each being disposed inside a corresponding first opening among the plurality of first openings, an insulating layer disposed on the first black matrix and the plurality of color filters and overlapped with the plurality of light emitting areas and the non-light emitting area, and a plurality of second conductive patterns disposed on the insulating layer and overlapped with the non-light emitting area.

An exemplary embodiment of the inventive concept provides a flexible display device including a display panel providing a base surface and including a plurality of light emitting areas and a non-light emitting area disposed adjacent to the plurality of light emitting areas and a touch screen disposed on the base surface. The touch screen includes a plurality of first conductive patterns disposed on the base surface and overlapped with the non-light emitting area, a plurality of color filters disposed on the base surface, a plurality of second conductive patterns disposed on the plurality of color filters and overlapped with the non-light emitting area, and a black matrix overlapped with the non-light emitting area.

An exemplary embodiment of the inventive concept provides a flexible display device including a display panel providing a base surface and including a plurality of light emitting areas and a non-light emitting area disposed adjacent to the plurality of light emitting areas and a touch screen disposed on the base surface. The touch screen includes a noise shielding conductive layer disposed on the base surface and overlapped with the non-light emitting area, a first insulating layer disposed on the base surface and covering the noise shielding conductive layer, a plurality of first conductive patterns disposed on the first insulating layer and overlapped with a portion of the noise shielding conductive layer, a second insulating layer disposed on the first insulating layer, a plurality of second conductive patterns disposed on the second insulating layer and overlapped with a portion of the noise shielding conductive layer, and a third insulating layer disposed on the second insulating layer.

An exemplary embodiment of the inventive concept provide a flexible display device including a display panel providing a base surface and including a plurality of light emitting areas and a non-light emitting area disposed adjacent to the plurality of light emitting areas and a touch screen disposed on the base surface. The touch screen may include a base member, a plurality of first conductive patterns disposed on the base member and overlapped with a portion of the noise shielding conductive layer, a first insulating layer disposed on the base member to cover the first conductive patterns. A plurality of second conductive patterns disposed on the first insulating layer and overlapped with a portion of the noise shielding conductive layer, and a second insulating layer disposed on the first insulating layer.

The foregoing general description and the following detailed description are exemplary and explanatory and are intended to provide further explanation of the claimed subject matter.

BRIEF DESCRIPTION OF THE DRAWINGS

The accompanying drawings, which are included to provide a further understanding of the inventive concept, and are incorporated in and constitute a part of this specification, illustrate exemplary embodiments of the inventive concept, and, together with the description, serve to explain principles of the inventive concept.

FIG. 14C is a partially enlarged view showing a portion "DD" of FIGS. 14A and 14B.

DETAILED DESCRIPTION OF THE ILLUSTRATED EMBODIMENTS

Figure 1A:
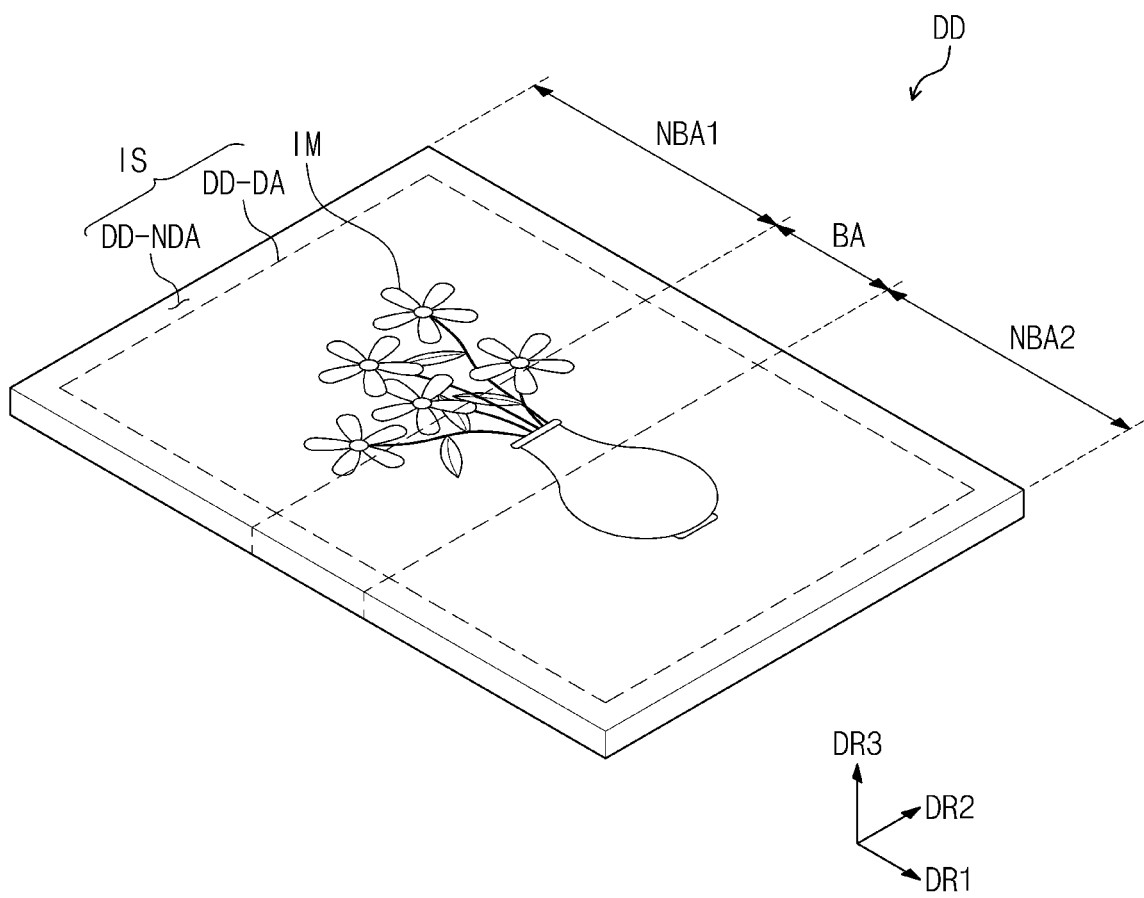
FIG. 1A is a perspective view showing a flexible display device in a first operation according to an exemplary embodiment of the present disclosure.

In the following description, for the purposes of explanation, numerous specific details are set forth in order to provide a thorough understanding of various exemplary embodiments. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments.

In the accompanying figures, the size and relative sizes of layers, films, panels, regions, etc., may be exaggerated for clarity and descriptive purposes. Also, like reference numerals denote like elements.

When an element or layer is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" may include any and all combinations of one or more of the associated listed items.

Although the terms "first," "second," etc. may be used herein to describe various elements, components, regions, layers, and/or sections, these elements, components, regions, layers, and/or sections should not be limited by these terms. These terms are used to distinguish one element, component, region, layer, and/or section from another element, component, region, layer, and/or section. Thus, a first element, component, region, layer, and/or section discussed below could be termed a second element, component, region, layer, and/or section without departing from the teachings of the present disclosure.

Spatially relative terms, such as "beneath," "below," "lower," "above," "upper," and the like, may be used herein for descriptive purposes, and, thereby, to describe one element or feature's relationship to another element(s) or feature(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," comprising," "may include," and/or "including," when used in this specification, specify the presence of stated features, integers, steps, operations, elements, components, and/or groups thereof, but do not preclude the presence or addition of one or more other features, integers, steps, operations, elements, components, and/or groups thereof.

Various exemplary embodiments are described herein with reference to sectional illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not be construed as limited to the particular illustrated shapes of regions, but are to include deviations in shapes that result from, for instance, manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the drawings are schematic in nature and their shapes are not intended to illustrate the actual shape of a region of a device and are not intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and will not be interpreted in an idealized or overly formal sense, unless expressly so defined herein.

Figure 1B:
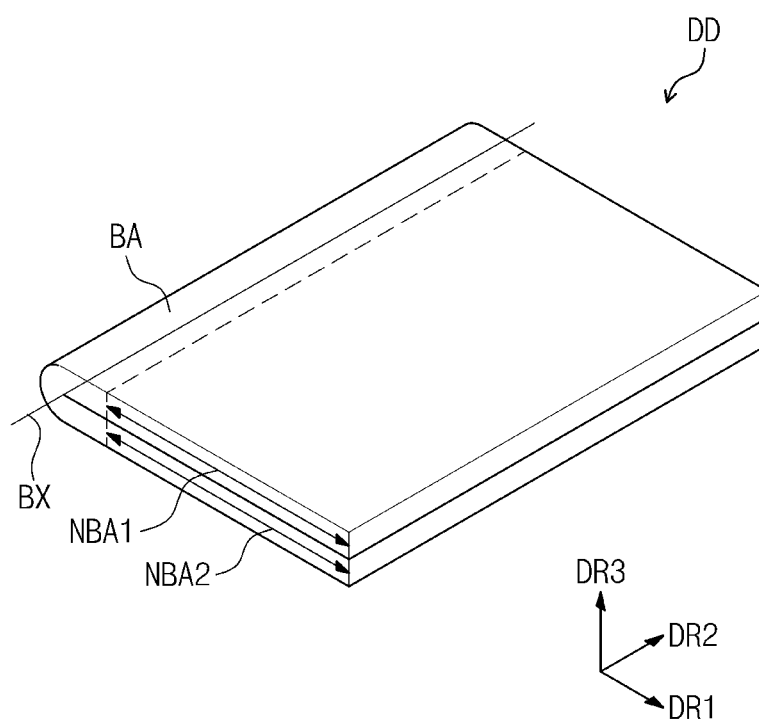
FIG. 1B is a perspective view showing a flexible display device in a second operation according to an exemplary embodiment of the present disclosure.
Figure 2A:
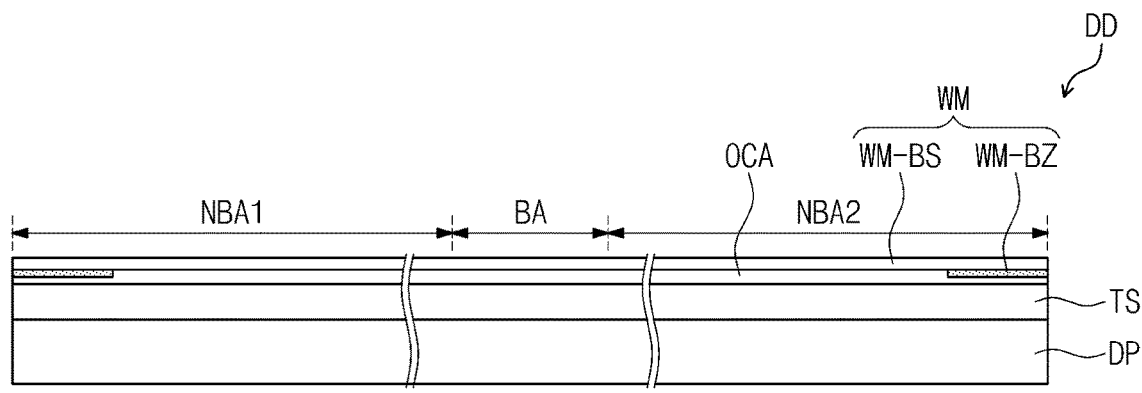
FIG. 2A is a cross-sectional view showing a flexible display device in a first operation according to an exemplary embodiment of the present disclosure.
Figure 2B:
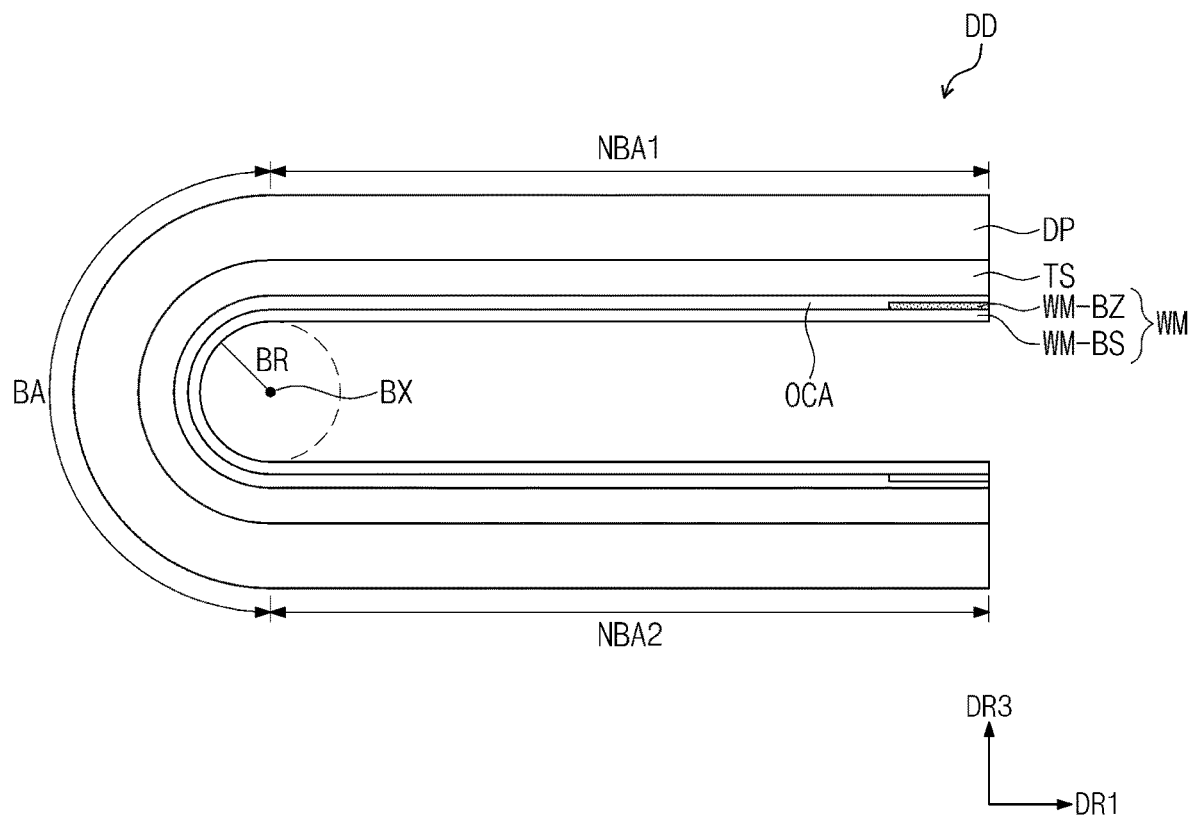
FIG. 2B is a cross-sectional view showing a flexible display device in a second operation according to an exemplary embodiment of the present disclosure.

FIG. 1A is a perspective view showing a flexible display device DD in a first operation according to an exemplary embodiment of the present disclosure. FIG. 1B is a perspective view showing a flexible display device DD in a second operation according to an exemplary embodiment of the present disclosure. FIG. 2A is a cross-sectional view showing a flexible display device DD in a first operation according to an exemplary embodiment of the present disclosure. FIG. 2B is a cross-sectional view showing a flexible display device DD in a second operation according to an exemplary embodiment of the present disclosure.

A display surface IS on which an image IM is displayed may be substantially parallel to a plane defined by a first directional axis DR1 and a second directional axis DR2. A normal line direction of the display surface IS, i.e., a thickness direction of the flexible display device DD, indicates a third directional axis DR3. Front (or upper) and rear (or lower) surfaces of each member of the flexible display device DD are distinct from each other by the third directional axis DR3. However, directions indicated by the first, second, and third directional axes DR1, DR2, and DR3 are relative to each other and may be changed to different directions. Hereinafter, first, second, and third directions indicated by the first, second, and third directional axes DR1, DR2, and DR3 are assigned with the same reference numerals as those of the first, second, and third directional axes DR1, DR2, and DR3.

FIGS. 1A, 1B, 2A, and 2B show a foldable display device as a representative example of the flexible display device DD, but the flexible display device DD is not limited to the foldable display device. That is, the flexible display device DD may be a curved flexible display device or a rollable flexible display device, which has a predetermined curvature, but is not limited thereto. Although not shown separately, the flexible display device DD according to the present exemplary embodiment may be applied to a large-sized electronic item, such as a television set, a monitor, etc., and a small and medium-sized electronic item, such as a mobile phone, a tablet, a car navigation unit, a game unit, a smart watch, etc.

As shown in FIG. 1A, the display surface IS of the flexible display device DD may include a plurality of areas. The flexible display device DD may include a display area DD-DA in which the image IM is displayed and a non-display area DD-NDA may be disposed adjacent to the display area DD-DA. The non-display area DD-NDA does not display an image. FIG. 1A shows a vase as the image IM. As an example, the display area DD-DA has a substantially quadrangular shape. The non-display area DD-NDA may surround the display area DD-DA, but it is not limited thereto. The shape of the display area DD-DA and the shape of the non-display area NDA may be relative to each other.

As shown in FIGS. 1A and 1B, the display device DD may include a bending area BA bent on the basis of a bending axis BX, a first non-bending area NBA1 that is not bent, and a second non-bending area NBA2 that is not bent. The display device DD may be inwardly bent (hereinafter, referred to as "inner-bending") in such a manner as to allow the display surface IS of the first non-bending area NBA1 to face the display surface IS of the second non-bending area NBA1. The display device DD may be outwardly bent (hereinafter, referred to as "outer-bending") in accordance with a user's operation in such a manner as to allow the display surface IS to be exposed to the outside.

In the present exemplary embodiment, the display device DD may include a plurality of bending areas BA. Further, the bending area BA may be defined corresponding to the user's operation. Different from FIG. 1B, the bending area BA may be defined to be substantially parallel to the first directional axis DR1 or to be substantially parallel to a diagonal line. The bending area BA may have a size determined by a bending radius BR (see to FIG. 2B).

Referring to FIGS. 2A and 2B, the display device DD may include a display panel DP, a touch screen TS, and a window member WM. Each of the display panel DP, the touch screen TS, and the window member WM may have a flexibility. Although not shown in figures, the display device DD according to the present exemplary embodiment may further include a protective member coupled to the window member WM to protect the display panel DP and the touch screen TS. The display panel DP may generate the image IM (see to FIG. 1A) corresponding to image data input thereto. The display panel DP may be an organic light emitting display panel, an electrophoretic display panel, or an electrowetting display panel, but is not limited thereto. In the present exemplary embodiment, the organic light emitting display panel will be described as the display panel DP. The organic light emitting display panel will be described in detail later.

The touch screens TS may obtain coordinate information of an external input. The touch screen TS may be disposed on a base surface provided by the display panel DP. In the present exemplary embodiment, the touch screen TS is manufactured with the display panel DP through consecutive processes.

The touch screen TS may be an electrostatic capacitive type touch screen, but it is not limited thereto. That is, the touch screen TS may be replaced with a touch screen including two types of touch electrodes as an electromagnetic induction type touch screen, or other type of touch screen.

The window member WM may be coupled to the touch screen TS by an optically clear adhesive (OCA) film. The window member WM may include a base member WM-BS and a bezel layer WM-BZ. The base member MW-BS may include a plastic film. The bezel layer WM-BZ may partially overlap with the base member WM-BS. The bezel layer WM-BZ may be disposed on a rear surface of the base member WM-BS to define a bezel area of the display device DD, i.e., the non-display area NDA (see to FIG. 1A). The bezel layer WM-BZ may be a colored organic layer and may be formed by a coating method.

Although not shown separately, the window member WM may further include a function coating layer disposed on an entire surface of the base member WM-BS. The function coating layer may include an anti-fingerprint layer, an anti-reflection layer, and a hard coating layer.

Although not shown separately, in the display device DD according to the present exemplary embodiment, the window member WM may be integrally coupled to the touch screen TS or the display panel DP. The OCA film may be omitted, and a coating layer may be formed on the touch screen TS or the display panel DP instead of the base member WM-BS.

Figure 3:
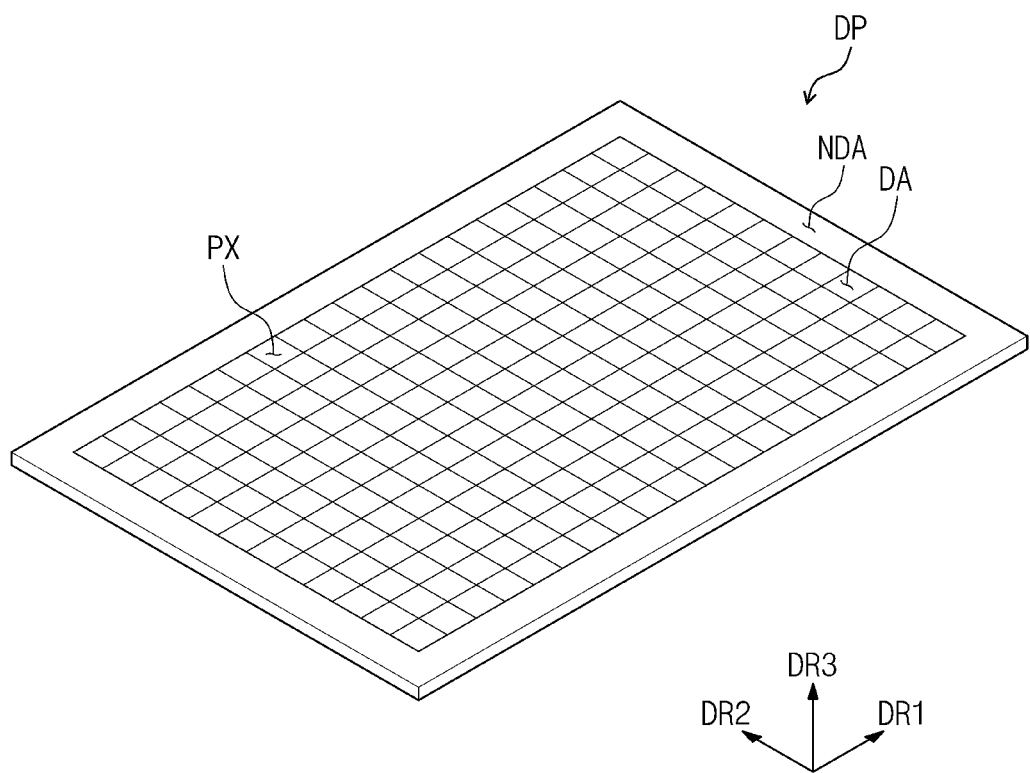
FIG. 3 is a perspective view showing a flexible display panel according to an exemplary embodiment of the present disclosure.
Figure 4:
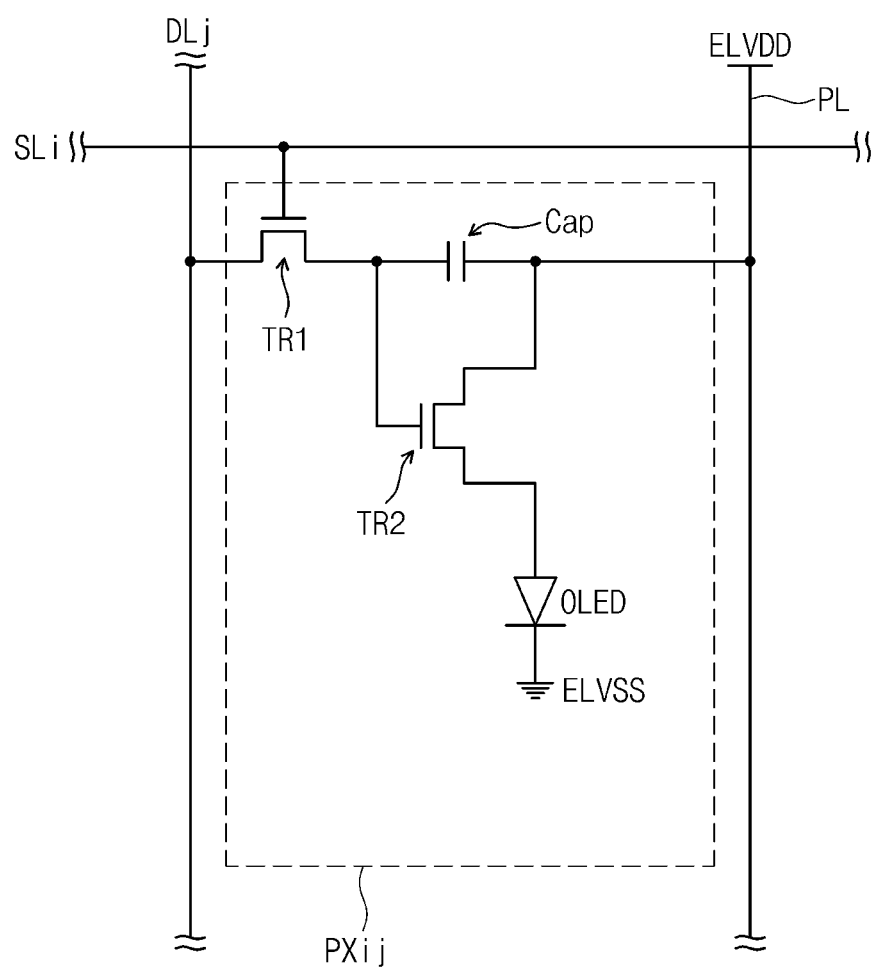
FIG. 4 is an equivalent circuit diagram showing a pixel according to an exemplary embodiment of the present disclosure.

FIG. 3 is a perspective view showing a flexible display panel DP according to an exemplary embodiment of the present disclosure, and FIG. 4 is an equivalent circuit diagram showing a pixel according to an exemplary embodiment of the present disclosure. Hereinafter, the organic light emitting display panel will be described as the display panel DP.

The organic light emitting display panel DP may include a display area DA and a non-display area NDA. The display area DA and the non-display area NDA of the organic light emitting display panel DP are not necessarily the same as the display area DD-DA and the non-display area DD-NDA of the display device DD, defined by the bezel layer WM-BZ, and may be changed in accordance with the structure and design of the organic light emitting display panel DP.

As shown in FIG. 3, the organic light emitting display panel DP may include a plurality of pixels PX arranged in the display area DA. In FIG. 3, the pixels PX are arranged in a matrix form, but they are not limited thereto. That is, the pixels PX may be arranged in a non-matrix form, i.e., a pentile form.

FIG. 4 shows the equivalent circuit of one pixel PXij connected to an i-th scan line SLi and a j-th source line DLj. Although not shown in figures, the pixels PX may have the same equivalent circuit.

The pixel PXij may include at least one transistor TR1 and TR2, at least one capacitor Cap, and at least one organic light emitting device OLED. In the present exemplary embodiment, a pixel driving circuit including two transistors TR1 and TR2 and one capacitor Cap is shown as a representative example, but a circuit configuration of the pixel driving circuit is not limited thereto.

The organic light emitting device OLED may include an anode receiving a first power source voltage ELVDD applied to a power source line PL through a second transistor TR2. The organic light emitting device OLED may include a cathode receiving a second power source voltage ELVSS. A first transistor TR1 may output a data signal applied to the j-th source line DLj in response to a scan signal applied to the i-th scan line SLi. The capacitor Cap may be charged with a voltage corresponding to the data signal provided from the first transistor TR1. The second transistor TR2 may control a driving current flowing through the organic light emitting device OLED in response to the voltage charged in the capacitor Cap.

Figure 5:
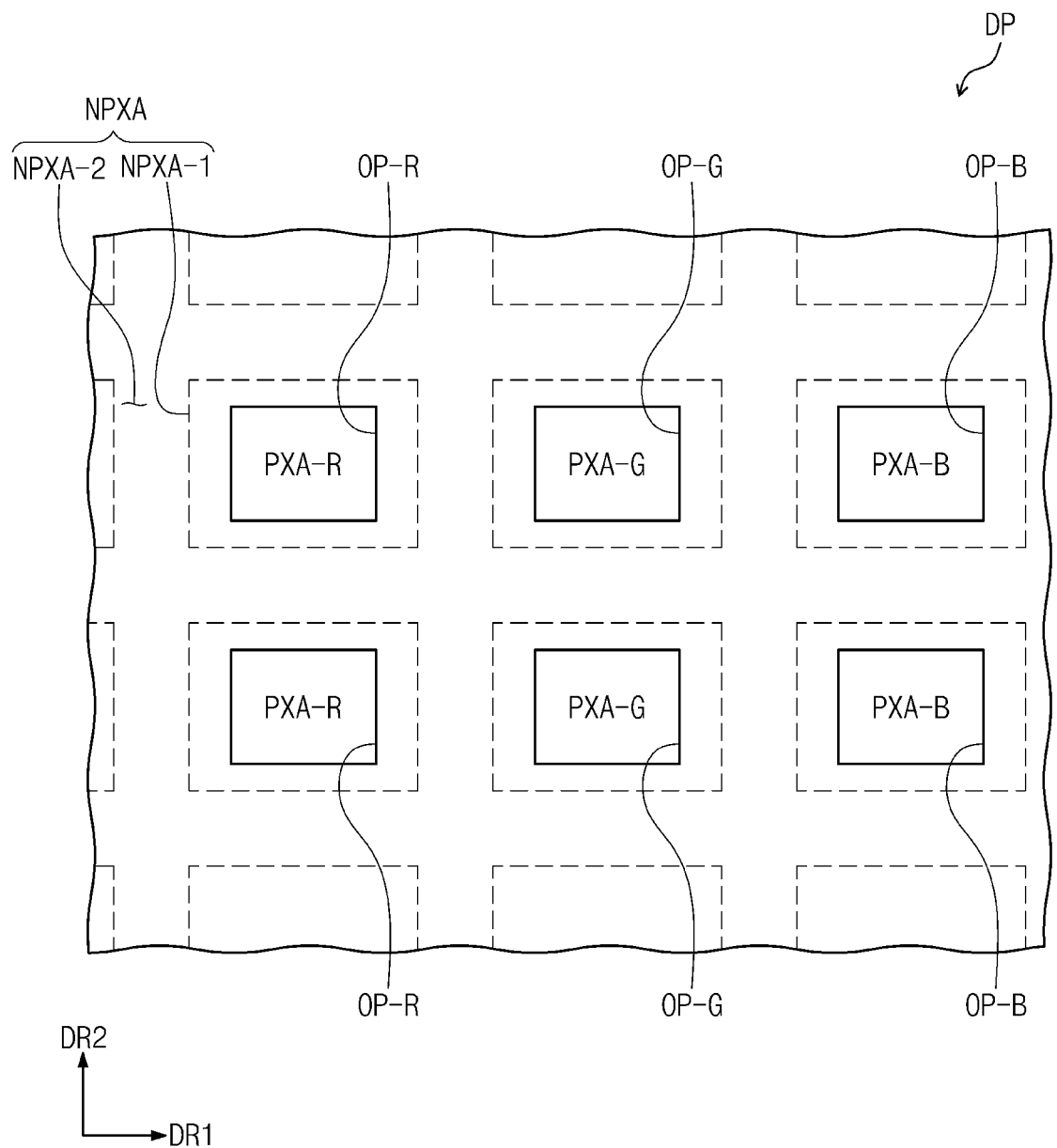
FIG. 5 is a plan view showing a portion of an organic light emitting display panel according to an exemplary embodiment of the present disclosure.
Figure 6A:
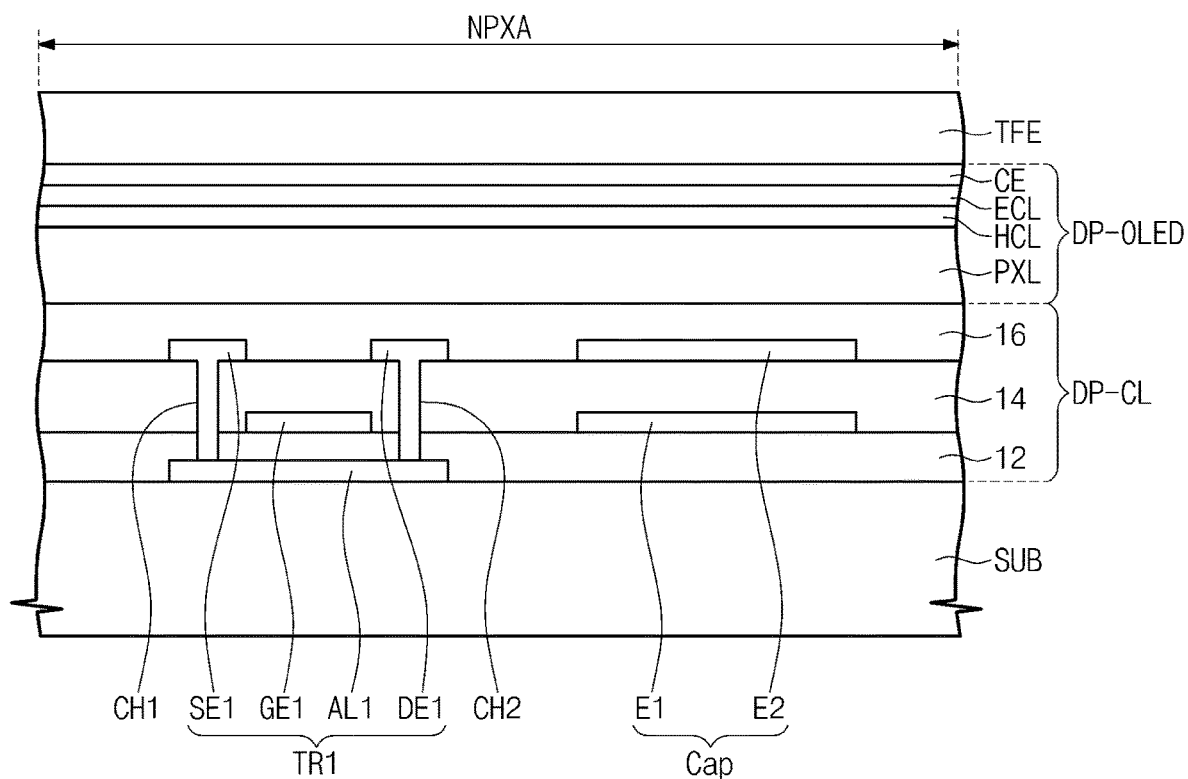
FIGS. 6A and 6B are cross-sectional views showing an organic light emitting display panel according to an exemplary embodiment of the present disclosure.
Figure 6B:
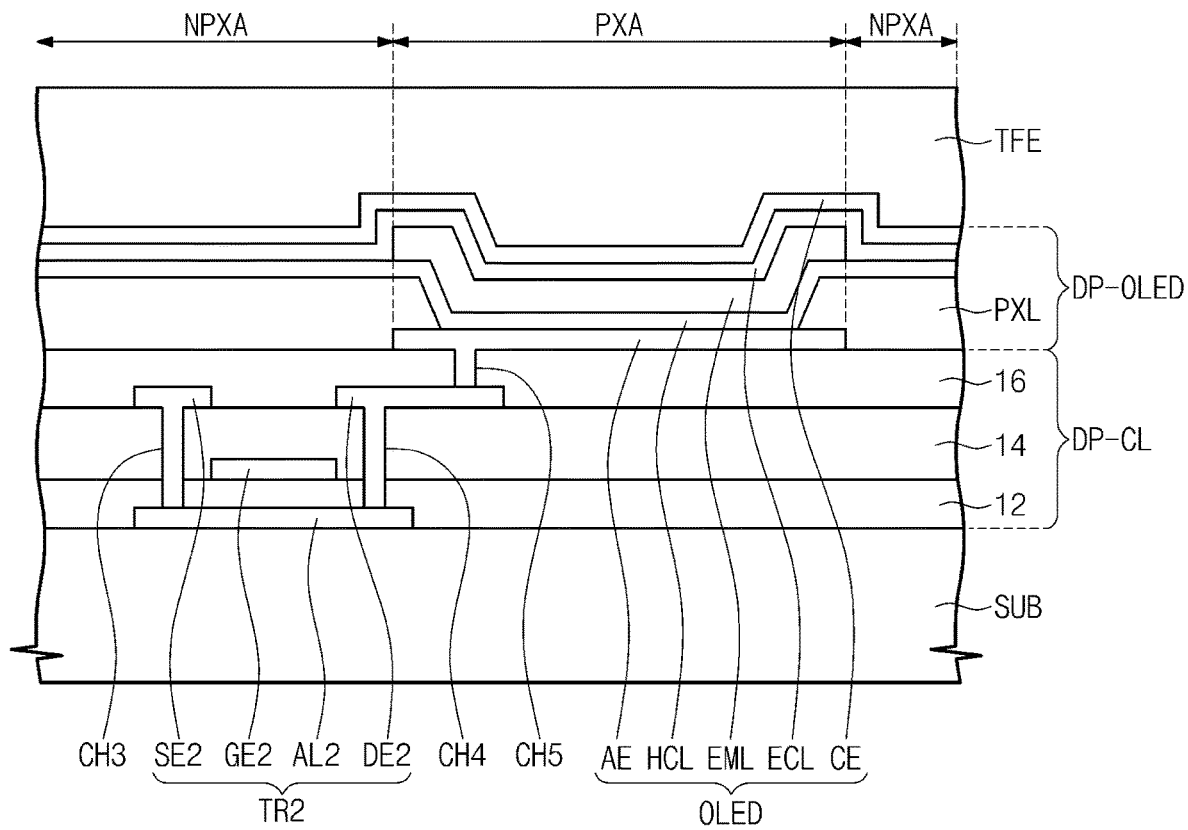

FIG. 5 is a plan view showing a portion of an organic light emitting display panel DP according to an exemplary embodiment of the present disclosure, and FIGS. 6A and 6B are cross-sectional views showing an organic light emitting display panel DP according to an exemplary embodiment of the present disclosure. FIG. 5 shows a portion of the display area DA (see FIG. 3). FIG. 6A shows the cross-sectional view corresponding to the first transistor TR1 and the capacitor Cap of the equivalent circuit diagram shown in FIG. 4, and FIG. 6B shows the cross-sectional view corresponding to the second transistor TR2 and the organic light emitting device OLED of the equivalent circuit diagram shown in FIG. 4.

Referring to FIG. 5, the organic light emitting display panel DP may include a plurality of light emitting areas PXA-R, PXA-G, and PXA-B and a non-light emitting area NPXA on a plane defined by the first directional axis DR1 and the second directional axis DR2. FIG. 5 shows three types of light emitting areas PXA-R, PXA-G, and PXA-B arranged in a matrix form. Three organic light emitting devices emitting lights having different colors may be respectively disposed in the three light emitting areas PXA-R, PXA-G, and PXA-B.

In the present exemplary embodiment, organic light emitting devices emitting a white light may be respectively disposed in the three light emitting areas PXA-R, PXA-G, and PXA-B. In this case, three color filters having different colors may be disposed to respectively overlap with the three light emitting areas PXA-R, PXA-G, and PXA-B.

In the following description, the expression "the light emitting area emits light having a predetermined color" used hereinafter means that not only that the light emitting area emits light generated by a corresponding light emitting device without converting the light, but also that the light emitting area emits light generated by the corresponding light emitting device after converting the color of the light generated by the corresponding light emitting device. In the present exemplary embodiment, the light emitting areas PXA-R, PXA-G, and PXA-B may include four or more types of light emitting areas. The non-light emitting area NPXA may include a first non-light emitting area NPXA-1 surrounding the light emitting areas PXA-R, PXA-G, and PXA-B and a second non-light emitting area NPXA-2 defining a boundary of the first non-light emitting areas NPXA-1. Each of the first non-light emitting areas NPXA-1 may include a driving circuit of a corresponding pixel, e.g., transistors TR1 and TR2 (see to FIG. 4) or the capacitor Cap (see FIG. 4). Signal lines, e.g., the scan line SLi (see FIG. 4), the source line DLj (see FIG. 4), and the power source line PL (see FIG. 4), etc., may be disposed in the second non-light emitting area NPXA-2. However, the first non-light emitting areas NPXA-1 and the second non-light emitting area NPXA-2 may not be distinct from each other according to exemplary embodiments.

Although not shown in figures, according to the present exemplary embodiment, each of the light emitting areas PXA-R, PXA-G, and PXA-B has a shape similar to a rhombus. According to the present exemplary embodiment, organic light emitting devices emitting lights having different four colors are respectively disposed in four light emitting areas different from each other.

Referring to FIGS. 6A and 6B, the organic light emitting display panel DP may include a base substrate SUB, a circuit layer DP-CL, an organic light emitting device layer DP-OLED, and a thin film encapsulation layer TFE. The circuit layer DP-CL may include a plurality of conductive layers and a plurality of insulating layers, and the organic light emitting device layer DP-OLED may include a plurality of conductive layers and a plurality of functional organic layers. The thin film encapsulation layer TFE may include a plurality of organic layers and/or a plurality of inorganic layers.

The base substrate SUB may be a flexible substrate and may include a plastic substrate formed of polyimide, a glass substrate, or a metal substrate. A semiconductor pattern AL1

(hereinafter, referred to as "a first semiconductor pattern") of the first transistor TR1 and a semiconductor pattern AL2 (hereinafter, referred to as "a second semiconductor pattern") of the second transistor TR2 may be disposed on the base substrate SUB. The first and second semiconductor patterns AL1 and AL2 may include amorphous silicon formed at a low temperature. In addition, the first and second semiconductor patterns AL1 and AL2 may include a metal oxide semiconductor. Although not shown in figures, functional layers may be further disposed on a surface of the base substrate SUB. The functional layers may include at least one of a barrier layer and a buffer layer. The first and second semiconductor patterns AL1 and AL2 may be disposed on the barrier layer or the buffer layer.

A first insulating layer 12 may be disposed on the base substrate SUB to cover the first and second semiconductor patterns AL1 and AL2. The first insulating layer 12 may include an organic layer and/or an inorganic layer. In particular, the first insulating layer 12 may include a plurality of inorganic thin film layers. The inorganic thin film layers may include a silicon nitride layer and a silicon oxide layer.

A control electrode GE1 (hereinafter, referred to as "a first control electrode") of the first transistor TR1 and a control electrode GE2 (hereinafter, referred to as "a second control electrode") of the second transistor TR2 may be disposed on the first insulating layer 12. A first electrode E1 of the capacitor Cap may be disposed on the first insulating layer 12. The first control electrode GE1, the second control electrode GE2, and the first electrode E1 may be formed through the same photolithography process as the process of forming the scan line SLi (see FIG. 4).

A second insulating layer 14 may be disposed on the first insulating layer 12 to cover the first control electrode GE1, the second control electrode GE2, and the first electrode E1. The second insulating layer 14 may include an organic layer and/or an inorganic layer. In particular, the second insulating layer 14 may include a plurality of inorganic thin film layers. The inorganic thin film layers may include a silicon nitride layer and a silicon oxide layer.

The source line DLj (refer to FIG. 4) and the power source line PL (see FIG. 4) may be disposed on the second insulating layer 14. An input electrode SE1 (hereinafter, referred to as "a first input electrode") and an output electrode DE1 (hereinafter, referred to as "a first output electrode") of the first transistor TR1 may be disposed on the second insulating layer 14. An input electrode SE2 (hereinafter, referred to as a second input electrode) and an output electrode DE2 (hereinafter, referred to as a second output electrode) of the second transistor TR2 may be disposed on the second insulating layer 14. The first input electrode SE1 may be branched from the source line DLj. The second input electrode DE2 may be branched from the power source line PL.

A second electrode E2 of the capacitor Cap may be disposed on the second insulating layer 14. The second electrode E2 may be formed through the same photolithography process as the process of forming the source line DLj and the power source line PL and may include the same material as that of the source line DLj and the power source line PL.

The first input electrode SE1 and the first output electrode DE1 may be respectively connected to the first semiconductor pattern AL1 through first and second contact holes CH1 and CH2 formed through the first and second insulating layers 12 and 14. The first output electrode DE1 may be electrically connected to the first electrode E1. The first output electrode DE1 may be connected to the first electrode E1 through a contact hole (not shown) formed through the second insulating layer 14. The second input electrode SE2 and the second output electrode DE2 may be respectively connected to the second semiconductor pattern AL2 through third and fourth contact holes CH3 and CH4 formed through the first and second insulating layers 12 and 14. Meanwhile, each of the first and second transistors TR1 and TR2 may have a bottom gate structure according to exemplary embodiments.

A third insulating layer 16 may be disposed on the second insulating layer 14 to cover the first input electrode SE1, the first output electrode DE1, the second input electrode SE2, and the second output electrode DE2. The third insulating layer 16 may include an organic layer and/or an inorganic layer. Particularly, the third insulating layer 16 may include an organic material which provides a relatively flat surface.

A pixel definition layer PXL and the organic light emitting device OLED may be disposed on the third insulating layer 16. The pixel definition layer PXL may be provided with an opening OP formed therethrough. The pixel definition layer PXL may serve as another insulating layer. The opening OP shown in FIG. 6B may correspond to openings OP-R, OP-G, and OP-B shown in FIG. 5.

The anode AE may be connected to the second output electrode DE2 through a fifth contact hole CH5 formed through the third insulating layer 16. The opening OP of the pixel definition layer PXL may expose at least a portion of the anode AE. A hole control layer HCL is may be commonly formed in the light emitting areas PXA-R, PXA-G, and PXA-B (see to FIG. 5) and the non-light emitting area NPXA (see to FIG. 5). An organic light emitting layer EML and an electron control layer ECL may be sequentially formed on the hole control layer HCL. The hole control layer HCL may include at least a hole transport layer, and the electron control layer ECL may include at least an electron transport layer. The cathode CE may be commonly formed in the light emitting areas PXA-R, PXA-G, and PXA-B and the non-light emitting area NPXA. The cathode CE may be formed by a deposition method or a sputtering method in accordance with a layer structure of the cathode CE.

The thin film encapsulation layer TFE may be disposed on the cathode CE to encapsulate the organic light emitting device layer DP-OLED. The thin film encapsulation layer TFE may protect the organic light emitting device OLED from moisture and foreign substance.

In the present exemplary embodiment, the light emitting area PXA may correspond to an area from which the light is generated. The light emitting area PXA may be defined to correspond to the anode AE or the light emitting layer EML of the organic light emitting device OLED. In the present exemplary embodiment, the organic light emitting layer EML is patterned, but the organic light emitting layer EML may be commonly disposed on the light emitting areas PXA-R, PXA-G, and PXAB (see to FIG. 5) and the non-light emitting area NPXA (see to FIG. 5). In this case, the organic light emitting layer EML may generate a white light.

Figure 7A:
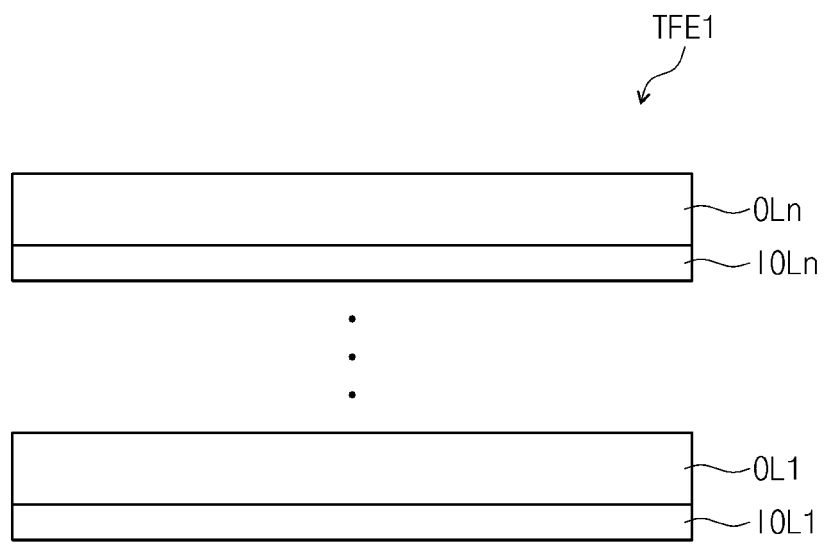
FIGS. 7A, 7B, and 7C are cross-sectional views showing a thin film encapsulation layer according to an exemplary embodiment of the present disclosure.
Figure 7B:
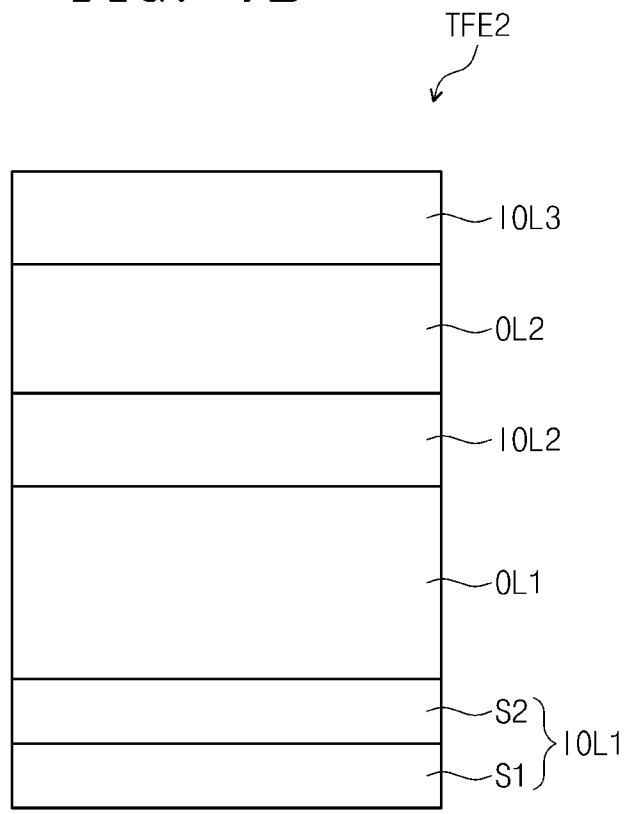
Figure 7C:
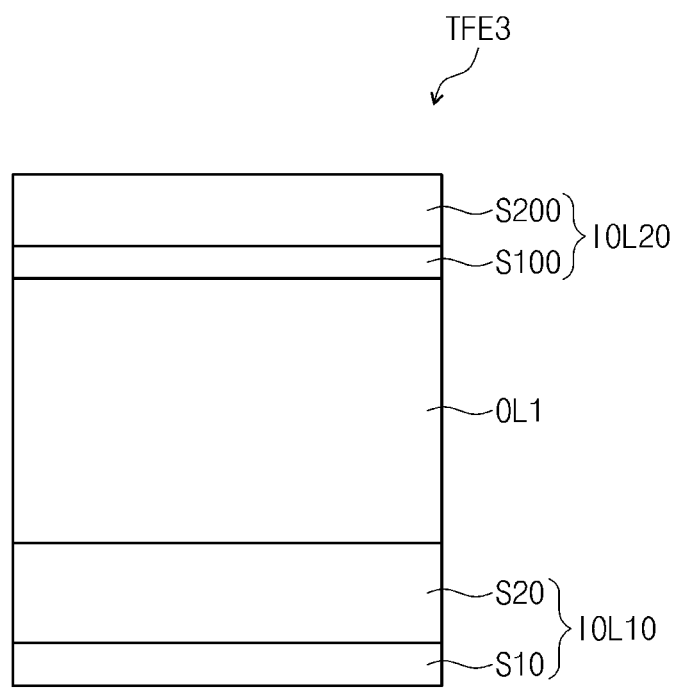

FIGS. 7A, 7B, and 7C are cross-sectional views showing thin film encapsulation layers TFE1, TFE2, and TFE3 according to an exemplary embodiment of the present disclosure. Hereinafter, the thin film encapsulation layers TFE1, TFE2, and TFE3 according to the present exemplary embodiment will be described with reference to FIGS. 7A, 7B, and 7C.

Each thin film encapsulation layer may include at least two inorganic thin film layers and an organic thin film layer disposed between the two inorganic thin film layers. The inorganic thin film layers may protect the organic light emitting device OLED from moisture, and the organic thin film layer may protect the organic light emitting device OLED from foreign substance, e.g., a dust particle.

Referring to FIG. 7A, the thin film encapsulation layer TFE1 may include "n" inorganic thin film layers IOL1 to IOLn, and a first inorganic thin film layer IOL1 among the "n" inorganic thin film layers IOL1 to IOLn may make contact with the cathode CE (see to FIG. 6B). The first inorganic thin film layer IOL1 may be referred to as a lower inorganic thin film layer, and the inorganic thin film layers except for the first inorganic thin film layer IOL1 among the "n" inorganic thin film layers IOL1 to IOLn may be referred to as upper inorganic thin film layers.

The thin film encapsulation layer TFE1 may include "n" organic thin film layers OL1 to OLn, and the "n" organic thin film layers OL1 to OLn may be alternately arranged with the "n" inorganic thin film layers IOL1 to IOLn. A layer disposed at an uppermost position may be an organic layer or an inorganic layer. The "n" organic thin film layers OL1 to OLn may have a thickness greater than that of the "n" inorganic thin film layers on average.

Each of the "n" inorganic thin film layers IOL1 to IOLn may have a single-layer structure of a single material or may have a multi-layer structure of different materials. Each of the "n" organic thin film layers OL1 to OLn may be formed by depositing organic monomers. The organic monomers may include an acrylic-based monomer.

Referring to FIGS. 7B and 7C, the inorganic thin film layers included in each of the thin film encapsulation layers TFE2 and TFE3 may include the same or different materials and may have the same or different thicknesses. The organic thin film layers included in each of the thin film encapsulation layers TFE2 and TFE3 may include the same or different materials and have the same or different thicknesses.

As shown in FIG. 7B, the thin film encapsulation layer TFE2 may include a first inorganic thin film layer IOL1, a first organic thin film layer OL1, a second inorganic thin film layer IOL2, a second organic thin film layer OL2, and a third inorganic thin film layer IOL3, which are sequentially stacked.

The first inorganic thin film layer IOL1 may have a double-layer structure. A first sub-layer S1 may be, but is not limited to, a lithium fluoride layer. A second sub-layer S2 may be, but not limited to, an aluminum oxide layer. The first organic thin film layer OL1 may be a first organic monomer layer, the second inorganic thin film layer IOL2 may be a first silicon nitride layer, the second organic thin film layer OL2 may be a second organic monomer layer, and the third inorganic thin film layer IOL3 may be a second silicon nitride layer.

As shown in FIG. 7C, the thin film encapsulation layer TFE3 may include a first inorganic thin film layer IOL10, a first organic thin film layer OL1, and a second inorganic thin film layer IOL20, which are sequentially stacked.

The first inorganic thin film layer IOL10 may have a double-layer structure. A first sub-layer S10 may be, but is not limited to, a lithium fluoride layer. A second sub-layer S20 may be, but not limited to, a silicon oxide layer. The first organic thin film layer OL1 may be a first organic monomer layer, and the second inorganic thin film layer IOL20 may have a double layer structure. The second inorganic thin film layer IOL20 may include a first sub-layer S100 and a second sub-layer S200, which are deposited in different environments. The first sub-layer S100 may be deposited under a lower power condition, and the second sub-layer S200 may be deposited under a high power condition. Each of the first and second sub-layers S100 and S200 may be, but are not limited to, a silicon nitride layer.

Figure 8A:
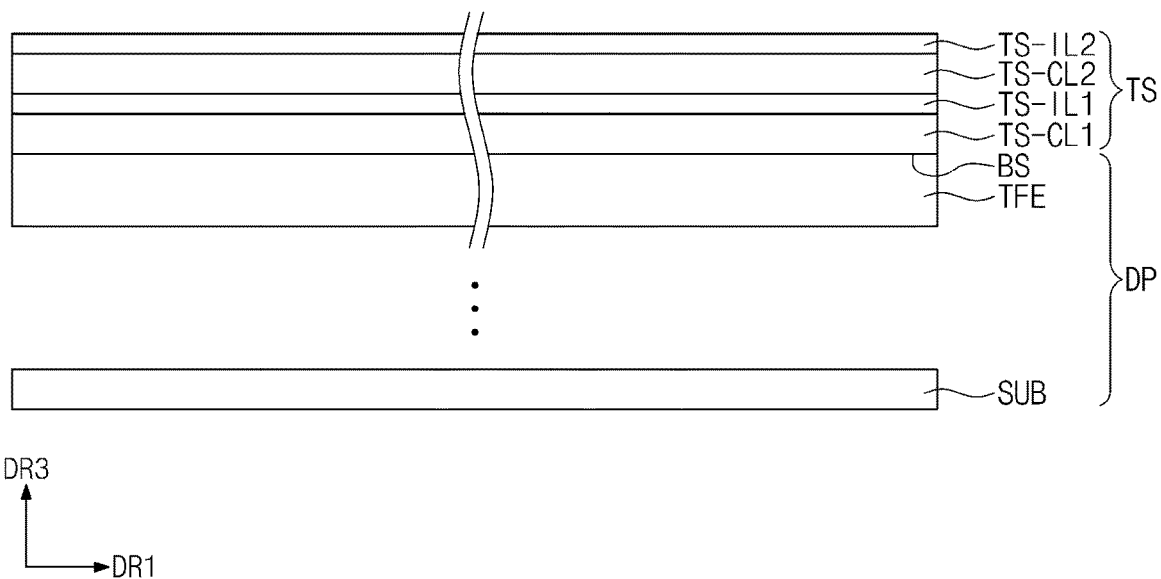
FIGS. 8A and 8B are cross-sectional views showing a display device according to an exemplary embodiment of the present disclosure.
Figure 8B:
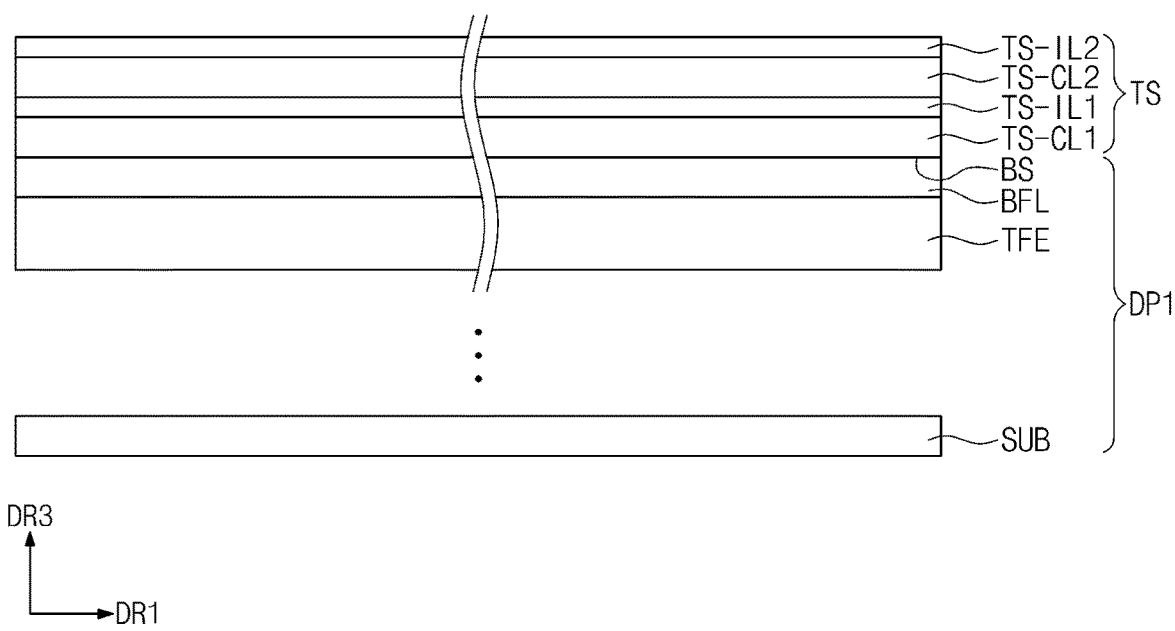

FIGS. 8A and 8B are cross-sectional views showing a display device according to an exemplary embodiment of the present disclosure. Display panels DP and DP1 are schematically shown in FIGS. 8A and 8B. Referring to FIGS. 8A and 8B, a touch screen TS may include a first conductive layer TS-CL1, a first insulating layer TS-IL1, a second conductive layer TS-CL2, and a second insulating layer TS-IL2.

Each of the first conductive layer TS-CL1 and the second conductive layer TS-CL2 may have a single-layer structure or a multi-layer structure of layers stacked along the third directional axis DR3. The conductive layer having the multi-layer structure may include a transparent conductive layer and at least one metal layer. The transparent conductive layer may include at least one of indium tin oxide (ITO), indium zinc oxide (IZO), zinc oxide (ZnO), indium tin zinc oxide (ITZO), PEDOT, metal nanowire, and graphene. The metal layer may include at least one of molybdenum, silver, titanium, copper, and aluminum. In addition, the metal layer may include an alloy of at least one of molybdenum, silver, titanium, copper, and aluminum.

Each of the first conductive layer TS-CL1 and the second conductive layer TS-CL2 may include a plurality of patterns. Hereinafter, the first conductive layer TS-CL1 may include first conductive patterns (not shown), and the second conductive layer TS-CL2 may include second conductive patterns (not shown). The first and second conductive patterns may include touch electrodes and touch signal lines.

Each of the first insulating layer TS-IL1 and the second insulating layer TS-IL2 may include an inorganic material or an organic material. The inorganic material may include silicon oxide or silicon nitride. The organic material may include at least one of an acryl-based resin, a methacryl-based resin, a polyisoprene, a vinyl-based resin, an epoxy-based resin, an urethane-based resin, a cellulose-based resin, and a perylene-based resin. The first insulating layer TS-IL1 may have a variety of shapes as long as the first insulating layer TS-IL1 insulates the first conductive layer TS-CL1 from the second conductive layer TS-CL2. The shape of the first insulating layer TS-IL1 may be determined depending on shapes of the first and second conductive patterns. The first insulating layer TS-IL1 may entirely cover a base surface BS described later or may include a plurality of insulating patterns.

As shown in FIG. 8A, the first conductive layer TS-CL1 is disposed on the thin film encapsulation layer TFE. In other words, the thin film encapsulation layer TFE provides the base surface BS on which the touch screen TS is disposed.

The display panel DP1 shown in FIG. 8B may further include a buffer layer BFL disposed on the thin film encapsulation layer TFE when compared with the display panel DP shown in FIG. 8A. The buffer layer BFL may provide the base surface BS. The buffer layer BFL may be an organic layer and may include any material determined in accordance with its purpose. The buffer layer BFL may be an organic layer and/or an inorganic layer to match a refractive index or may be a color filter layer to reduce a reflection of an external light.

Figure 9A:
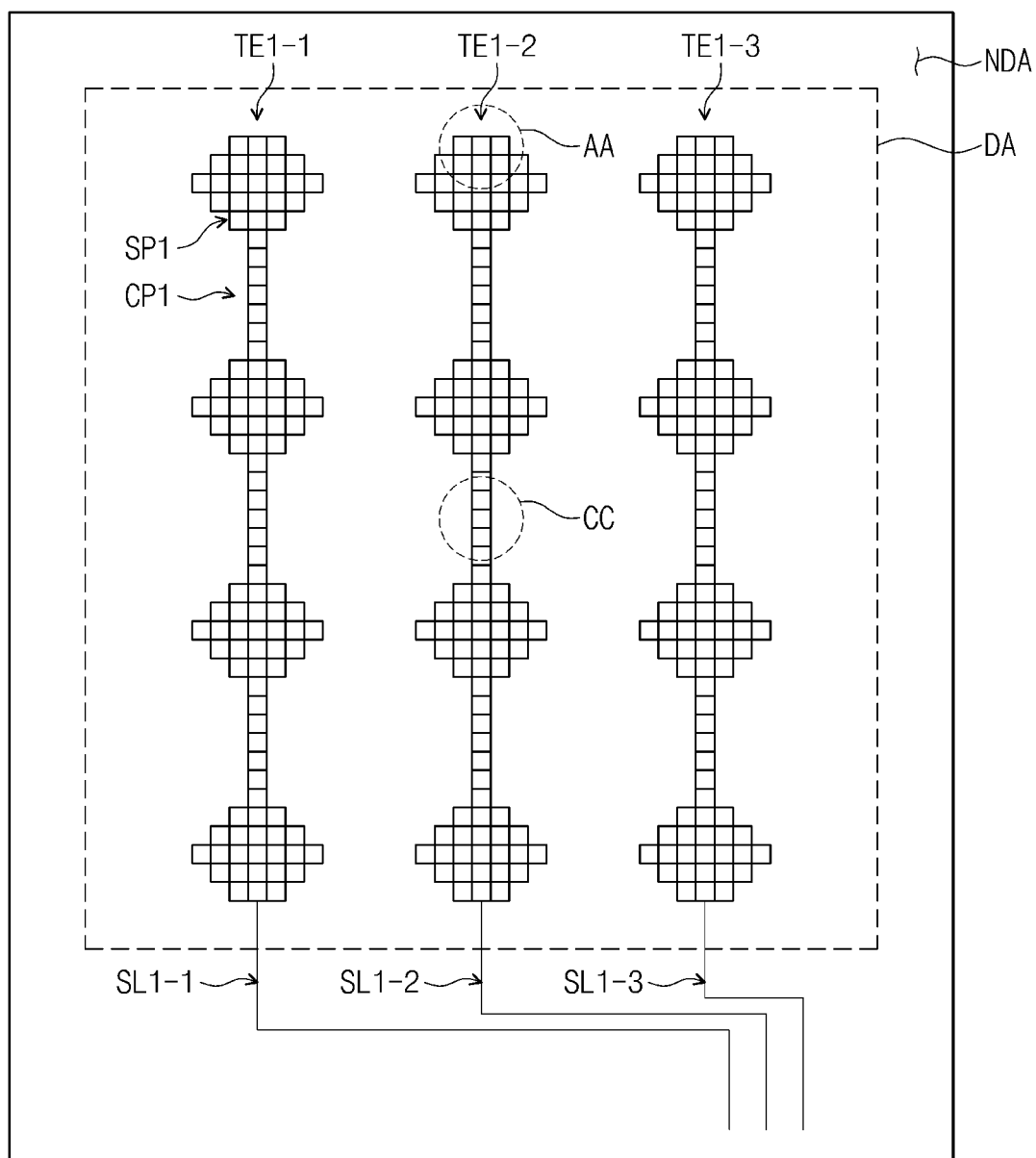
FIGS. 9A and 9B are plan views showing conductive layers of a touch screen according to exemplary embodiments of the present disclosure.
Figure 9B:
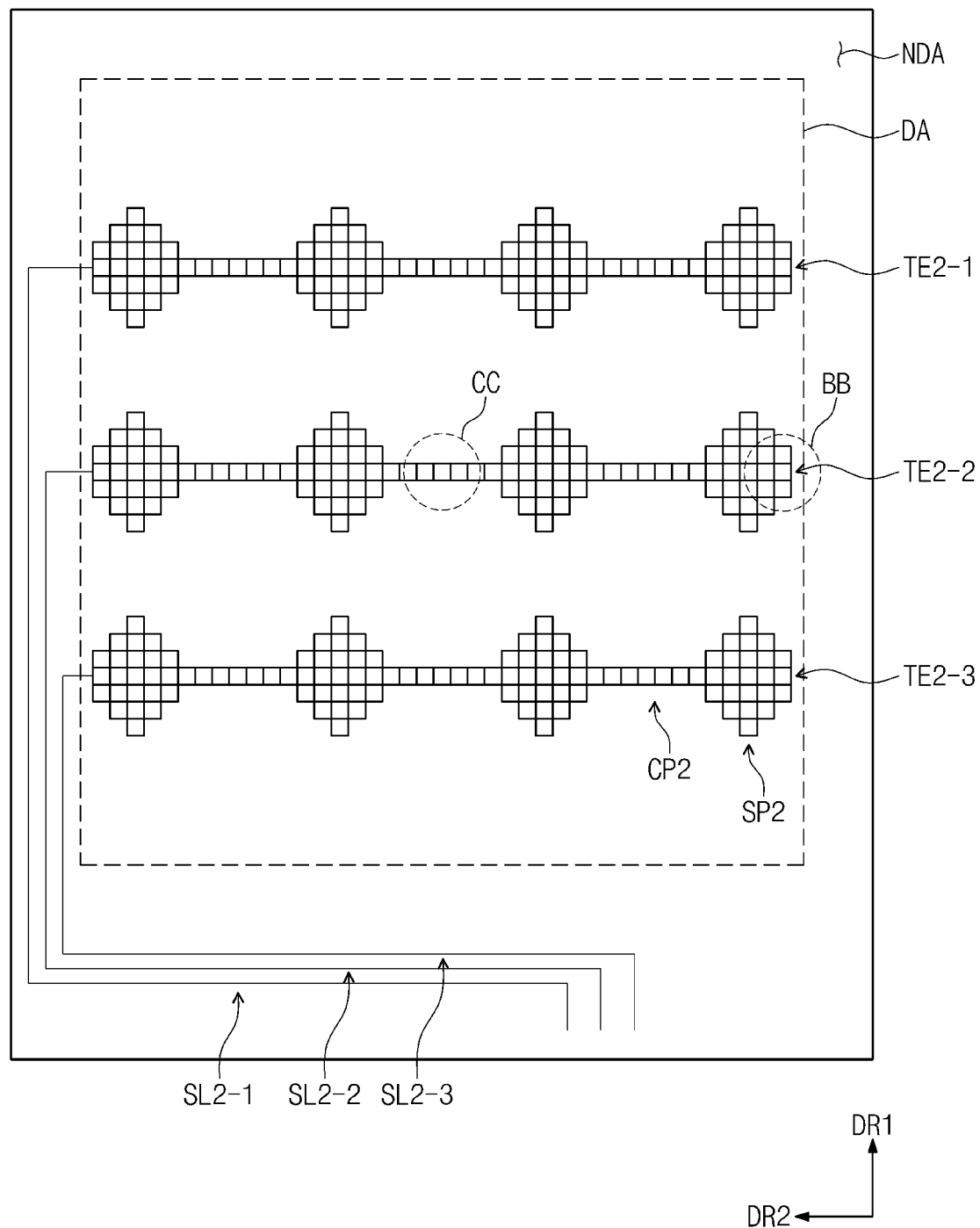
Figure 10A:
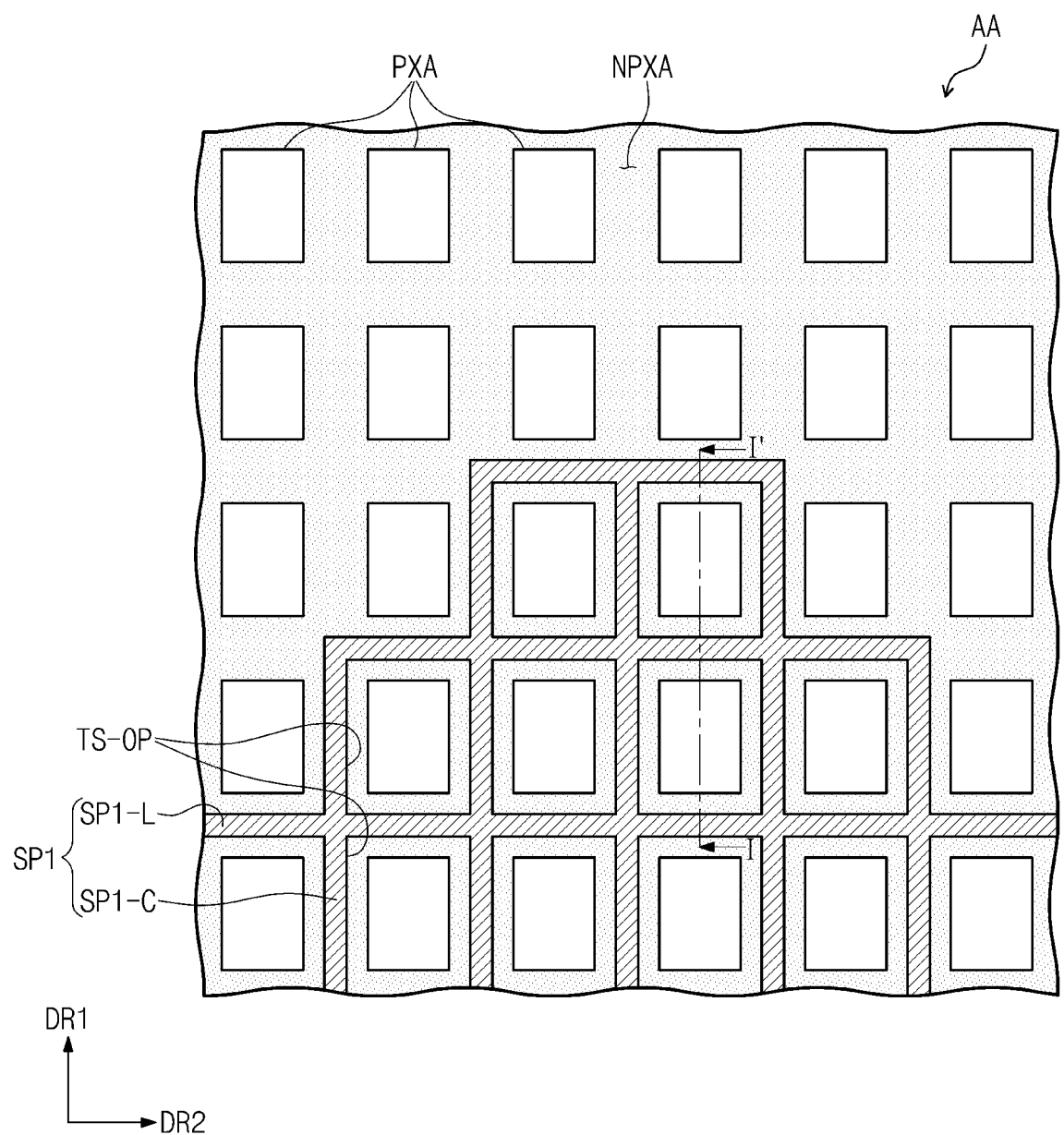
FIG. 10A is a partially enlarged view showing a portion "AA" of FIG. 9A.
Figure 10B:
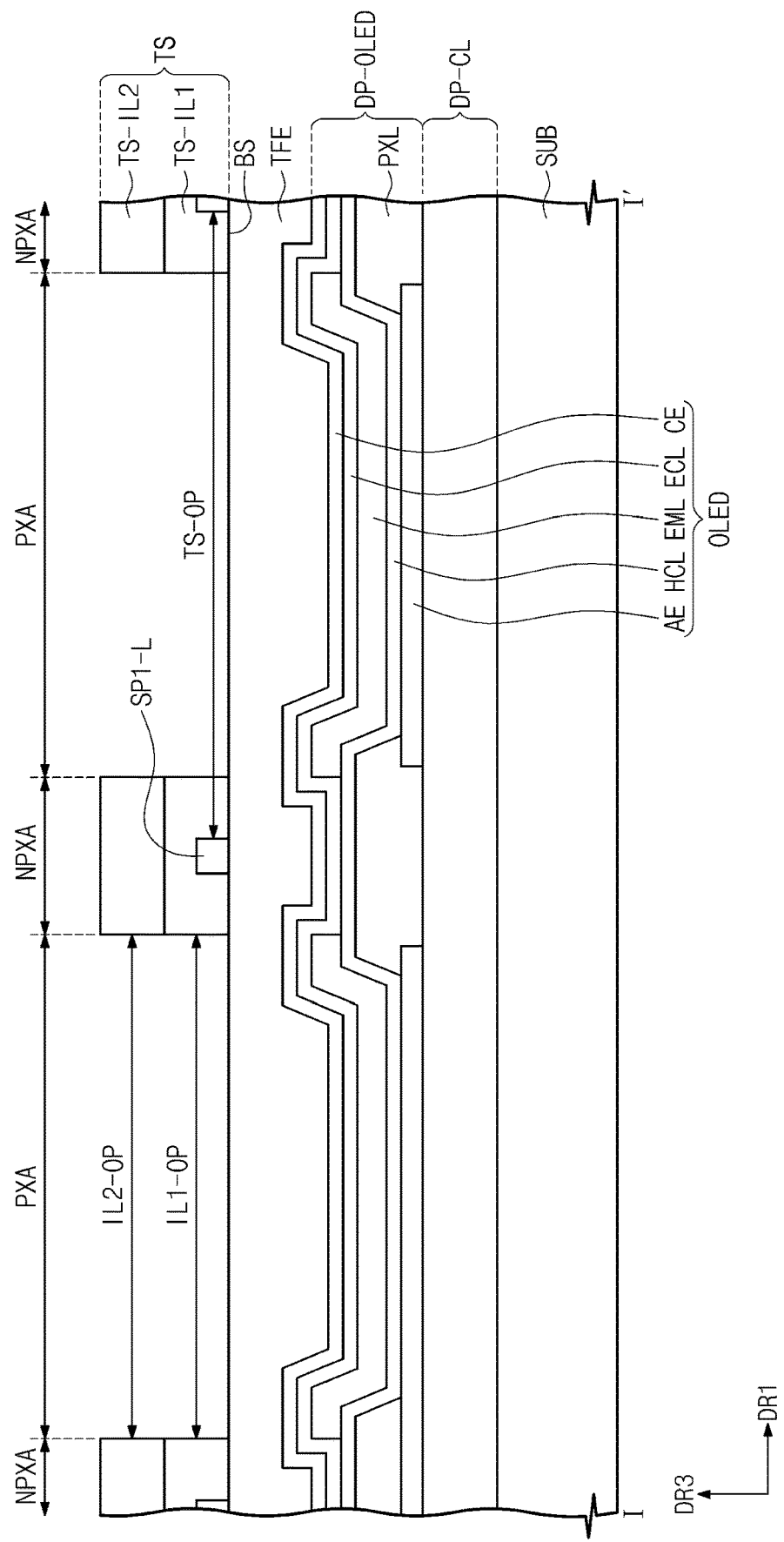
FIG. 10B is a cross-sectional view showing a portion of FIG. 10A along sectional line I to I'.
Figure 11A:
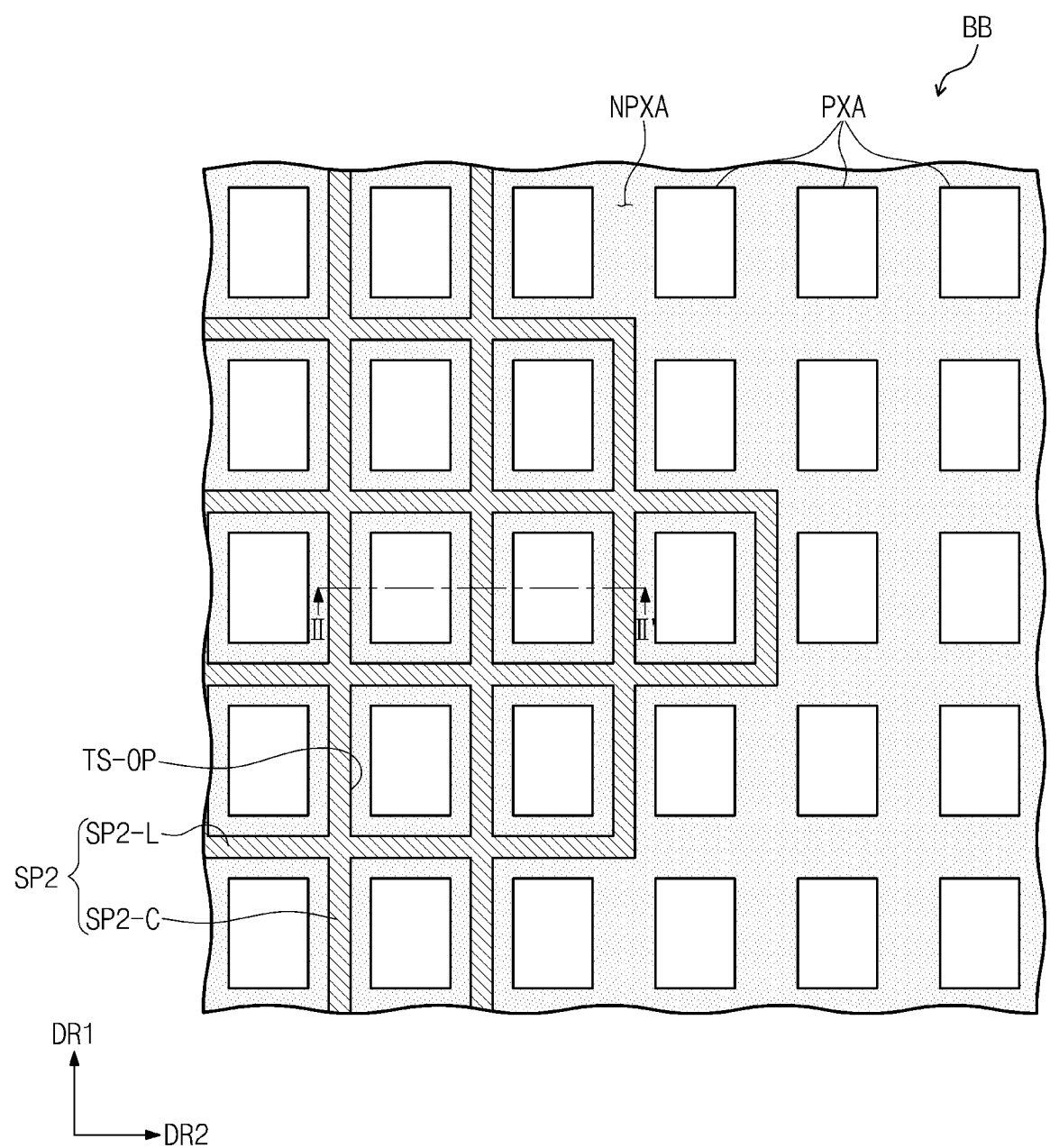
FIG. 11A is a partially enlarged view showing a portion "BB" of FIG. 9B.
Figure 11B:
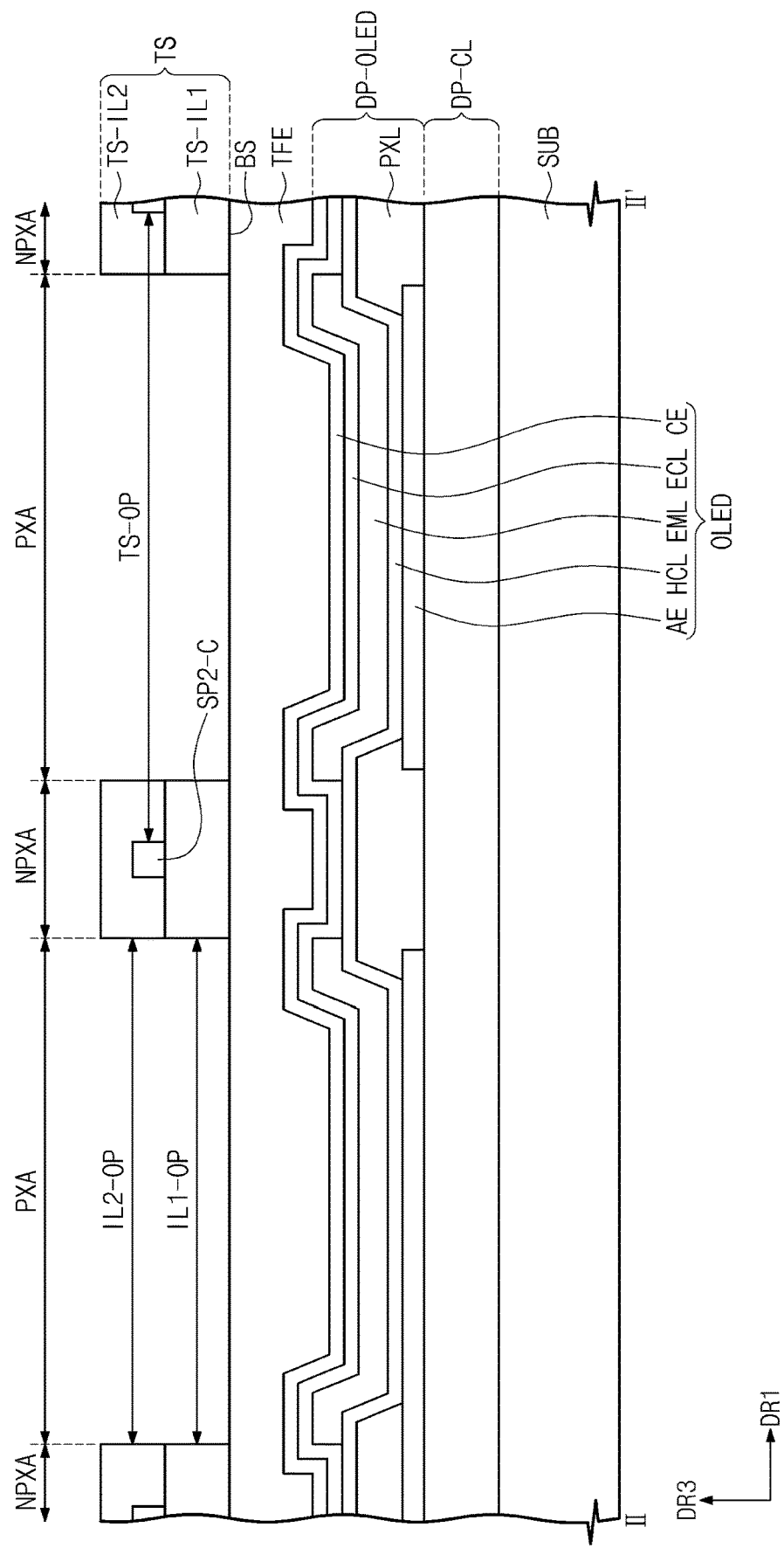
FIG. 11B is a cross-sectional view showing a portion of FIG. 11A along sectional line II to II'.
Figure 12A:
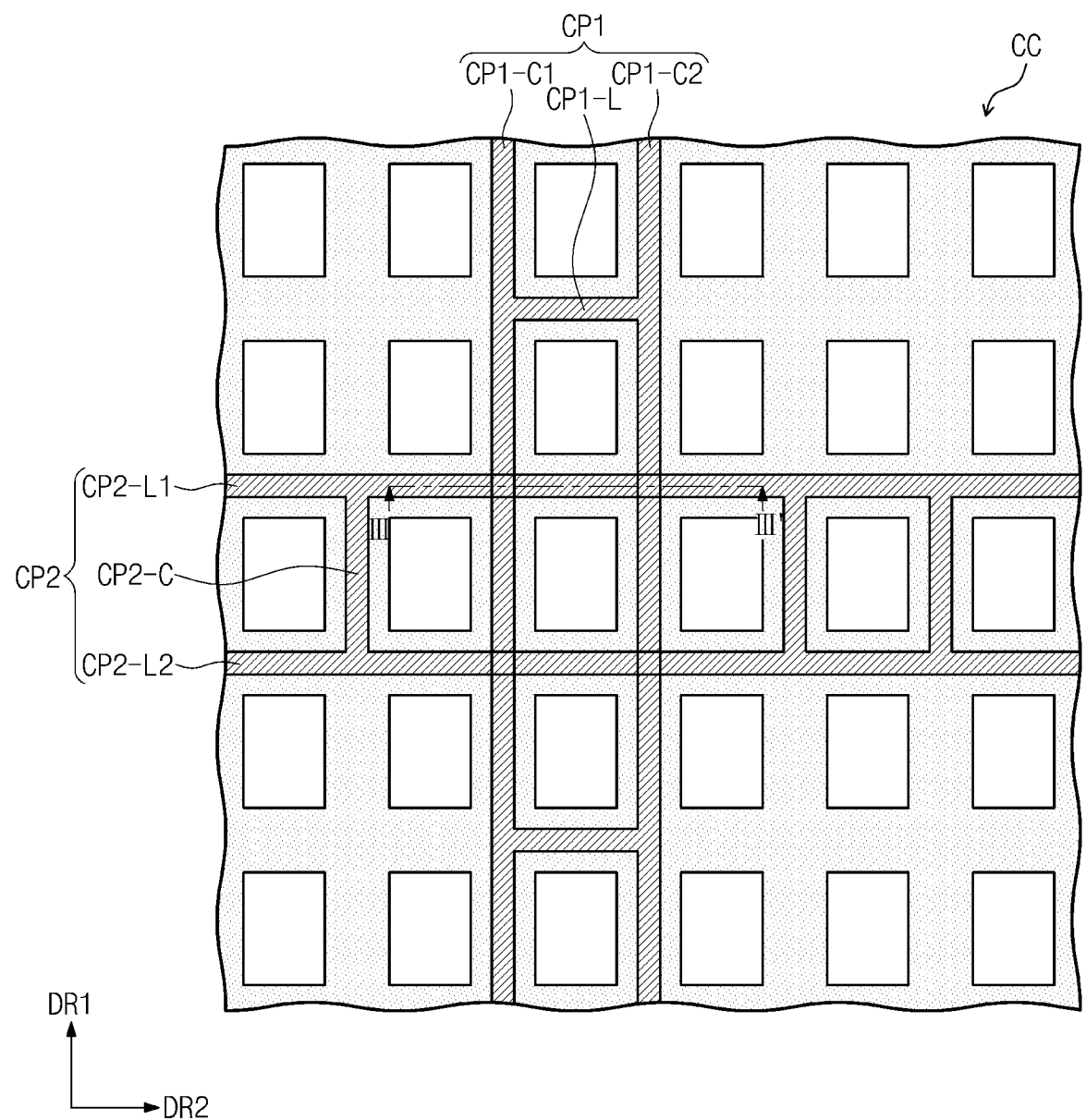
FIG. 12A is a partially enlarged view showing a portion "CC" of FIGS. 9A and 9B.
Figure 12B:
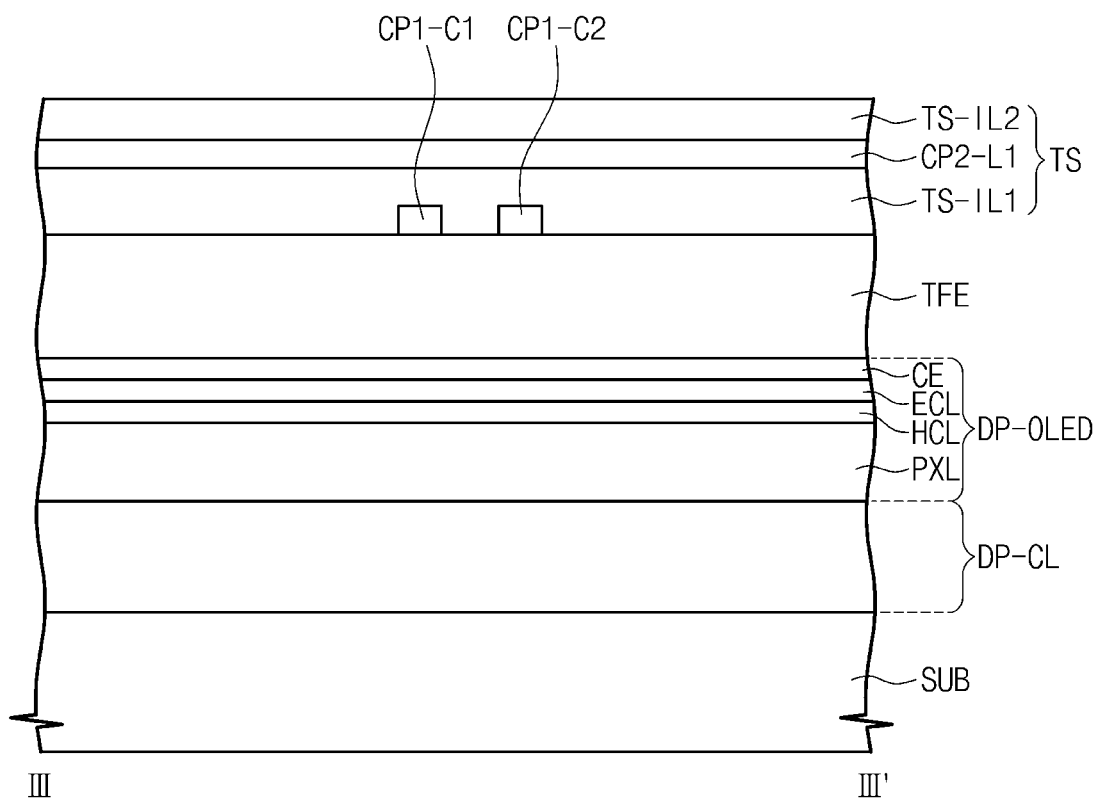
FIG. 12B is a cross-sectional view showing a portion of FIG. 12A along sectional line III to III'.

FIGS. 9A and 9B are plan views showing the conductive layers TS-CL1 and TS-CL2 of the touch screen TS according to exemplary embodiments of the present disclosure. FIG. 10A is a partially enlarged view showing a portion "AA" of FIG. 9A, FIG. 10B is a cross-sectional view showing a portion of FIG. 10A along sectional line I to I'. FIG. 11A is a partially enlarged view showing a portion "BB" of FIG. 9B. FIG. 11B is a cross-sectional view showing a portion of FIG. 11A along sectional line II to II'. FIG. 12A is a partially enlarged view showing a portion "CC" of FIGS. 9A and 9B. FIG. 12B is a cross-sectional view showing a portion of FIG. 12A along sectional line III to III'. The organic light emitting device layer DP-OLED is schematically shown in FIGS. 10B, 11B, and 12B.

In the present exemplary embodiment, a two-layer electrostatic capacitive touch screen will be described in detail. The two-layer electrostatic capacitive touch screen may obtain coordinate information of a position at which a touch event occurs by a self-capacitance mode or a mutual capacitance mode, but the driving method of the touch screen is not limited thereto. The first conductive patterns of FIG. 9A may correspond to the first conductive layer TS-CL1 of FIGS. 8A and 8B, and the second conductive patterns of FIG. 9B may correspond to the second conductive layer TS-CL2 of FIGS. 8A and 8B.

Referring to FIG. 9A, the first conductive patterns may include first touch electrodes TE1-1, TE1-2, and TE1-3 and first touch signal lines SL1-1, SL-2, and SL1-3. FIG. 9A shows an example of three first touch electrodes TE1-1, TE1-2, and TE1-3 connected to first touch signal lines SL1-1, SL-2, and SL1-3.

The first touch electrodes TE1-1, TE1-2, and TE1-3 may extend in the first direction DR1 and may be arranged in the second direction DR2. Each of the first touch electrodes TE1-1, TE1-2, and TE1-3 may have a mesh shape through which a plurality of touch openings may be defined. The mesh shape will be described in detail later.

Each of the first touch electrodes TE1-1, TE1-2, and TE1-3 may include a plurality of first sensing parts SP1 and a plurality of first connecting parts CP1. The first sensing parts SP1 may be arranged in the first direction DR1. Each of the first connecting parts CP1 may connect two first sensing parts SP1 adjacent to each other among the first sensing parts SP1.

The first touch signal lines SL1-1, SL1-2, and SL1-3 may have a mesh shape. The first touch signal lines SL1-1, SL1-2, and SL1-3 may have the same layer structure as that of the first touch electrodes TE1-1, TE1-2, and TE1-3.

Referring to FIG. 9B, the second conductive patterns may include second touch electrodes TE2-1, TE2-2, and TE2-3 and second touch signal lines SL2-1, SL2-2, and SL2-3. FIG. 9B shows an example of three second touch electrodes TE2-1, TE2-2, and TE2-3 connected to second touch signal lines SL2-1, SL2-2, and SL2-3.

The second touch electrodes TE2-1, TE2-2, and TE2-3 may be insulated from the first touch electrodes TE1-1, TE1-2, and TE1-3 while crossing the first touch electrodes TE1-1, TE1-2, and TE1-3. Each of the second touch electrodes TE2-1, TE2-2, and TE2-3 may have a mesh shape through which a plurality of touch openings may be defined.

Each of the second touch electrodes TE2-1, TE2-2, and TE2-3 may include a plurality of second sensing parts SP2 and a plurality of second connecting parts CP2. The second sensing parts SP2 may be arranged in the second direction DR2. Each of the second connecting parts CP2 may connect two second sensing parts SP2 adjacent to each other among the second sensing parts SP2.

The second touch signal lines SL2-1, SL2-2, and SL2-3 may have a mesh shape. The second touch signal lines SL2-1, SL2-2, and SL2-3 have the same layer structure as that of the second touch electrodes TE2-1, TE2-2, and TE2-3.

The first touch electrodes TE1-1, TE1-2, and TE1-3 may be capacitively coupled to the second touch electrodes TE2-1, TE2-2, and TE2-3. When sensing signals are applied to the first touch electrodes TE1-1, TE1-2, and TE1-3, capacitors may be formed between the first sensing parts SP1 and the second sensing parts SP2.

The connecting parts may correspond to portions at which the first touch electrodes TE1-1, TE1-2, and TE1-3 cross the second touch electrodes TE2-1, TE2-2, and TE2-3, and the sensing parts correspond to portions at which the first touch electrodes TE1-1, TE1-2, and TE1-3 may not overlap with the second touch electrodes TE2-1, TE2-2, and TE2-3. In the present exemplary embodiment, each of the first touch electrodes TE1-1, TE1-2, and TE1-3 and each of the second touch electrodes TE2-1, TE2-2, and TE2-3 have a bar shape with a predetermined width. However, the shapes of the first touch electrodes TE1-1, TE1-2, and TE1-3 and the second touch electrodes TE2-1, TE2-2, and TE2-3, which include the sensing part and the connecting part, are not limited thereto.

Referring to FIG. 10A, the first sensing part SP1 may be overlapped with the non-light emitting area NPXA. The first sensing part SP1 may include a plurality of vertical portions SP1-C extending in the first direction DR1 and a plurality of horizontal portions SP1-L extending in the second direction DR2. The first vertical portions SP1-C and the first horizontal portions SP1-L may be referred to as mesh lines each having a line width of a few micrometers.

The first vertical portions SP1-C may be connected to the first horizontal portions SP1-L to form a plurality of touch openings TS-OP. In other words, the first sensing part SP1 may have a mesh shape defined by the touch openings TS-OP. In the present exemplary embodiment, the touch openings TS-OP correspond to the light emitting areas PXA in a one-to-one correspondence, but they are not limited thereto. That is, one touch opening TS-OP may correspond to two or more light emitting areas PXA.

Referring to FIG. 10B, the first insulating layer TS-IL1 may be disposed on the base surface BS to cover the first sensing part SP1, i.e., the first horizontal portion SP1-L. Although not shown in figures, the first insulating layer TS-IL1 may cover the first connecting part CP1 and the first touch signal lines SL1-1, SL1-2, and SL1-3. In the present exemplary embodiment, the thin film encapsulation layer TFE may provide the base surface BS. The first insulating layer TS-IL1 may overlap with the non-light emitting area NPXA. A plurality of first insulating openings IL1-OP may be defined through the first insulating layer TS-IL1 to correspond to the light emitting areas PXA.

The light emitting areas PXA may have the same shape as that of the first insulating openings IL1-OP. In other words, the first insulating layer TS-IL1 may have the same shape as that of the non-light emitting area NPXA. That is, the first insulating layer TS-IL1 may have the same widths as those of the non-light emitting area NPXA in the first and second directions DR1 and DR2. However, the present inventive concept should not be limited thereto. That is, the light emitting areas PXA may have a shape different from that of the first insulating openings IL1-OP.

The second insulating layer TS-IL2 may be disposed on the first insulating layer TS-IL1. A plurality of second insulating openings IL2-OP may be defined through the second insulating layer TS-IL2 to correspond to the first insulating openings IL1-OP. The first insulating layer TS-IL1 including the first insulating openings IL1-OP defined therethrough may have the same shape as that of the second insulating layer TS-IL2 including the second insulating openings IL2-OP defined therethrough. The first and second insulating openings IL1-OP and IL2-OP which may correspond to each other may be substantially simultaneously formed through a single process after the first and second insulating layers TS-IL1 and TS-IL2 are sequentially stacked.

Referring to FIGS. 11A and 11B, the second sensing part SP2 may overlap with the non-light emitting area NPXA. The second sensing part SP2 may include a plurality of second vertical portions SP2-C extending in the first direction DR1 and a plurality of second horizontal portions SP2-L extending in the second direction DR2.

The second vertical portions SP2-C may be connected to the second horizontal portions SP2-L to form the touch openings TS-OP. In other words, the second sensing part SP2 may have a mesh shape. The second insulating layer TS-IL2 may be disposed on the first insulating layer TS-IL1 and cover the second sensing part SP2.

Referring to FIGS. 12A and 12B, the first connecting part CP1 may include third vertical portions CP1-C1 and CP1-C2 disposed on the thin film encapsulation layer TFE and third horizontal portions CP1-L connecting the third vertical portions CP1-C1 and CP1-C2. FIGS. 12A and 12B show two third vertical portions CP1-C1 and CP1-C2, but the number of the third vertical portions is not limited thereto.

The second connecting part CP2 may include fourth horizontal portions CP2-L1 and CP2-L2 disposed on the first insulating layer TS-IL1 and fourth vertical portions CP2-C connecting the fourth horizontal portions CP2-L1 and CP2-L2. The first and second connecting parts CP1 and CP2 may have a mesh shape.

As described above, since the first touch electrodes TE1-1, TE1-2, and TE1-3 and the second touch electrodes TE2-1, TE2-2, and TE2-3 have a mesh shape and the first and second insulating openings IL1-OP and IL2-OP are respectively defined through the first and second insulating layers TS-IL1 and TS-IL2, the flexibility of the flexible display device DD may be improved. As shown in FIGS. 1B and 2B, when the flexible display device DD is bent, a tensile-compressive stress applied to the first touch electrodes TE1-1, TE1-2, and TE1-3 and the second touch electrodes TE2-1, TE2-2, and TE2-3 may be reduced, and thus the first touch electrodes TE1-1, TE1-2, and TE1-3 and the second touch electrodes TE2-1, TE2-2, and TE2-3 may be prevented from cracking. In addition, since the first and second insulating openings IL1-OP and IL2-OP are defined, the tensile-compressive stress applied to the first touch electrodes TE1-1, TE1-2, and TE1-3 and the second touch electrodes TE2-1, TE2-2, and TE2-3 may be further reduced.

Figure 13A:
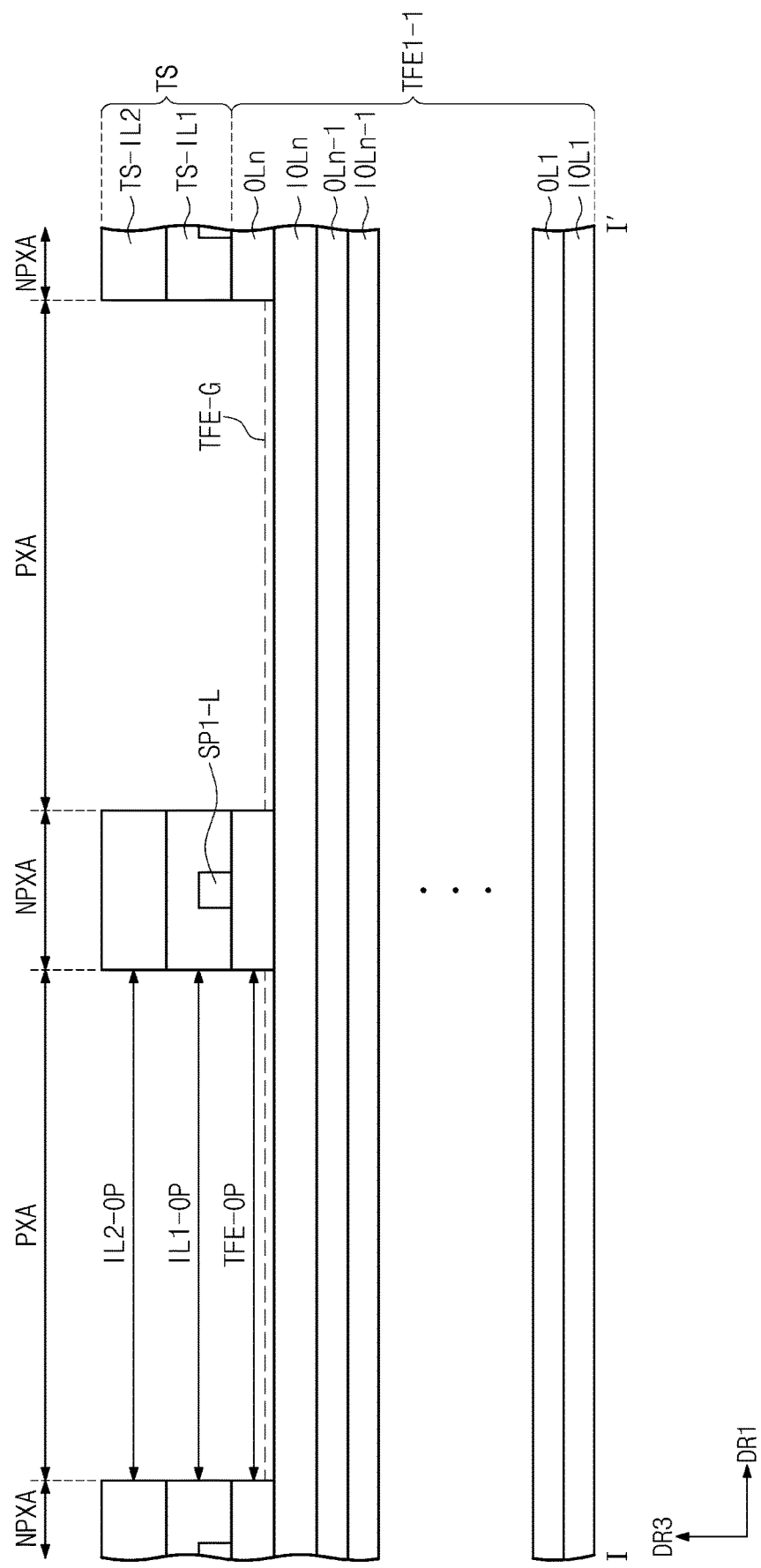
FIGS. 13A and 13B are cross-sectional views showing a display device according to an exemplary embodiment of the present disclosure along sectional line I-I' of FIG. 10A.
Figure 13B:
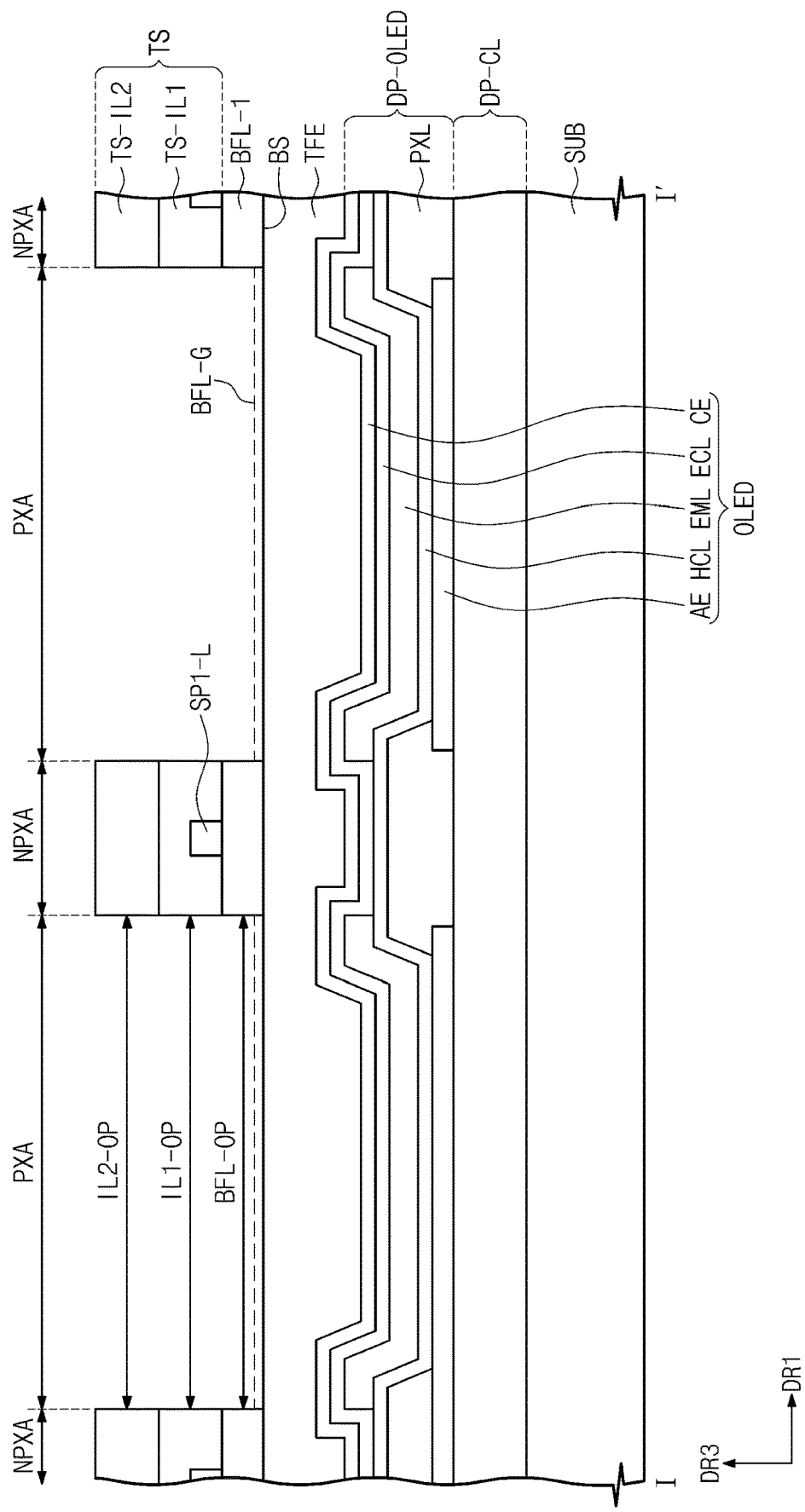

FIGS. 13A and 13B are cross-sectional views showing a display device according to an exemplary embodiment of the present disclosure. FIGS. 13A and 13B show the cross-section corresponding to sectional line I-I' of FIG. 10A. FIG. 13A does not show components disposed under a thin film encapsulation layer TFE1-1. FIG. 13B shows a display device further including a buffer layer BFL-1. In FIGS. 13A and 13B, detailed descriptions of the same components as those described above will be omitted.

Referring to FIG. 13A, the thin film encapsulation layer TFE1-1 may include "n" inorganic thin film layers IOL1 to IOLn including a first inorganic thin film layer IOL1. The thin film encapsulation layer TFE1-1 may include "n" organic thin film layers OL1 to OLn alternately arranged with the "n" inorganic thin film layers IOL1 to IOLn.

A thin film layer disposed at an upper position may include encapsulation openings TFE-OP or encapsulation grooves TFE-G defined therethrough to correspond to a plurality of first insulating openings IL1-OP. In the present exemplary embodiment, the thin film layer disposed at the upper position may be an n-th organic thin film layer OLn. The encapsulation grooves TFE-G are indicated by a dotted line in FIG. 13A and may be formed by removing portions of the upper thin film layer in the third direction DR3.

Referring to FIG. 13B, the buffer layer BFL-1 may include buffer openings BFL-OP or buffer grooves BFL-G defined therethrough to correspond to the first insulating openings IL1-OP. The buffer openings BFL-OP are indicated by a dotted line in FIG. 13B and may be formed by removing portions of the buffer layer BFL-1 in the third direction DR3.

Due to the encapsulation openings TFE-OP, the encapsulation grooves TFE-G, the buffer openings BFL-OP, and the buffer grooves BFL-G, the flexibility of the flexible display device may be improved.

Figure 14A:
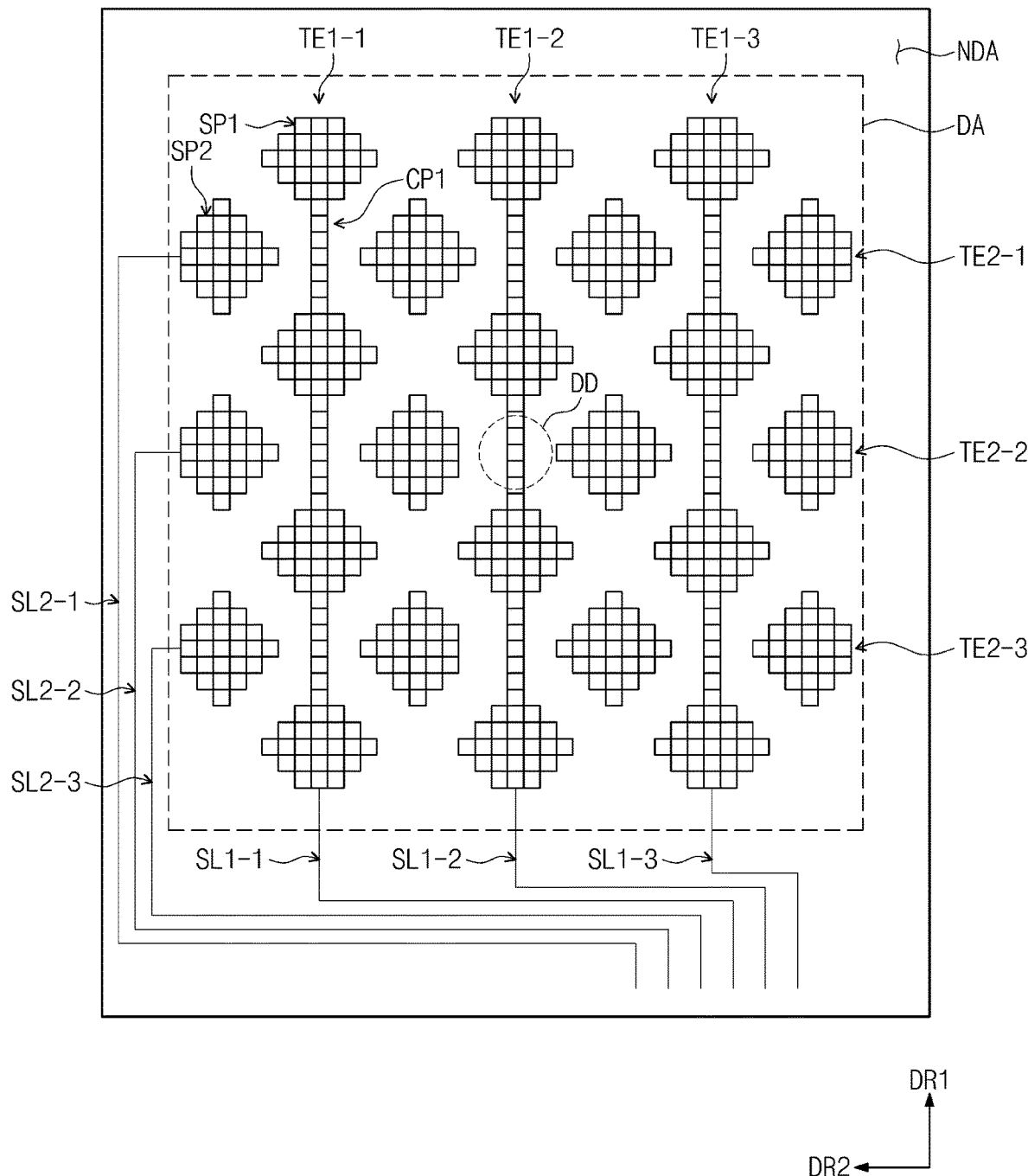
FIGS. 14A and 14B are plan views showing conductive layers of a touch screen according to an exemplary embodiment of the present disclosure.
Figure 14B:
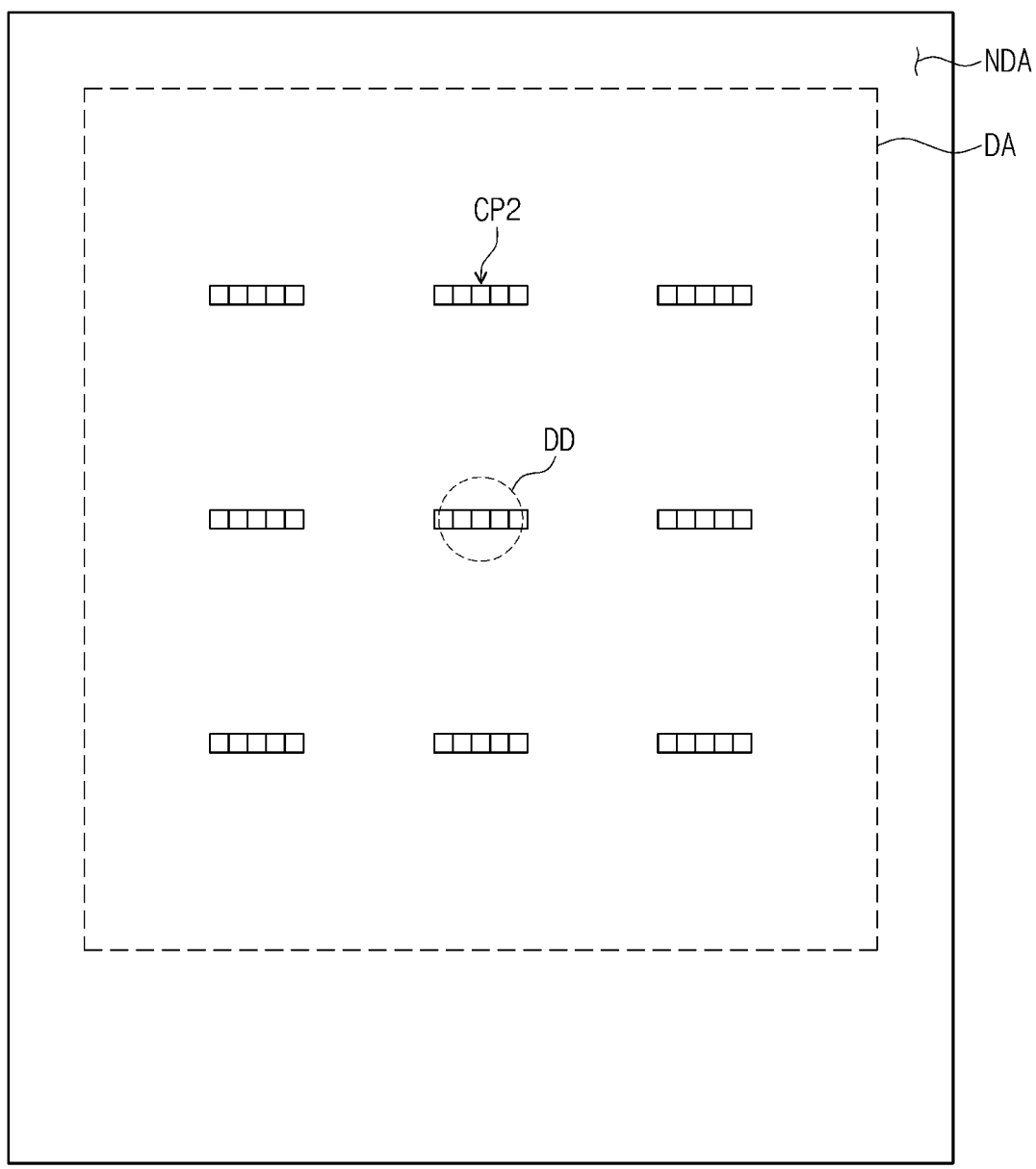
Figure 14D:
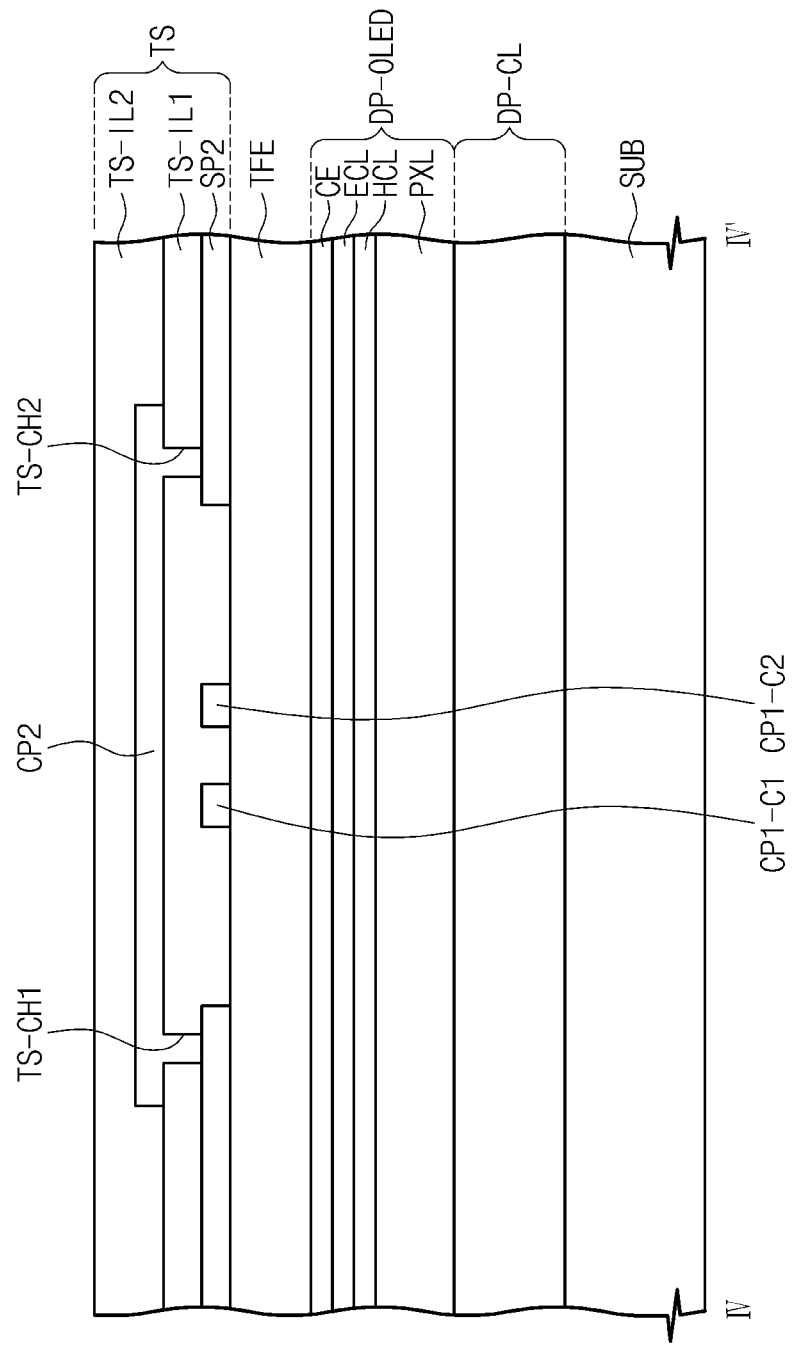
FIG. 14D is a cross-sectional view showing a portion of FIG. 14C along sectional line IV-IV'.
Figure 14E:
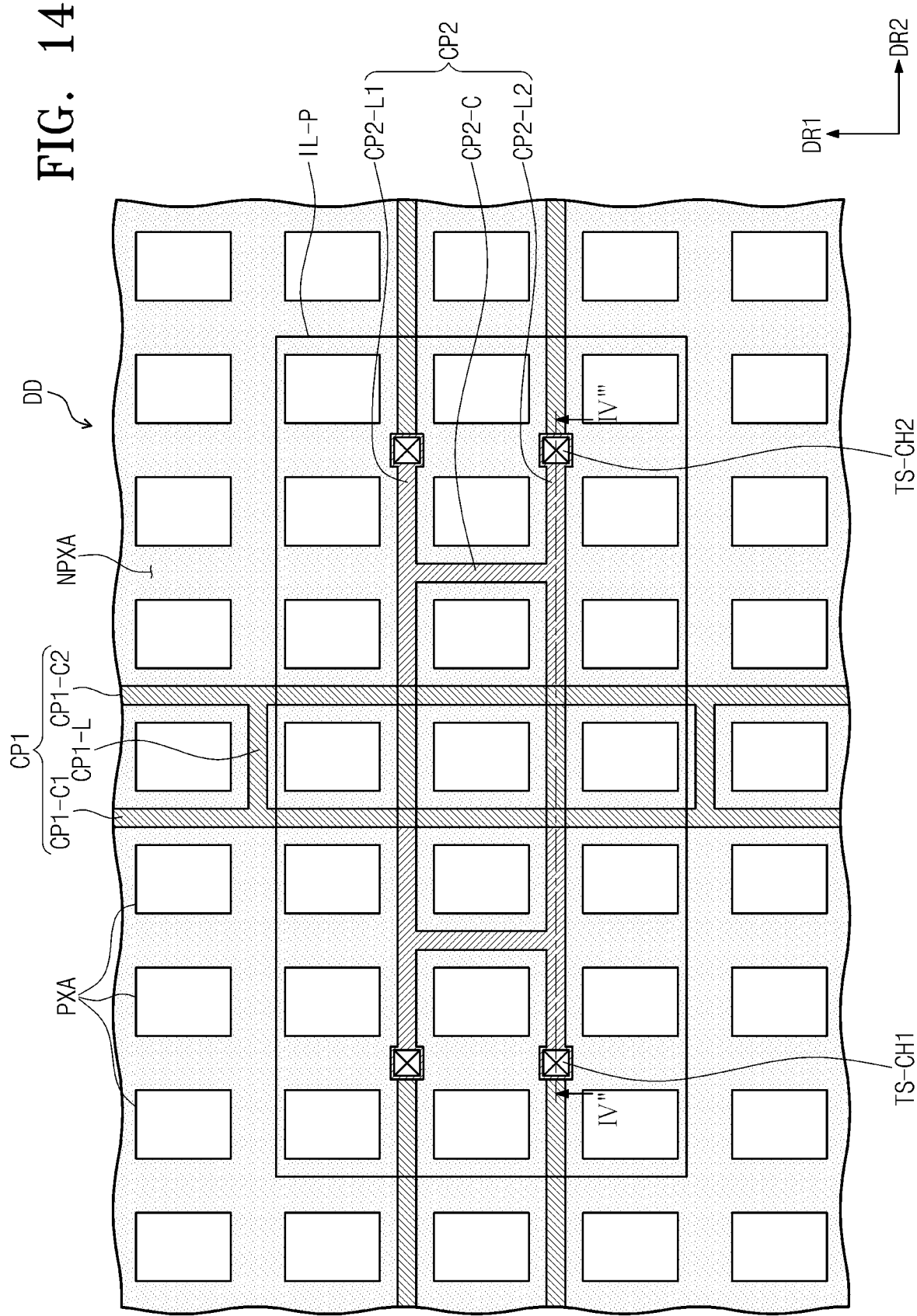
FIG. 14E is a partially enlarged view showing a portion "DD" of FIGS. 14A and 14B.
Figure 14F:
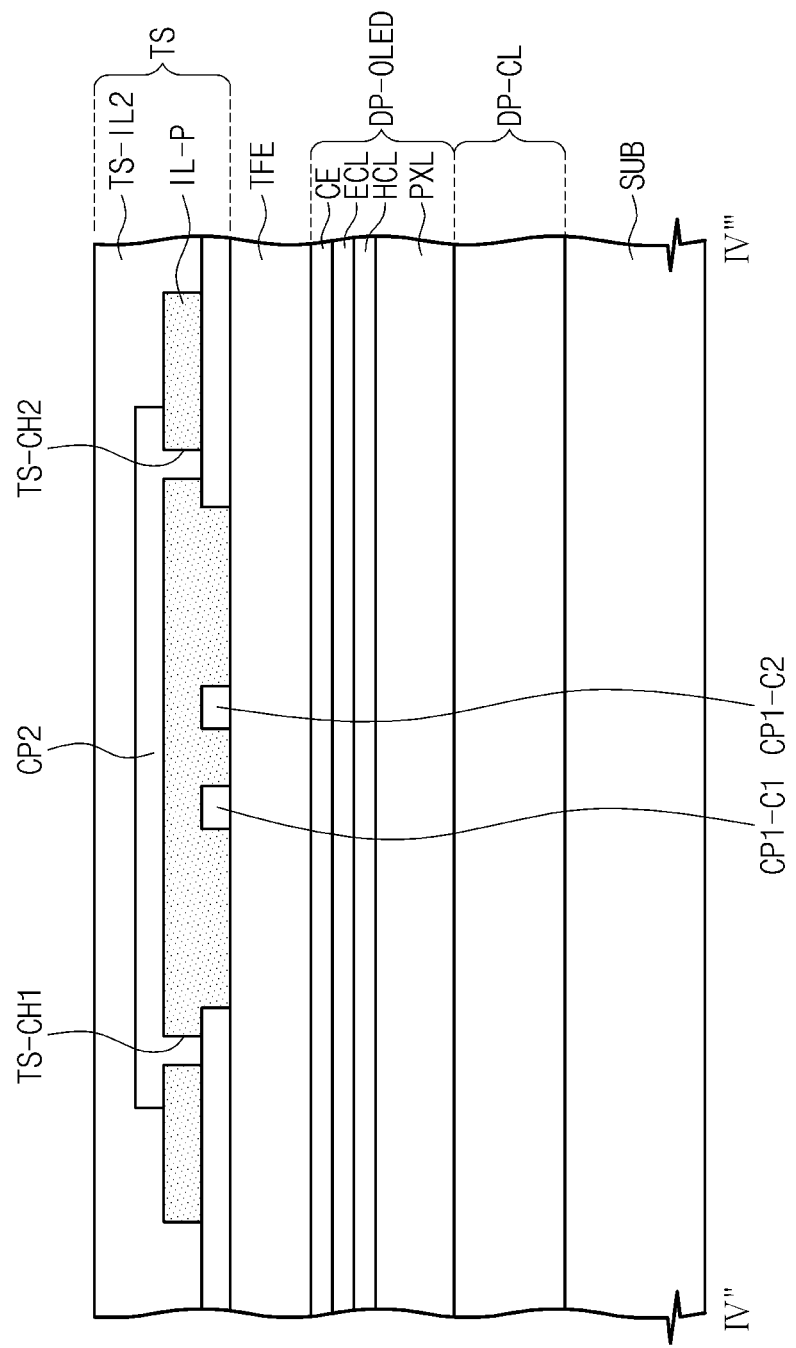
FIG. 14F is a cross-sectional view showing a portion of FIG. 14E along sectional line IV"-IV"'.

FIGS. 14A and 14B are plan views showing conductive layers of a touch screen TS according to an exemplary embodiment of the present disclosure. FIG. 14C is a partially enlarged view showing a portion "DD" of FIGS. 14A and 14B. FIG. 14D is a cross-sectional view showing a portion of FIG. 14C along sectional line IV-IV'. FIG. 14E is a partially enlarged view showing a portion "DD" of FIGS. 14A and 14B. FIG. 14F is a cross-sectional view showing a portion of FIG. 14E along sectional line IV'''-IV'''.

Hereinafter, in FIGS. 14A, 14B, 14C, 14D, 14E, and 14F, the same elements as those described above will be omitted.

In the present exemplary embodiment, one-layer electrostatic capacitive touch screen will be described in detail. The one-layer electrostatic capacitive touch screen may be operated in a self-capacitance mode to obtain the coordinate information, but the driving method of the touch screen is not limited thereto. In the present exemplary embodiment, the first conductive patterns of FIG. 14A correspond to the first conductive layer TS-CL1 of FIGS. 8A and 8B, and the second conductive patterns of FIG. 14B correspond to the second conductive layer TS-CL2 of FIGS. 8A and 8B, but it is not limited thereto. In another exemplary embodiment, the first conductive patterns of FIG. 14A correspond to the second conductive layer TS-CL2 of FIGS. 8A and 8B, and the second conductive patterns of FIG. 14B correspond to the first conductive layer TS-CL1 of FIGS. 8A and 8B.

Referring to FIG. 14A, the first conductive patterns may include first touch electrodes TE1-1, TE1-2, and TE1-3, first touch signal lines SL1-1, SL1-2, and SL1-3, second sensing parts SP2 of second touch electrodes TE2-1, TE2-2, and TE2-3, and second touch signal lines SL2-1, SL2-2, and SL2-3. Each of the first touch electrodes TE1-1, TE1-2, and TE1-3 may include a plurality of first sensing parts SP1 and a plurality of first connecting parts CP1.

Referring to FIG. 14B, the second conductive patterns may include a plurality of second connecting parts CP2 of the second touch electrodes TE2-1, TE2-2, and TE2-3. The second connecting parts CP2 may have a bridge function.

Referring to FIGS. 14C and 14D, the second connecting part CP2 may electrically connect two second sensing parts SP2 adjacent to each other in the second direction DR2 through first and second contact holes TS-CH1 and TS-CH2. The first and second contact holes TS-CH1 and TS-CH2 may be formed to penetrate through the first insulating layer TS-IL1.

Referring to FIGS. 14E and 14F, the first insulating layer TS-IL1 of FIG. 14E may include a plurality of insulating patterns IL-P. Different from the first insulating layer TS-IL1 disposed over the entire display area DA in the touch screen TS described with reference to FIGS. 10A, 10B, 11A, 11B, 12A, and 12B, the first insulating layer TS-IL1 according to the present exemplary embodiment is partially overlapped with the display area DA. The insulating patterns IL-P may insulate the first connecting parts CP1 and the second connecting parts CP2 from each other.

Figure 15A:
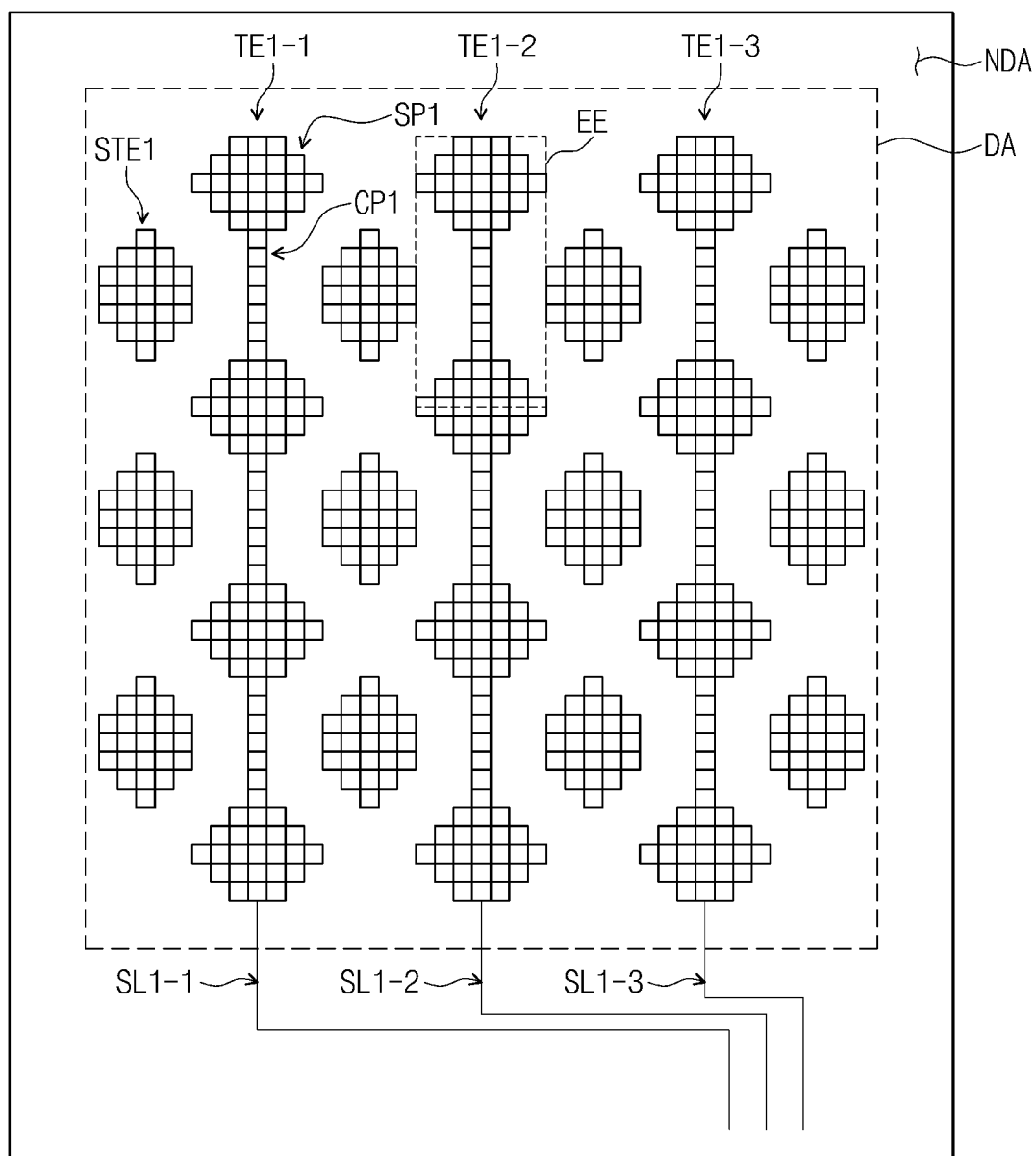
FIGS. 15A and 15B are plan views showing conductive layers of a touch screen according to an exemplary embodiment of the present disclosure.
Figure 15B:
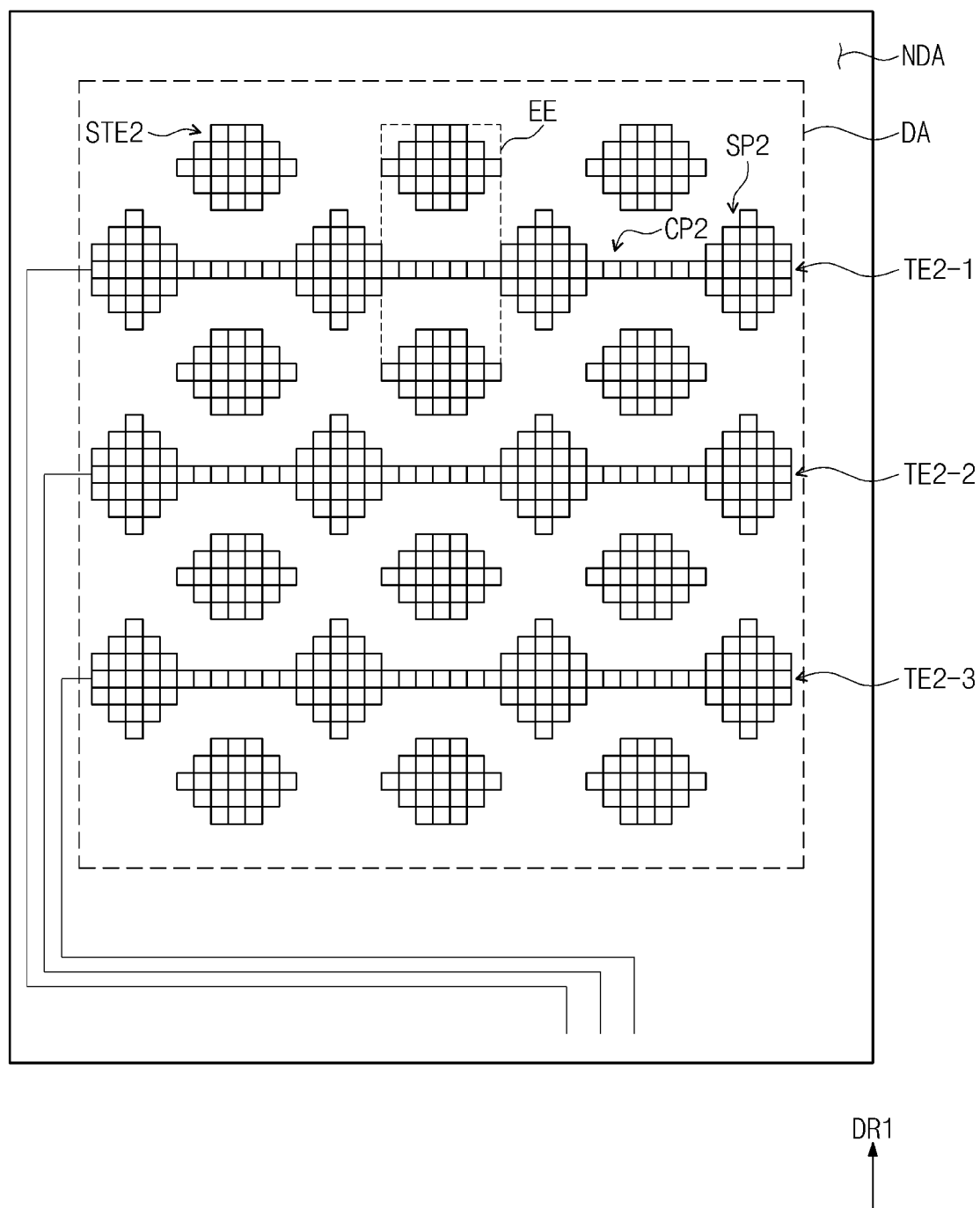
Figure 16A:
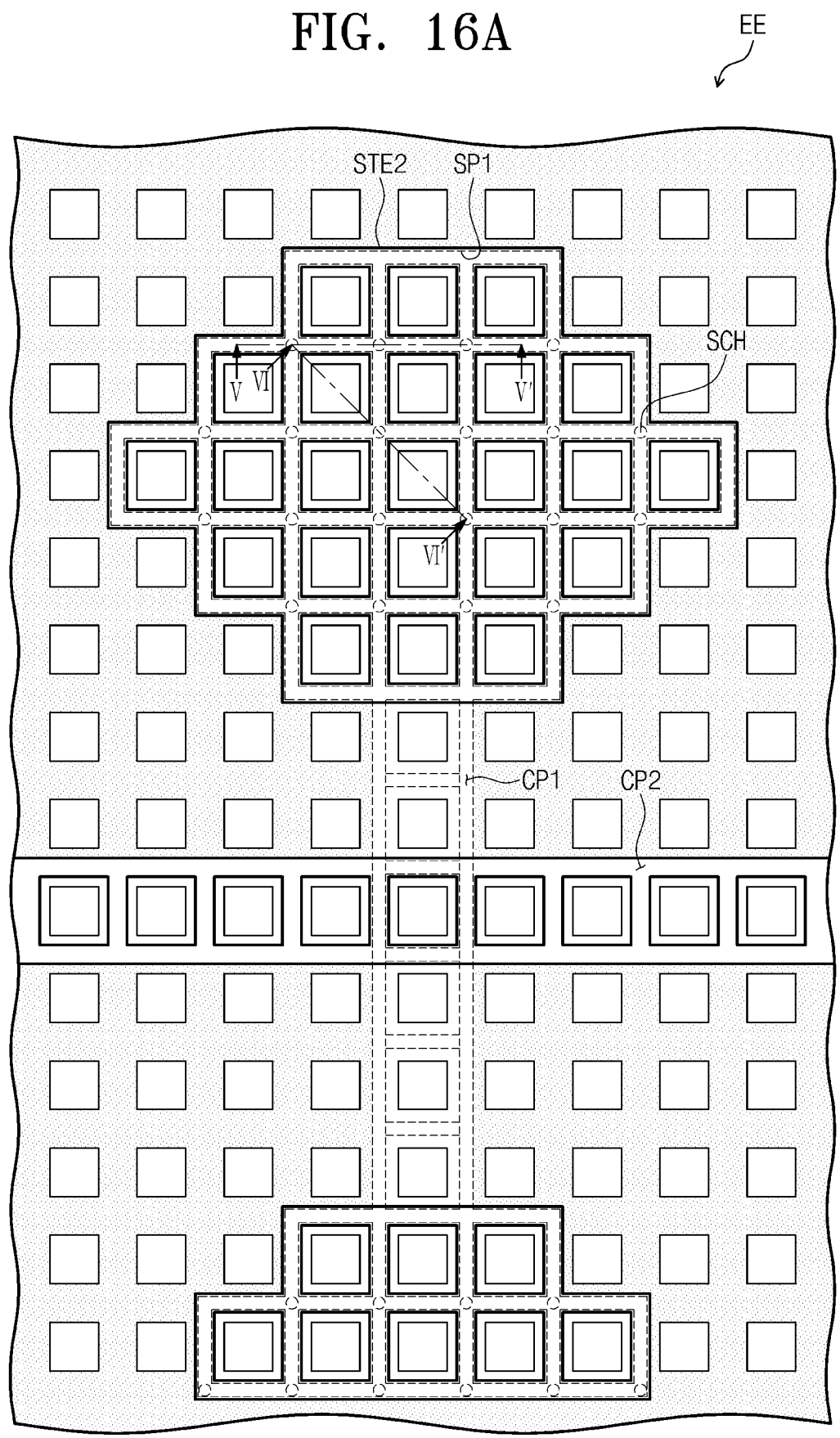
FIG. 16A is a partially enlarged view showing a portion "EE" of FIGS. 15A and 15B.
Figure 16B:
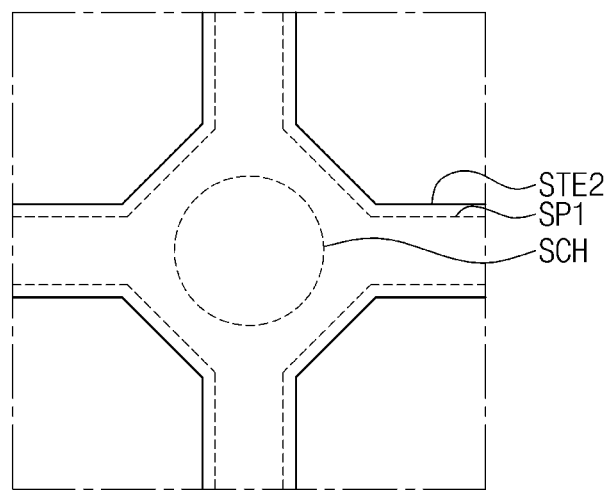
FIG. 16B is a partially enlarged view of FIG. 16A.
Figure 16C:
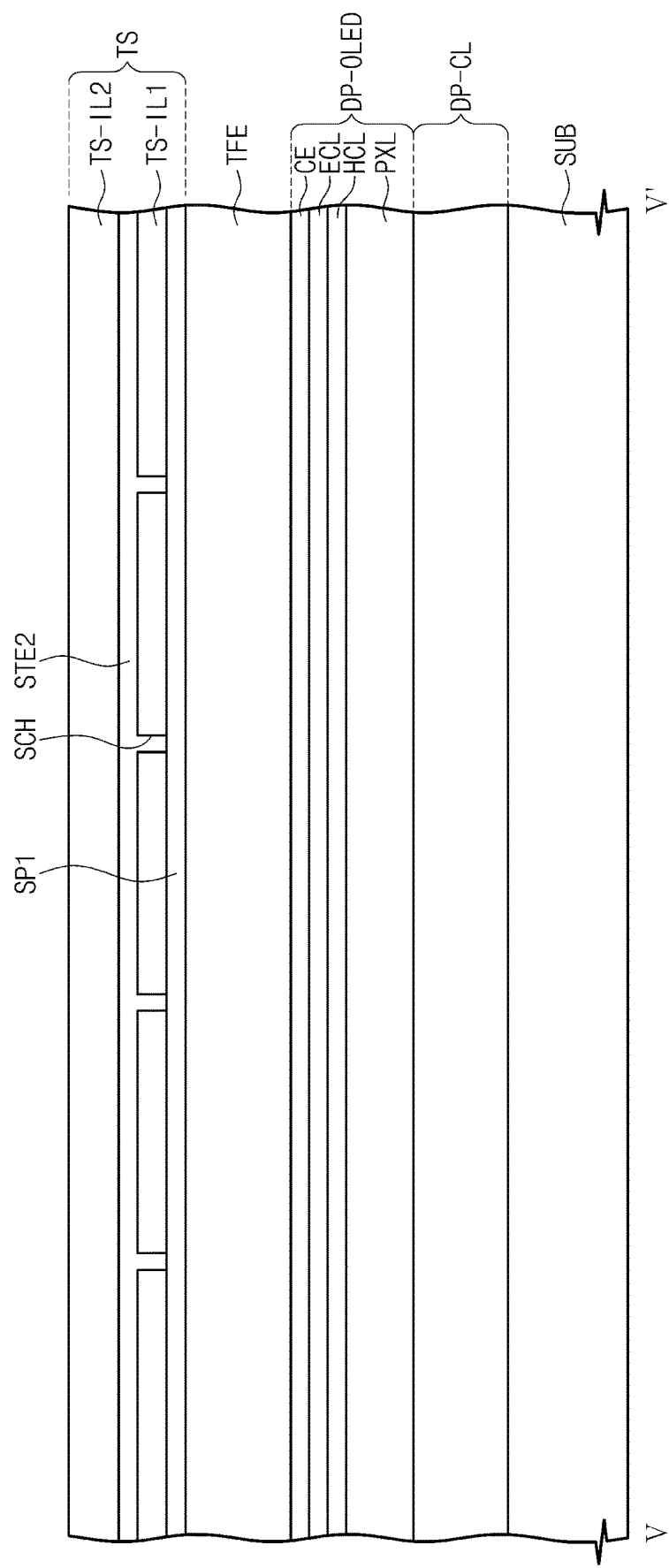
FIGS. 16C and 16D are cross-sectional views showing a portion of FIG. 16A along lines V to V' and VI to VI' of FIG. 16A, respectively.
Figure 16D:
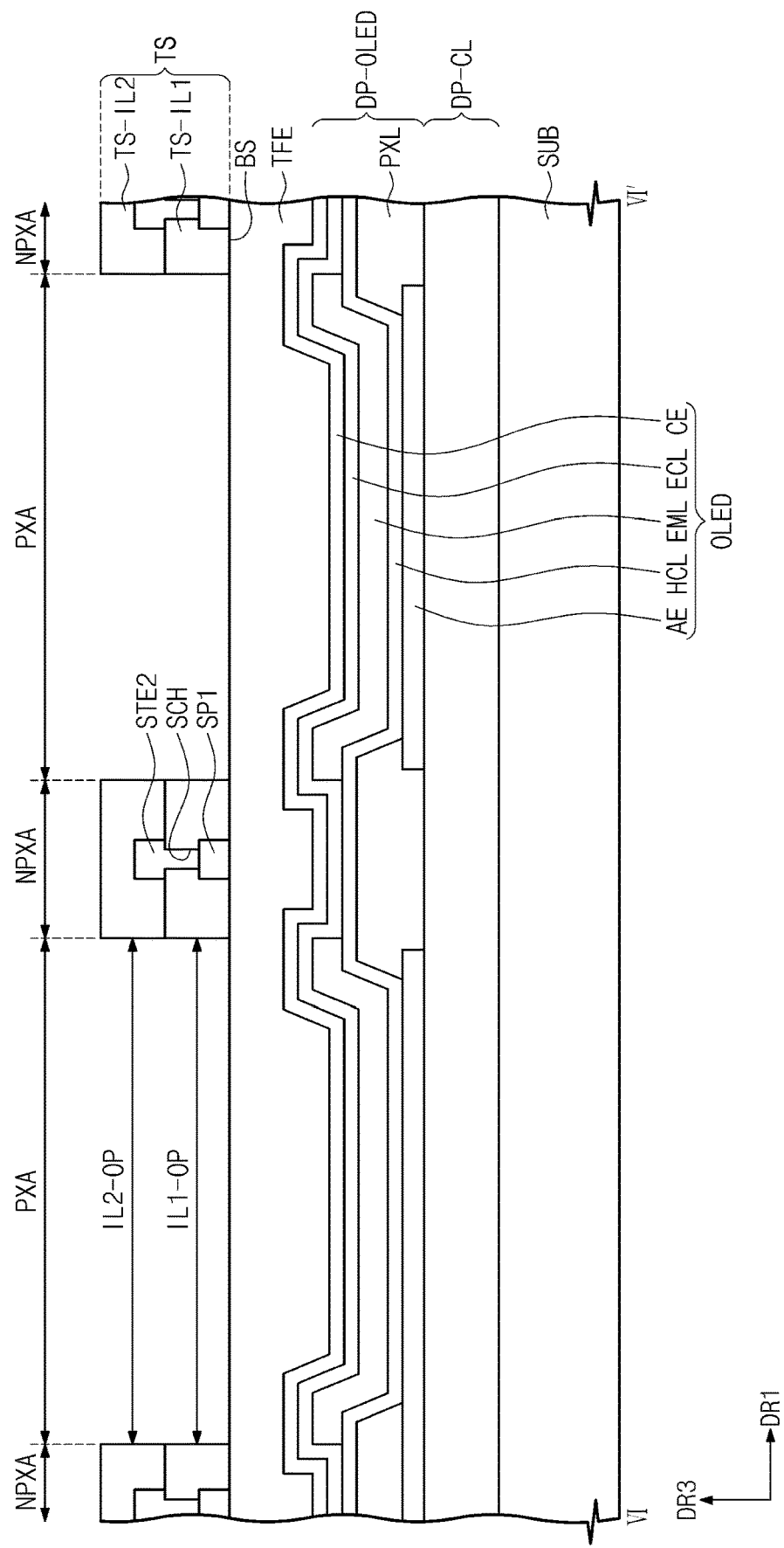

FIGS. 15A and 15B are plan views showing conductive layers of a touch screen TS according to an exemplary embodiment of the present disclosure. FIG. 16A is a partially enlarged view showing a portion "EE" of FIGS. 15A and 15B, FIG. 16B is a partially enlarged view of FIG. 16A. FIGS. 16C and 16D are cross-sectional views showing a portion of FIG. 16A along sectional lines V to V' and VI to VI' of FIG. 16A, respectively. In FIGS. 15A, 15B, and 16A, 16B, 16C, and 16D, detailed descriptions of the same elements as those above will be omitted.

Referring to FIGS. 15A and 15B, first conductive patterns may include first touch electrodes TE1-1, TE1-2, and TE1-3 and first auxiliary electrodes STE1. Each of the first touch electrodes TE1-1, TE1-2, and TE1-3 may include a plurality of first sensing parts SP1 and a plurality of first connecting parts CP1. Second conductive patterns may include second touch electrodes TE2-1, TE2-2, and TE2-3 and second auxiliary electrodes STE2. Each of the second touch electrodes TE2-1, TE2-2, and TE2-3 may include a plurality of second sensing parts SP2 and a plurality of second connecting parts CP2.

Each of the first auxiliary electrodes STE1 may overlap with a corresponding second sensing part of the second sensing parts SP2, and each of the second auxiliary electrodes STE2 may overlap with a corresponding first sensing part of the first sensing parts SP1. The first and second auxiliary electrodes STE1 and STE2 may have a mesh shape. Each of the first auxiliary electrodes STE1 may be electrically connected to the corresponding second sensing part, and each of the second auxiliary electrodes STE2 may be electrically connected to the corresponding first sensing part. Accordingly, a resistance of the first touch electrodes TE1-1, TE1-2, and TE1-3 and the second touch electrodes TE2-1, TE2-2, and TE2-3 may be reduced and a touch sensitivity of the first touch electrodes TE1-1, TE1-2, and TE1-3 and the second touch electrodes TE2-1, TE2-2, and TE2-3 may be improved.

The first touch electrode may be defined by a combination of the first sensing parts SP1, a plurality of first connecting parts CP1, and the second auxiliary electrodes STE2. The first sensing parts SP1 may correspond to a lower sensing part of the first touch electrode, the first connecting parts CP1 may correspond to lower connecting parts, and the second auxiliary electrodes STE2 may correspond to an upper sensing part. Similarly, the second touch electrode may be defined by a combination of the second sensing parts SP2, a plurality of second connecting parts CP2, and the first auxiliary electrodes STE1.

FIGS. 16A and 16B show a connection relation between the second auxiliary electrode STE2 and the first sensing part SP1. The first sensing part SP1 is indicated by a dotted line, and the second auxiliary electrode STE2 is indicated by a solid line. In FIGS. 16A and 16B, a line width of the second auxiliary electrode STE2 may be greater than a line width of the first sensing part SP1, but it is not limited thereto. The second auxiliary electrode STE2 and the first sensing part SP1 may have the same line width. The second auxiliary electrode STE2 may overlap with the first sensing part SP1 and not overlap with the first connecting part CP1.

Referring to FIGS. 16C and 16D, the second auxiliary electrode STE2 may be connected to the first sensing part SP1 through a plurality of sub-contact holes SCH. In the present exemplary embodiment, the thin film encapsulation layer TFE provides the flat base surface BS, but another layer (e.g., a buffer layer) may provide the base surface BS according to another embodiment.

As described above, since the touch electrodes have the mesh shape and the insulating layer making contact with the touch electrodes may include the openings defined therethrough, the flexibility of the display device may be improved. When the flexible display device is bent, the tensile stress and the compressive stress applied to the touch electrodes may be reduced, and thus the touch electrodes may be prevented from being cracked.

FIGS. 17A, 17B, 17C, 17D, and 17E are cross-sectional views showing a display device according to an exemplary embodiment of the present disclosure along sectional line I to I' of FIG. 10A. FIG. 18 is a cross-sectional view showing a portion of a display device according to an exemplary embodiment of the present disclosure along sectional line II to II' of FIG. 11A.

FIGS. 17A, 17B, 17C, 17D, and 17E are cross-sectional views taken along a line I-I' of FIG. 10A to show a display device according to an exemplary embodiment of the present disclosure, and FIG. 18 is cross-sectional view taken along a sectional line II-II' of FIG. 11A to show a display device according to an exemplary embodiment of the present disclosure. In FIGS. 17A, 17B, 17C, 17D, 17E and 18, detailed descriptions of the same elements as those described above will be omitted.

In the present exemplary embodiment, the touch screen TS reduces a reflection of an external light. This is because the touch screen TS may include color filters CF as described later. The color filters CF may replace an optical film (e.g., a polarizing film) or a λ/4 wavelength film used to prevent the external light from being reflected.

Figure 17A:
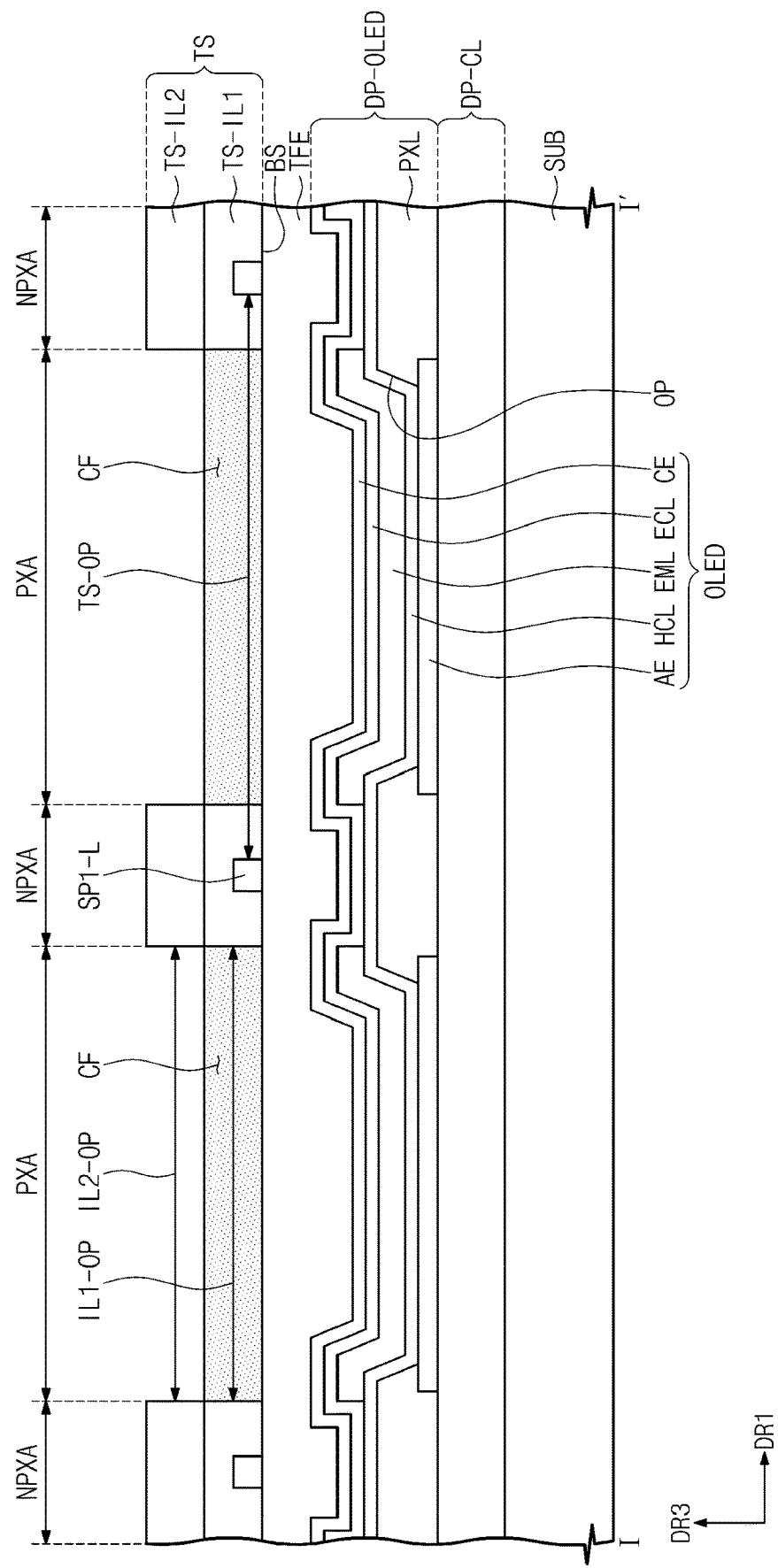
FIGS. 17A, 17B, 17C, 17D, and 17E are cross-sectional views showing a display device according to an exemplary embodiment of the present disclosure along sectional line I to I' of FIG. 10A.
Figure 18:
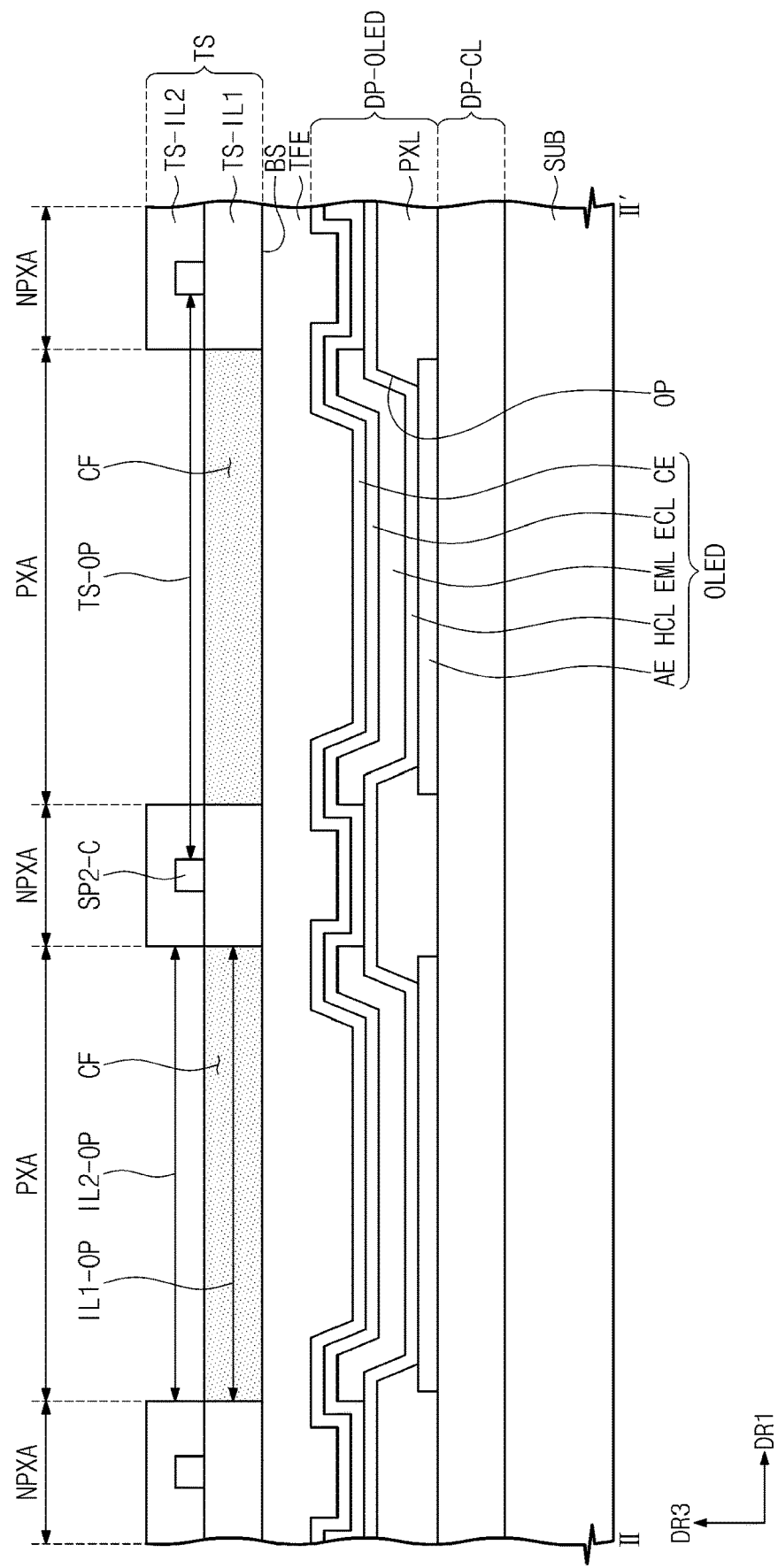
FIG. 18 is a cross-sectional view showing a portion of a display device according to an exemplary embodiment of the present disclosure along sectional line II to II' of FIG. 11A.

Referring to FIG. 17A, the color filters CF may be disposed inside the first insulating openings IL1-OP. The color filters CF may be an organic pattern formed by pigment or dye. The color filters CF may include a plurality of color filter groups. The color filters CF may include red color filters, green color filters, and blue color filters. The color filters CF may further include a gray color filter.

The colors of the color filters CF may be different in each of the first insulating openings IL1-OP in consideration of the colors of the lights generated by the organic light emitting devices OLED. For example, the red color filters are disposed to overlap with the organic light emitting devices OLED emitting a red light, the green color filters are disposed to overlap with the organic light emitting devices OLED emitting a green light, and the blue color filters are disposed to overlap with the organic light emitting devices OLED emitting a blue light.

The color filters CF may allow transmission of the light generated by the organic light emitting devices OLED and reduce the reflectance of the external light. In addition, an amount of the external light may be reduced to about ⅓ while passing through the color filters CF. A portion of the light may become extinct while passing through the color filters CF, and the light maybe partially reflected by the organic light emitting device layer DP-OLED and the thin film encapsulation layer TFE. The reflected light may be incident to the color filters CF. A brightness of the reflected light may be reduced after the light passes through the color filters CF. Consequently, only a portion of the external light may be reflected by the display device.

The first insulating opening IL1-OP and a second insulating opening IL2-OP corresponding to the first insulating opening IL-OP may be substantially simultaneously formed through a single process performed on the first insulating layer TS-IL1 and the second insulating layer TS-IL2 after the first insulating layer TS-IL1 and the second insulating layer TS-IL2 are sequentially stacked. The color filters CF may be formed after the first insulating layer TS-IL1 and the second insulating layer TS-IL2 are formed. The color filters CF may be formed by a printing method, e.g., an inkjet printing method, or a photolithography method.

Figure 17B:
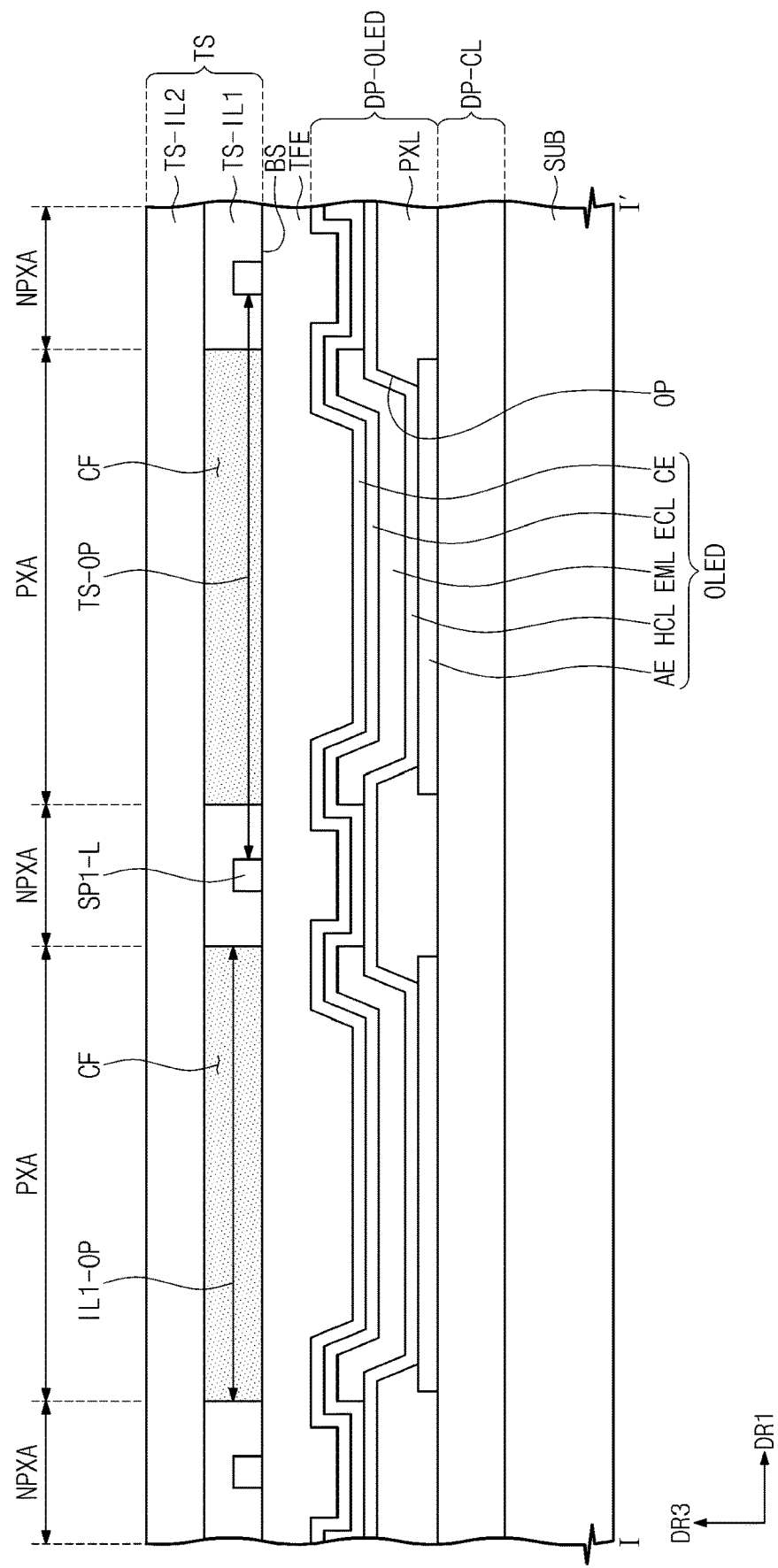

Referring to FIG. 17B, the second insulating layer TS-IL2 may be disposed on the first insulating layer TS-IL1. Different from the structure shown in FIG. 17A, the second insulating openings IL2-OP may not be defined in the second insulating layer TS-IL2. The second insulating layer TS-IL2 may overlap with the color filters CF.

Figure 17C:
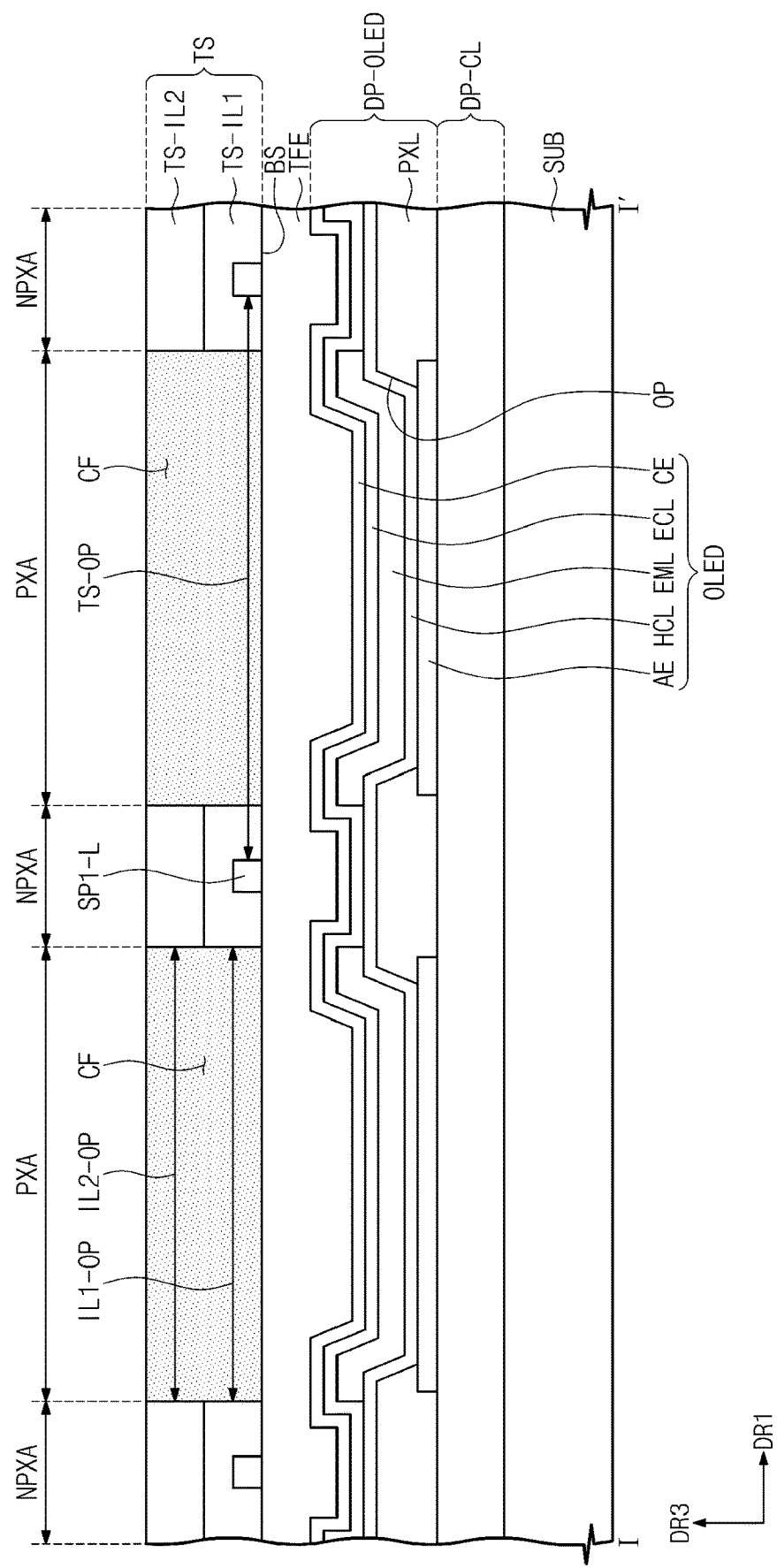

Referring to FIG. 17C, the color filter CF may be formed in the first insulating opening IL1-OP and the second insulating opening IL2-OP. Since the first and second insulating openings IL1-OP and IL2-OP may be substantially simultaneously formed, the first and second insulating openings IL1-OP and IL2-OP may be aligned with each other. The color filter CF may have a shape extending from the inside of the first insulating opening IL1-OP to the inside of the second insulating opening IL2-OP. The color filter CF may have a thickness that is the same as a sum of a thickness of the first insulating layer TS-IL1 and a thickness of the second insulating layer TS-IL2.

Figure 17D:
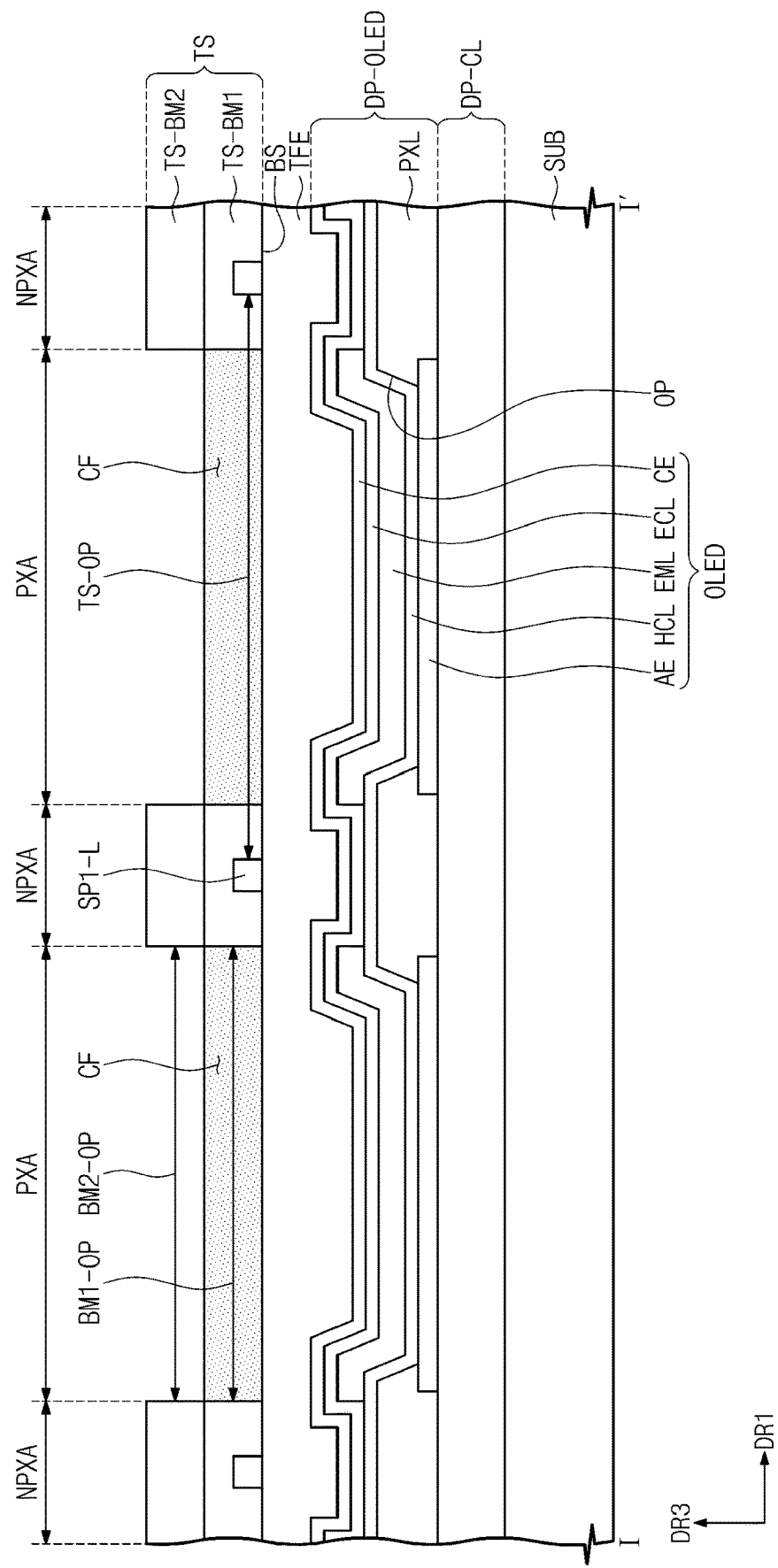

Referring to FIG. 17D, each of a first insulating layer TS-BM1 and a second insulating layer TS-BM2 may be, but not limited to, a black matrix. The black matrix may include an organic material having high light-absorbance. To this end, the black matrix may include a black pigment or a black dye.

Figure 17E:
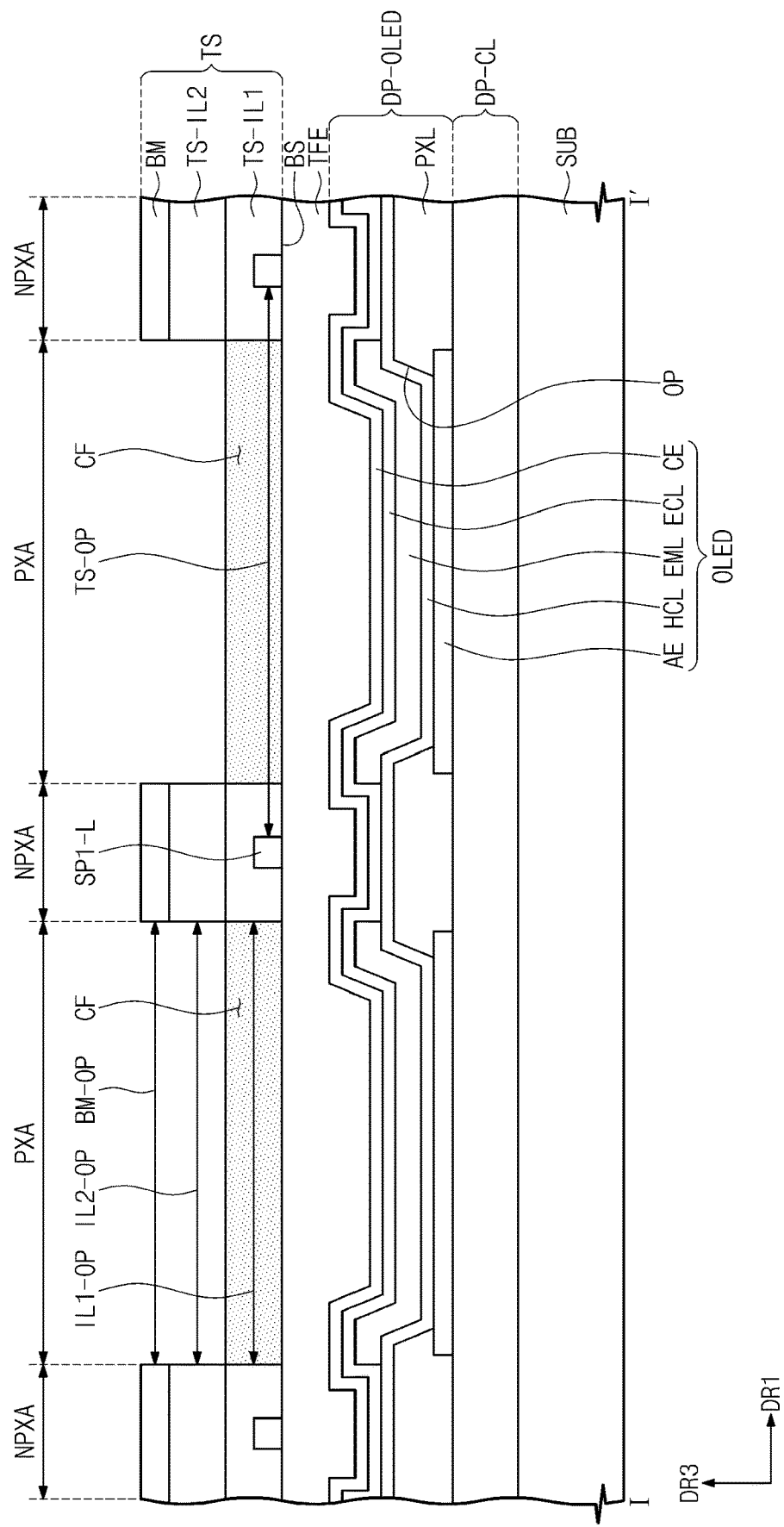

Referring to FIG. 17E, a black matrix layer BM is disposed on the second insulating layer TS-IL2. The black matrix layer BM may include the organic material having the high light-absorbance. The black matrix layer BM may include a plurality of transmitting openings BM-OP defined therethrough to correspond to the light emitting areas PXA. In the present exemplary embodiment, the transmitting openings BM-OP may further cover an inner sidewall of each of the first insulating opening IL-OP1 and the second insulating opening IL2-OP.

Referring to FIG. 18, the second sensing part SP2 may overlap with the non-light emitting area NPXA. FIG. 18 shows the cross-sectional view of the second sensing part SP2 corresponding to that shown in FIG. 17A. In the present exemplary embodiment, although the cross-sectional views of the second sensing part SP2 corresponding to those shown in FIGS. 17B, 17C, 17D, and 17E are not shown, the cross-sectional views of the second sensing part SP2 are substantially the same as the cross-sectional views shown in FIGS. 17B, 17C, 17D, and 17E except for the position of the first sensing part SP1.

Figure 19A:
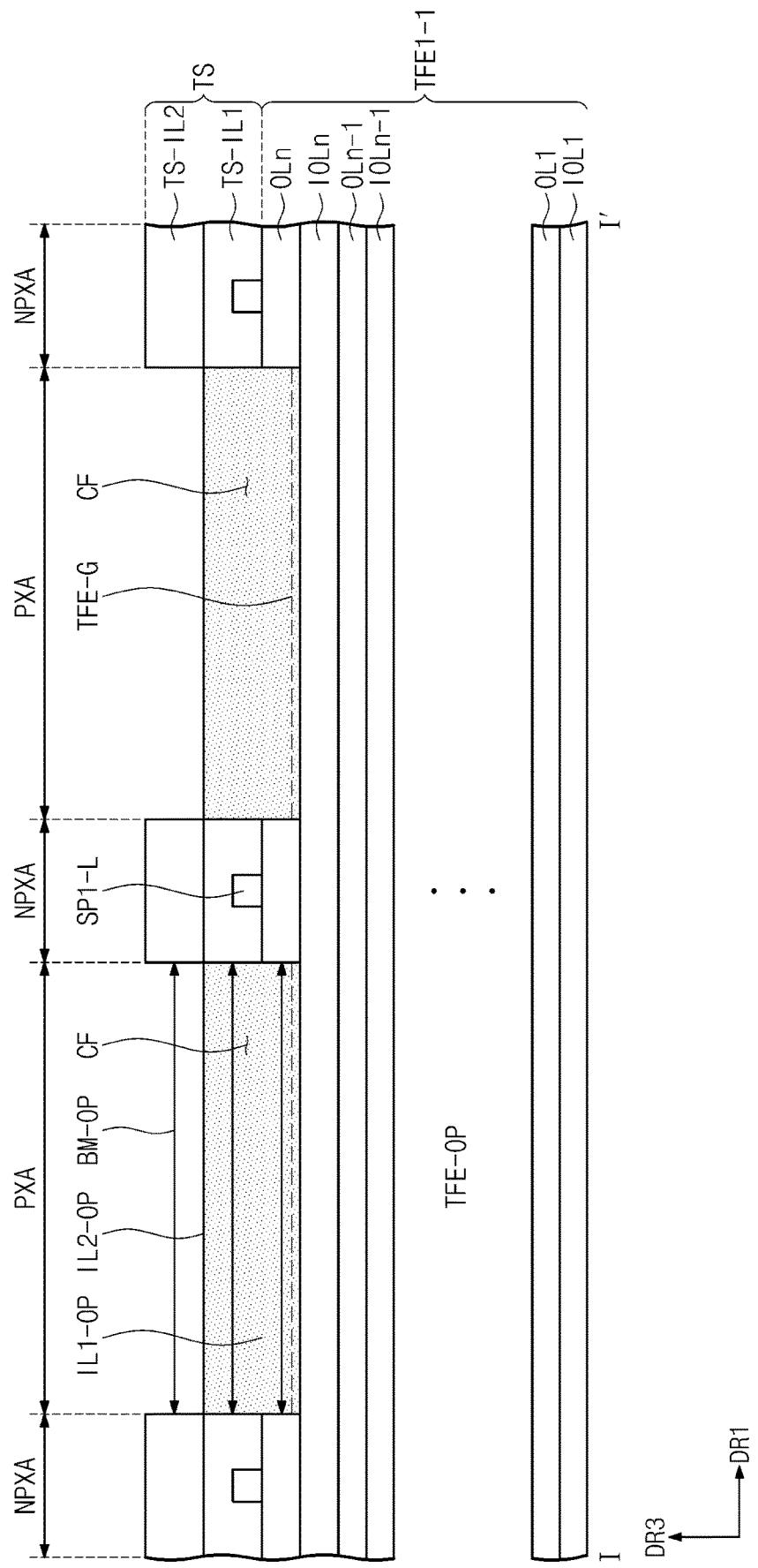
FIGS. 19A and 19B are cross-sectional views showing a portion of a display device according to an exemplary embodiment of the present disclosure along sectional line I-I' of FIG. 10A.
Figure 19B:
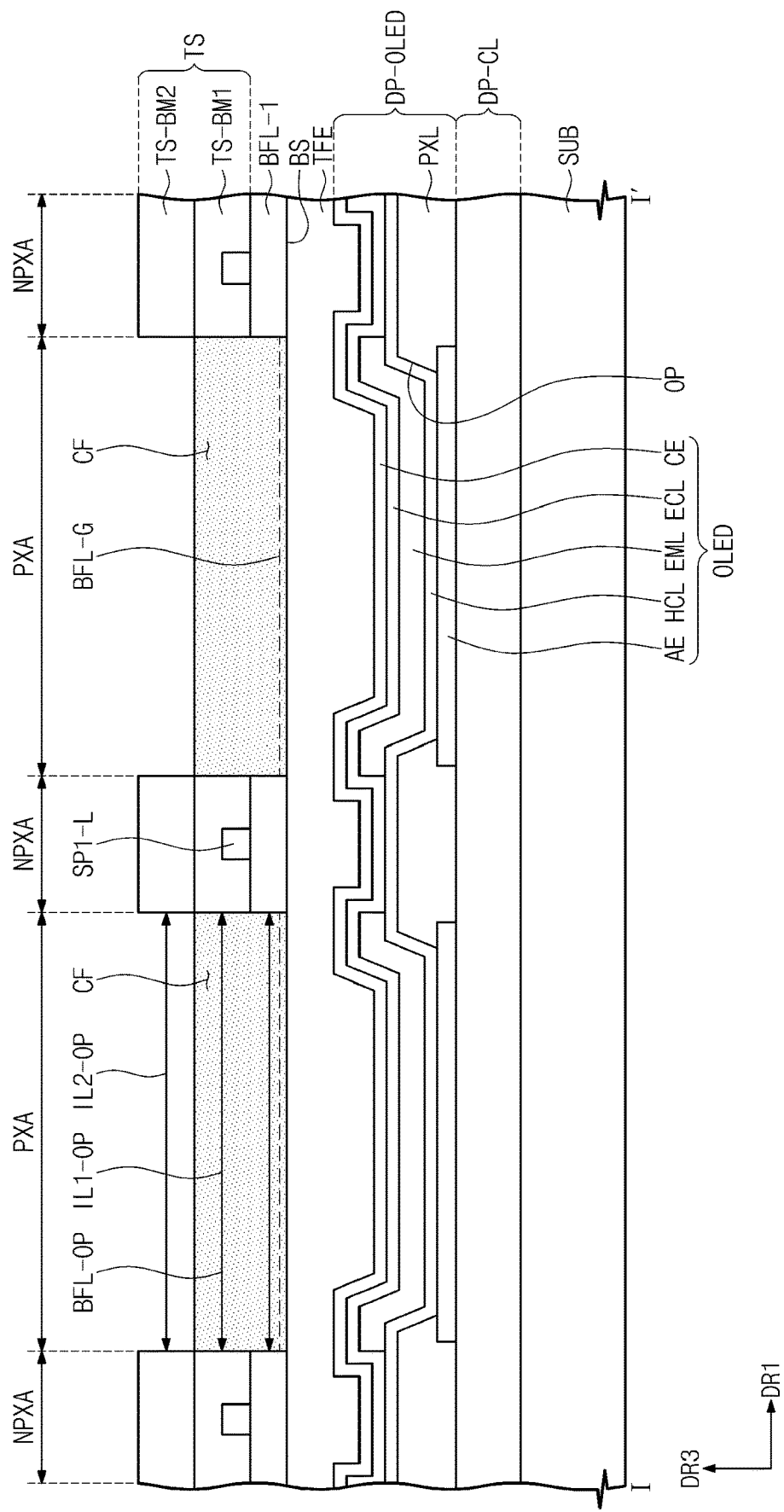

FIGS. 19A and 19B are cross-sectional views showing a portion of a display device according to an exemplary embodiment of the present disclosure along sectional line I-I' of FIG. 10A. FIGS. 19A and 19B correspond to FIGS. 13A and 13B, respectively.

Referring to FIG. 19A, a color filter CF may be disposed inside the encapsulation openings TFE-OP or the encapsulation grooves TFE-G. The color filter CF may be disposed inside the first insulating opening IL1-OP and inside the encapsulation openings TFE-OP or the encapsulation grooves TFE-G. The color filter CF may have a shape extending from the inside of the first insulating opening IL1-OP to the inside of the encapsulation openings TFE-OP or the inside of the encapsulation grooves TFE-G.

Referring to FIG. 19B, the color filter CF may be disposed inside the buffer openings BFL-OP or inside the buffer grooves BFL-G. The color filter CF may be disposed inside the first insulating opening IL1-OP and inside the buffer openings BFL-OP or the buffer grooves BFL-G. The color filter CF may have a shape extending from the inside of the first insulating opening IL1-OP to the inside of the buffer openings BFL-OP or the inside of the buffer grooves BFL-G.

Although not shown in figures, the second insulating layer TS-IL2 and the color filter CF shown in FIGS. 19A and 19B may be changed to the second insulating layer TL-IL2 and the color filter CF shown in FIGS. 17B, 17C, 17D, and 17E.

Figure 20:
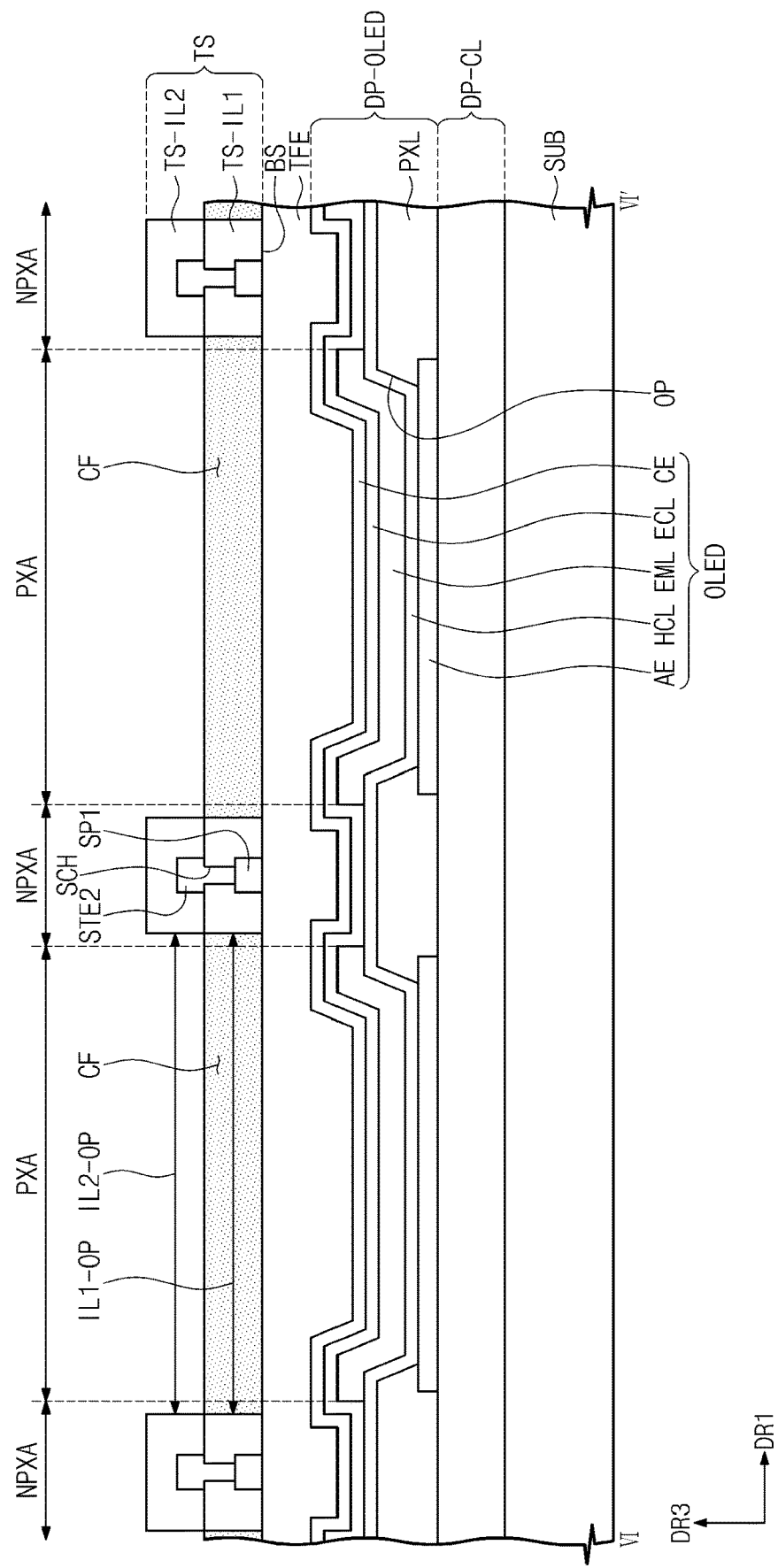
FIG. 20 is a cross-sectional view showing a portion of a display device according to an exemplary embodiment of the present disclosure along sectional line VI-VI' of FIG. 16A.

FIG. 20 is a cross-sectional view showing a portion of a display device according to an exemplary embodiment of the present disclosure along line VI-VI' of FIG. 16A. FIG. 20 may correspond to FIG. 16D. A second auxiliary electrode STE2 may be connected to a first sensing part SP1 through a plurality of sub-contact holes SCH. Although not shown separately, a second insulating layer TS-IL2 and a color filter CF shown in FIG. 20 may be changed to the second insulating layer TL-IL2 and the color filter CF shown in FIGS. 17B, 17C, 17D, and 17E.

Although not shown separately, the display device according to the present exemplary embodiment may include one-layer electrostatic capacitive type touch screen as described with reference to FIGS. 14A, 14B, 14C, and 14D. The one-layer electrostatic capacitive type touch screen TS may include color filters CF as described with reference to FIGS. 17A, 17C, 17D, 17E, 18, 19A, 19B, and 20.

As described above, since the color filters may be disposed in the openings defined through the insulating layers of the touch screen, the display device may become slimmer. The color filters filter the external light, and thus the reflectance of the external light may be reduced.

Figure 21A:
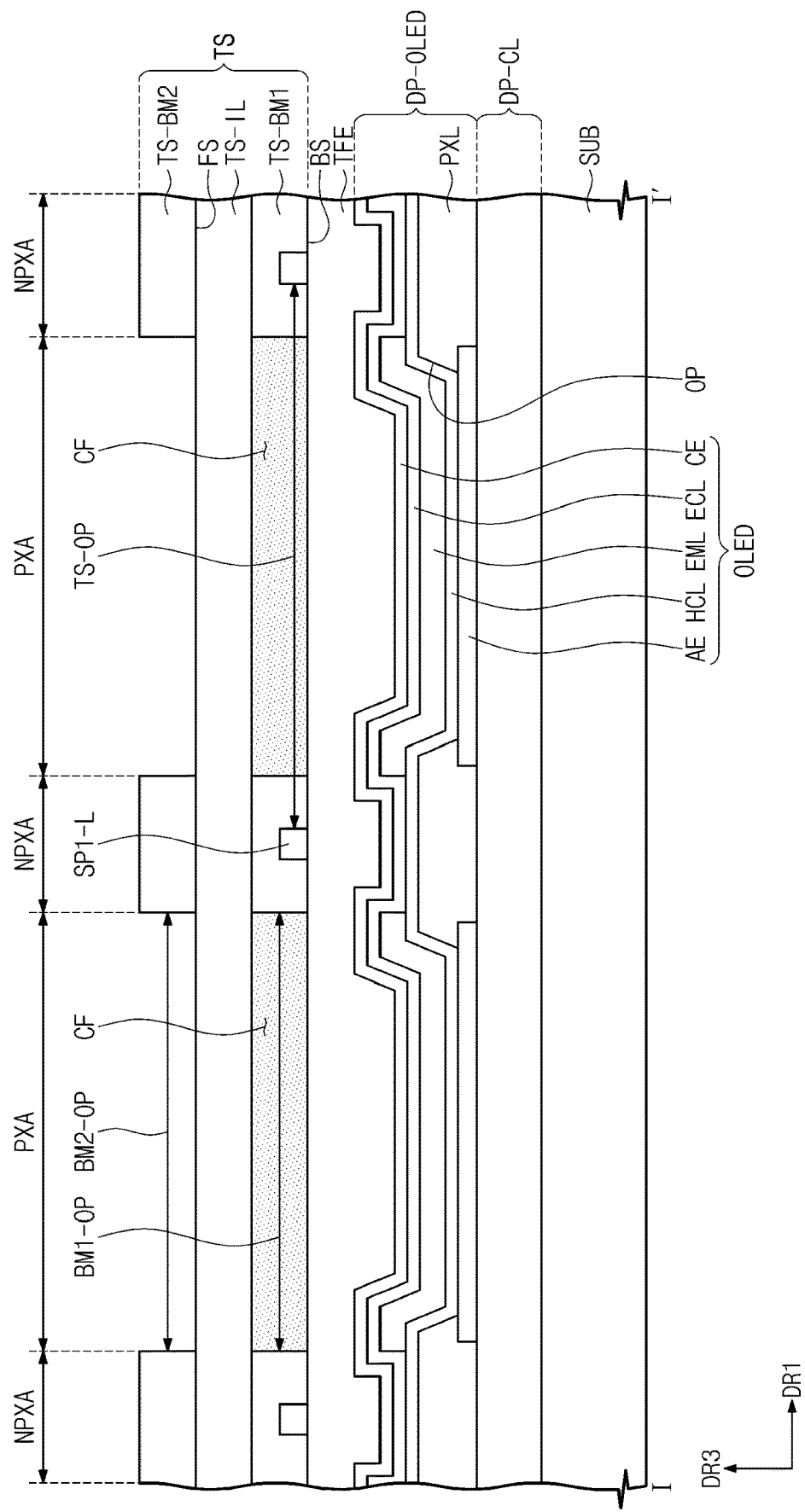
FIGS. 21A, 21B, and 21C are cross-sectional views showing a portion of a display device according to an exemplary embodiment of the present disclosure.
Figure 21B:
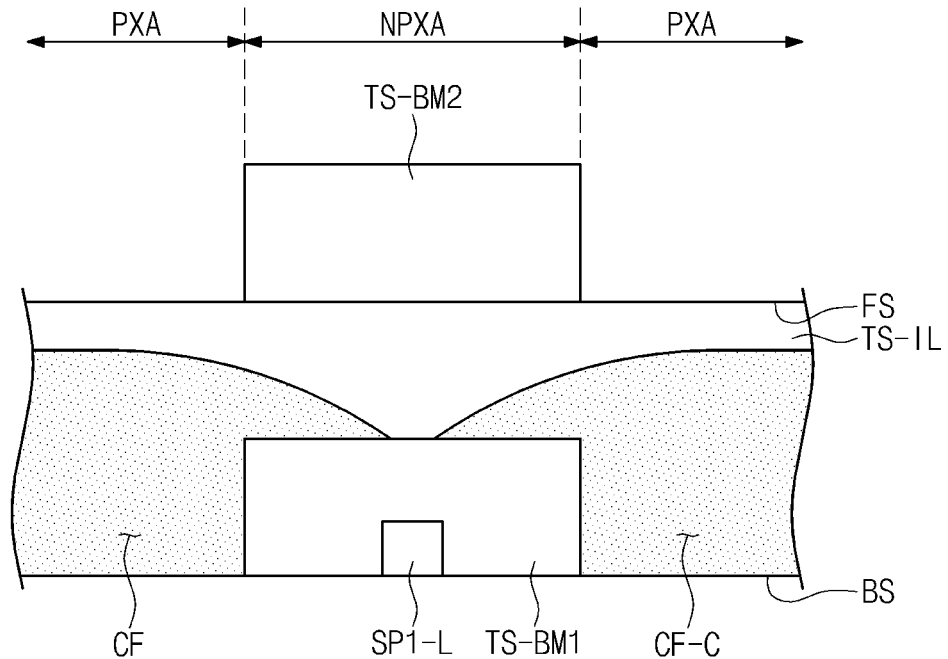
Figure 21C:
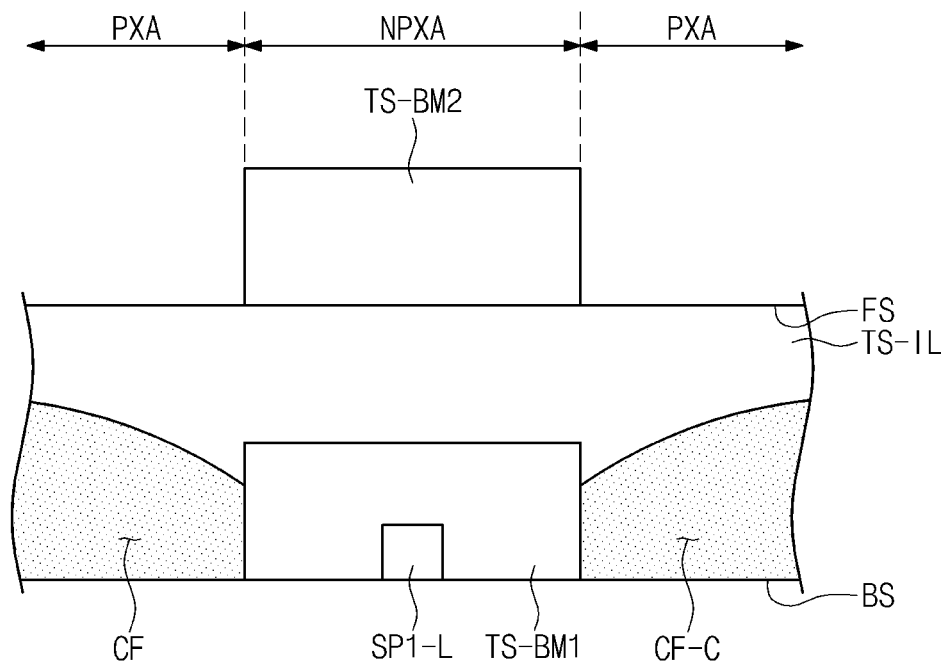

FIGS. 21A, 21B, and 21C are cross-sectional views showing a portion of a display device according to an exemplary embodiment of the present disclosure. FIGS. 22A, 22B, 22C, and 22D are cross-sectional views showing a portion of a display device according to an exemplary embodiment of the present disclosure. FIG. 23 is a cross-sectional view showing a portion of a display device according to an exemplary embodiment of the present disclosure.

Each of FIGS. 21A, 21B, and 21C show a cross-sectional view along I-I' of FIG. 10A to show the portion of the display device according to an exemplary embodiment of the present disclosure. Each of FIGS. 22A, 22B, 22C, and 22D show the cross-sectional view along sectional line II-II' of FIG. 11A to show the portion of the display device according to an exemplary embodiment of the present disclosure. FIG. 23 shows the cross-sectional view corresponding to the sectional line of FIG. 12A to show the portion of the display device according to an exemplary embodiment of the present disclosure. Hereinafter, detailed descriptions of the same elements as those described above will be omitted.

According to the present exemplary embodiment, the first insulating layer TS-IL1 (see to FIG. 8A) may include at least a color filter layer. The color filter layer may include a plurality of color filters. In the present exemplary embodiment, the first insulating layer TS-IL1 may further include a black matrix. The first insulating layer TS-IL1 may further include at least one of an inorganic material layer or an organic material layer. The inorganic material layer or the organic material layer may be a planarization layer providing a relatively flat surface. The inorganic material layer may include silicon oxide or silicon nitride. The organic material layer may include at least one of an acryl-based resin, a methacryl-based resin, a polyisoprene, a vinyl-based resin, an epoxy-based resin, an urethane-based resin, a cellulose-based resin, and a perylene-based resin.

In the present exemplary embodiment, the second insulating layer TS-IL2 may include a black matrix. The second insulating layer TS-IL2 may include at least one of an inorganic material layer and an organic material layer. Particularly, the second insulating layer TS-IL2 may further include the organic material layer to provide a relatively flat surface. Materials for the inorganic material layer and materials for the organic material layer may be selected from materials applied to the first insulating layer TS-IL1.

Referring to FIG. 21A, a thin film encapsulation layer TFE may provide a base surface BS. A first black matrix TS-BM1 may be disposed on the base surface BS to cover a first sensing part SP1, i.e., a first horizontal portion SP1-L. Although not shown separately, the first black matrix TS-BM1 may cover a first connecting part CP1 and first touch signal lines SL1-1, SL1-2, and SL1-3. The first black matrix TS-BM1 may be overlapped with a non-light emitting area NPXA. The first black matrix TS-BM1 may include a plurality of first openings BM1-0P defined therethrough to correspond to a plurality of light emitting areas PXA. The light emitting areas PXA may have substantially the same shape as that of the first openings BM1-OP when viewed in a plan view. In other words, the first black matrix TS-BM1 may have substantially the same shape as that of the non-light emitting area NPXA. That is, the first black matrix TS-BM1 may have substantially the same width as that of the non-light emitting area NPXA in the first and second directions DR1 and DR2. However, the light emitting areas PXA may have different shape or size from that of the first openings BM1-OP according to other embodiments.

The color filters CF may be disposed inside the first openings BM1-OP, respectively. The color filters CF may include a plurality of color filter groups. The color filters CF may include red color filters, green color filters, and blue color filters.

The colors of the color filters CF may be different in each of the first insulating openings IL1-OP in consideration of the colors of the lights generated by the organic light emitting devices OLED. For example, the red color filters are disposed to overlap with the organic light emitting devices OLED emitting a red light, the green color filters are disposed to overlap with the organic light emitting devices OLED emitting a green light, and the blue color filters are disposed to overlap with the organic light emitting devices OLED emitting a blue light.

An insulating layer TS-IL may be disposed on the first black matrix TS-BM1 and the color filters CF. The insulating layer TS-IL may be a planarization layer providing a flat surface FS. The insulating layer TS-IL may overlap with the light emitting areas PXA and the non-light emitting area NPXA.

A second black matrix TS-BM2 may be disposed on the insulating layer TS-IL. The second black matrix TS-BM2 may include a plurality of second openings BM2-OP defined therethrough to correspond to the first openings BM1-OP. The first black matrix TS-BM1 including the first openings BM1-OP defined therethrough may have substantially the same shape as that of the second black matrix TS-BM2 including the second openings BM2-OP defined therethrough. However, the second black matrix TS-BM2 is not limited thereto, and may be omitted in the present exemplary embodiment.

FIGS. 21B and 21C show the enlarged non-light emitting area NPXA shown in FIG. 21A. In FIGS. 21B and 21C, elements disposed under the base surface BS are omitted. As shown in FIG. 21B, edges of the color filters CF may be partially overlapped with the first black matrix TS-BM1. As shown in FIG. 21C, the color filers CF may have a height different from that of the first black matrix TS-BM1. The insulating layer TS-IL may compensate for a step difference caused by the processes and provides a flat surface FS. The second black matrix TS-BM2 may be disposed on the flat surface FS.

Figure 22A:
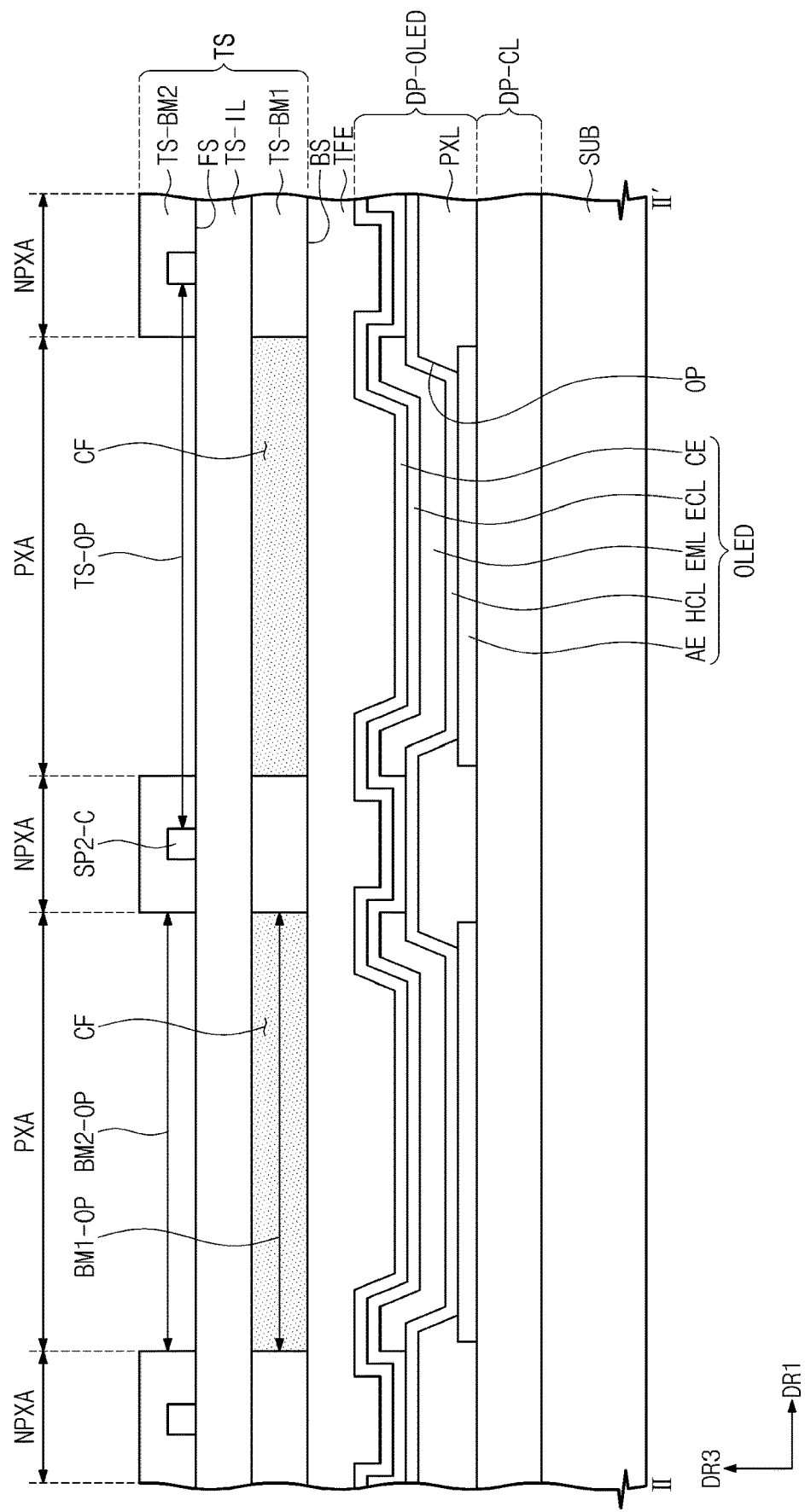
FIGS. 22A, 22B, 22C, and 22D are cross-sectional views showing a portion of a display device according to an exemplary embodiment of the present disclosure.
Figure 23:
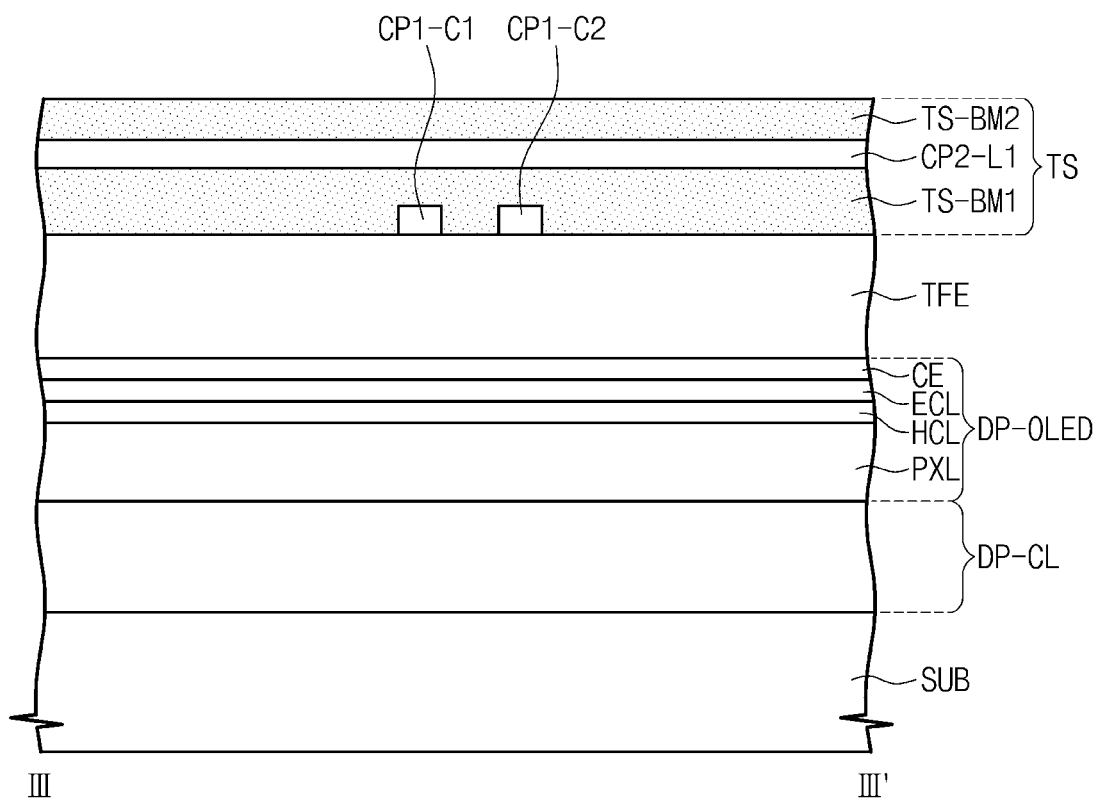
FIG. 23 is a cross-sectional view showing a portion of a display device according to an exemplary embodiment of the present disclosure along sectional line III to III; of FIG. 12A.

As shown in FIG. 22A, the second sensing part SP2, i.e., the second vertical portions SP2-C, may be disposed on the flat surface FS. The second black matrix TS-BM2 may cover the second sensing part SP2, i.e., the second vertical portions SP2-C.

Figure 22B:
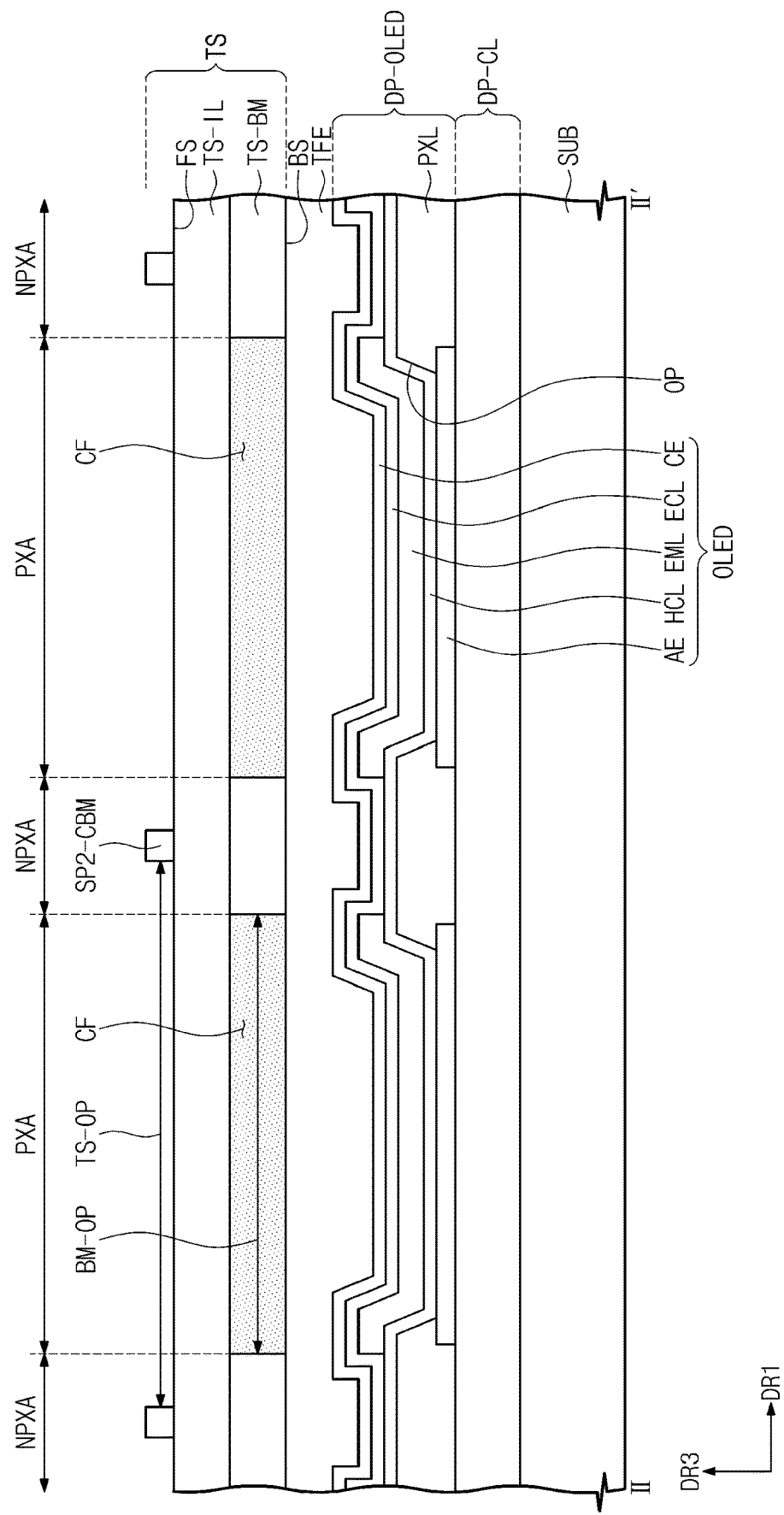

As shown in FIG. 22B, the second black matrix TS-BM2 may be omitted. In this case, the second sensing part SP2 may include a conductive light blocking material. The conductive light blocking material may include a conductive material having low reflectance. The conductive light blocking material may include at least one of chromium oxide, chromium nitride, titanium oxide, and titanium nitride. In addition, the light blocking material may include an alloy of at least one of chromium oxide, chromium nitride, titanium oxide, and titanium nitride.

Figure 22C:
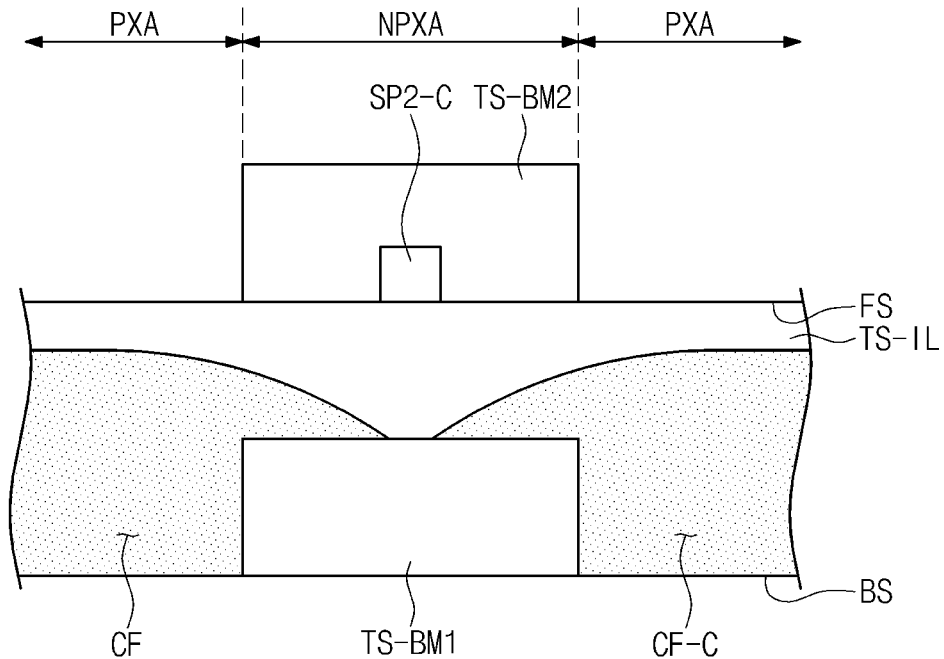
Figure 22D:
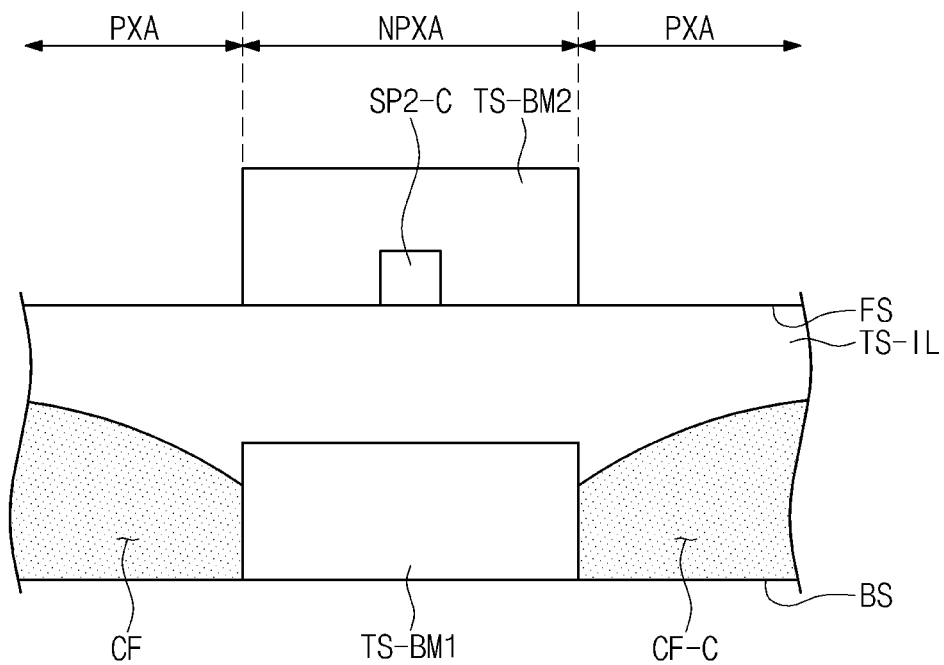

FIGS. 22C and 22D shows the enlarged non-light emitting area NPXA corresponding to FIGS. 21B and 21C. The insulating layer TS-IL may compensate for a step difference caused by the processes, and the second vertical portions SP2-C may be disposed on the insulating layer TS-IL.

As shown in FIG. 23, the first connecting part may include third vertical portions CP1-C1 and CP1-C2 disposed on the thin film encapsulation layer TFE. The second connecting part CP2 may include fourth horizontal portions CP2-L1 disposed on the first black matrix TS-BM1.

Figure 24A:
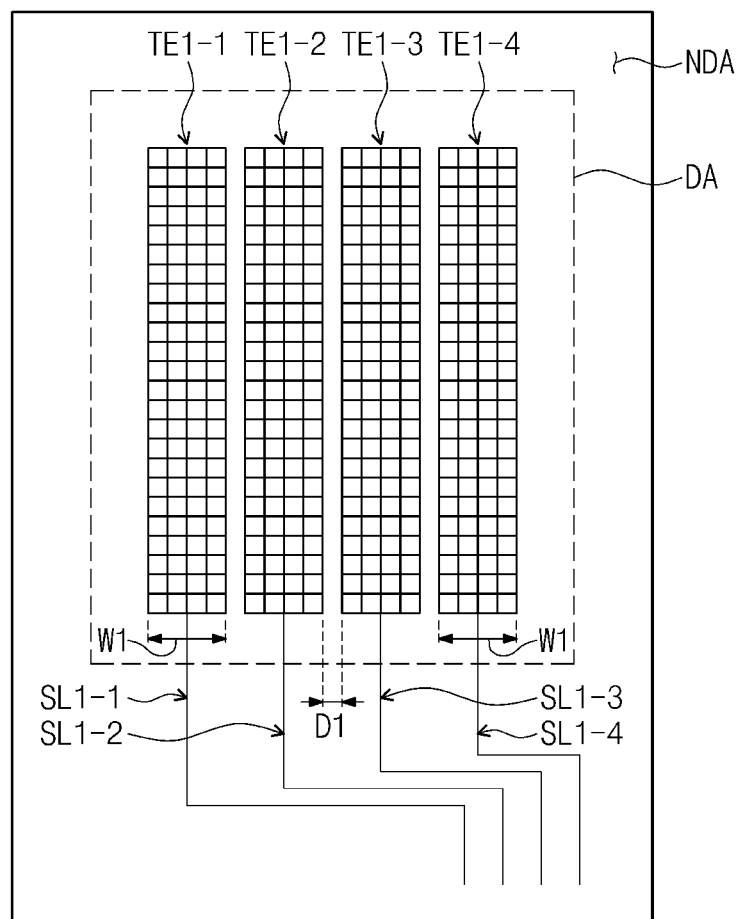
FIGS. 24A and 24B are plan views showing conductive layers of a touch screen according to an exemplary embodiment of the present disclosure.
Figure 24B:
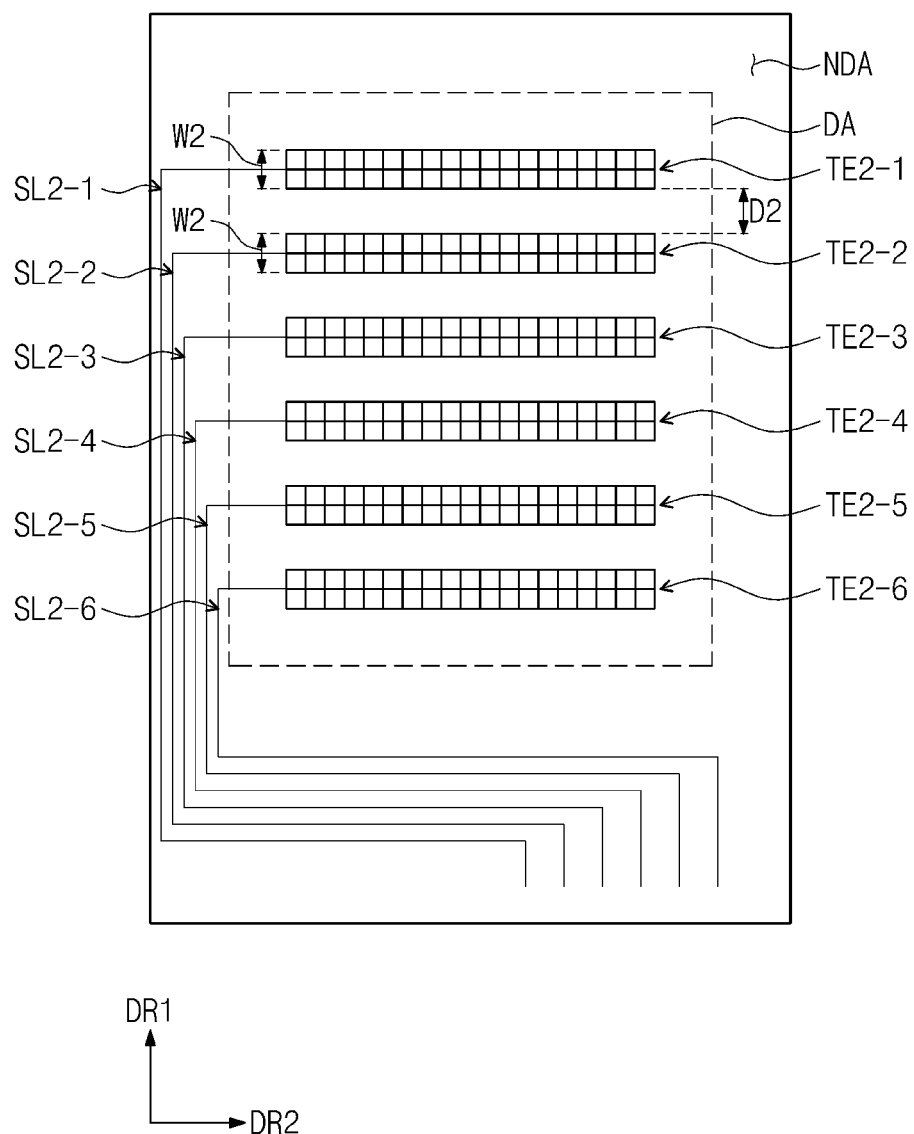

FIGS. 24A and 24B are plan views showing conductive layers of a touch screen according to an exemplary embodiment of the present disclosure. In FIGS. 24A and 24B, detailed descriptions of the same elements as those described above will be omitted.

Referring to FIG. 24A, first conductive patterns may include first touch electrodes TE1-1, TE1-2, TE1-3, and TE1-4 and first touch signal lines SL1-1, SL1-2, SL1-3, and SL1-4. For example, FIG. 24A shows four first touch electrodes TE1-1, TE1-2, TE1-3, and TE1-4 and the first touch signal lines SL1-1, SL1-2, SL1-3, and SL1-4 connected to the first touch electrodes TE1-1, TE1-2, TE1-3, and TE1-4.

The first touch electrodes TE1-1, TE1-2, TE1-3, and TE1-4 may extend in the first direction DR1 and are may be arranged in the second direction DR2. Each of the first touch electrodes TE1-1, TE1-2, TE1-3, and TE1-4 may have a mesh shape through which a plurality of touch openings is defined. The first touch electrodes TE1-1, TE1-2, TE1-3, and TE1-4 may have substantially the same first width W1 in the second direction DR2. The first width W1 of each of the first touch electrodes TE1-1, TE1-2, TE1-3, and TE1-4 may be constant in the first direction DR1. The first touch electrodes TE1-1, TE1-2, TE1-3, and TE1-4 may be spaced apart from each other at regular intervals D1 in the second direction DR2. The first touch electrodes TE1-1, TE1-2, TE1-3, and TE1-4 may receive detecting signals to drive the touch screen. The detecting signals may be an alternating current signal.

Referring to FIG. 24B, second conductive patterns may include second touch electrodes TE2-1, TE2-2, TE2-3, TE2-

4, TE2-5, and TE2-6 and second touch signal lines SL2-1, SL2-2, SL2-3, SL2-4, SL2-5, and SL2-6. For example, FIG. 24B shows six second touch electrodes TE2-1, TE2-2, TE2-3, TE2-4, TE2-5, and TE2-6 and the second touch signal lines SL2-1, SL2-2, SL2-3, SL2-4, SL2-5, and SL2-6 connected to the second touch electrodes TE2-1, TE2-2, TE2-3, TE2-4, TE2-5, and TE2-6.

The second touch electrodes TE2-1, TE2-2, TE2-3, TE2-4, TE2-5, and TE2-6 extend in the second direction DR2 and are arranged in the first direction DR1. Each of the second touch electrodes TE2-1, TE2-2, TE2-3, TE2-4, TE2-5, and TE2-6 has a mesh shape through which a plurality of touch openings is defined. The second touch electrodes TE2-1, TE2-2, TE2-3, TE2-4, TE2-5, and TE2-6 have substantially the same second width W2 in the first direction DR1. Each of the second touch electrodes TE2-1, TE2-2, TE2-3, TE2-4, TE2-5, and TE2-6 may have a constant width. The second touch electrodes TE2-1, TE2-2, TE2-3, TE2-4, TE2-5, and TE2-6 are spaced apart from each other at regular intervals D2 in the first direction DR1. The second touch electrodes TE2-1, TE2-2, TE2-3, TE2-4, TE2-5, and TE2-6 are capacitively coupled to the first touch electrodes TE1-1, TE1-2, TE1-3, and TE1-4, and touch signals are read out from the second touch electrodes TE2-1, TE2-2, TE2-3, TE2-4, TE2-5, and TE2-6.

As shown in FIGS. 24A and 24B, since the first touch electrodes TE1-1, TE1-2, TE1-3, and TE1-4 may be disposed closer to each other than the second touch electrodes TE2-1, TE2-2, TE2-3, TE2-4, TE2-5, and TE2-6, the first touch electrodes TE1-1, TE1-2, TE1-3, and TE1-4 may block a noise that is generated in the display panel DP (see to FIG. 2A) which may interfere with the second touch electrodes TE2-1, TE2-2, TE2-3, TE2-4, TE2-5, and TE2-6. This is because the first touch electrodes TE1-1, TE1-2, TE1-3, and TE1-4 may be disposed closer to each other than the second touch electrodes TE2-1, TE2-2, TE2-3, TE2-4, TE2-5, and TE2-6 and the first touch electrodes TE1-1, TE1-2, TE1-3, and TE1-4 may cover most of the second touch electrodes TE2-1, TE2-2, TE2-3, TE2-4, TE2-5, and TE2-6. That is, the first touch electrodes TE1-1, TE1-2, TE1-3, and TE1-4 may block paths of the noise interference.

Figure 25A:
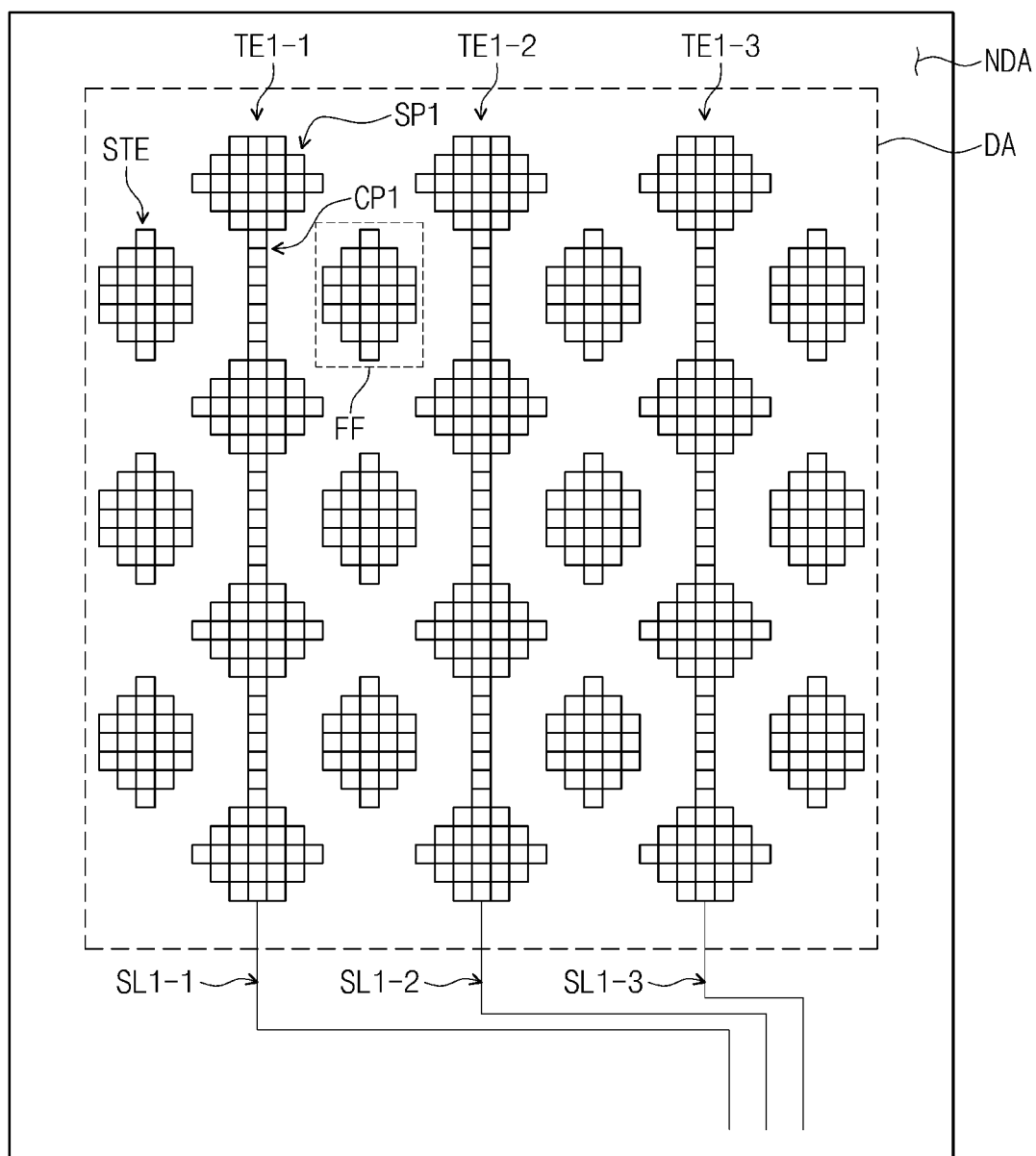
FIGS. 25A and 25B are plan views showing conductive layers of a touch screen according to an exemplary embodiment of the present disclosure.
Figure 25B:
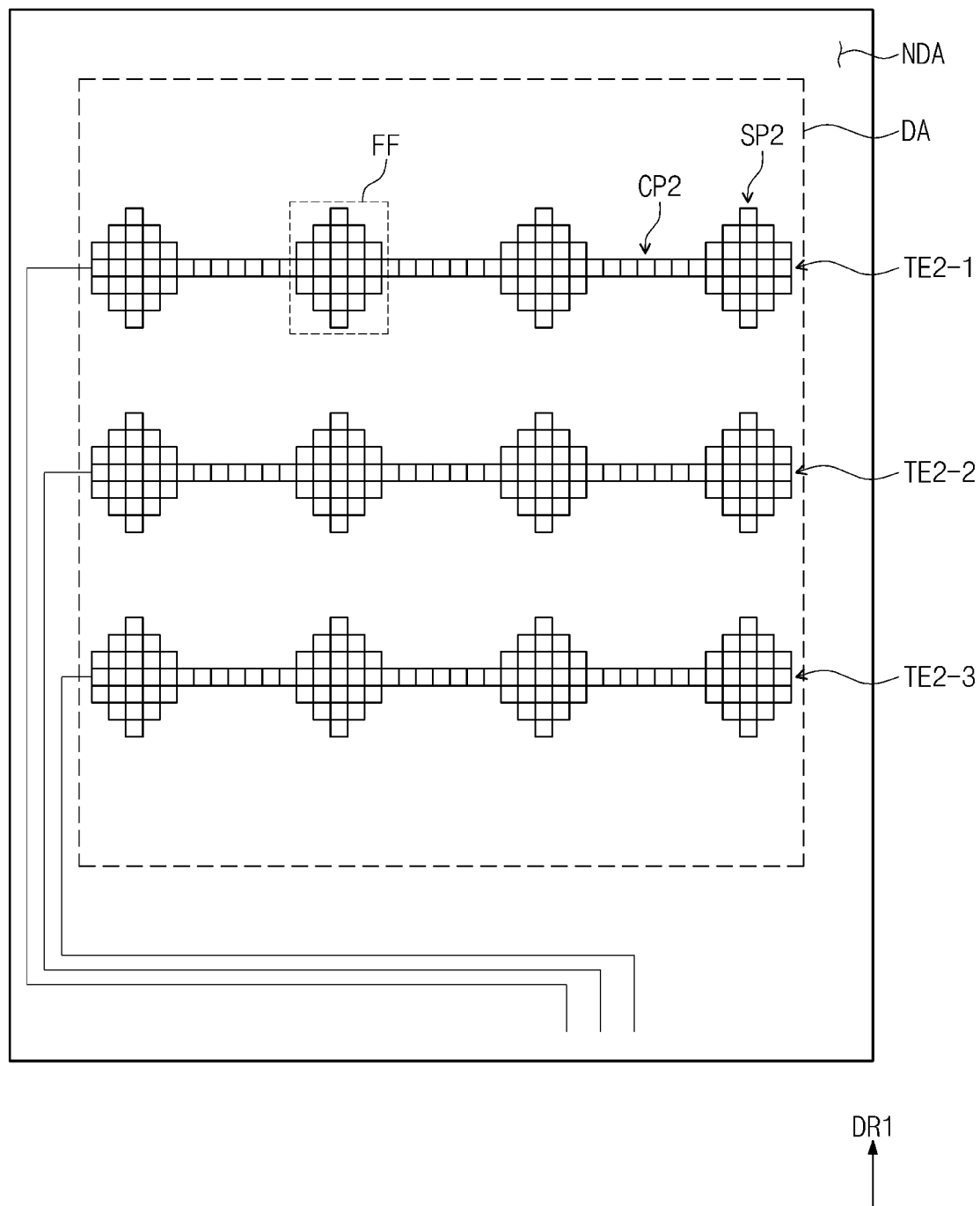
Figure 25C:
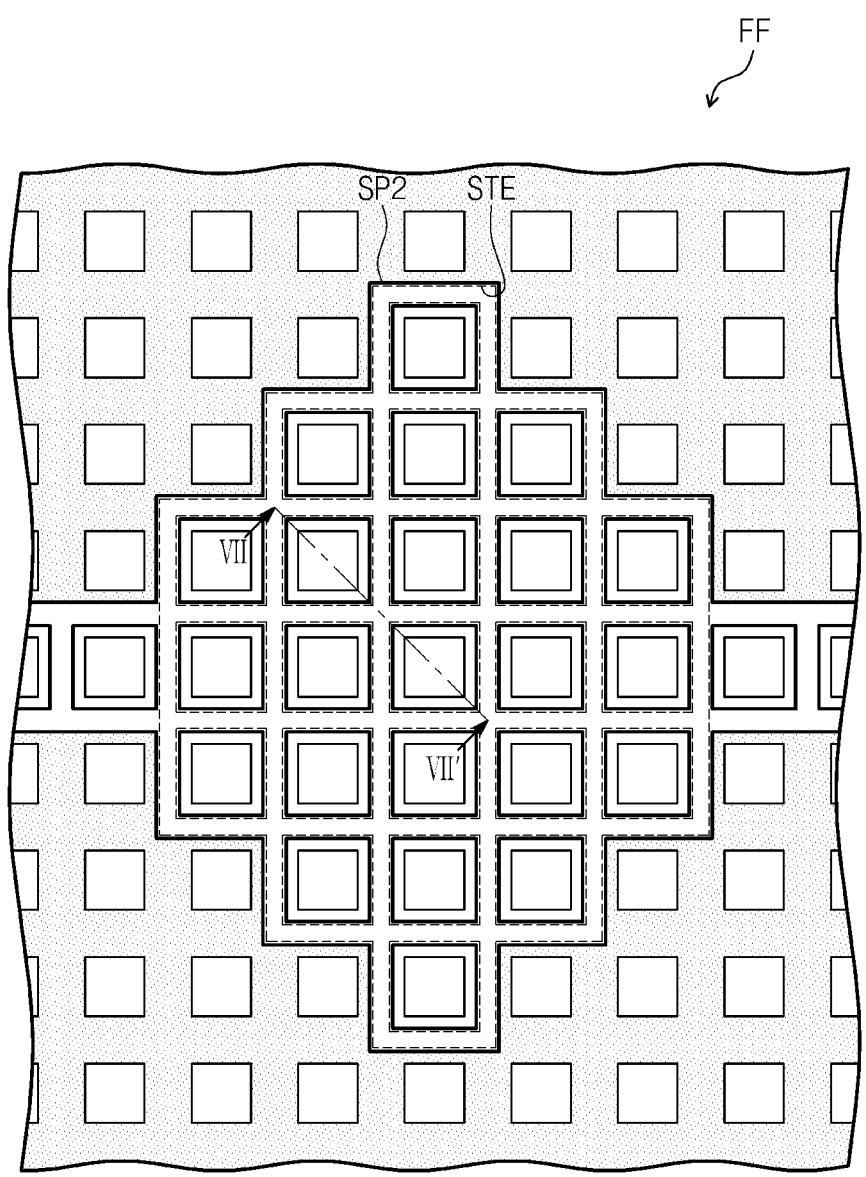
FIG. 25C is a partially enlarged view showing a portion "FF" of FIGS. 25A and 25B.
Figure 25D:
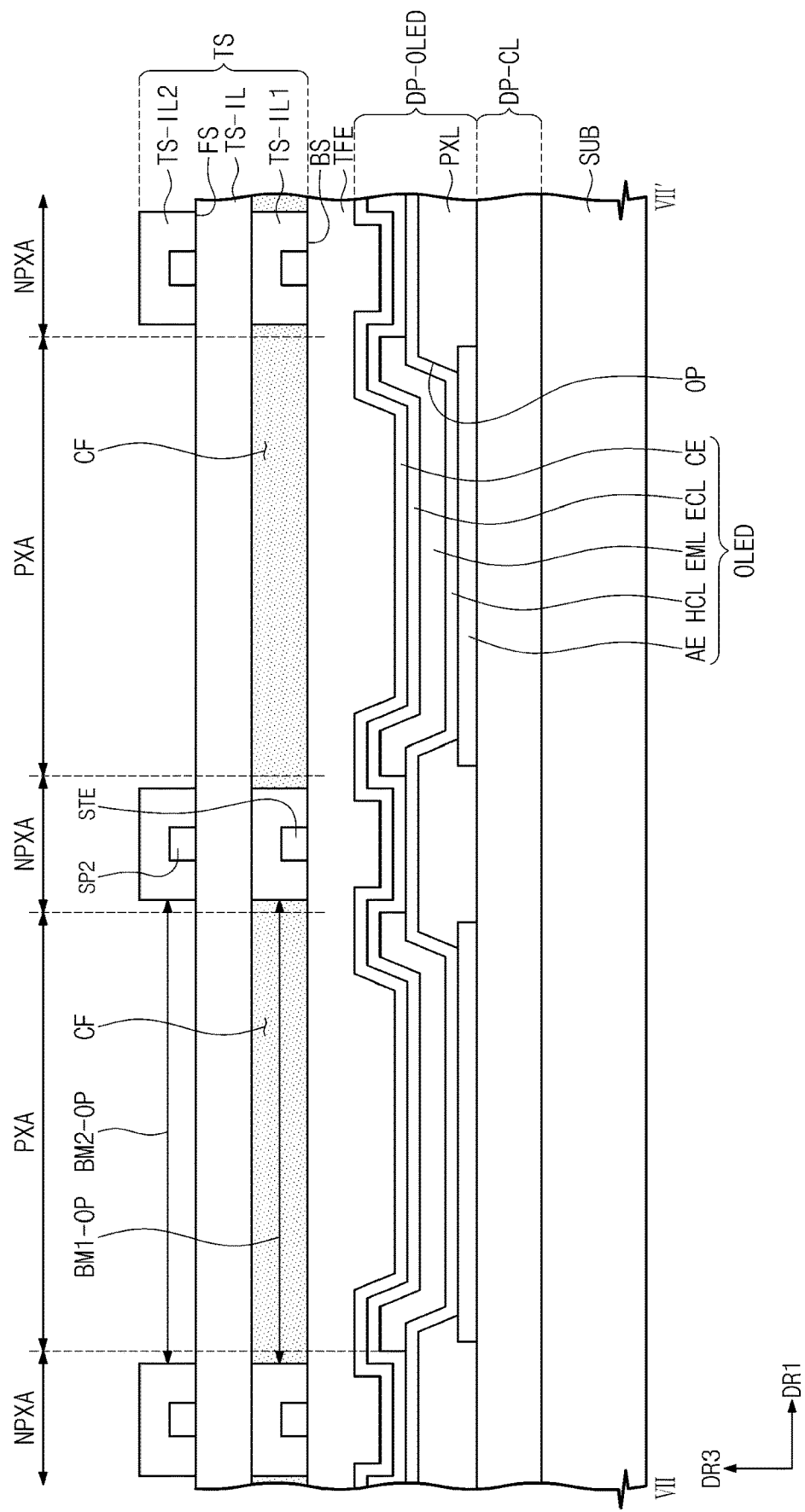
FIG. 25D is a cross-sectional view showing a portion of FIG. 25C along sectional line VII-VII'.

FIGS. 25A and 25B are plan views showing conductive layers of a touch screen according to an exemplary embodiment of the present disclosure. FIG. 25C is a partially enlarged view showing a portion "FF" of FIGS. 25A and 25B. FIG. 25D is a cross-sectional view showing a portion of FIG. 25C along line VII to VII'. In FIGS. 25A, 25B, 25C, and 25D, detailed descriptions of the same elements as those described above will be omitted.

Referring to FIGS. 25A and 25B, first conductive patterns may include first touch electrodes TE1-1, TE1-2, and TE1-3 and shielding electrodes STE. Each of the first touch electrodes TE1-1, TE1-2, and TE1-3 may include a plurality of first sensing parts SP1 and a plurality of first connecting parts CP1. The second conductive patterns may include second touch electrodes TE2-1, TE2-2, and TE2-3. Each of the second touch electrodes TE2-1, TE2-2, and TE2-3 may include a plurality of second sensing parts SP2 and a plurality of second connecting parts CP2.

Each of the shielding electrodes STE may overlap with a corresponding second sensing part among the second sensing parts SP2. Each of the shielding electrodes STE may have a mesh shape. Each of the shielding electrodes STE may be a floating electrode.

In the present exemplary embodiment, each of the shielding electrodes STE receives a ground voltage. Although not shown separately, electrodes arranged in the first direction DR1 among the shielding electrodes may be connected to each other. The shielding electrodes STE may block a noise that is generated in the display panel DP (see to FIG. 2A) which may interfere with the second sensing parts SP2.

FIGS. 25C and 25D show a relation between the shielding electrode STE and the second sensing part SP2. The shielding electrode STE is indicated by a dotted line, and the second sensing part SP2 is indicated by a solid line. In FIGS. 25C and 25D, the second sensing part SP2 may have a line width greater than a line width of the shielding electrode STE, but it is not limited thereto. According to an exemplary embodiment, the line width of the second sensing part SP2 may be substantially the same as the line width of the shielding electrode STE.

Although not shown separately, the display device according to the present exemplary embodiment may include one-layer electrostatic capacitive touch screen as described with reference to FIGS. 14A, 14B, 14C, and 14D. The one-layer electrostatic capacitive touch screen TS may include color filters CF or shielding electrodes as described with reference to FIGS. 21A, 21B, 21C, 22A, 22B, 22C, 22D, 23, 24A, 24B, 25A, 25B, 25C, and 25D.

As described above, since the color filters are respectively disposed inside the openings of the black matrix of the touch screen, the display device may become slimmer. The color filters may filter the external light, and thus the reflectance of the external light may be reduced.

Since the first conductive patterns may be disposed to overlap with the second conductive patterns, the second conductive patterns may be prevented from being interfered with by the noise generated from the display panel.

Figure 26A:
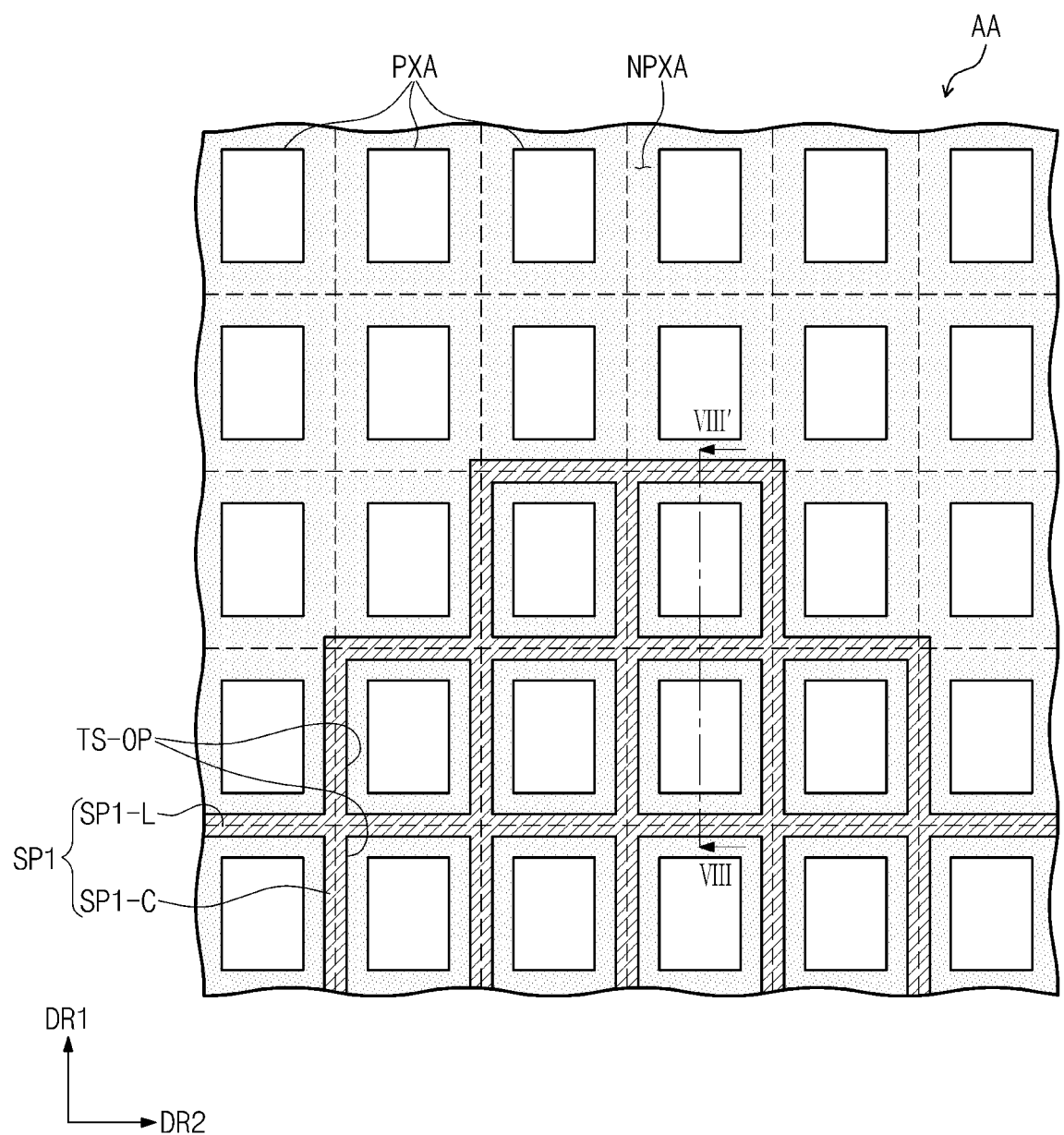
FIG. 26A is a partially enlarged view showing a portion of a display device according to an exemplary embodiment of the present disclosure.

FIG. 26A is a partially enlarged view showing a portion of a display device according to an exemplary embodiment of the present disclosure. FIGS. 26B, 26C, 26D, and 26E are cross-sectional views showing a portion of a display device according to an exemplary embodiment of the present disclosure. FIG. 27A is a partially enlarged view showing a portion of a display device according to an exemplary embodiment of the present disclosure, and FIGS. 27B, 27C, 27D, and 27E are cross-sectional views showing a portion of a display device according to an exemplary embodiment of the present disclosure. FIG. 28A is a partially enlarged view showing a display device according to an exemplary embodiment of the present disclosure. FIG. 28B is a cross-sectional view showing a portion of FIG. 28A along sectional line X-X'.

FIG. 26A is a partially enlarged view showing the portion "AA" of FIG. 9A. Each of FIGS. 26B, 26C, 26D, and 26E shows the cross-sectional view corresponding to a sectional line VIII-VIII' of FIG. 26A to show the portion of the display device according to an exemplary embodiment of the present disclosure. FIG. 27A is a partially enlarged view showing the portion "BB" of FIG. 9B. Each of FIGS. 27B, 27C, 27D, and 27E shows the cross-sectional view corresponding to a line IX-IX' of FIG. 27A to show the portion of the display device according to an exemplary embodiment of the present disclosure. FIG. 28A shows a state in which the conductive layers of FIG. 9A may overlap with the conductive layers of FIG. 9B. In FIGS. 26A, 26B, 26C, 26D, 26E, 27A, 27B, 27C, 27D, 27E, 28A, and 28B, detailed descriptions of the same elements as those described above will be omitted.

Referring to FIG. 26A, a first sensing part SP1 may overlap with a non-light emitting area NPXA adjacent to light emitting areas PXA. The first sensing part SP1 may include a plurality of first vertical portions SP1-C extending in a first direction DR1 and a plurality of first horizontal portions SP1-L extending in a second direction DR2. The first vertical portions SP1-C and the first horizontal portions SP1-L may be referred to as mesh lines. The first vertical portions SP1-C may be connected to the first horizontal portion SP1-L to form a plurality of touch openings TS-OP.

Figure 26B:
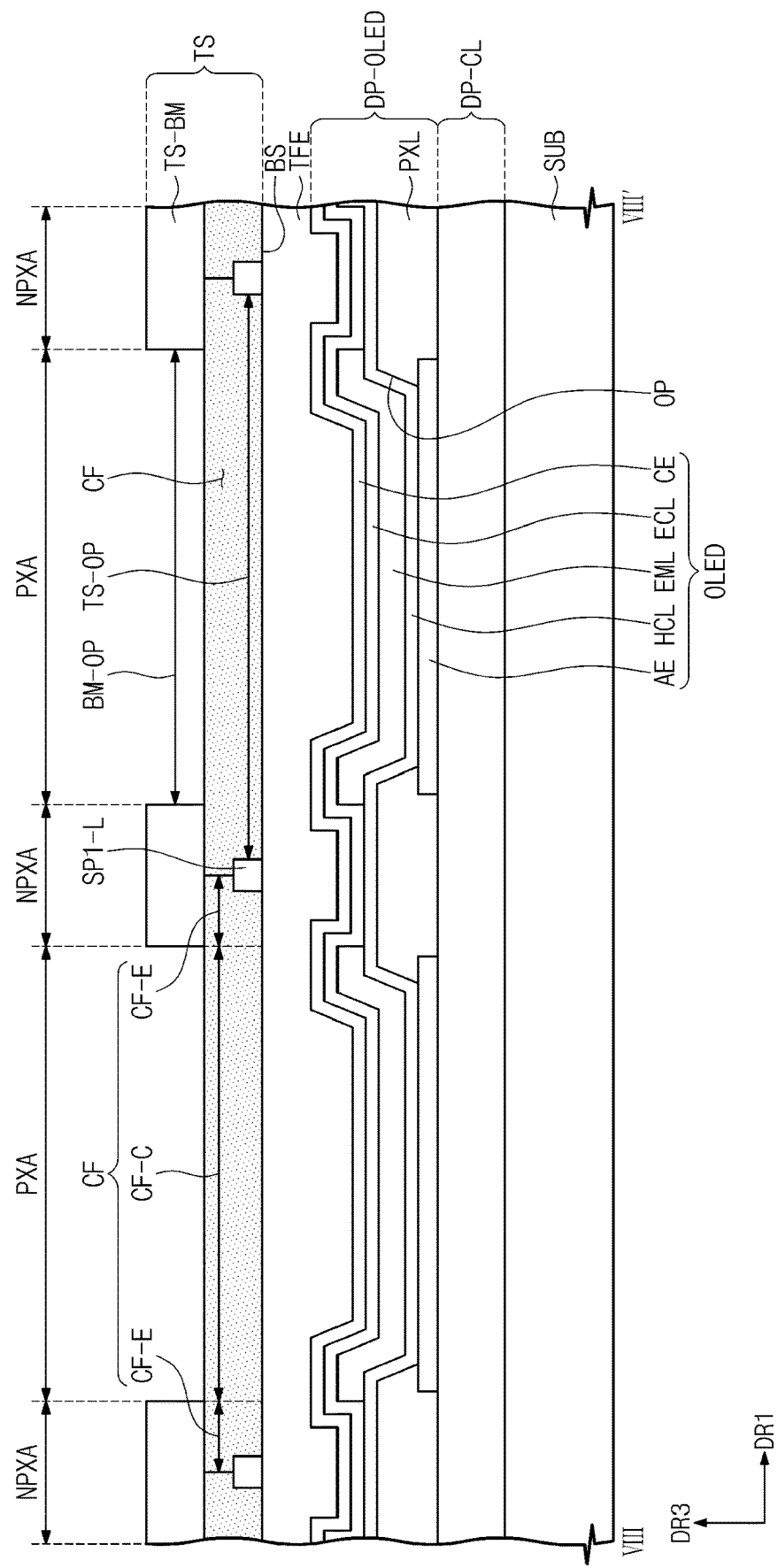
FIGS. 26B, 26C, 26D, and 26E are cross-sectional views showing a portion of a display device according to an exemplary embodiment of the present disclosure.
Figure 27A:
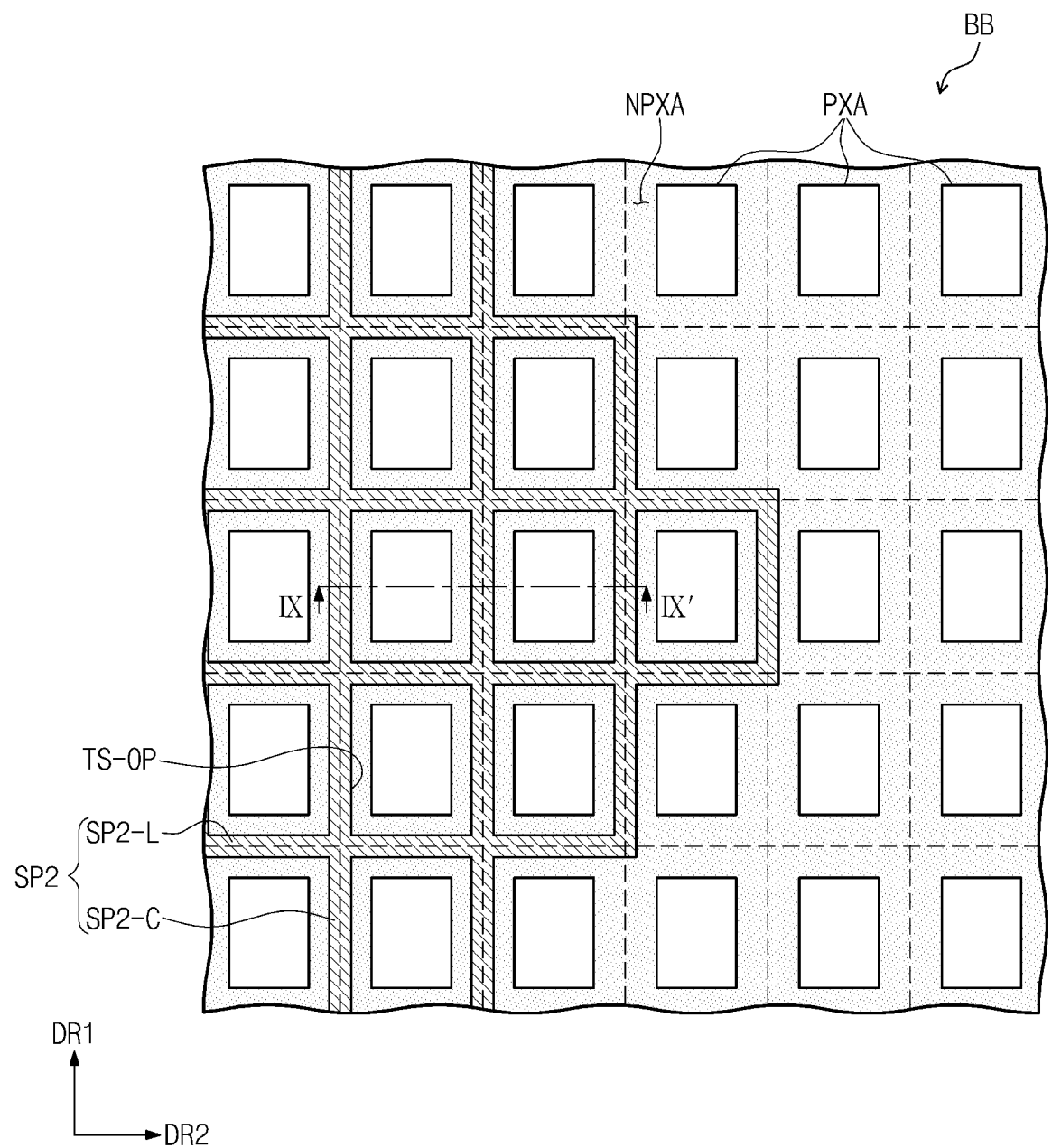
FIG. 27A is a partially enlarged view showing a portion of a display device according to an exemplary embodiment of the present disclosure.

Referring to FIG. 26B, a thin film encapsulation layer TFE may provide a base surface BS. Color filters CF may be disposed on the base surface BS. In FIG. 26A, a dotted line may indicate a boundary between the color filters CF shown in FIG. 26B.

As shown in FIG. 26B, each of the color filters CF may include a center portion CF-C and an edge portion CF-E. The center portion CF-C may overlap with a corresponding light emitting area among the light emitting areas PXA. The edge portion CF-E may extend from the center portion CF-C, overlapped with the non-light emitting area NPXA, and overlap with a first conductive pattern (e.g., the first horizontal portion SP1-L of the first sensing part SP1). Although not shown separately, the color filters CF may overlap with the first connecting part CP1. When viewed in a plan view, the edge portion CF-E may surround the center portion CF-C in each of the color filters CF.

Among the color filters CF shown in the present exemplary embodiment, a left color filter is a red color filter, and a right color filter is a green color filter. The edge portion CF-E of each of the color filters CF adjacent to each other may make contact with the first horizontal portion SP1-L and may cover the first horizontal portion SP1-L. The edge portions CF-E of the color filters CF may partially cover the first horizontal portion SP1-L and may completely cover the first conductive pattern in cooperation with the adjacent color filter CF.

A black matrix TS-BM is disposed on the color filters CF. As shown in FIG. 26B, the black matrix TS-BM may be directly disposed on the color filters CF. The black matrix TS-BM may include a plurality of transmitting openings BM-OP defined therethrough to correspond to the light emitting areas PXA.

The black matrix TS-BM may be disposed to correspond to the non-light emitting area NPXA. The light emitting areas PXA may have substantially the same shape as that of the transmitting openings BM-OP when viewed in a plan view. In other words, the black matrix TS-BM may have substantially the same shape as that of the non-light emitting area NPXA. That is, the black matrix TS-BM may have the same widths as those of the non-light emitting area NPXA in the first and second directions DR1 and DR2. However, the present inventive concept is not limited thereto. That is, the light emitting areas PXA may have a shape different from that of the transmitting openings BM-OP.

Figure 26C:
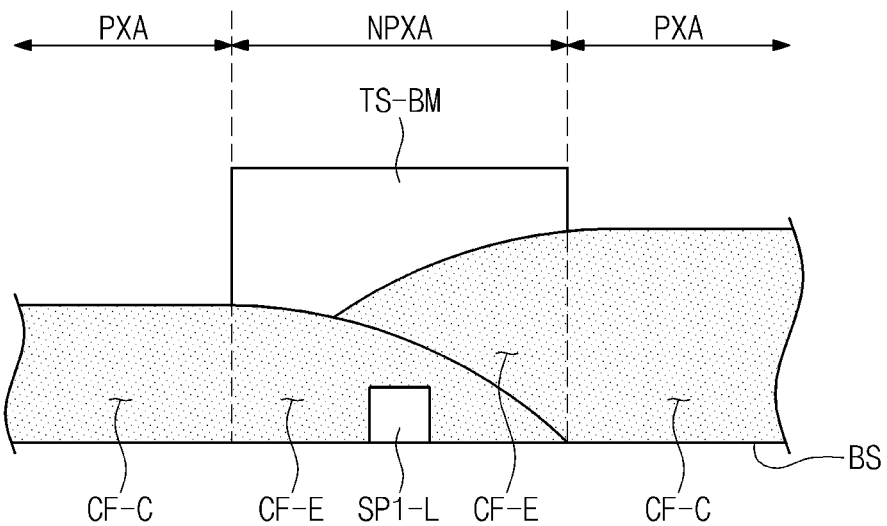
Figure 26D:
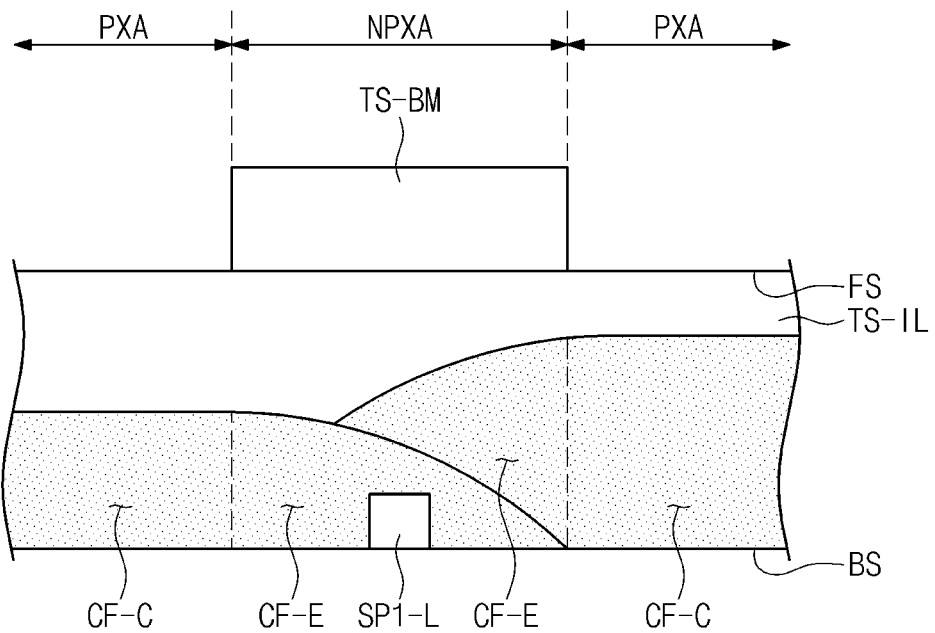

FIGS. 26C and 26D show the enlarged view of the non-light emitting area NPXA shown in FIG. 26B. In FIGS. 26C and 26D, components disposed under the base surface BS are not shown. As shown in FIG. 26C, the edge portion CF-E of the left color filter may completely cover the first horizontal portion SP1-L. The edge portion CF-E of the right color filter may be disposed on the edge portion CF-E of the left color filter. The shape of the boundary between the color filters disposed in the non-light emitting area NPXA may be changed in accordance with the order of forming the left and right color filters.

As shown in FIG. 26D, an insulating layer TS-IL may further disposed on the left and right color filters. The insulating layer TS-IL may provide a flat surface FS. The black matrix TS-BM may be directly disposed on the flat surface FS.

Figure 26E:
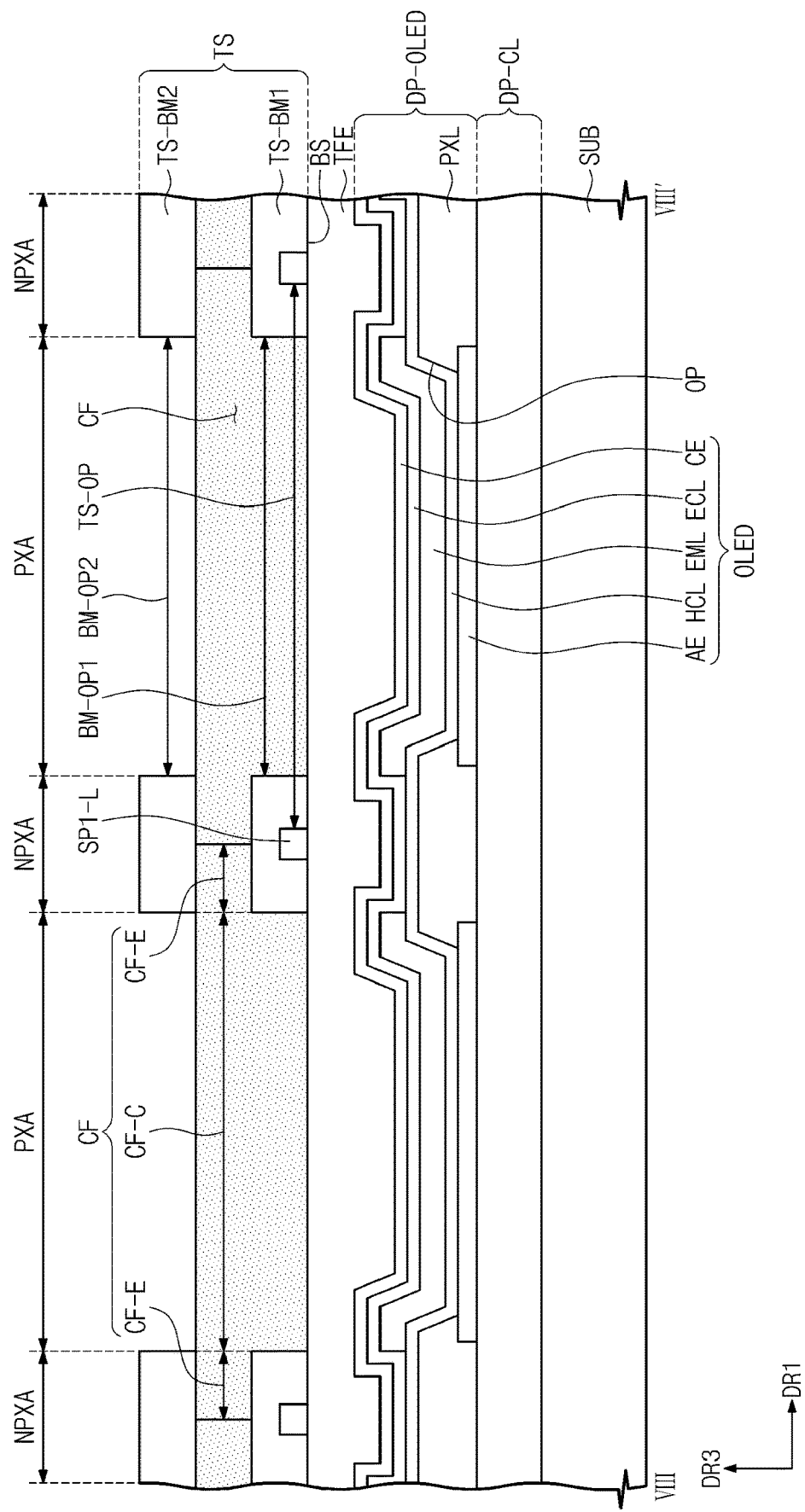

As shown in FIG. 26E, the touch screen TS may include a first black matrix TS-BM1 and a second black matrix TS-BM2. The first black matrix TS-BM1 may be disposed on the base surface BS and covers the first conductive pattern (e.g., the first horizontal portion SP1-L). The first black matrix TS-BM1 may include a plurality of first transmitting openings BM1-OP defined therethrough to correspond to the light emitting areas PXA.

The edge portions CF-E of the color filters CF may contact the first black matrix TS-BM1 and may cover the first black matrix TS-BM1. The color filters CF may completely cover the first black matrix TS-BM1 in cooperation with an adjacent color filter CF.

The second black matrix TS-BM2 may be disposed on the color filters CF. The second black matrix TS-BM2 may include a plurality of second transmitting openings BM2-OP defined therethrough to correspond to the light emitting areas PXA. Although not shown separately, the edge portions CF-E of the adjacent color filters CF may be substantially the same as those shown in FIG. 26C, and the second black matrix TS-BM2 may be disposed on the insulating layer covering the color filters CF.

Figure 27B:
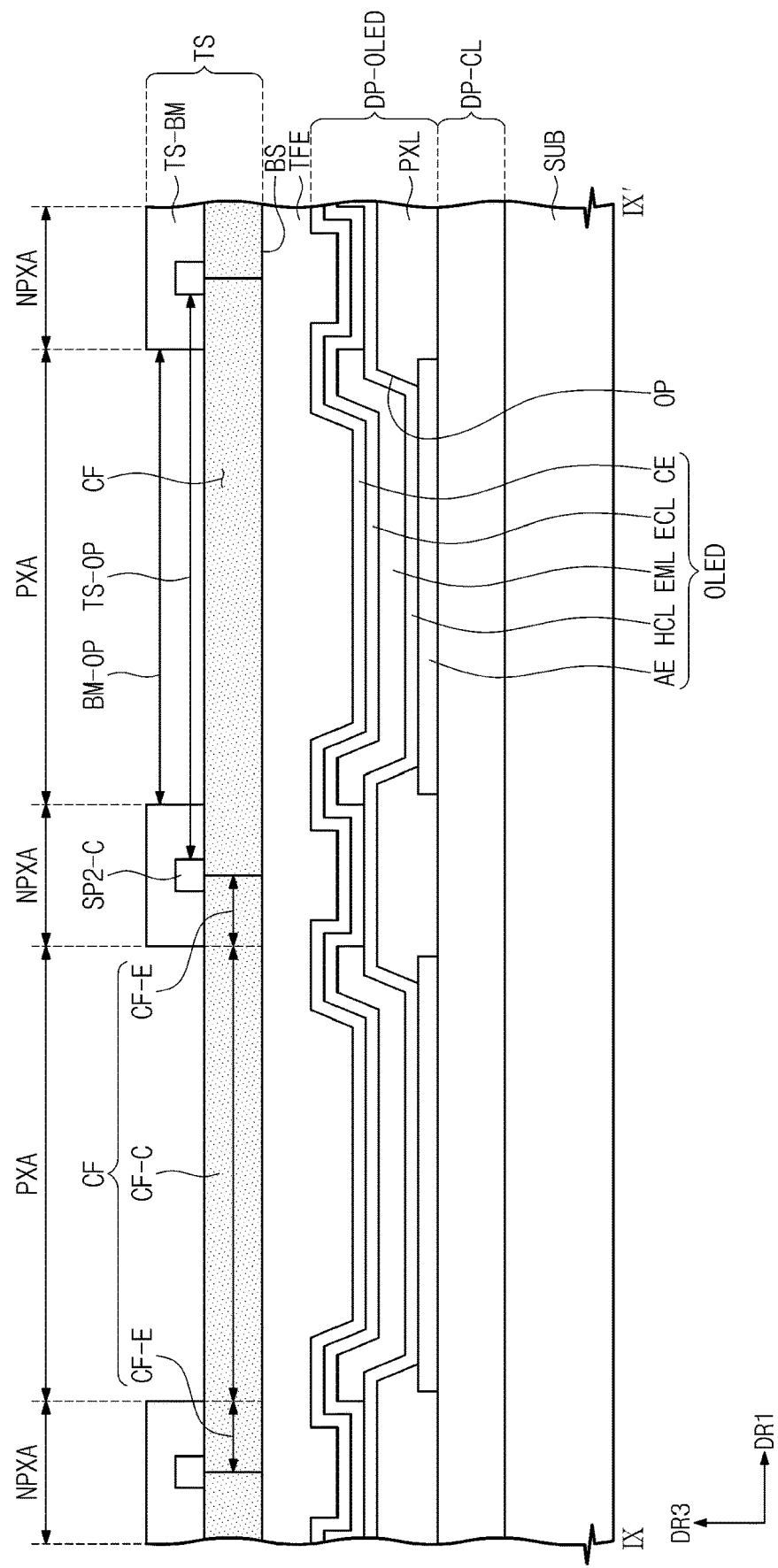
FIGS. 27B, 27C, 27D, and 27E are cross-sectional views showing a portion of a display device according to an exemplary embodiment of the present disclosure.
Figure 28A:
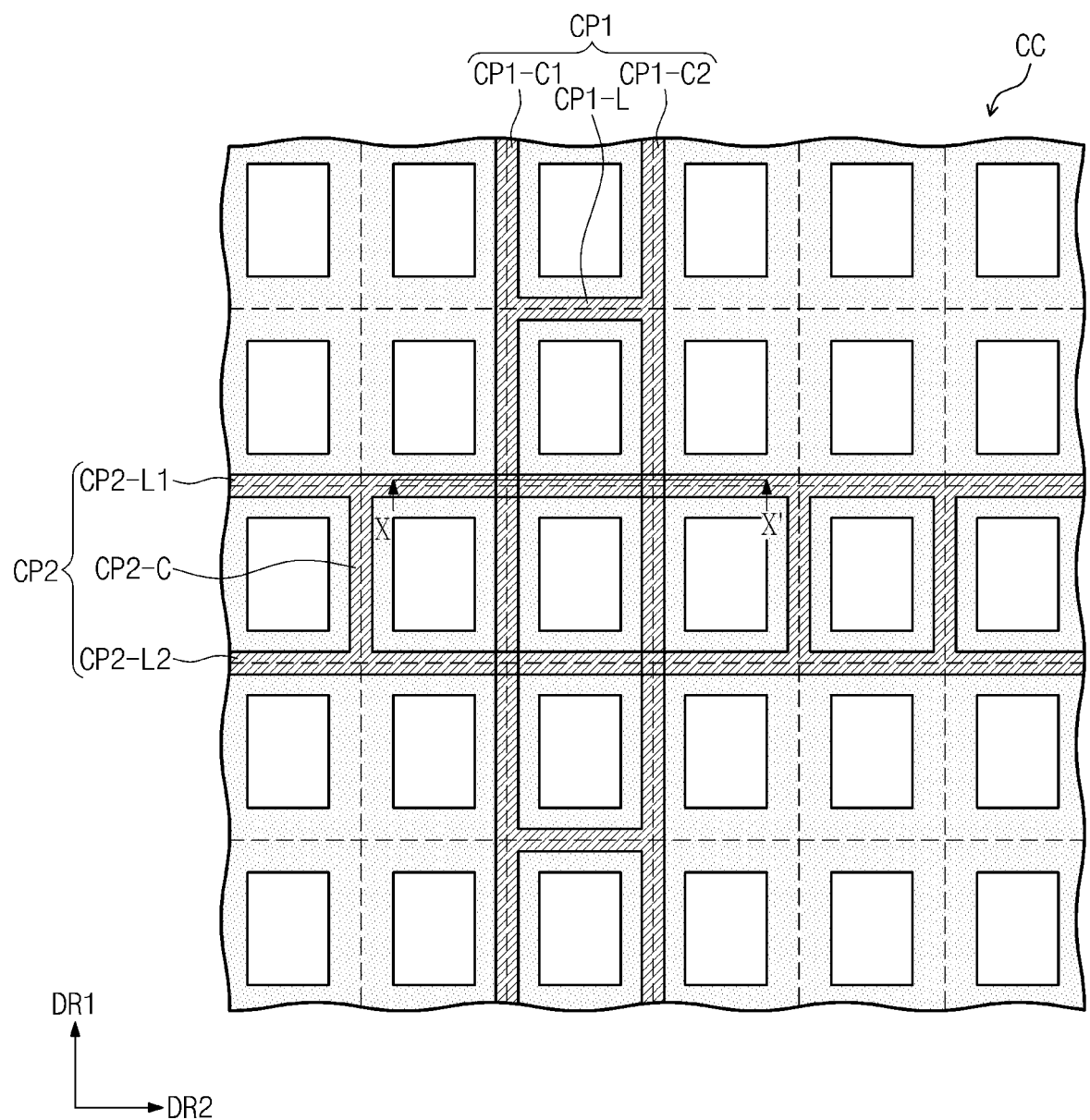
FIG. 28A is a partially enlarged view showing a display device according to an exemplary embodiment of the present disclosure.
Figure 28B:
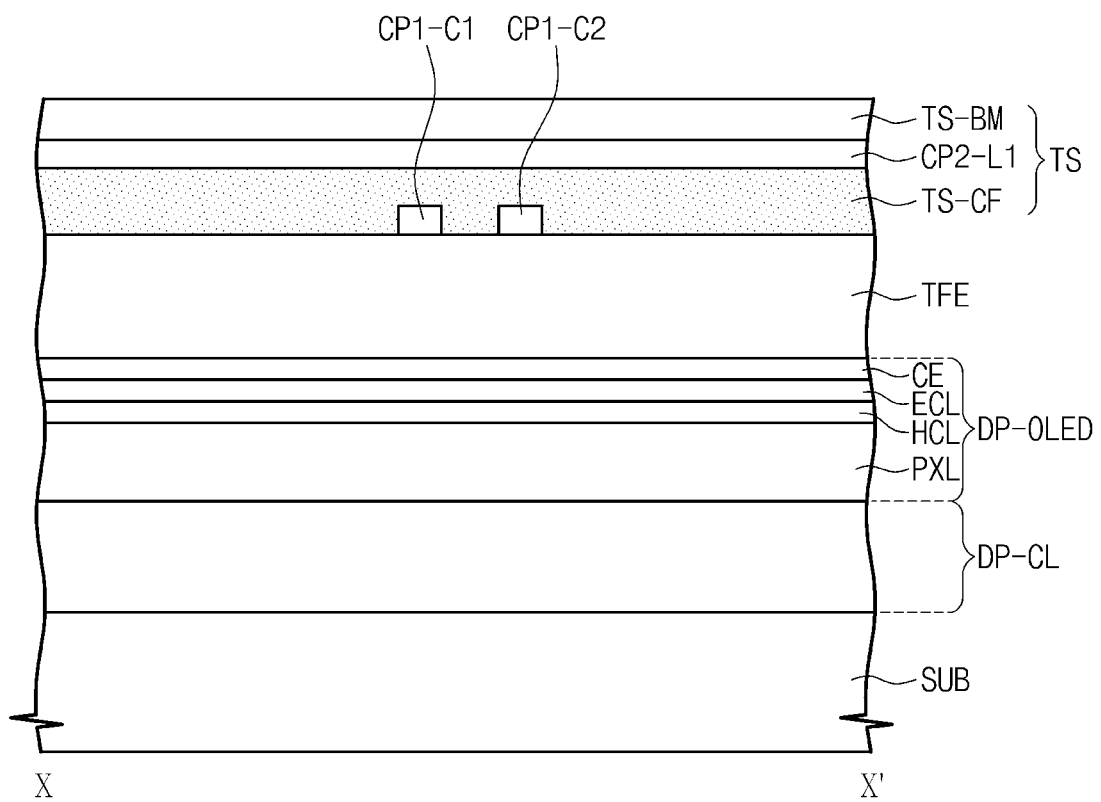
FIG. 28B is a cross-sectional view showing a portion of FIG. 28A along sectional line X-X'.

As shown in FIGS. 27A and 27B, a second sensing part SP2 may overlap with the non-light emitting area NPXA. The second sensing part SP2 may include a plurality of second vertical portions SP2-C extending in the first direction DR1 and a plurality of second horizontal portions SP2-L extending in the second direction DR2. The second vertical portions SP2-C may be connected to the second horizontal portions SP2-L to form a plurality of touch openings TS-OP.

Figure 27C:
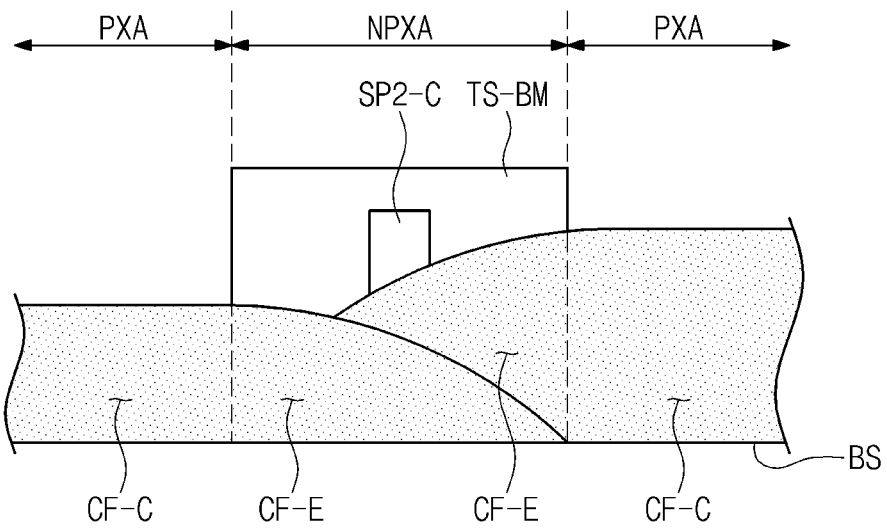
Figure 27D:
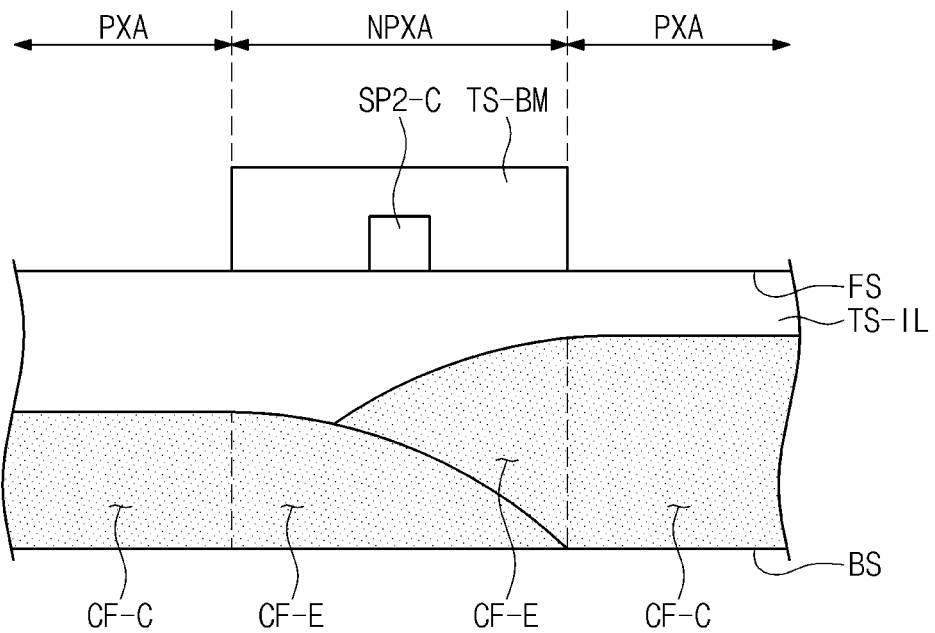
Figure 27E:
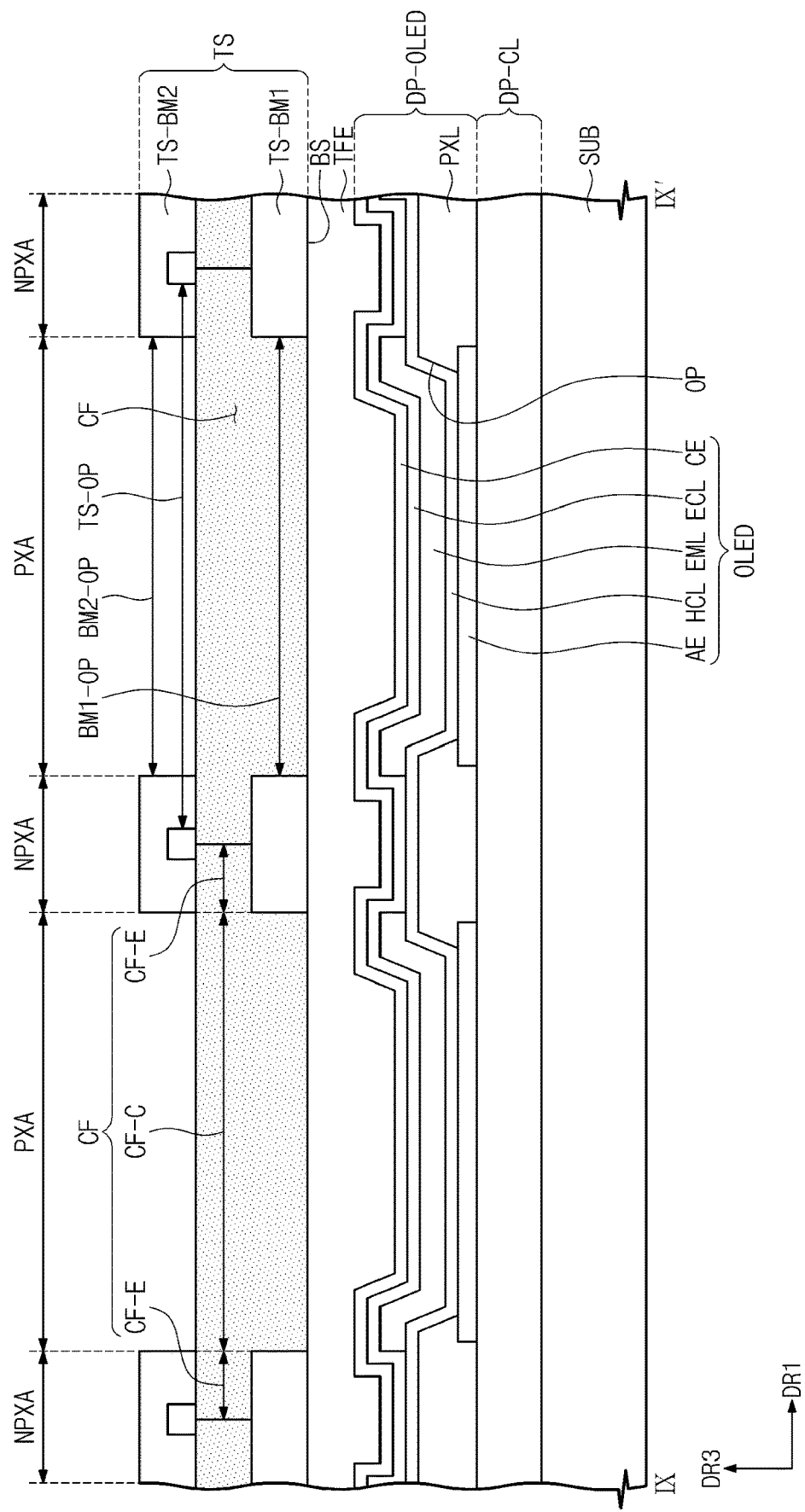

As shown in FIGS. 27B, 27C, and 27D, the black matrix TS-BM may be disposed on the color filters CF and may cover the second conductive patterns (e.g., the second vertical portions SP2-C). As shown in FIG. 27E, the second black matrix TS-BM may be directly disposed on the color filters CF and may cover the second conductive patterns (e.g., the second vertical portions SP2-C).

As described above, the color filters CF may serve as an insulating layer to insulate the first conductive patterns from the second conductive patterns (e.g., the first horizontal portions SP1-L from the second vertical portions SP2-C). The color filters CF may reduce the reflectance of the external light, and thus the insulating layer may be omitted.

FIG. 28A shows an example in which the conductive layers of FIG. 9A are overlapped with the conductive layers of FIG. 9B. As shown in FIGS. 28A and 28B, the first connecting part CP1 may include third vertical portions CP1-C1 and CP1-C2 disposed on the thin film encapsulation layer TFE and third horizontal portions CP1-L connecting the third vertical portions CP1-C1 and CP1-C2. FIG. 28A shows two third vertical portions CP1-C1 and CP1-C2, but the number of the third vertical portions should not be limited to two.

The second connecting part CP2 may include fourth horizontal portions CP2-L1 and CP2-L2 disposed on a color filter layer TS-CF and fourth vertical portions CP2-C connecting the fourth horizontal portions CP2-L1 and CP2-L2. The color filter layer TS-CF shown in FIG. 28B may include a plurality of color filters. A boundary between the color filters may be substantially the same as that shown in FIGS. 26B, 26C, 26D, and 26E. The first connecting part CP1 and the second connecting part CP2 may have a mesh shape. The black matrix TS-BM may cover the fourth horizontal portions CP2-L1 and CP2-L2 and the fourth vertical portions CP2-C.

FIG. 28B shows a layer structure corresponding to FIGS. 26B and 27B, but it is not limited thereto. A cross-sectional view corresponding to the connecting parts CP1 and CP2 of the touch screen TS may be changed to the shape shown in FIGS. 26C, 26D, and 26E.

Figure 29A:
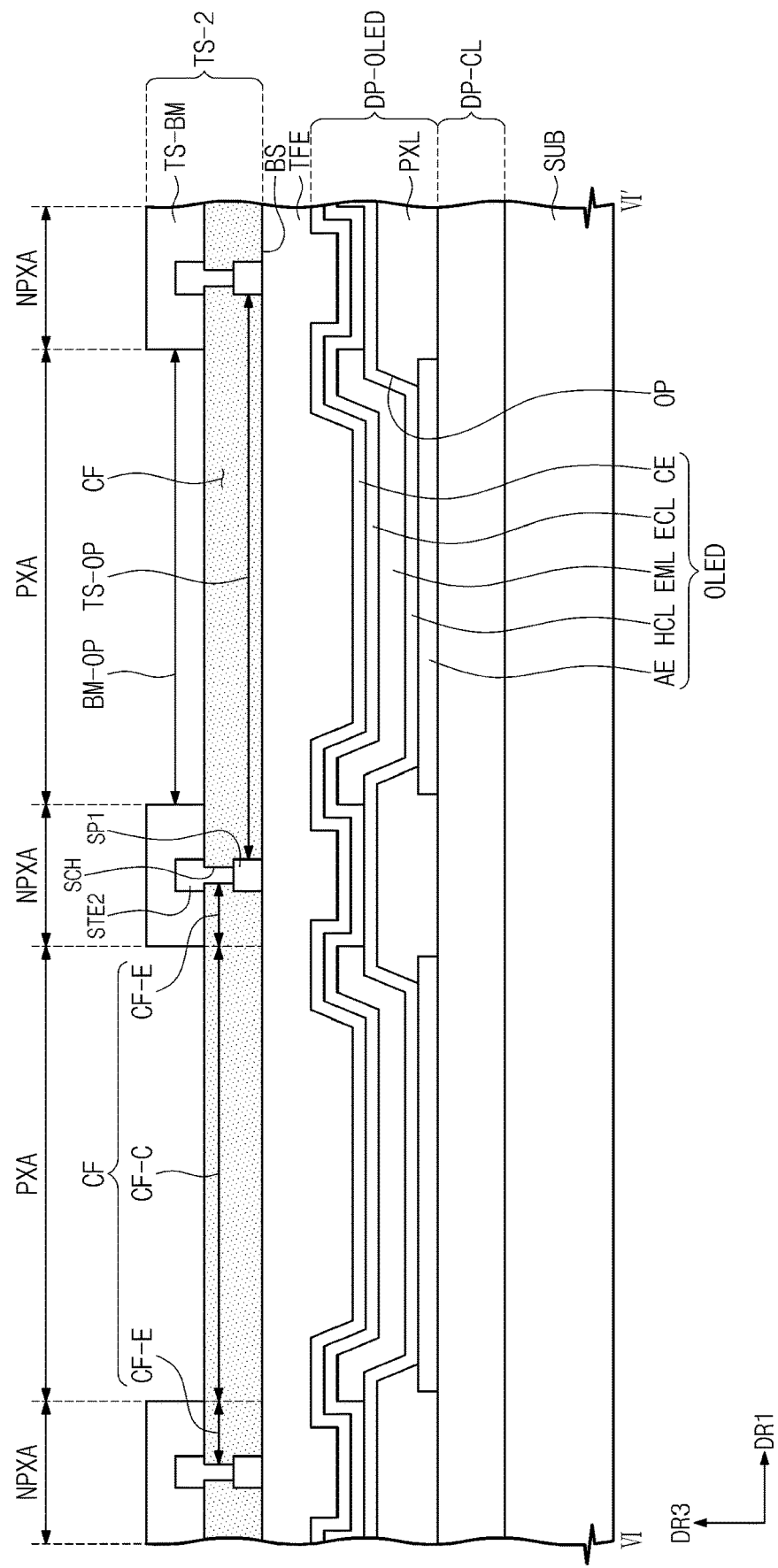
FIGS. 29A and 29B are cross-sectional views showing a portion of a display device according to an exemplary embodiment of the present disclosure along sectional line VI-VI' of FIG. 16A.
Figure 29B:
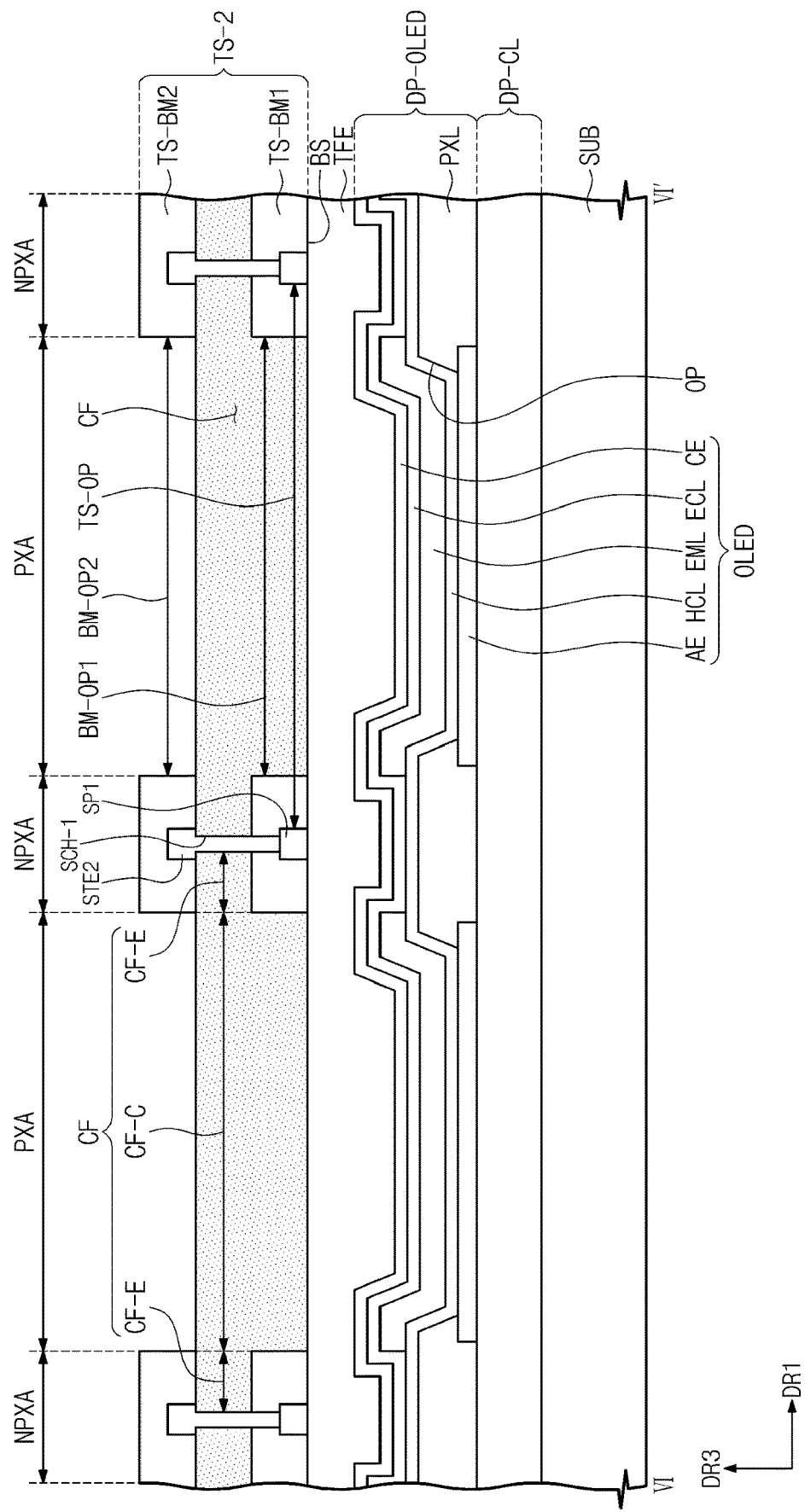

FIGS. 29A and 29B are cross-sectional views showing a portion of a display device according to an exemplary embodiment of the present disclosure along sectional line VI-VI' of FIG. 16A. Each of FIGS. 29A and 29B corresponds to FIG. 16D.

Referring to FIG. 29A, a second auxiliary electrode STE2 and a first sensing part SP1 may be connected to each other through a plurality of auxiliary contact holes SCH. The auxiliary contact holes SCH may be formed penetrating through corresponding color filters CF among a plurality of color filters. A portion of the auxiliary contact holes SCH may partially penetrates the color filters CF adjacent to each other. In the present exemplary embodiment, the thin film encapsulation layer TFE provides the flat base surface BS, but another layer, such as a buffer layer, may provide the base surface BS according to another embodiment. Although not shown separately, the color filter CF and the black matrix TS-BM shown in FIG. 29A may be changed to the shape shown in FIGS. 26C and 26D.

FIG. 29B shows a structure corresponding to that shown in FIG. 26E. First and second black matrices TS-BM1 and TS-BM2 may be disposed on the base surface BS. An auxiliary contact hole SCH-1 may be formed to penetrate through a corresponding color filter CF and a corresponding first black matrix TS-BM1.

Although not shown separately, the display device according to the present exemplary embodiment may include one-layer electrostatic capacitive touch screen as described with reference to FIGS. 14A, 14B, 14C, and 14D. The one-layer electrostatic capacitive touch screen TS may include color filters CF as described with reference to FIGS. 26A, 26B, 26C, 26D, 26E, 27A, 27B, 27C, 27D, 27E, 28A, and 28B.

As described above, the color filters may serve as an insulating layer of the touch screen, and thus the display device may become slimmer. The color filters may filter the external light to reduce the reflectance of the external light. Since the touch electrodes have the mesh shape, the tensile stress and the compressive stress applied to the touch electrodes may be reduced, and thus the touch electrodes may be prevented from cracking.

Figure 30A:
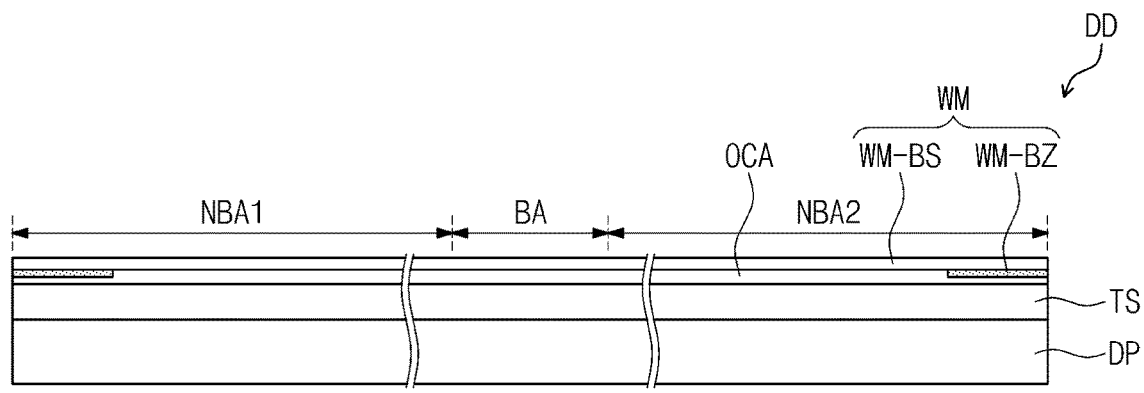
FIG. 30A is a cross-sectional view showing a flexible display device in a first operation according to an exemplary embodiment of the present disclosure.
Figure 30B:
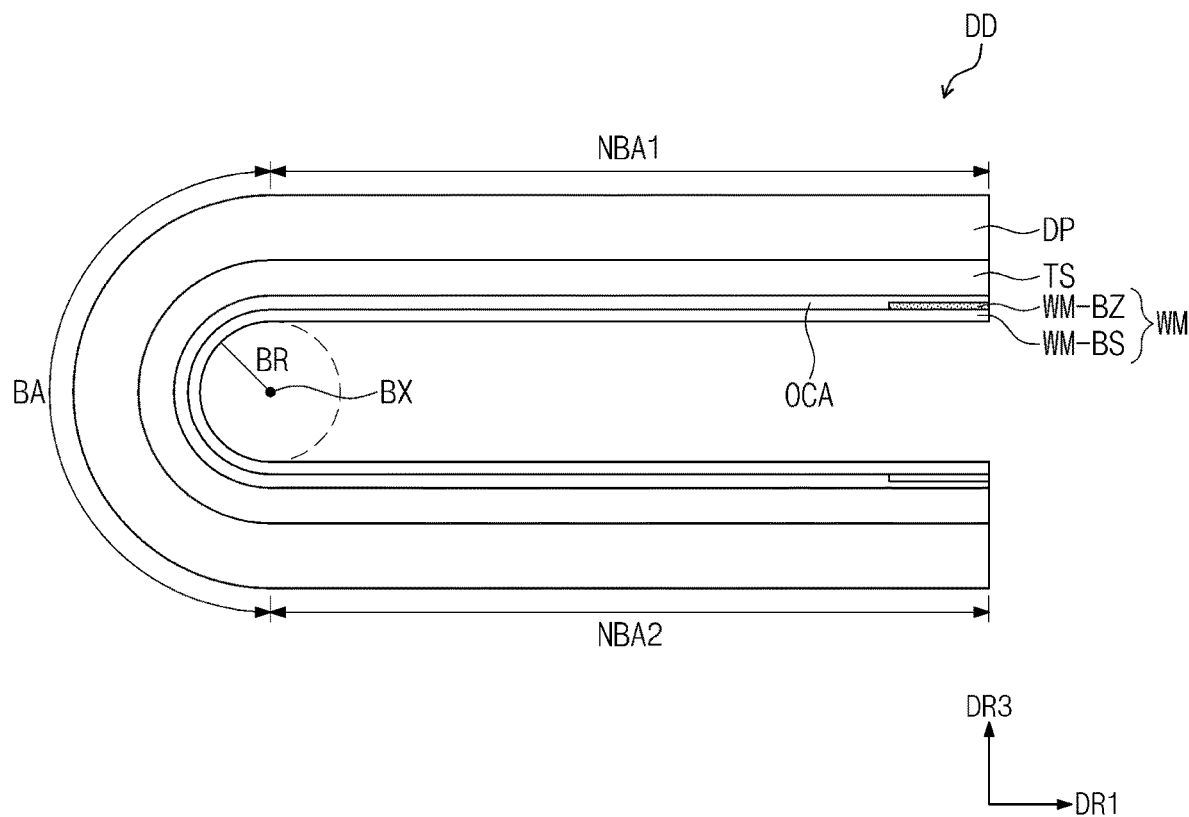
FIG. 30B is a cross-sectional view showing a flexible display device in a second operation according to an exemplary embodiment of the present disclosure.
Figure 30C:
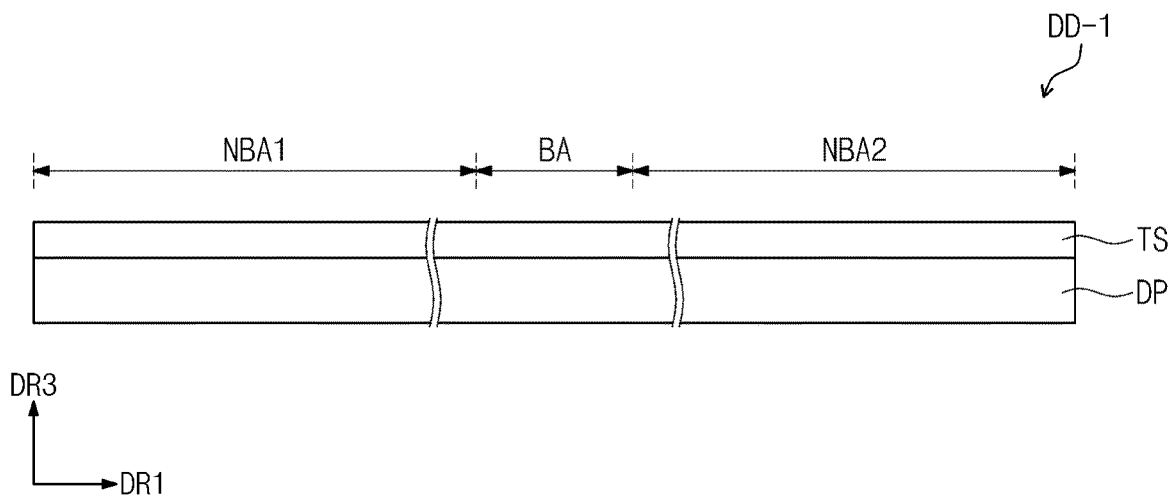
FIGS. 30C, 30D, and 30E are cross-sectional views showing a display device according to an exemplary embodiment of the present disclosure.
Figure 30D:
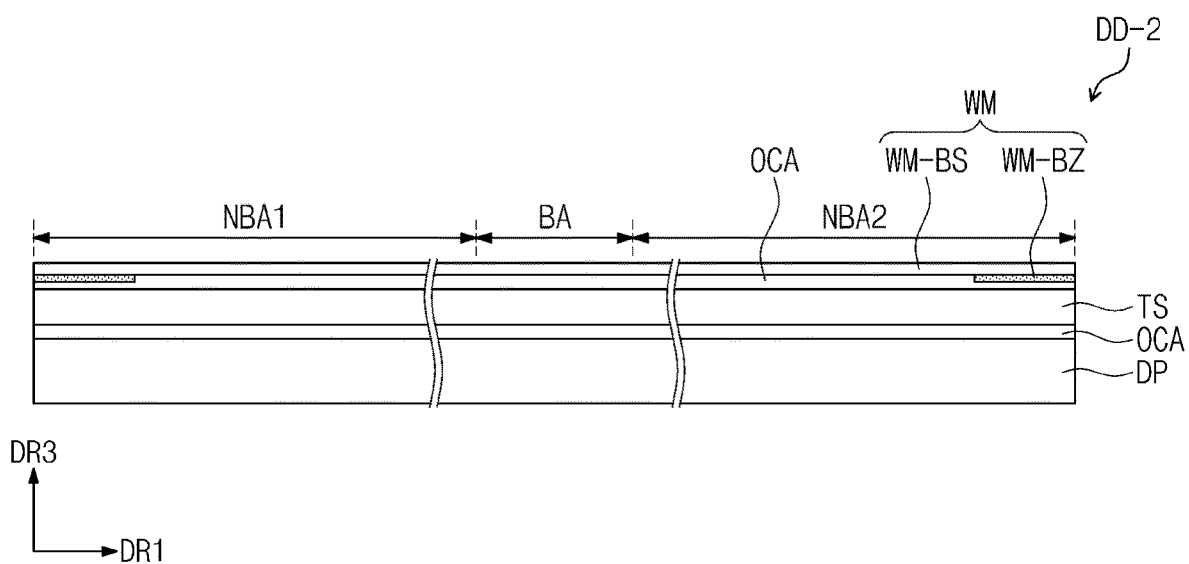
Figure 30E:
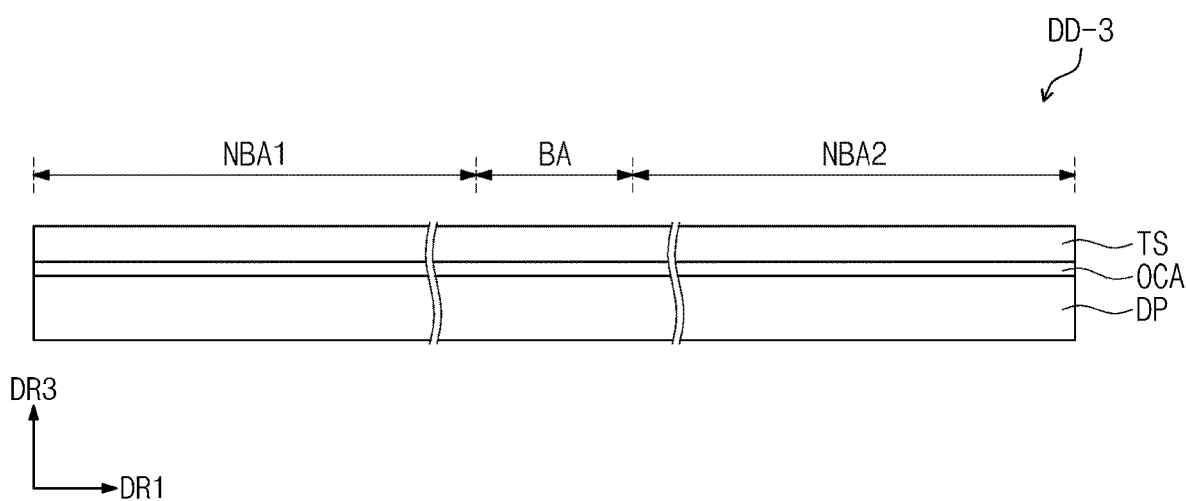

FIG. 30A is a cross-sectional view showing a flexible display device in a first operation according to an exemplary embodiment of the present disclosure. FIG. 30B is a cross-sectional view showing a flexible display device in a second operation according to an exemplary embodiment of the present disclosure. FIGS. 30C, 30D, and 30E are cross-sectional views showing a display device according to an exemplary embodiment of the present disclosure. In FIGS. 30A, 30B, 30C, 30D, and 30E, detailed descriptions of the same elements as those described above will be omitted.

Referring to FIGS. 30A and 30B, a display device DD according to the present exemplary embodiment may include a display panel DP, a touch screen TS, and a window member WM. In the present exemplary embodiment, the touch screen TS may be manufactured with the display panel through successive processes. The touch screen TS may include color filters. The window member WM may be coupled to the touch screen TS by an optically clear adhesive OCA.

FIGS. 30C, 30D, and 30E show flexible display devices DD-1, DD-2, and DD-3 according to an exemplary embodiment different from the flexible display device shown in FIGS. 30A and 30B. As shown in FIG. 30C, the window member WM may be omitted. The window member WM may be integrally formed with the touch screen TS. In this case, the touch screen TS may include at least one hard coating layer to enhance a surface strength thereof. As shown in FIGS. 30D and 30E, the touch screen TS may be coupled to the display panel DP by the optically clear adhesive OCA.

FIGS. 31A, 31B, 31C, and 31D are cross-sectional views showing a display device according to an exemplary embodiment of the present disclosure. Display panels DP, DP1, and DP2 are schematically shown in FIGS. 31A, 31b, 31C, and 31D. Hereinafter, similarities and differences between the display devices will be described with reference to FIGS. 31A, 31B, 31C, and 31D.

Figure 31A:
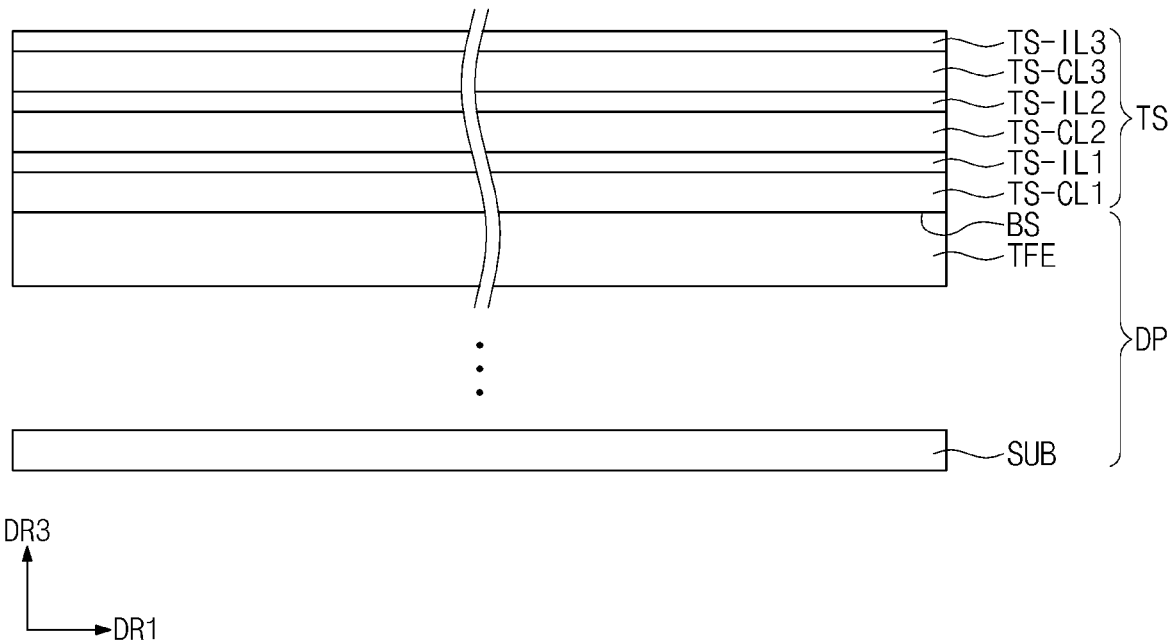
FIGS. 31A, 31B, 31C, and 31D are cross-sectional views showing a display device according to an exemplary embodiment of the present disclosure.
Figure 31B:
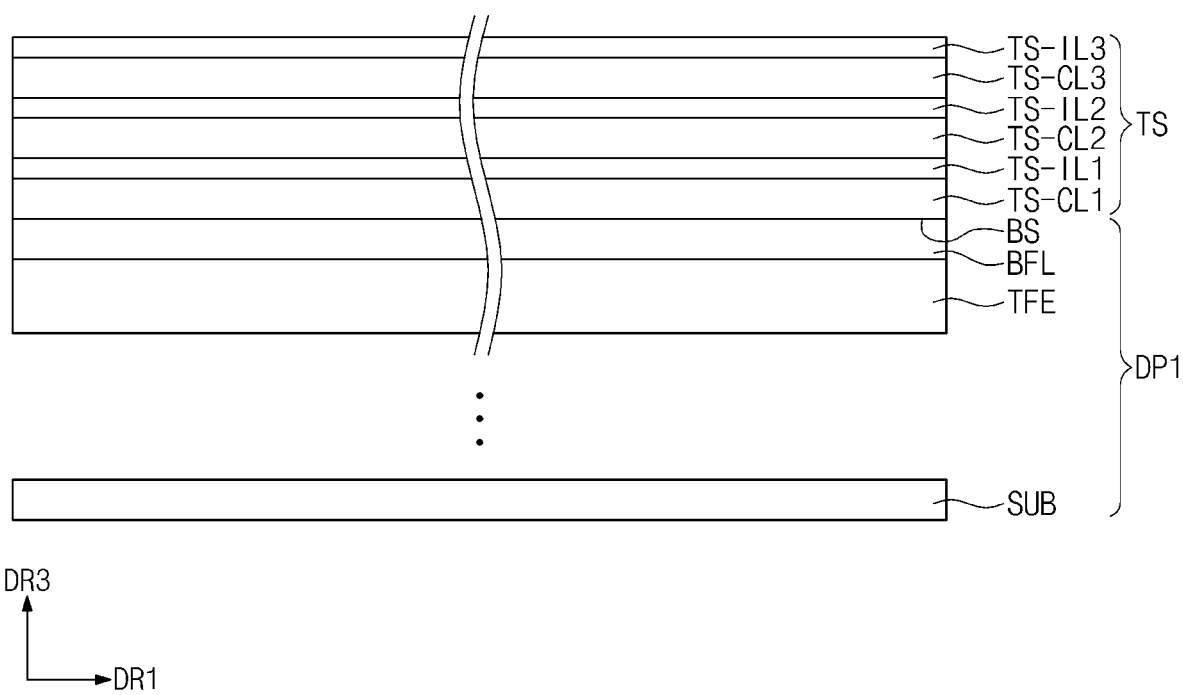

As shown in FIGS. 31A and 31B, a touch screen TS may include a first conductive layer TS-CL1, a first insulating layer TS-ILL a second conductive layer TS-CL2, a second insulating layer TS-IL2, a third conductive layer TS-CL3, and a third insulating layer TS-IL3. The touch screen TS may be directly disposed on each of the display panels DP and DP1. Each of the first conductive layer TS-CL1, the second conductive layer TS-CL2, and the third conductive layer TS-CL3 may have a single-layer structure or a multi-layer structure of layers stacked in a third direction DR3. The conductive layer having the multi-layer structure may include a transparent conductive layer and at least one metal layer. The transparent conductive layer may include indium tin oxide, indium zinc oxide, zinc oxide, indium tin zinc oxide, PEDOT, metal nanowire, and graphene. The metal layer may include at least one of molybdenum, silver, titanium, copper, and aluminum. In addition, the metal layer may include an alloy of at least one of molybdenum, silver, titanium, copper, and aluminum.

Each of the first conductive layer TS-CL1, the second conductive layer TS-CL2, and the third conductive layer TS-CL3 may include a plurality of patterns. Hereinafter, the first conductive layer TS-CL1 may include first conductive patterns, the second conductive layer TS-CL2 may include second conductive patterns, and the third conductive layer TS-CL3 may include third conductive patterns. The first conductive patterns may be a conductive layer (hereinafter, referred to as a noise shielding conductive layer) to shield a noise generated by the display panel DP. The noise shielding conductive layer may be a floating electrode layer or may receive a ground voltage. The second conductive patterns and the third conductive patterns may include touch electrodes and touch signal lines to sense an external input.

In the present exemplary embodiment, one insulating layer of the first and second insulating layers TS-IL1 and TS-IL2 includes at least a color filter layer. The color filter layer may include a plurality of color filters. The color filters may be an organic pattern formed by pigment or dye. The color filters may include a plurality of color filter groups. The color filters may include red color filters, green color filters, and blue color filters.

One insulating layer of the first and second insulating layers TS-IL1 and TS-IL2 may further include a black matrix. The black matrix may include an organic material as its base material. The black matrix may include a black pigment or dye.

In the present exemplary embodiment, each of the first insulating layer TS-IL1 and the second insulating layer TS-IL2 includes an inorganic material layer or an organic material layer. The inorganic material layer may be a planarization layer to provide a substantially flat surface. The inorganic material layer may include silicon oxide or silicon nitride. The organic material layer may include at least one of an acryl-based resin, a methacryl-based resin, a polyisoprene, a vinyl-based resin, an epoxy-based resin, an urethane-based resin, a cellulose-based resin, and a perylene-based resin.

In the present exemplary embodiment, the insulating layer TS-IL3 may further include a black matrix. The black matrix may include an organic material having high light absorbance as its base material. The black matrix may include substantially black pigment or dye.

In the present exemplary embodiment, the third insulating layer TS-IL3 may further include at least one of the inorganic material layer and the organic material layer. In particular, the third insulating layer TS-IL3 may include the organic material layer to provide a substantially flat surface. The inorganic material layer may include silicon oxide or silicon nitride. The organic material layer may include at least one of an acryl-based resin, a methacryl-based resin, a polyisoprene, a vinyl-based resin, an epoxy-based resin, an urethane-based resin, a cellulose-based resin, and a perylene-based resin. In the present exemplary embodiment, at least one of the first, second, and third insulating layers TS-IL1, TS-IL2, and TS-IL3 may further include a hard coating layer. Accordingly, the touch screen TS may replace the window member. In the present exemplary embodiment, the hard coating layer includes a silicon-based polymer, but it should not be limited thereto or thereby.

As shown in FIG. 31A, the first conductive layer TS-CL1 may be disposed on a thin film encapsulation layer TFE. In other words, the thin film encapsulation layer TFE may provide a base surface BS on which the touch screen TS may be disposed.

The display panel DP1 shown in FIG. 31B may further include a buffer layer BFL disposed on the thin film encapsulation layer TFE when compared with the display panel DP shown in FIG. 31A. The buffer layer BFL may provide the base surface BS. The buffer layer BFL may be an organic layer and may include any material determined in accordance with its purpose. The buffer layer BFL may be an organic layer and/or an inorganic layer to match a refractive index.

Figure 31C:
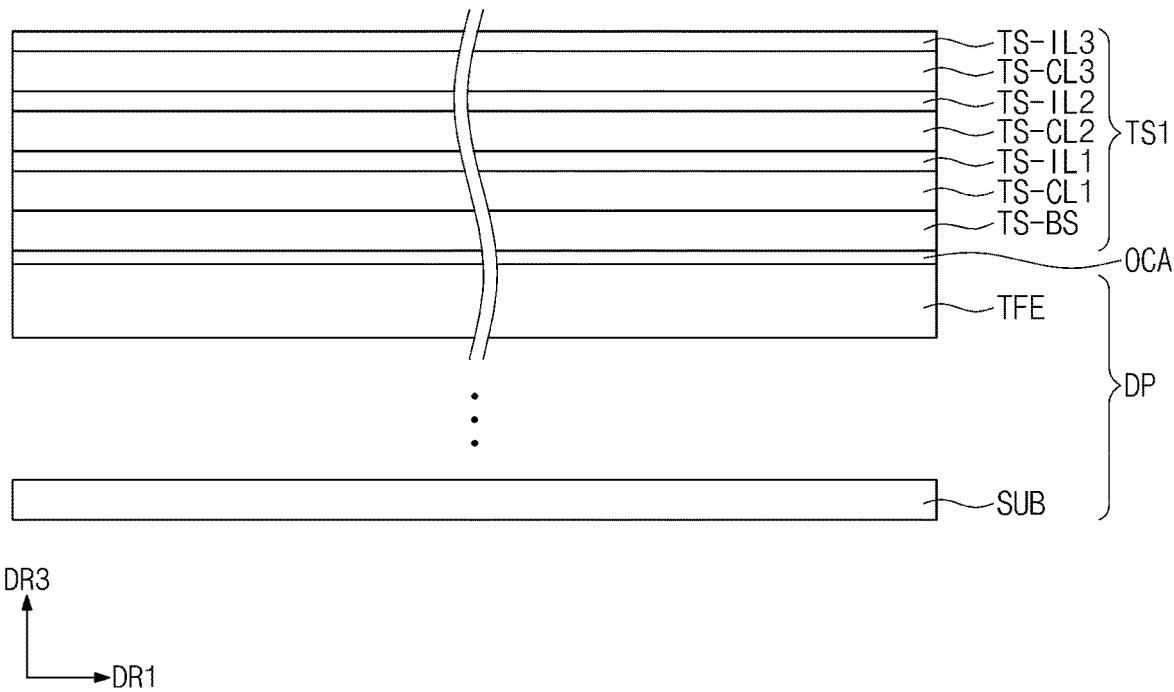

As shown in FIG. 31C, a touch screen TS1 may be coupled to the display panel DP by an optically clear adhesive OCA. The touch screen TS1 may further include a base member TS-BS on which a first conductive layer TS-CL1 and a first insulating layer TS-IL1 may be disposed.

Figure 31D:
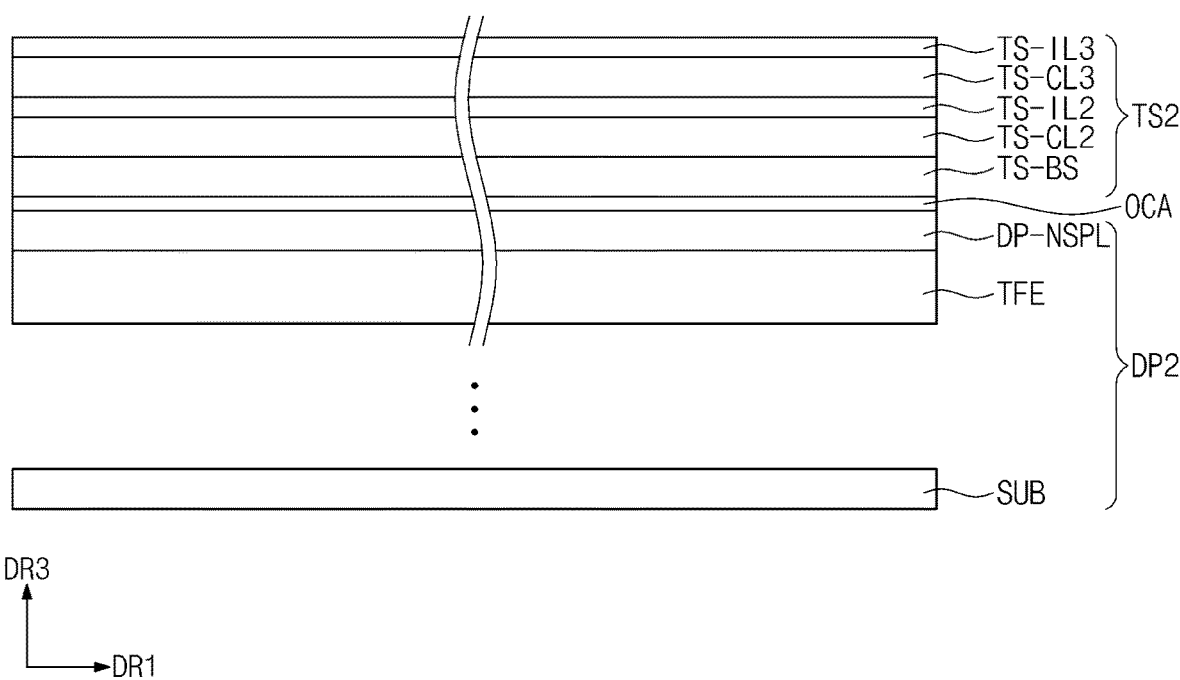

As shown in FIG. 31D, a touch screen TS2 may include second and third conductive layers TS-CL2 and TS-CL3, and each of the second and third conductive layers TS-CL2 and TS-CL3 may include touch electrodes and touch signal lines. The first conductive layer TS-CL1 shielding the noise is omitted from the touch panel TS2, and the display panel DP2 further may include a noise shielding conductive layer DP-NSPL. The noise shielding conductive layer DP-NSPL may be disposed on the thin film encapsulation layer TFE.

Figure 32A:
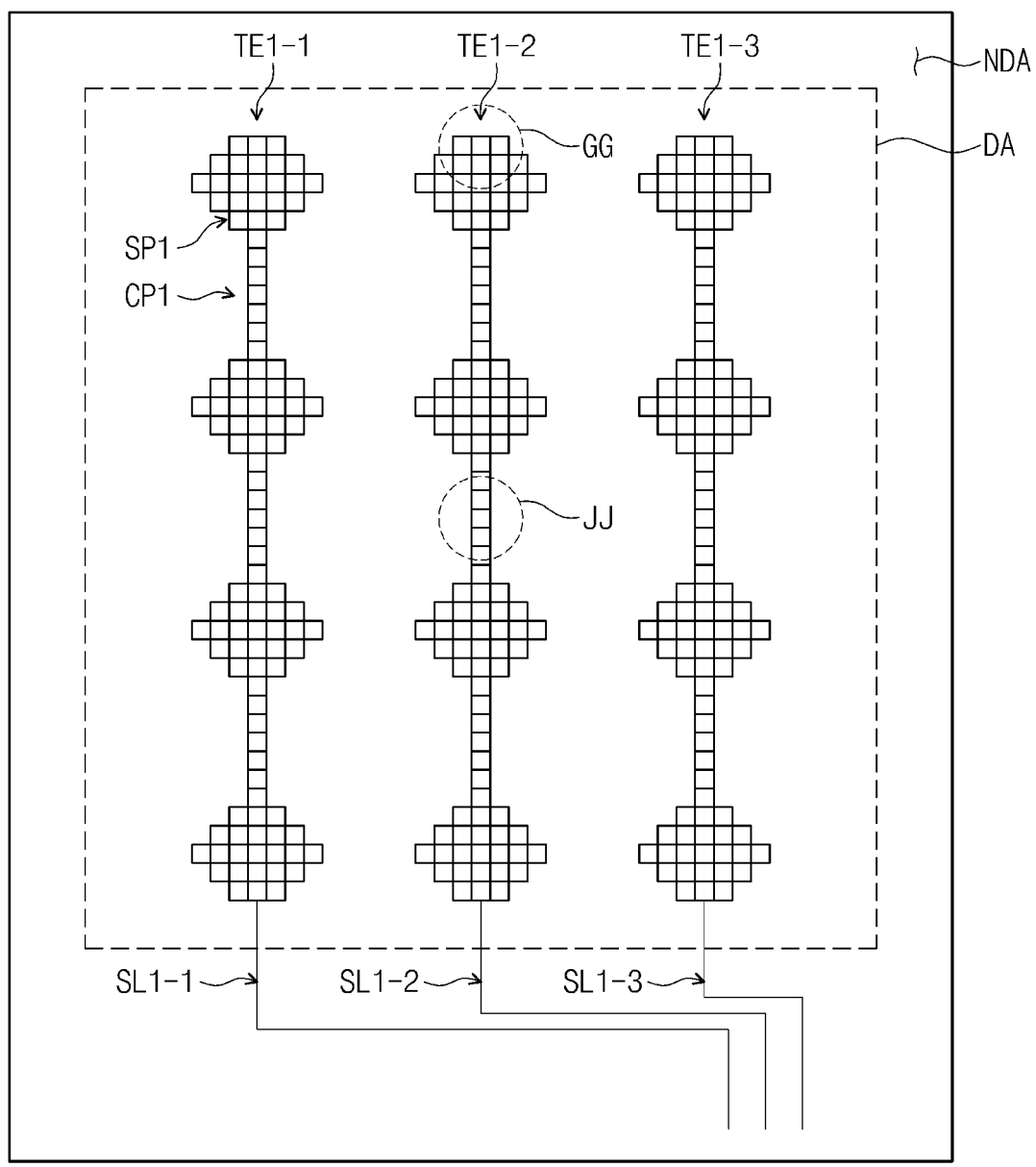
FIGS. 32A and 32B are plan views showing conductive layers of a touch screen according to an exemplary embodiment of the present disclosure.
Figure 32B:
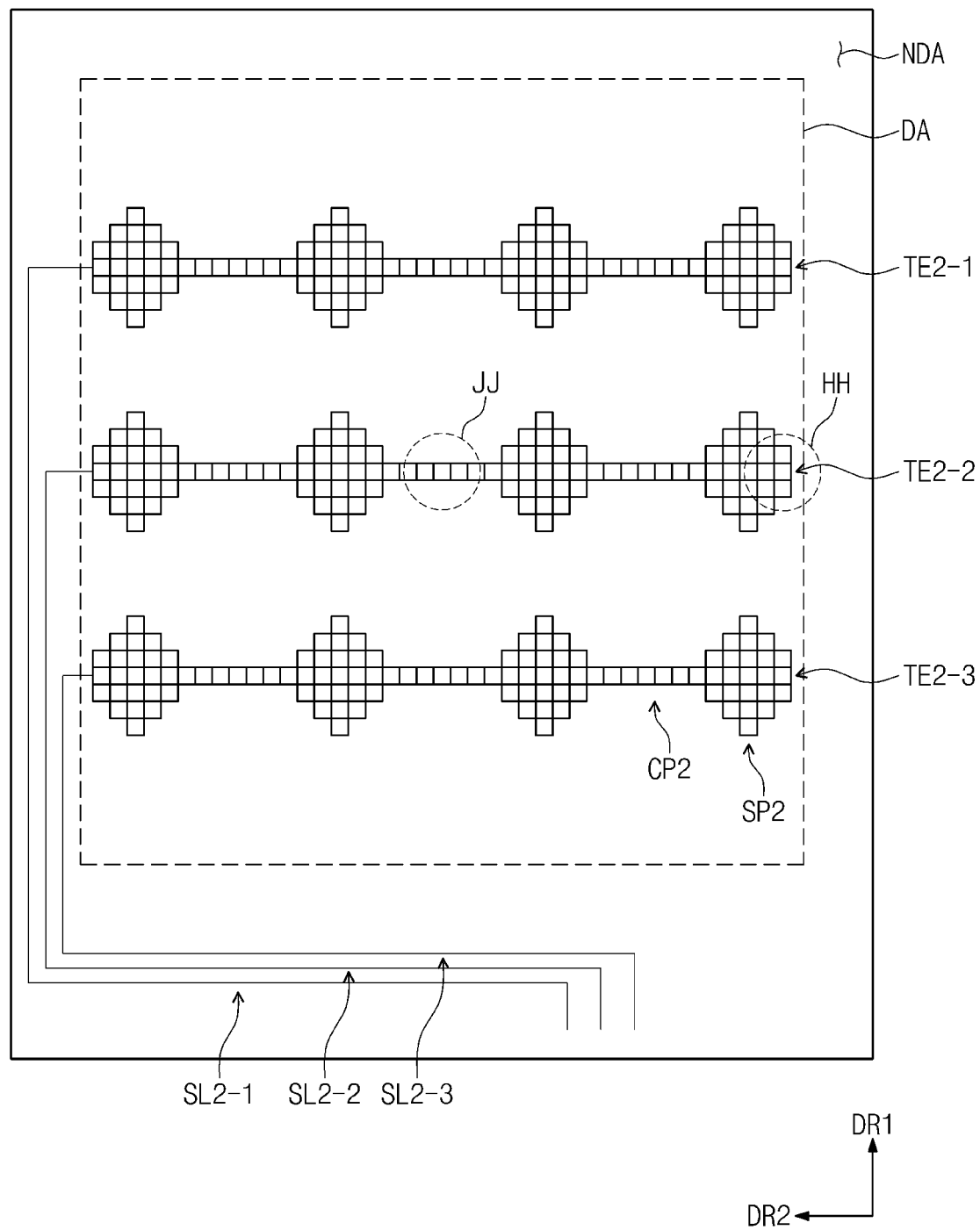
Figure 32C:
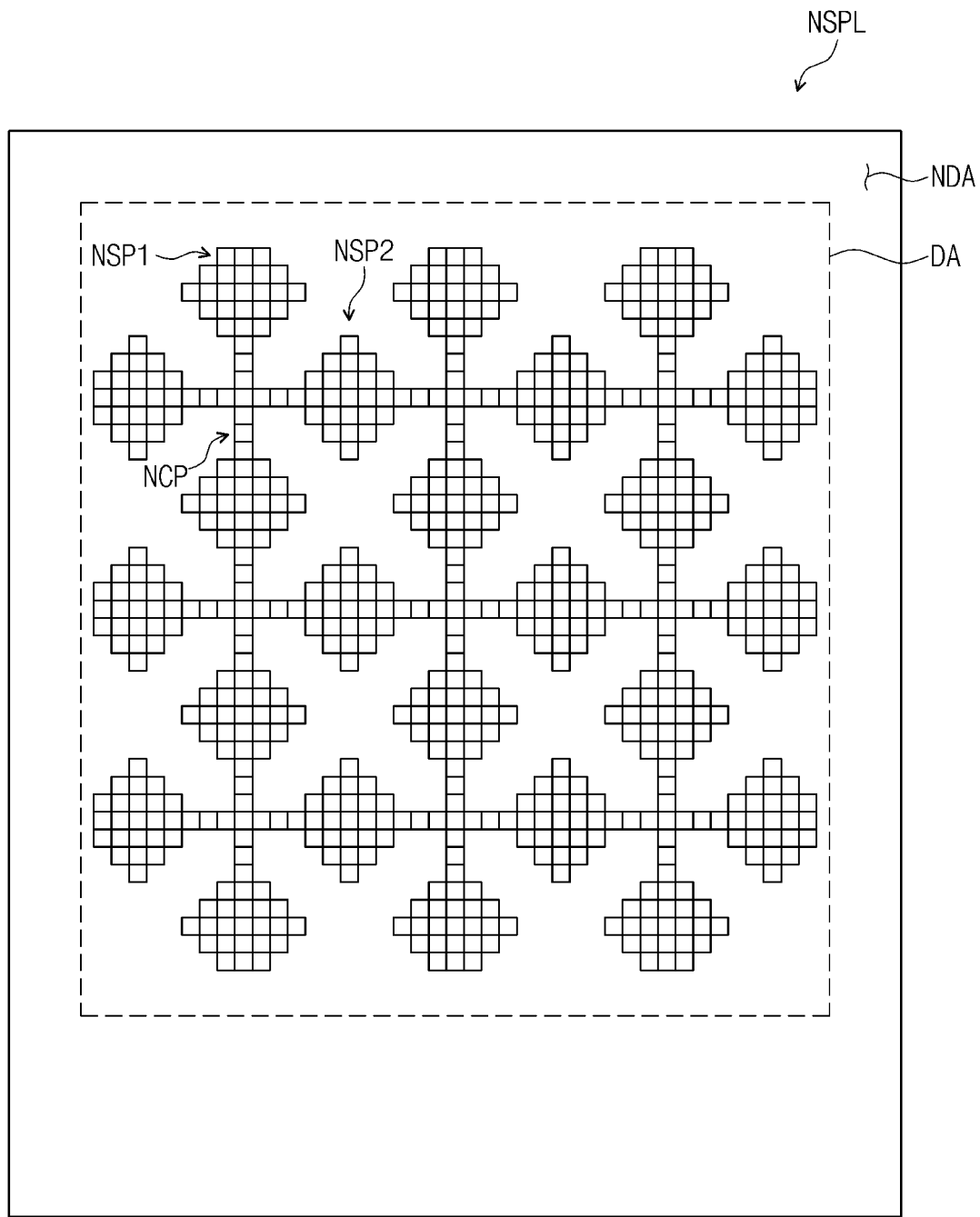
FIGS. 32C and 32D are plan views showing a noise shielding conductive layer of a touch screen according to an exemplary embodiment of the present disclosure.
Figure 32D:
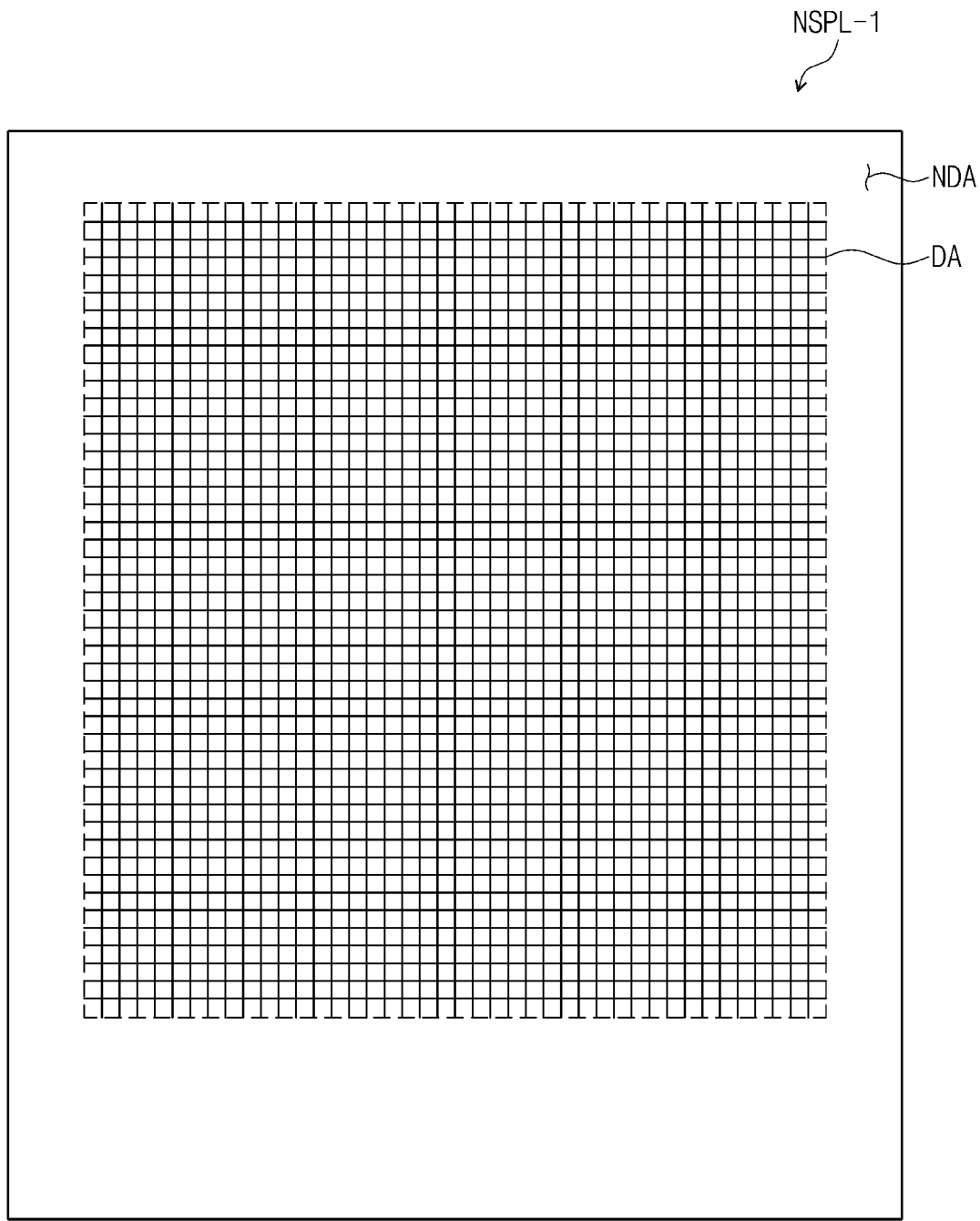

FIGS. 32A and 32B are plan views showing conductive layers of a touch screen according to an exemplary embodiment of the present disclosure. FIGS. 32C and 32D are plan views showing a noise shielding conductive layer of a touch screen according to an exemplary embodiment of the present disclosure.

In the present exemplary embodiment, a two-layer electrostatic capacitive touch screen will be described in detail. The two-layer electrostatic capacitive touch screen may obtain coordinate information of a position at which a touch event occurs by a self-capacitance mode or a mutual capacitance mode, but the driving method of obtaining the coordinate information in the touch screen is not thereto.

As shown in FIG. 32A, first conductive patterns may include first touch electrodes TE1-1, TE1-2, and TE1-3 and first touch signal lines SL1-1, SL1-2, and SL1-3. For example, FIG. 32A shows three first touch electrodes TE1-1, TE1-2, and TE1-3 and first touch signal lines SL1-1, SL1-2, and SL1-3 connected to the three first touch electrodes TE1-1, TE1-2, and TE1-3.

The first touch electrodes TE1-1, TE1-2, and TE1-3 may extend in a first direction DR1 and may be arranged in a second direction DR2. Each of the first touch electrodes TE1-1, TE1-2, and TE1-3 may have a mesh shape through which a plurality of touch openings is defined. The touch openings may correspond to a plurality of light emitting areas PXA-R, PXA-G, and PXA-B (see to FIG. 5). The mesh shape will be described in detail later.

Each of the first touch electrodes TE1-1, TE1-2, and TE1-3 may include a plurality of first sensing parts SP1 and a plurality of first connecting parts CP1. The first sensing parts SP1 may be arranged in the first direction DR1. Each of the first connecting parts CP1 may connect two first sensing parts SP1 adjacent to each other among the first sensing parts SP1.

The first touch signal lines SL1-1, SL1-2, and SL1-3 may have the mesh shape. The first touch signal lines SL1-1, SL1-2, and SL1-3 may have the same layer structure as that of the first touch electrodes TE1-1, TE1-2, and TE1-3.

Referring to FIG. 32B, the second conductive patterns may include second touch electrodes TE2-1, TE2-2, and TE2-3 and second touch signal lines SL2-1, SL2-2, and SL2-3. For example, FIG. 32B shows three second touch electrodes TE2-1, TE2-2, and TE2-3 and the second touch signal lines SL2-1, SL2-2, and SL2-3 connected to the second touch electrodes TE2-1, TE2-2, and TE2-3.

The second touch electrodes TE2-1, TE2-2, and TE2-3 may be insulated from the first touch electrodes TE1-1, TE1-2, and TE1-3 while crossing the first touch electrodes TE1-1, TE1-2, and TE1-3. Each of the second touch electrodes TE2-1, TE2-2, and TE2-3 may have a mesh shape through which a plurality of touch openings may be defined.

Each of the second touch electrodes TE2-1, TE2-2, and TE2-3 may include a plurality of second sensing parts SP2 and a plurality of second connecting parts CP2. The second sensing parts SP2 may be arranged in the second direction DR2. Each of the second connecting parts CP2 may connect two second sensing parts SP2 adjacent to each other among the second sensing parts SP2.

The second touch signal lines SL2-1, SL2-2, and SL2-3 may have the mesh shape. The second touch signal lines SL2-1, SL2-2, and SL2-3 may have the same layer structure as that of the second touch electrodes TE2-1, TE2-2, and TE2-3.

The first touch electrodes TE1-1, TE1-2, and TE1-3 may be capacitively coupled to the second touch electrodes TE2-1, TE2-2, and TE2-3. When sensing signals are applied to the first touch electrodes TE1-1, TE1-2, and TE1-3, capacitors may be formed between the first sensing parts SP1 and the second sensing parts SP2.

In the present exemplary embodiment, the connecting parts correspond to portions at which the first touch electrodes TE1-1, TE1-2, and TE1-3 cross the second touch electrodes TE2-1, TE2-2, and TE2-3, and the sensing parts correspond to portions at which the first touch electrodes TE1-1, TE1-2, and TE1-3 are not overlapped with the second touch electrodes TE2-1, TE2-2, and TE2-3. Each of the first touch electrodes TE1-1, TE1-2, and TE1-3 and each of the second touch electrodes TE2-1, TE2-2, and TE2-3 may have a bar shape with a predetermined width. However, the shapes of the first touch electrodes TE1-1, TE1-2, and TE1-3 and the second touch electrodes TE2-1, TE2-2, and TE2-3, which include the sensing part and the connecting part, are not limited thereto.

As shown in FIG. 32C, the noise shielding conductive layer NSPL may be overlapped with the first touch electrodes TE1-1, TE1-2, and TE1-3 and the second touch electrodes TE2-1, TE2-2, and TE2-3. For example, the noise shielding conductive layer NSPL includes first shielding parts NSP1 overlapped with the first sensing parts SP1, second shielding parts NSP2 overlapped with the second sensing parts SP2, and third shielding parts NCP overlapped with the first connecting parts CP1 and the second connecting parts CP2. The noise shielding conductive layer NSPL may have a mesh shape through which a plurality of shielding openings may be defined. The shielding openings may correspond to the light emitting areas PXA-R, PXA-G, and PXA-B (refer to FIG. 5). Each of the first shielding parts NSP1, the second shielding parts NSP1, and the third shielding parts NCP may be defined as mesh lines.

As shown in FIG. 32D, a noise shielding conductive layer NSPL-1 may have a shape irrelevant to that of the first touch electrodes TE1-1, TE1-2, and TE1-3 and the second touch electrodes TE2-1, TE2-2, and TE2-3. The noise shielding conductive layer NSPL-1 may have a quadrangular shape through which a plurality of shielding openings may be defined.

Figure 33A:
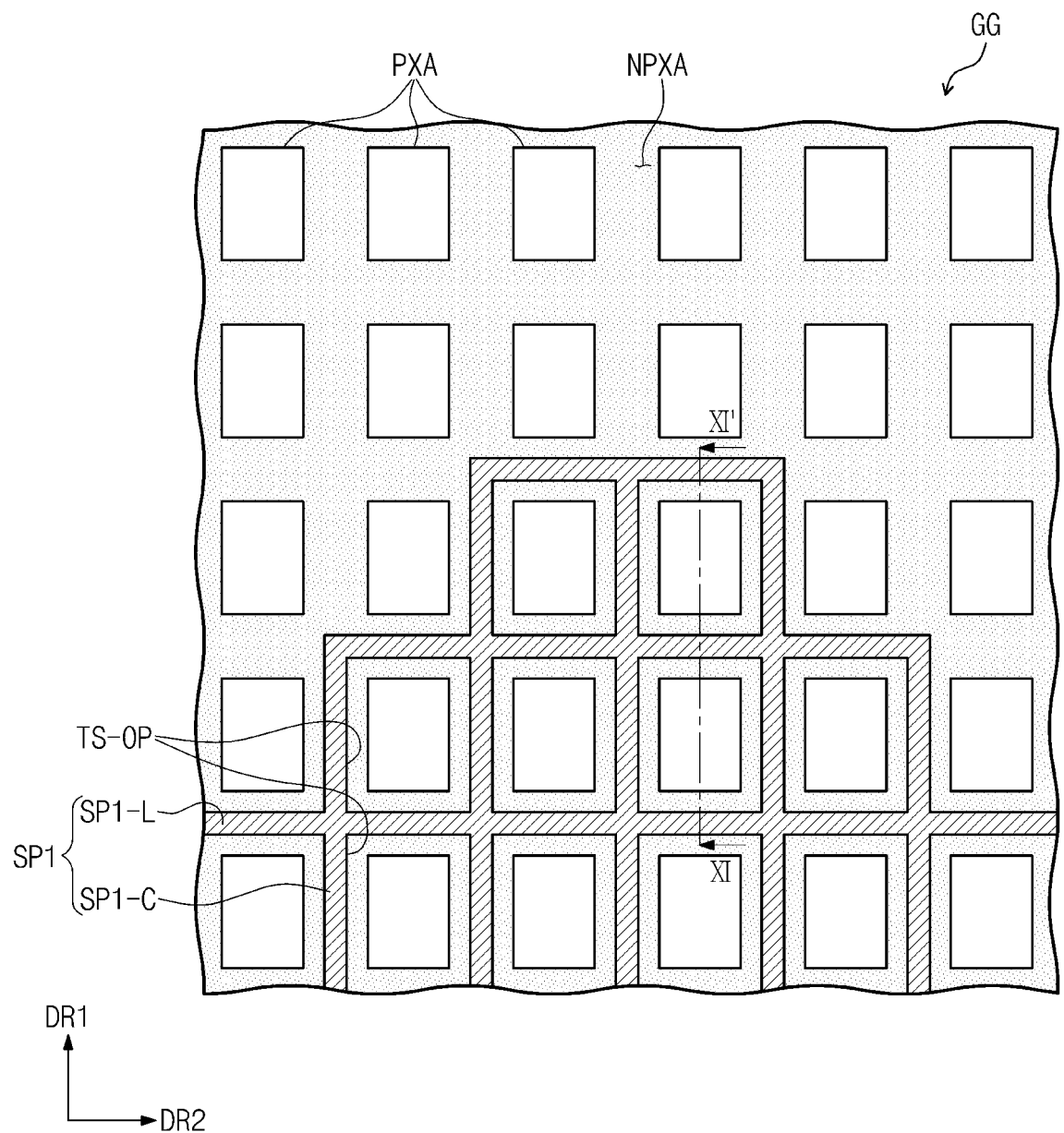
FIG. 33A is a partially enlarged view showing a portion "GG" of FIG. 32A.
Figure 34A:
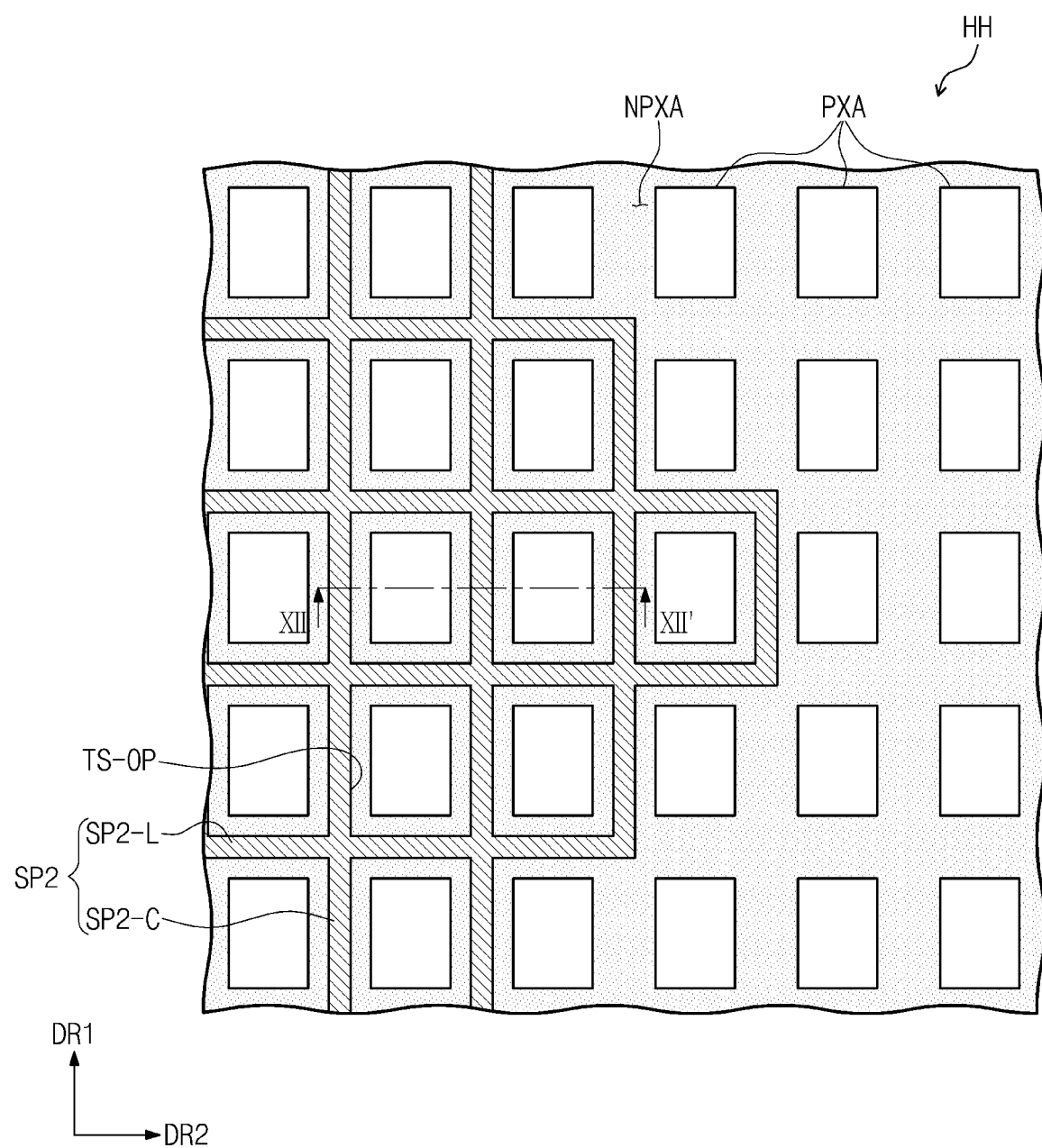
FIG. 34A is a partially enlarged view of a portion "HH" of FIG. 32B.
Figure 34B:
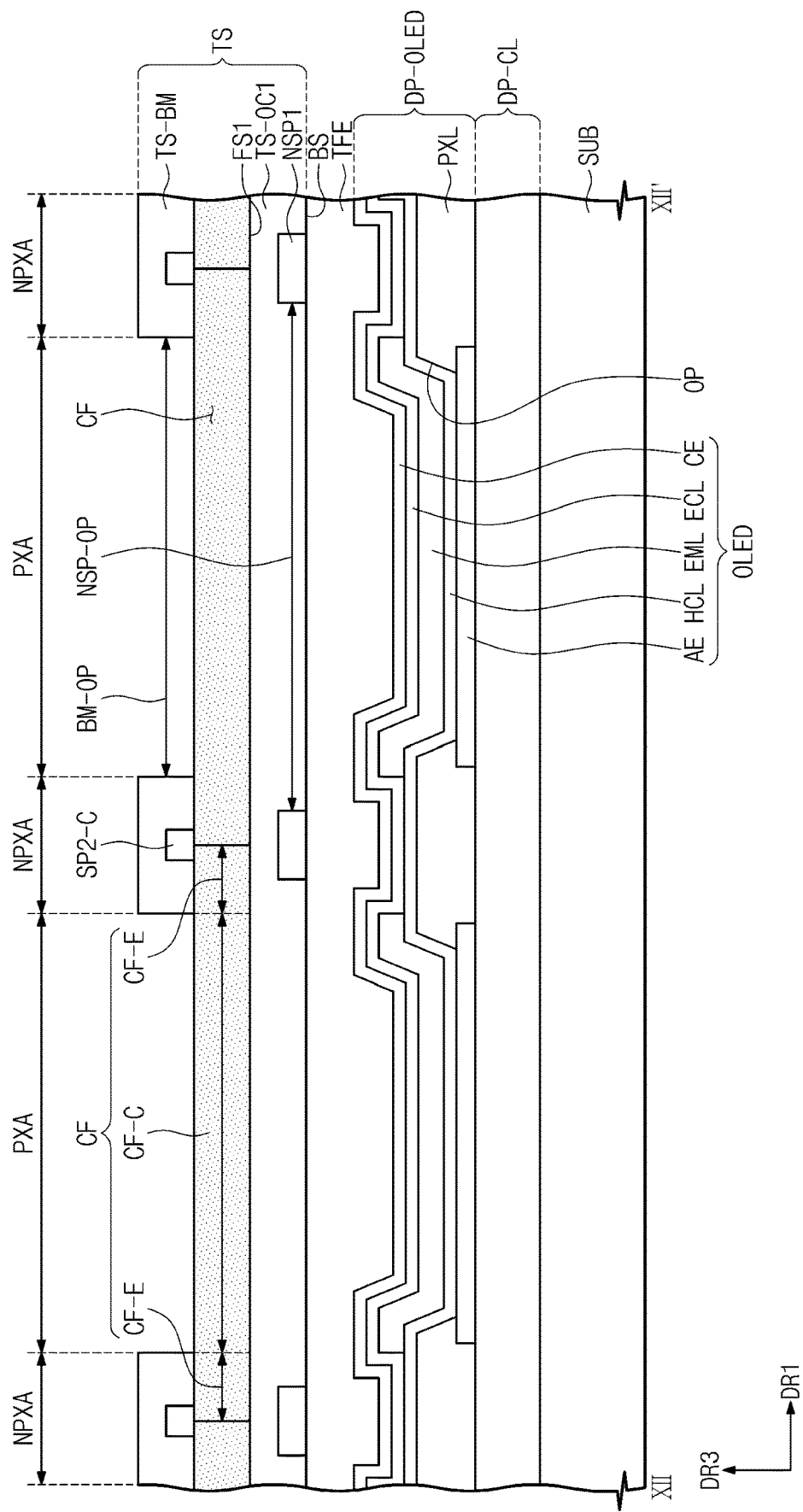
FIG. 34B is a cross-sectional view showing a portion of FIG. 34A according to an exemplary embodiment of the present disclosure along sectional line XII-XII'.
Figure 35A:
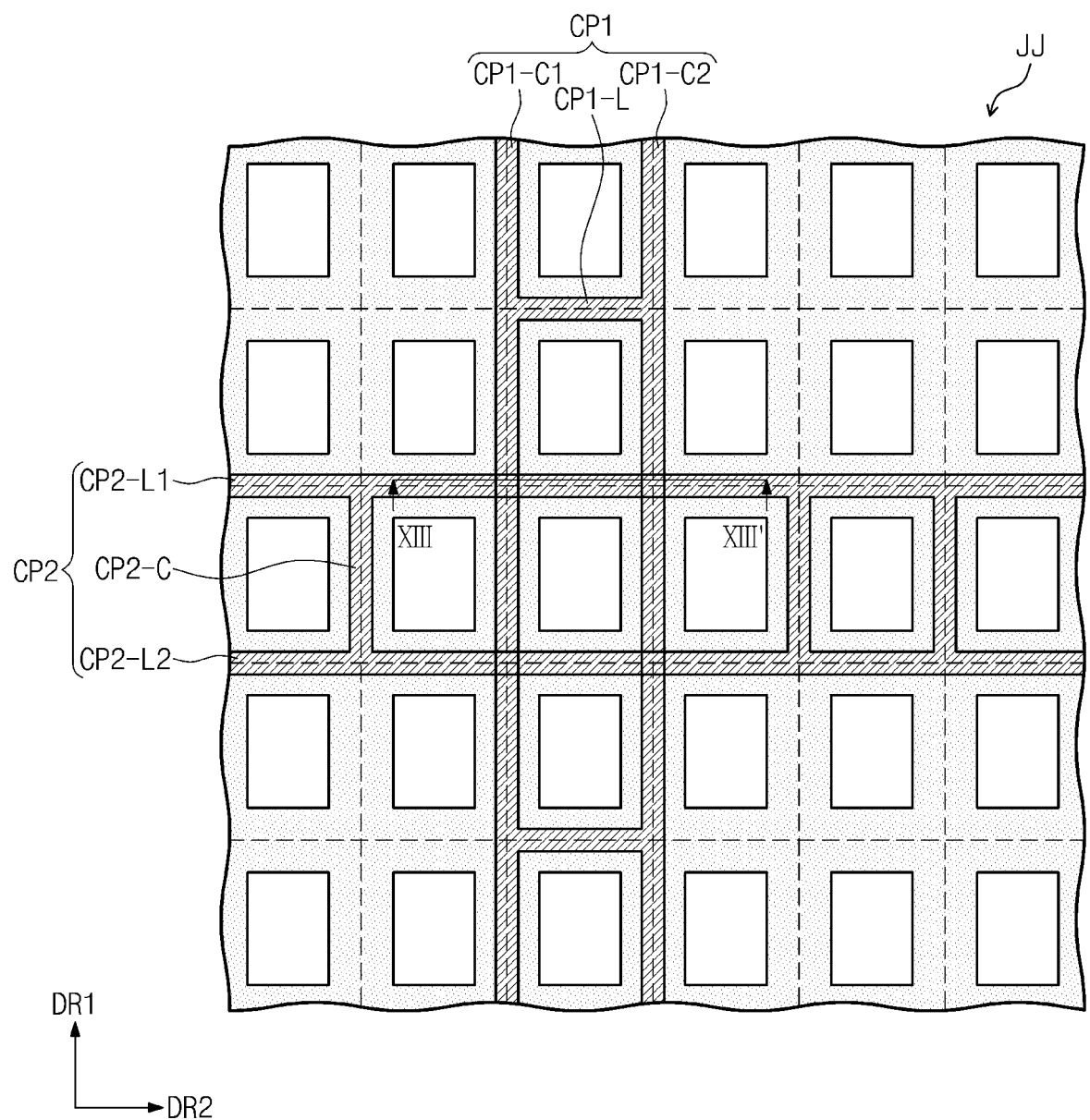
FIG. 35A is a partially enlarged view showing a portion "JJ" of FIGS. 32A and 32B.
Figure 35B:
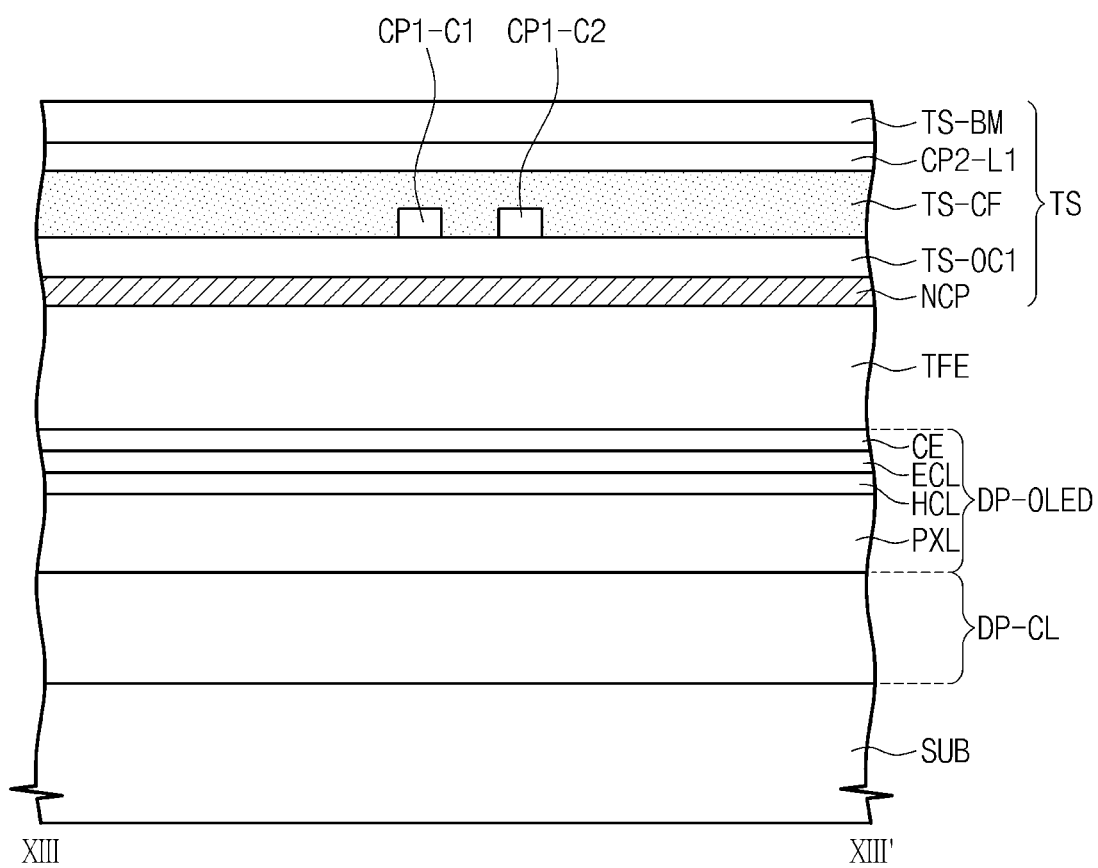
FIG. 35B is a cross-sectional view showing a portion of FIG. 35A along sectional line XIII-XIII'.

FIG. 33A is a partially enlarged view showing a portion "GG" of FIG. 32A. FIGS. 33B, 33C, 33D, 33E, 33F, 33G, 33H, 33I, and 33J are cross-sectional views showing a portion of FIG. 33A according to an exemplary embodiment of the present disclosure along line XI-XI'. FIG. 34A is a partially enlarged view of a portion "HH" of FIG. 32B. FIG. 34B is a cross-sectional view showing a portion of FIG. 34A according to an exemplary embodiment of the present disclosure along line XII-XII'. FIG. 35A is a partially enlarged view showing a portion "JJ" of FIGS. 32A and 32B. FIG. 35B is a cross-sectional view showing a portion of FIG. 35A along line XIII-XIII'. FIGS. 33B, 33C, 33D, 33E, 33F, 33G, 33H, 33I, 33J, 34B, and 35B show the cross-sectional views of the display device without the window member WM. The circuit layer DP-CL is schematically shown as a single layer in FIGS. 33B, 33E, 33F, 33G, 33H, 33I, 33J, 34B, and 35B.

As shown in FIG. 33A, a first sensing part SP1 may overlap with a non-light emitting area NPXA, which may be adjacent to the light emitting areas PXA. The first sensing part SP1 may include a plurality of first vertical portions SP1-C extending in a first direction DR1 and a plurality of first horizontal portions SP1-L extending in a second direction DR2. The first vertical portions SP1-C and the first horizontal portions SP1-L may be defined as mesh lines.

The first vertical portions SP1-C may be connected to the first horizontal portions SP1-L to form a plurality of touch openings TS-OP. In other words, the first sensing part SP1 may have the mesh shape defined by the touch openings TS-OP. In the present exemplary embodiment, the touch openings TS-OP correspond to the light emitting areas PXA in a one-to-one correspondence, but they are not limited thereto. One touch opening TS-OP may correspond to two or more light emitting areas PXA. That is, two or more light emitting areas PXA may be disposed inside the one touch opening TS-OP.

Figure 33B:
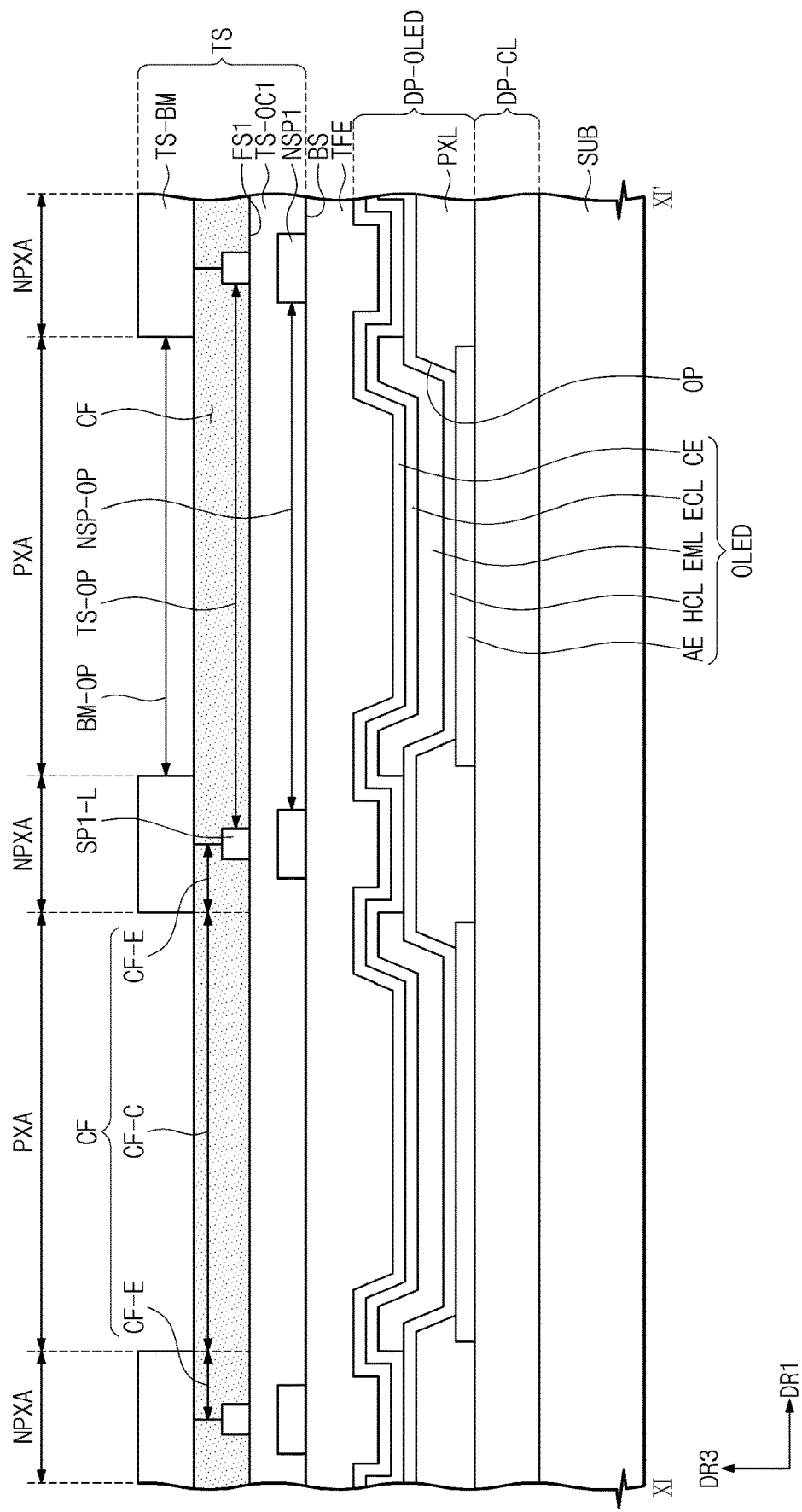
FIGS. 33B, 33C, 33D, 33E, 33F, 33G, 33H, 33I, and 33J are cross-sectional views showing a portion of FIG. 33A according to an exemplary embodiment of the present disclosure.

As shown in FIG. 33B, a thin film encapsulation layer TFE may provide a base surface BS. A first shielding part NSP1 may be disposed on the base surface BS to overlap with the non-light emitting area NPXA. The first shielding part NSP1 may have a mesh shape through which a shielding opening NSP-OP is defined.

A first over coating layer TS-OC1 may be disposed on the base surface BS to cover the first shielding part NSP1 and to provide a first substantially flat surface FS1. The first over coating layer TS-OC1 corresponds to the first insulating layer TS-IL1 described with reference to FIGS. 8A, 8B, and 8C and is an organic material layer.

The first sensing part SP1 may be disposed on the first over coating layer TS-OC1 and may overlap with the first shielding part NSP1. Color filters CF may be disposed above the first over coating layer TS-OC1 to cover the first sensing part SP1. The color filters CF may be disposed to correspond to the light emitting areas PXA, respectively. The color filters CF may be the organic material layer included in the second insulating layer TS-IL2 described with reference to FIGS. 31A, 31B, and 31C.

Each of the color filters CF may include a center portion CF-C and an edge portion CF-E. The center portion CF-C may overlap with a corresponding light emitting area among the light emitting areas PXA. The edge portion CF-E may extend from the center portion CF-C, overlap with the non-light emitting area NPXA, and cover a first horizontal portion SP1-L of the first sensing part SP1. Although not shown separately, when viewed in a plan view, the edge portion CF-E may surround the center portion CF-C in each of the color filters CF.

Among the color filters CF shown in the present exemplary embodiment, a left color filter is a red color filter, and a right color filter is a green color filter. The edge portion CF-E of each of color filters CF adjacent to each other may contact the first horizontal portion SP1-L and cover the first horizontal portion SP1-L. The edge portions CF-E of the color filters CF may partially cover the first horizontal portion SP1-L and may completely cover the first conductive pattern in cooperation with an adjacent color filters CF.

A black matrix TS-BM may be disposed on the color filters CF to overlap with the non-light emitting area NPXA. The black matrix TS-BM may be an organic material layer included in the third insulating layer TS-IL3 described with reference to FIGS. 31A, 31B, and 31C. As shown in FIG. 33B, the black matrix TS-BM may be directly disposed on the color filters CF. The black matrix TS-BM may include a plurality of transmitting openings BM-OP defined therethrough and which correspond to light emitting areas PXA.

The light emitting areas PXA may have substantially the same shape as that of the transmitting openings BM-OP when viewed in a plan view. In other words, the black matrix TS-BM may have substantially the same shape as that of the non-light emitting area NPXA. That is, the black matrix TS-BM may have the same widths as those of the non-light emitting area NPXA in the first and second directions DR1 and DR2. However, the present inventive concept is not limited thereto. That is, the light emitting areas PXA may have a shape different from that of the transmitting openings BM-OP. When viewed in a plan view, the first shielding part NSP1 and the first horizontal part SP1-L may be disposed inside the black matrix TS-BM.

The color filters CF may allow transmission of the light generated by an organic light emitting devices OLED and reduce the reflectance of the external light. In addition, an amount of the external light may be reduced to about ⅓ while passing through the color filters CF. A portion of the light may become extinct while passing through the color filters CF, and the light may be partially reflected by the organic light emitting device layer DP-OLED and the thin film encapsulation layer TFE. The reflected light may be incident to the color filters CF. An amount of the reflected light may be reduced to about ⅓ while passing through the color filters CF. Consequently, only a portion of the external light may be reflected by the display device.

Figure 33C:
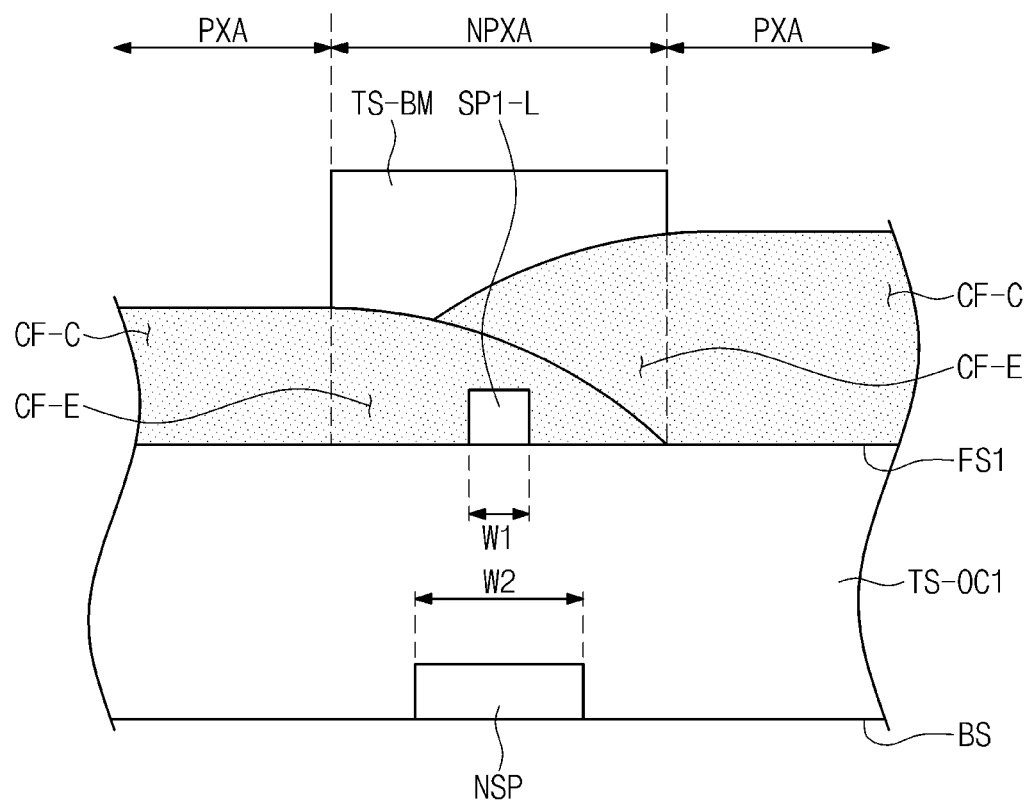
Figure 33D:
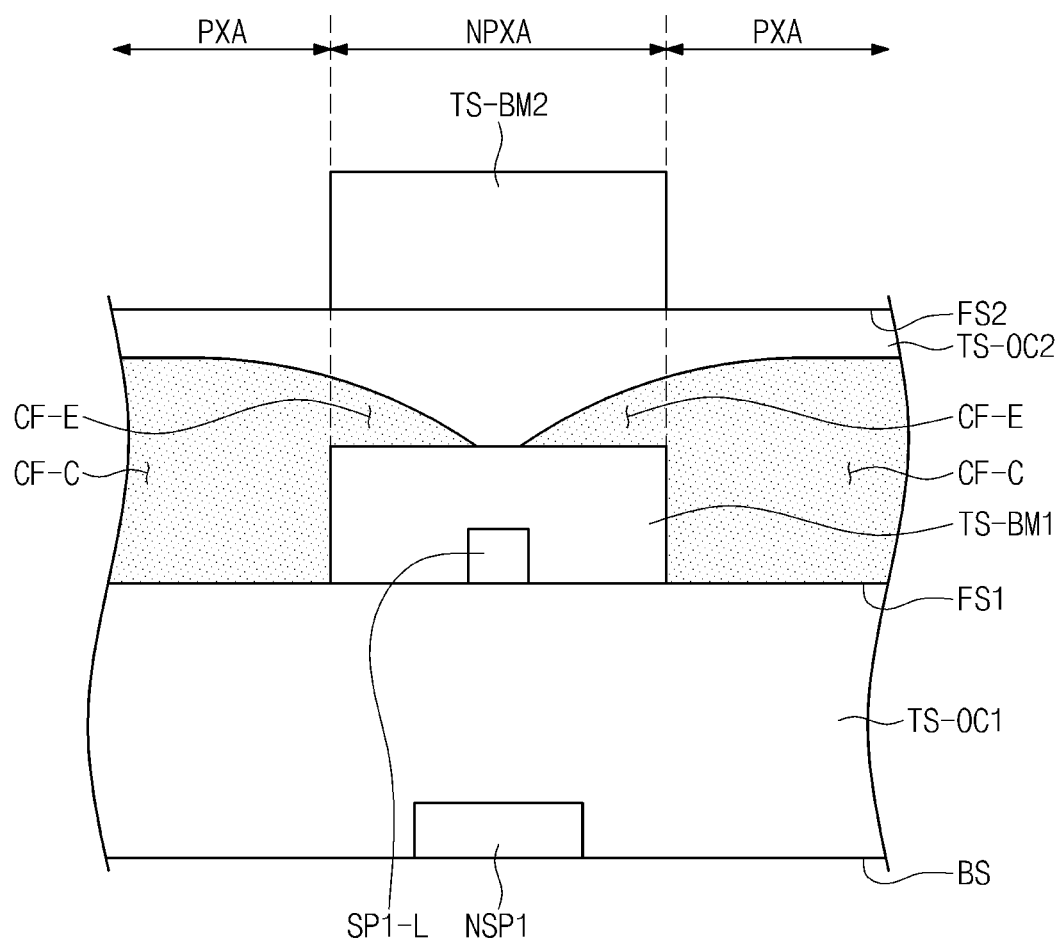

FIGS. 33C and 33D show the enlarged view of the non-light emitting area NPXA shown in FIG. 33B. In FIGS. 33C and 33D, components disposed under the base surface BS are not shown. As shown in FIG. 33C, the edge portion CF-E of the left color filter may completely cover the first horizontal portion SP1-L. The edge portion CF-E of the right color filter may be disposed on the edge portion CF-E of the left color filter. The shape of the boundary between the color filters disposed in the non-light emitting area NPXA may be changed in accordance with the order of forming the left and right color filters. The first horizontal portion SP1-L may have a first line width W1 and the first shielding part NSP1 may have a second line width W2 that is greater than the first line width W1. The first horizontal portion SP1-L may be disposed inside the first shielding part NSP1.

As shown in FIG. 33D, the first black matrix TS-BM1 may be disposed on the first flat surface FS1 and overlap with the first horizontal part SP1-L. The color filters may be disposed on the first flat surface FS1. The edge portion CF-E of the right color filter and the edge portion CF-E of the left color filter may partially expose the first black matrix TS-BM1. The edge portions CF-E of the color filters may be omitted. That is, the color filters may be disposed only inside the transmitting openings BM-OP of the black matrix TS-BM.

A second over coating layer TS-OC2 may be disposed on the left color filter and the right color filter. The second over coating layer TS-OC2 may provide a second flat surface FS2. The second over coating layer TS-OC2 may be the organic material layer included in the second insulating layer TS-IL2 described with reference to FIGS. 31A, 31B, and 31C.

Figure 33E:
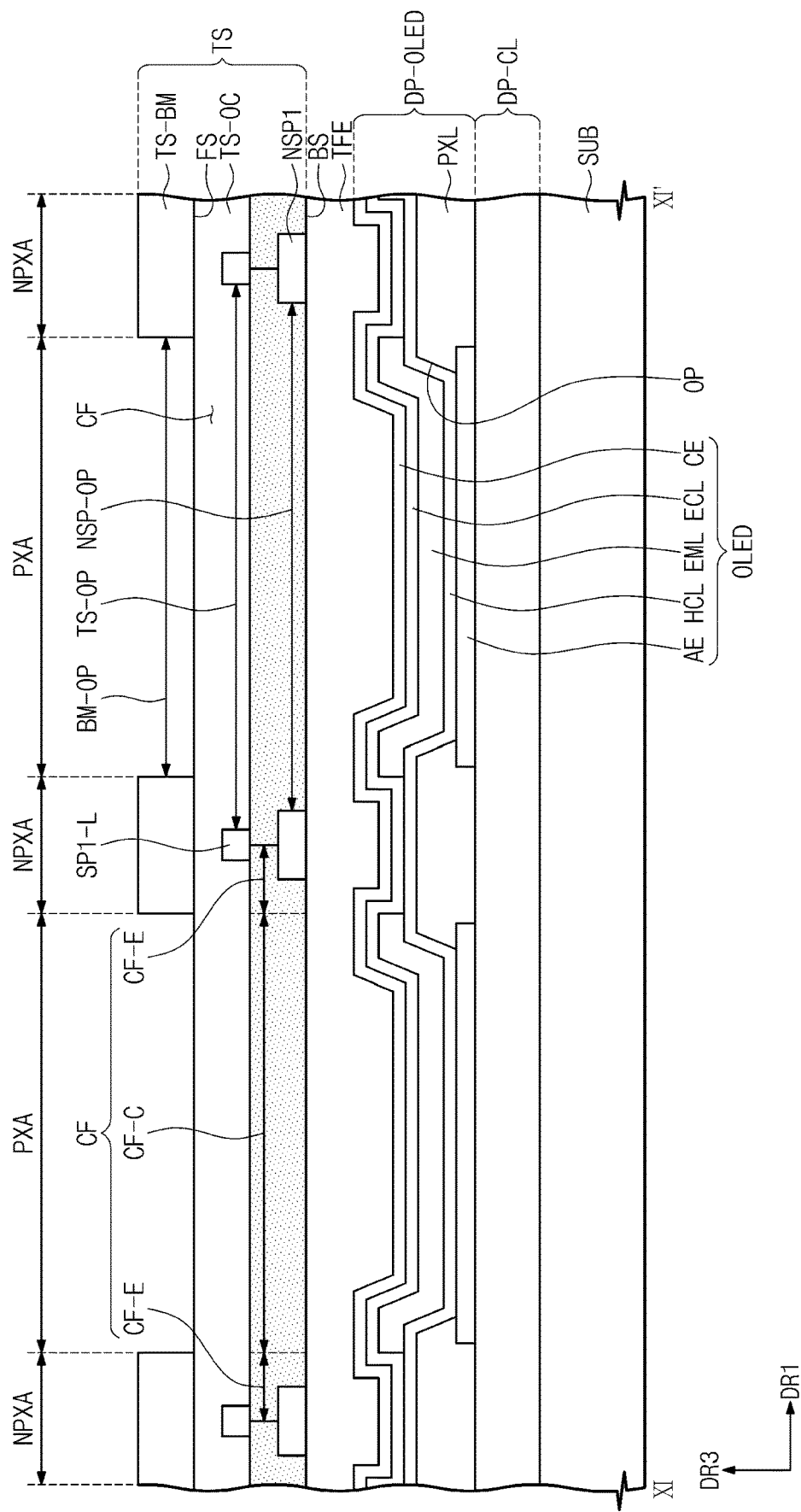

As shown in FIG. 33E, a first shielding part NSP1 may be disposed on a base surface BS to overlap with a non-light emitting area NPXA. Color filters CF may be disposed on the base surface BS to cover the first shielding part NSP1. A first horizontal part SP1-L may be disposed on the color filters CF. An over coating layer TS-OC may be disposed on the color filters CF. A black matrix TS-BM may be disposed on the flat surface FS of the over coating layer TS-OC. Additional over coating layer may be further disposed on the color filters CF.

Figure 33F:
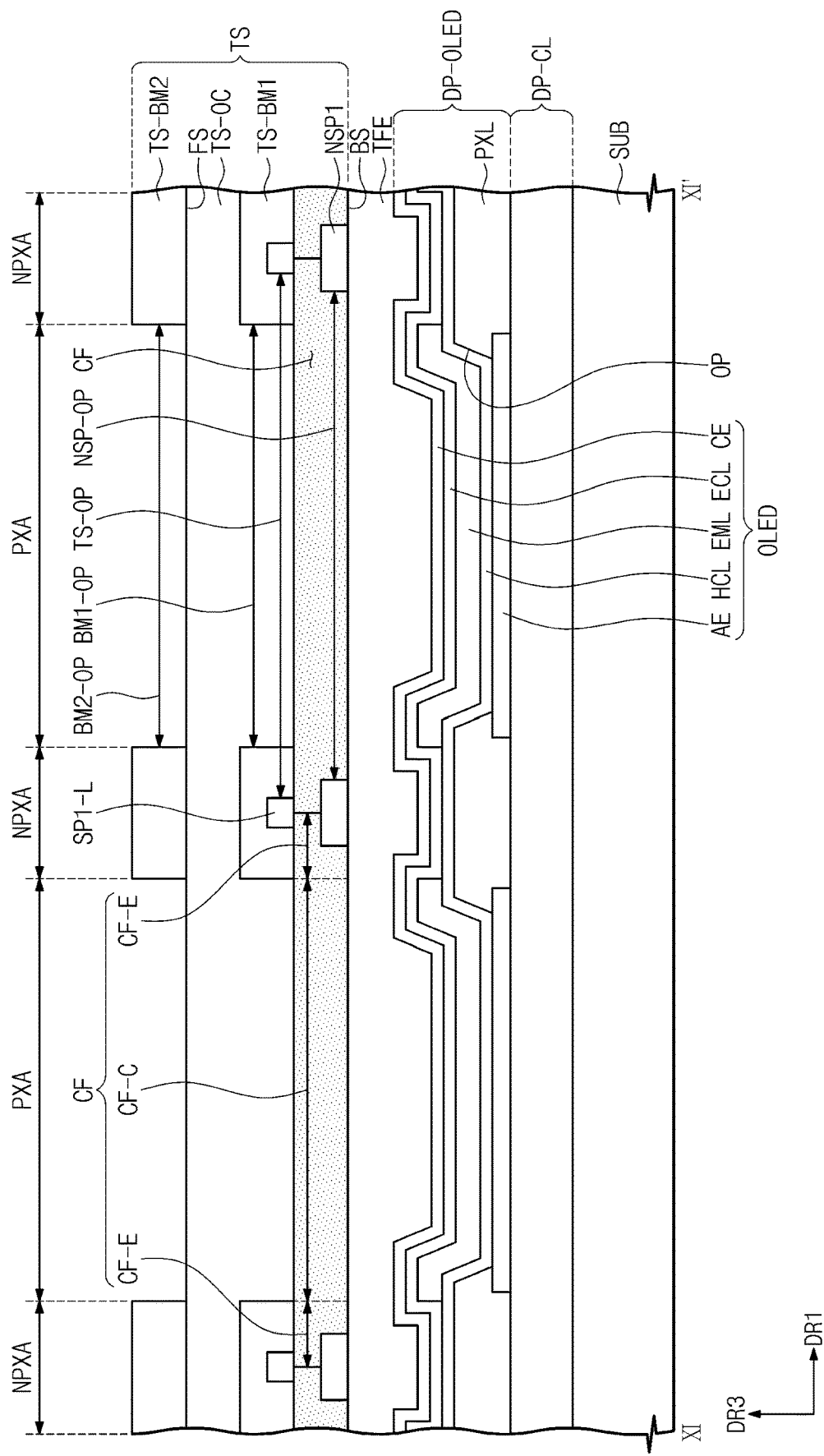

As shown in FIG. 33F, a first black matrix TS-BM1 may be disposed on color filters CF to cover a first horizontal part SP1-L. The first black matrix TS-BM1 may define first transmitting openings BM-OP1. An over coating layer TS-OC may be disposed on the color filters to cover the first black matrix TS-BM1. A second black matrix TS-BM2 may be disposed on the flat surface FS of the over coating layer TS-OC. The second black matrix TS-BM2 may define second transmitting openings BM-OP2.

Figure 33G:
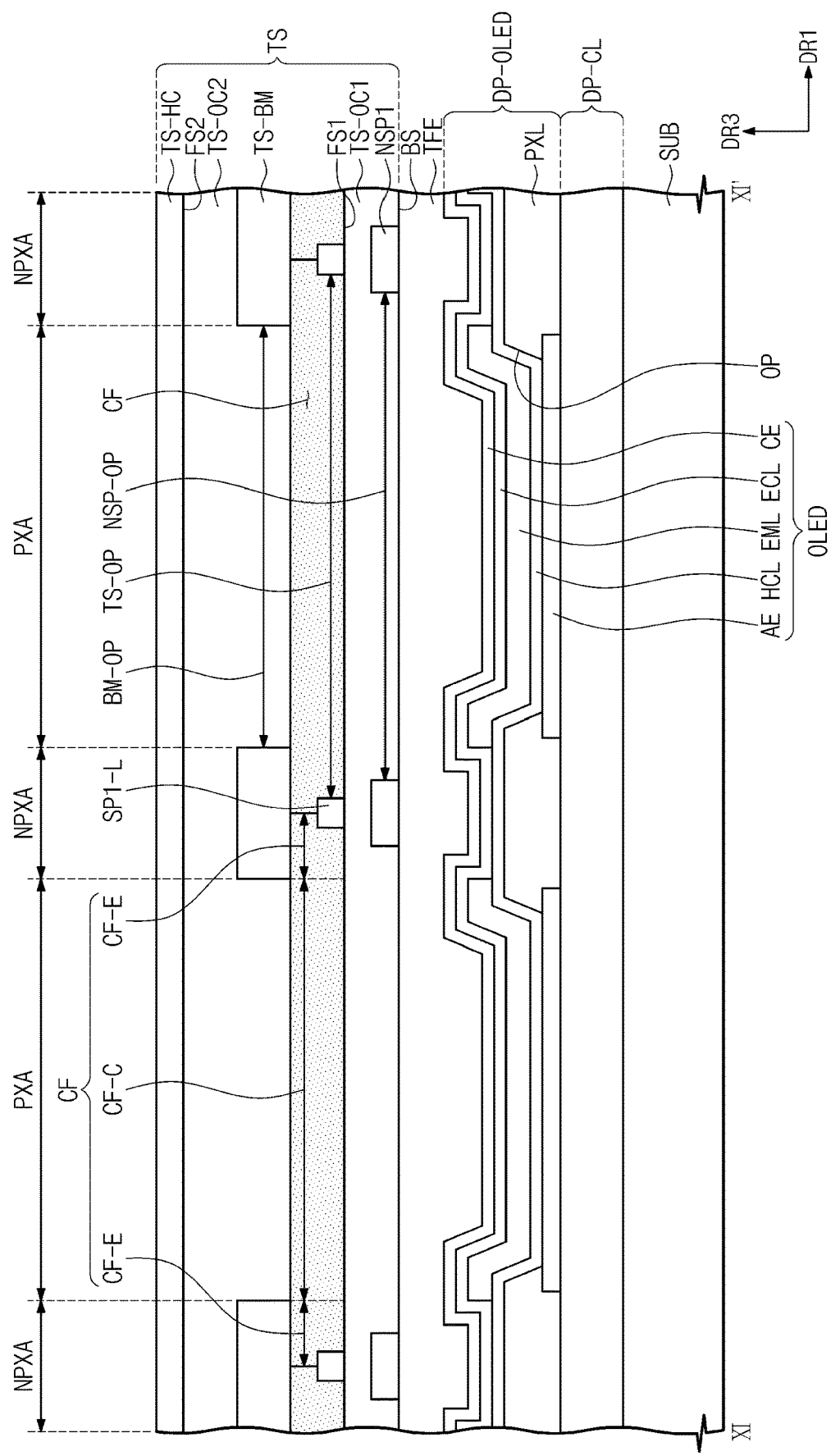
Figure 33H:
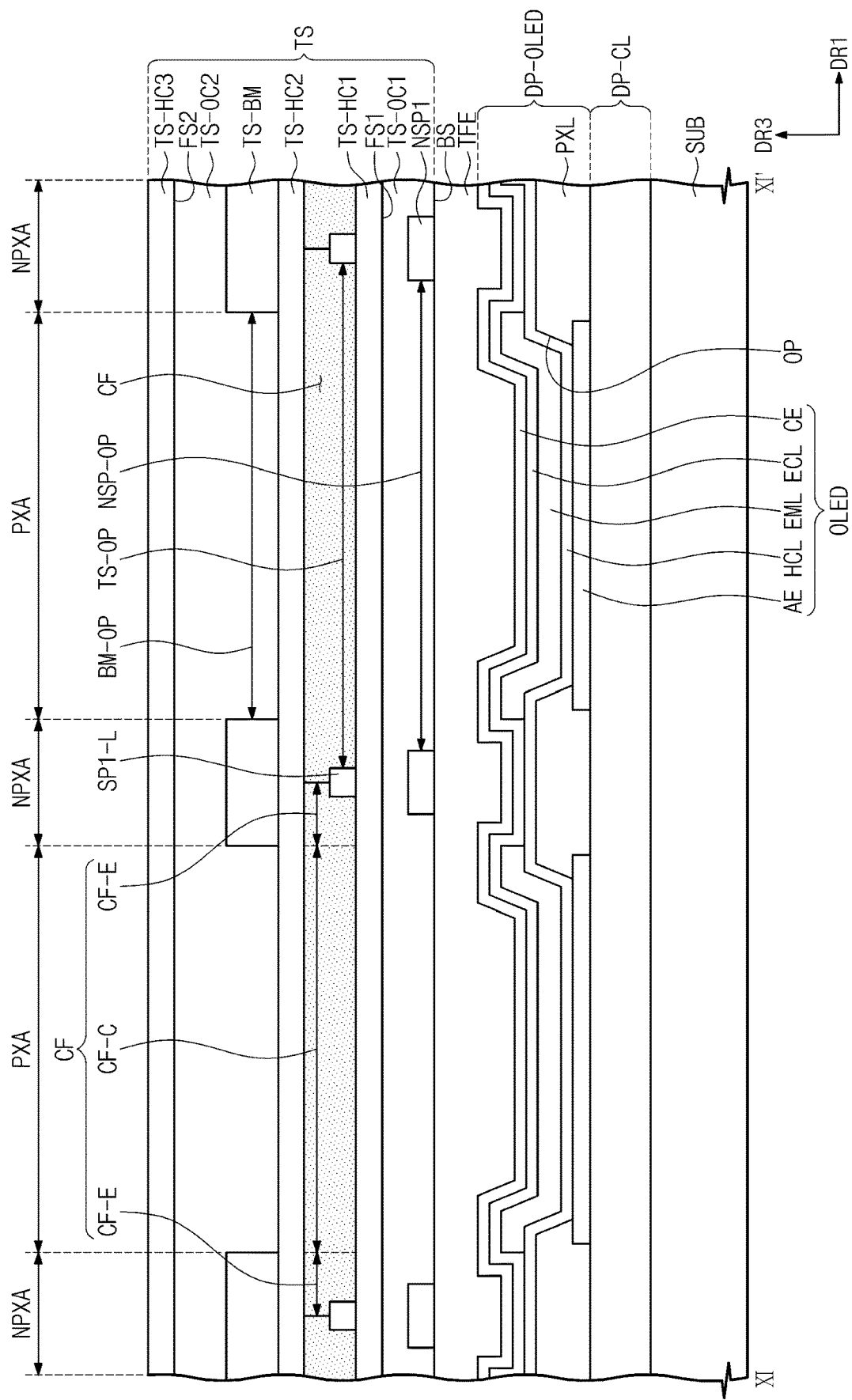

As shown in FIGS. 33G and 33H, a touch screen TS may further include at least one hard coating layer TS-HC, TS-HC1, TS-HC2, and TS-HC3. The touch screen TS shown in FIG. 33G may further include a second over coating layer TS-OC2 and a hard coating layer TS-HC disposed on a second flat surface FS2 when compared with the touch screen TS shown in FIG. 33B.

Due to the hard coating layer TS-HC disposed on second flat surface FS2, a hardness of the second over coating layer TS-OC may be enhanced, and thus the window member WM may be omitted. Since the window member WM may be integrally formed with the touch screen TS, the display device may become slimmer.

A touch screen TS shown in FIG. 33H may further include first, second, and third hard coating layers TS-HC1, TS-HC2, and TS-HC3. The first hard coating layer TS-HC1 may be disposed between a first over coating layer TS-OC1 and a color filter layer including color filters CF, the second hard coating layer TS-HC2 may be disposed between the color filter layer and a black matrix TS-BM, and the third hard coating layer TS-HC3 may be disposed at an uppermost position of the touch screen TS. The touch screen TS of FIGS. 33G and 33H may further include the hard coating layer when compared with the touch screen TS of FIG. 33B, but it is not limited thereto.

Figure 33I:
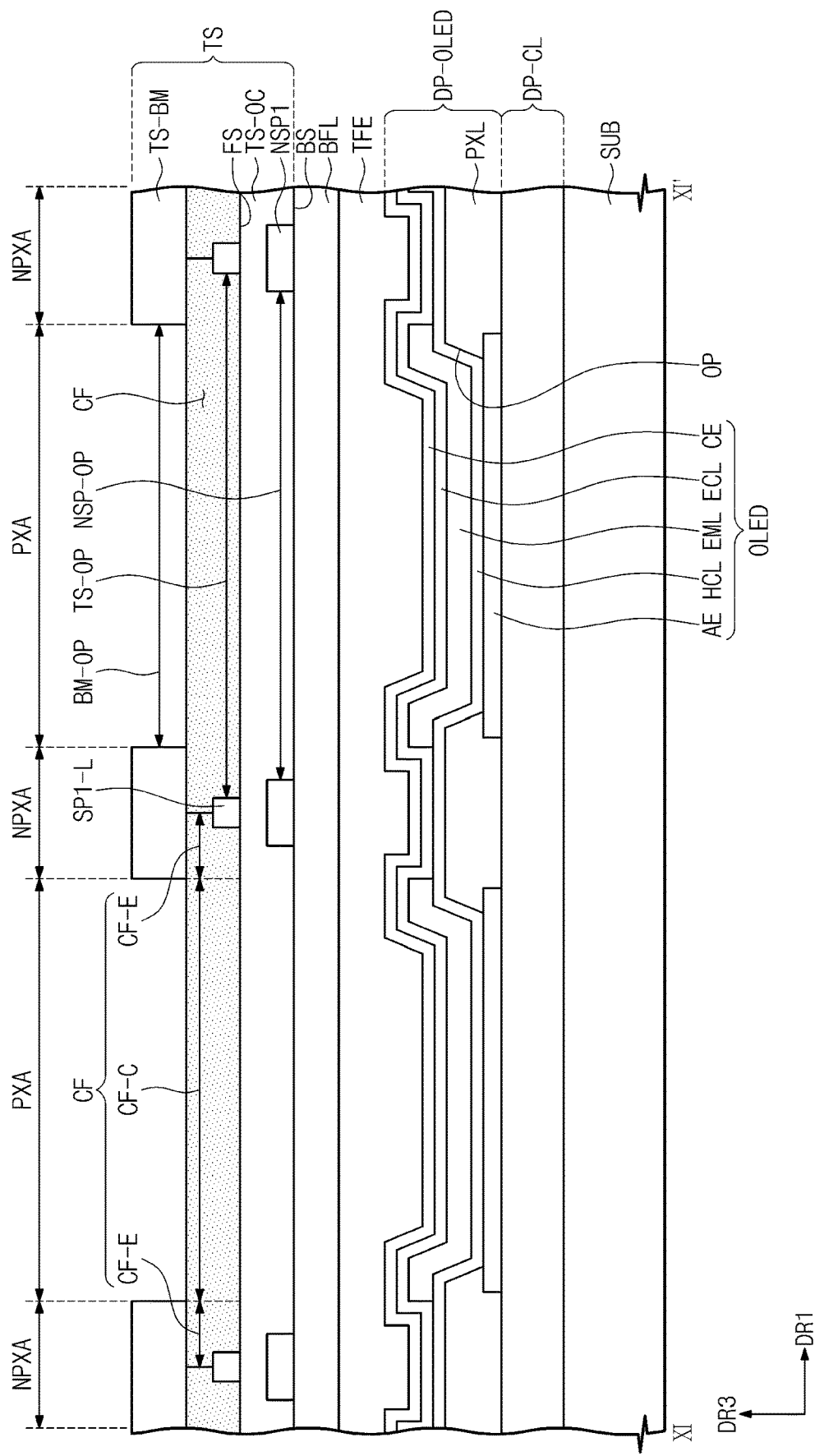

As shown in FIG. 33I, a first shielding part NSP1 (e.g., noise shielding conductive layers NSPL and NSPL-1) (see FIGS. 32C and 32D) may be disposed on a buffer layer BFL of a display panel DP-1. FIG. 33I shows the touch screen TS of FIG. 33B as an example, but the structure of the touch screen TS is not limited thereto.

Although not shown separately, the touch screen shown in FIGS. 33B, 33C, 33D, 33E, 33F, 33G, 33H, and 33I may further include a base member. When the base member is coupled to the display panel by an optically clear adhesive, the display device shown in FIG. 31C may be realized.

Figure 33J:
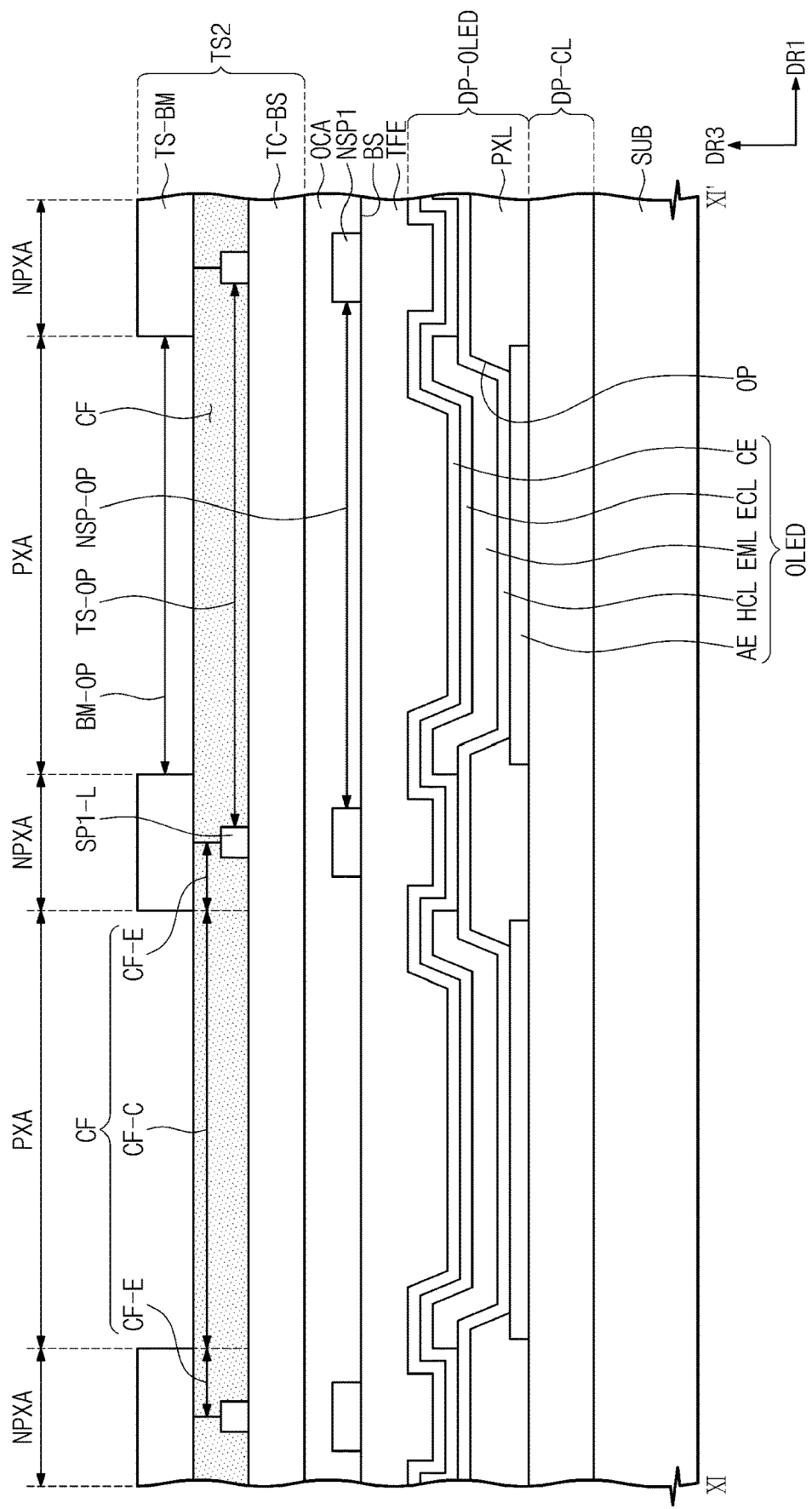

FIG. 33J shows the display device shown in FIG. 31D in detail. As shown in FIG. 33J, a display panel may include noise shielding conductive layers NSPL and NSPL-1 (see to FIGS. 32C and 32D). FIG. 33J shows the first shielding part NSP1 as a portion of the noise shielding conductive layer. The first shielding part NSP1 may be disposed on the base surface BS. The optically clear adhesive OCA may be disposed on the base surface BS, and the base member TS-BS may be disposed on the optically clear adhesive OCA.

FIG. 33J shows a touch screen TS having substantially the same layer structure as that of the touch screen TS shown in FIG. 33B. However, the structure of the touch screen TS is not limited thereto.

As shown in FIGS. 34A and 34B, a second sensing part SP2 may overlap with a non-light emitting area NPXA. The second sensing part SP2 may include a plurality of second vertical portions SP2-C extending in a first direction DR1 and a plurality of second horizontal portions SP2-L extending in a second direction DR2.

The second vertical portions SP2-C may be connected to the second horizontal portions SP2-L to form a plurality of touch openings TS-OP. In other words, the second sensing part SP2 may have a mesh shape.

As shown in FIG. 34B, color filters CF may be disposed on a first flat surface FS1. Edges CF-E of the color filters CF adjacent to each other may contact each other. The second vertical portions SP2-C may be disposed on the color filters CF. A black matrix TS-BM disposed on the color filters CF may cover second conductive patterns (e.g., the second vertical portions SP2-C).

FIG. 34B shows a cross-sectional view of a portion "HH" corresponding to FIG. 34A. According to another exemplary embodiment of the present disclosure, the cross-sectional view of the portion "HH" may have the structures shown in FIGS. 33C, 33D, 33E, 33F, 33G, 33H, 33I, and 33J. However, in the exemplary cross-sectional view of the portion "HH", the first horizontal portions SP1-L are omitted, and the second vertical portions SP2-C are disposed.

As shown in FIGS. 35A and 35B, a first connecting part CP1 may include third vertical portions CP1-C1 and CP1-

C2 disposed on a first over coating layer TS-OC1 and third horizontal portions CP1-L connecting the third vertical portions CP1-C1 and CP1-C2 to each other. FIG. 35A shows two third vertical portions CP1-C1 and CP1-C2, but the number of the third vertical portions should not be limited to two.

A second connecting part CP2 may include fourth horizontal portions CP2-L1 and CP2-L2 disposed on a color filter layer TS-CF and fourth vertical portions CP2-C connecting the fourth horizontal portions CP2-L1 and CP2-L2 to each other. The first and second connecting parts CP1 and CP2 have a mesh shape.

Although not shown in FIG. 35A, a third shielding part NCP is disposed on a base surface BS as shown in FIG. 35B. The third shielding part NCP is overlapped with the first and second connecting parts CP1 and CP2. The first over coating layer TS-OC1 covers the third shielding part NCP.

FIGS. 35A and 35B show a layer structure corresponding to FIGS. 33B and 34B, but the layer structure is not limited thereto. The cross-sectional structure corresponding to the connecting parts CP1 and CP2 of the touch screen TS may be changed to those shown in FIGS. 33C, 33D, 33E, 33F, 33G, 33H, 33I, and 33J.

As described with reference to FIGS. 33A, 33B, 33C, 33D, 33E, 33F, 33G, 33H, 33I, 33J, 34A, 34B, 35A, and 35B, the first touch electrodes TE1-1, TE1-2, and TE1-3, the second touch electrodes TE2-1, TE2-2, and TE2-3, the first shielding parts NSP1, the second shielding parts NSP2, and the third shielding parts NCP may have the mesh shape, and thus the flexibility of the flexible display device DD may be improved. When the flexible display device DD is bent as shown in FIGS. 1B and 2B, the tensile stress and the compressive stress, which are applied to the first touch electrodes TE1-1, TE1-2, and TE1-3 and the second touch electrodes TE2-1, TE2-2, and TE2-3 may be reduced, and the first touch electrodes TE1-1, TE1-2, and TE1-3 and the second touch electrodes TE2-1, TE2-2, and TE2-3 may be prevented from being cracked.

Since the insulating layers of the touch screen TS may include the color filters CF, the display device may become slimmer. In addition, since the first, second, and third shielding parts NSP1, NSP2, and NCP are applied to the image sensor, the noise generated in the first touch electrodes TE1-1, TE1-2, and TE1-3 and the second touch electrodes TE2-1, TE2-2, and TE2-3 may be reduced even though the first touch electrodes TE1-1, TE1-2, and TE1-3 and the second touch electrodes TE2-1, TE2-2, and TE2-3 are disposed adjacent to the circuit layer DP-CL and the organic light emitting device layer DP-OLED. Accordingly, a touch sensitivity of the image sensor may be improved.

Figure 36A:
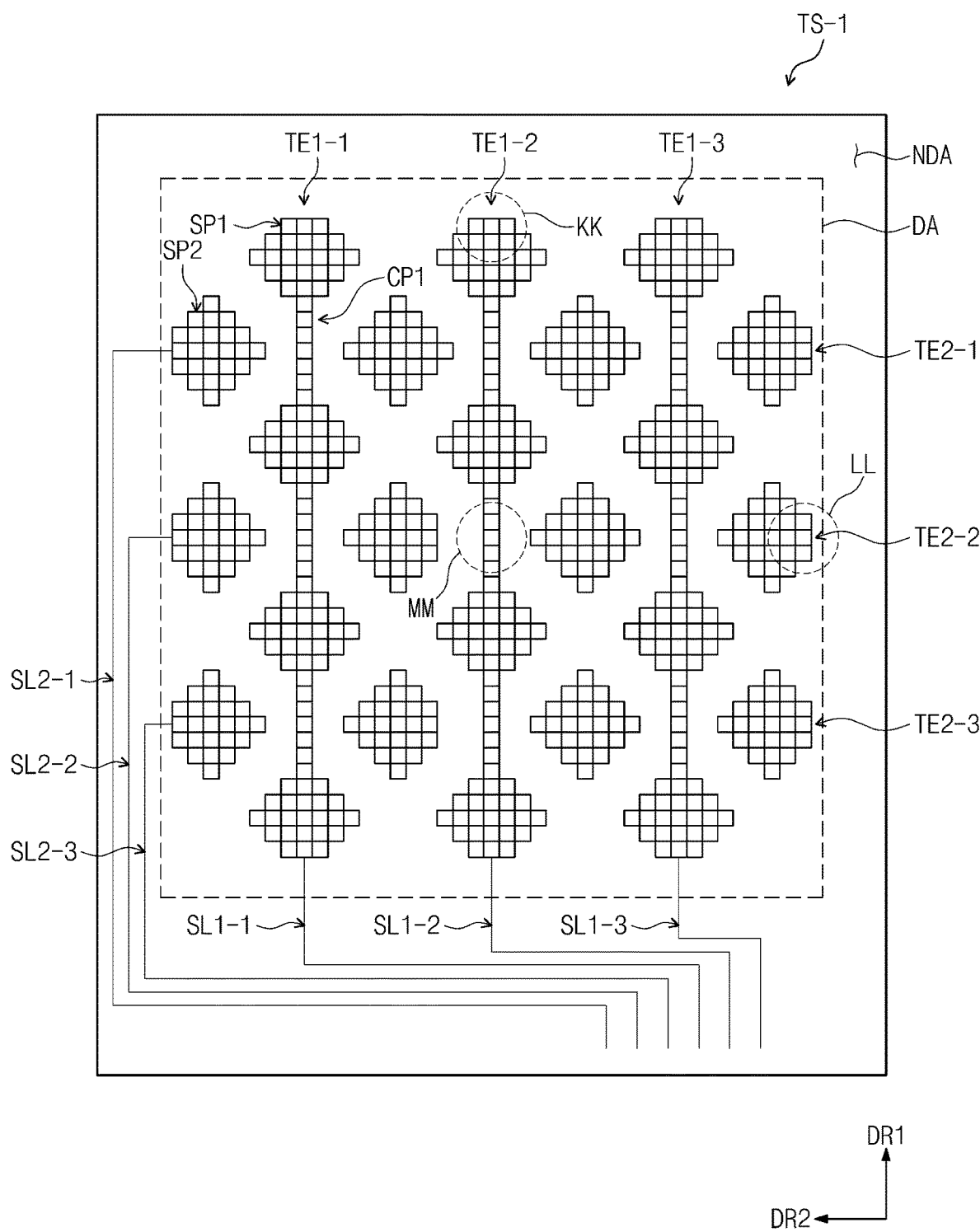
FIGS. 36A and 36B are plan views showing conductive layers of a touch screen according to an exemplary embodiment of the present disclosure.
Figure 36B:
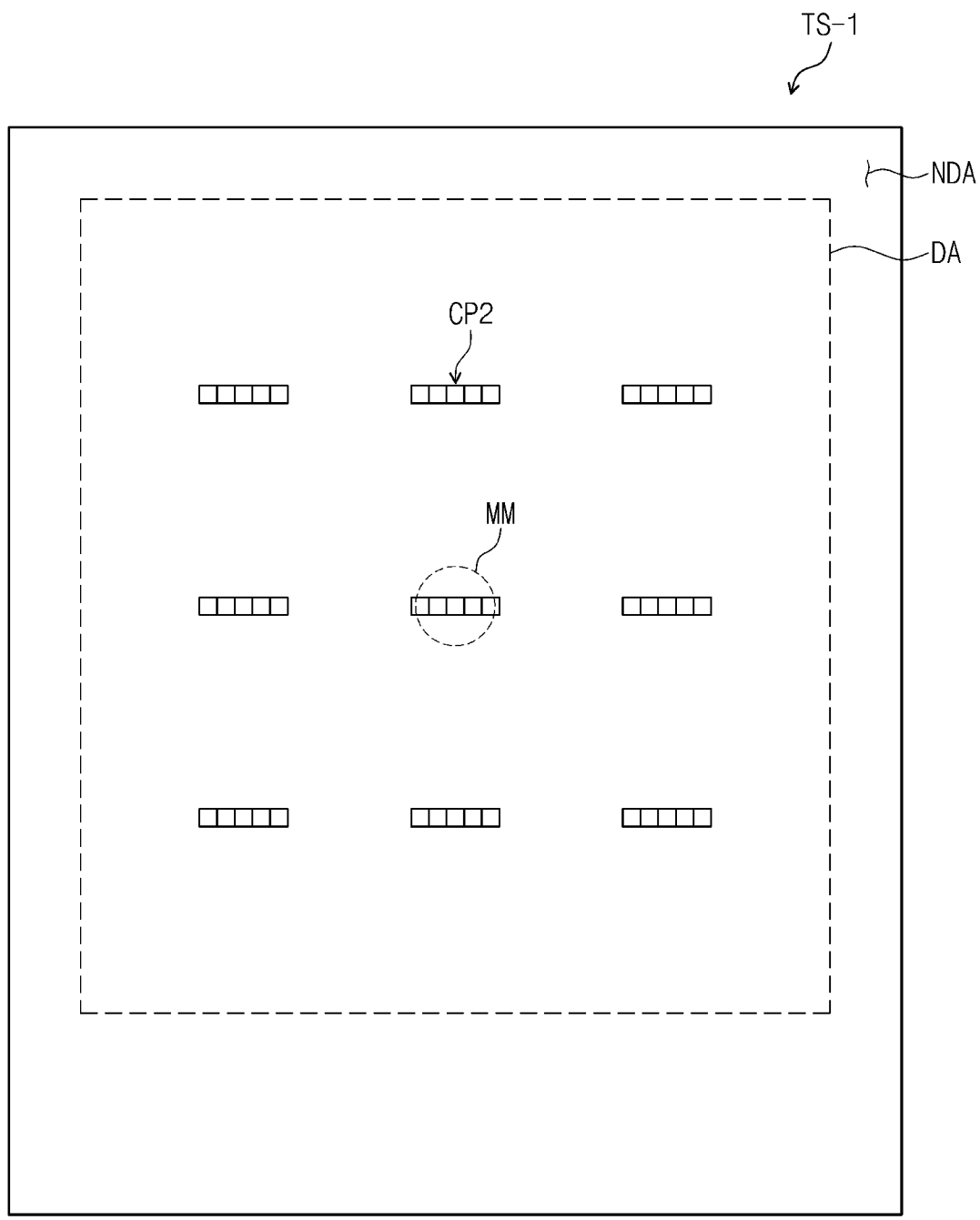
Figure 36C:
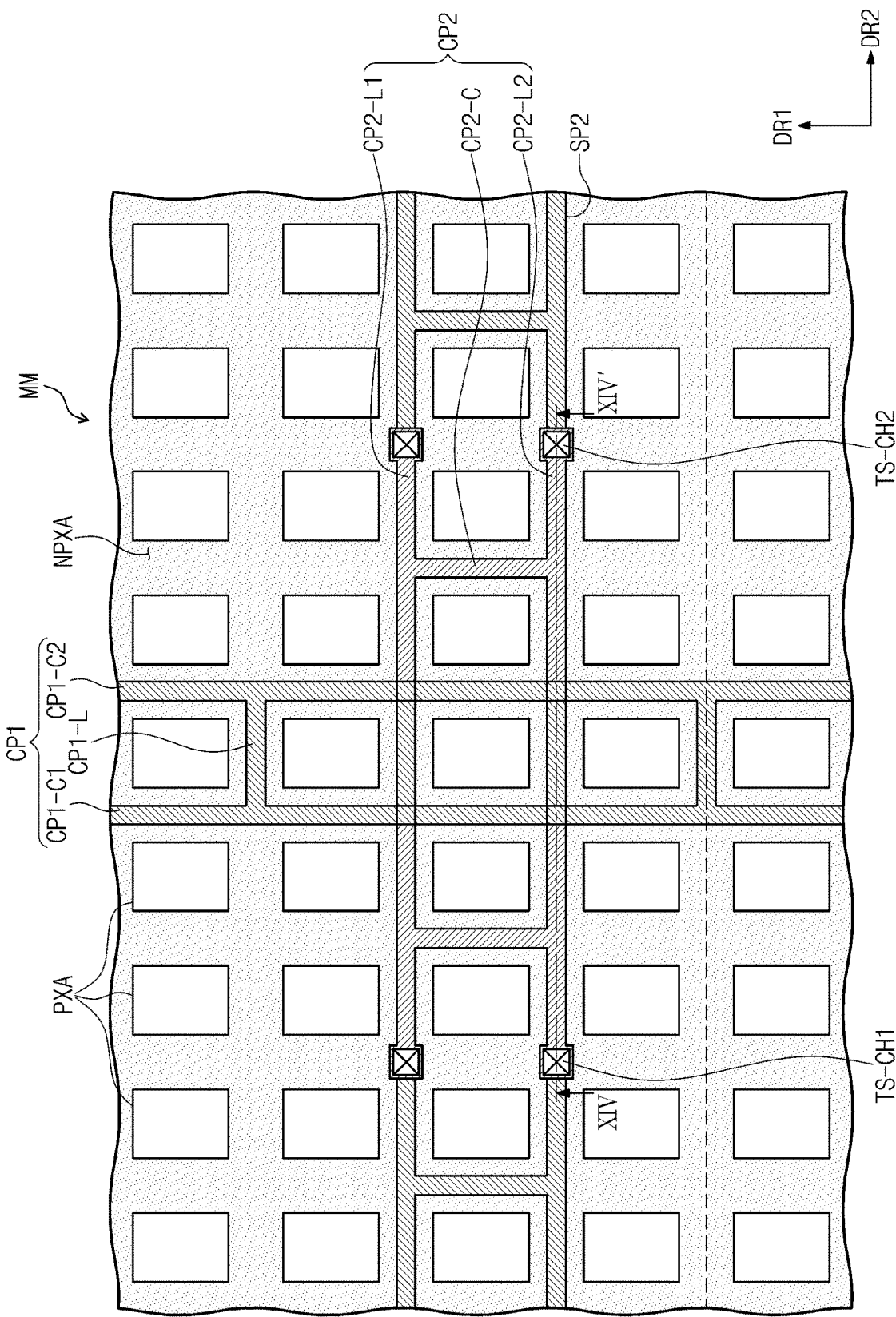
FIG. 36C is a partially enlarged view showing a portion "MM" of FIGS. 36A and 36B.
Figure 36D:
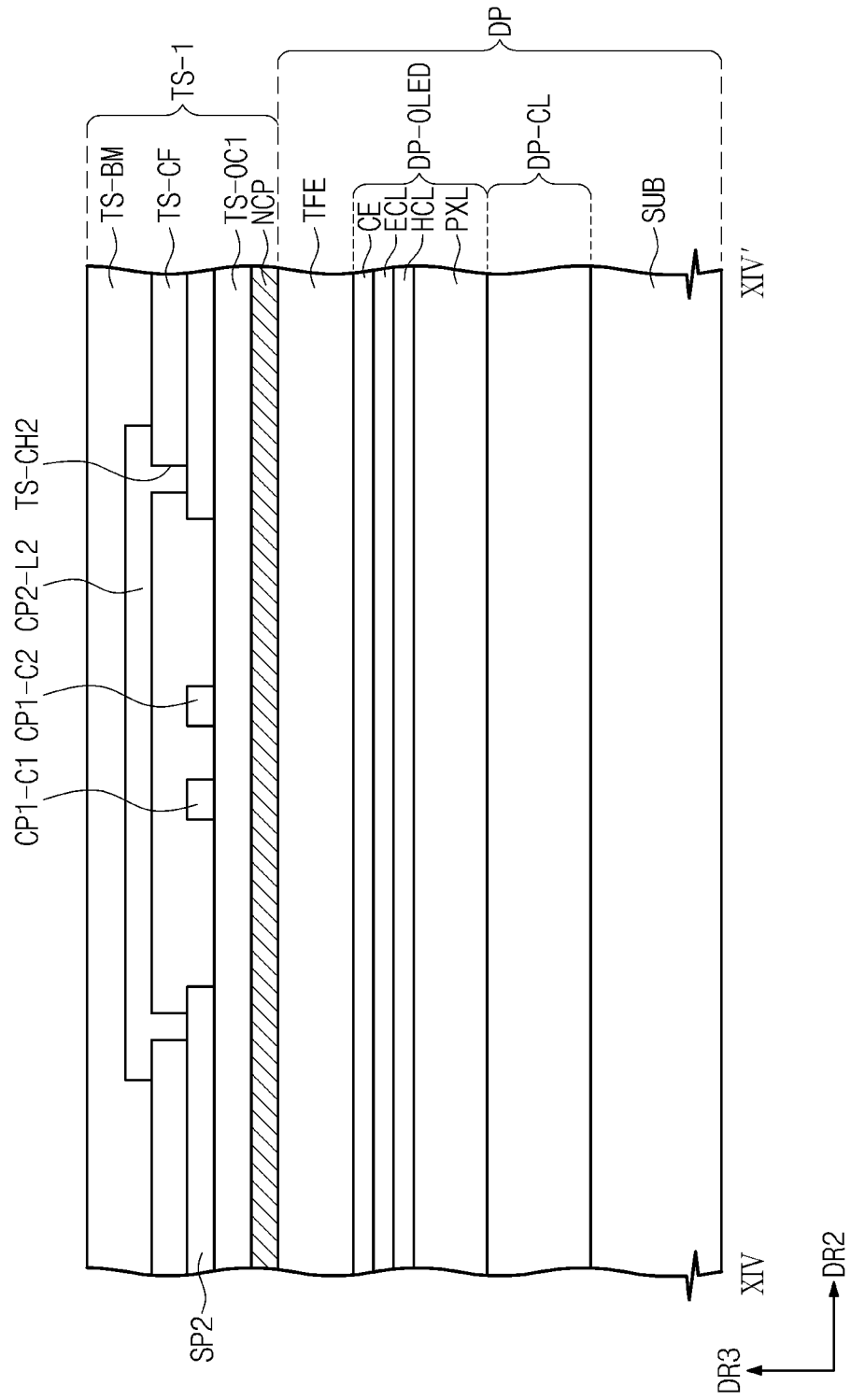
FIG. 36D is a cross-sectional view showing a portion of FIG. 36C along sectional line XIV-XIV'.

FIGS. 36A and 36B are plan views showing conductive layers of a touch screen according to an exemplary embodiment of the present disclosure. FIG. 36C is a partially enlarged view showing a portion "MM" of FIGS. 36A and 36B. FIG. 36D is a cross-sectional view showing a portion of FIG. 36C along line XIV-XIV'. In FIGS. 36A, 36B, 36C, and 36D, detailed descriptions of the same elements as those described above will be omitted.

In the present exemplary embodiment, a one-layer electrostatic capacitive touch screen will be described in detail. The one-layer electrostatic capacitive touch screen may be operated in a self-capacitance mode to obtain the coordinate information, but the driving method of the touch screen is not limited thereto.

Referring to FIG. 36A, first conductive patterns may include first touch electrodes TE1-1, TE1-2, and TE1-3, first touch signal lines SL1-1, SL1-2, and SL1-3, second sensing parts SP2 of second touch electrodes TE2-1, TE2-2, and TE2-3, and second touch signal lines SL2-1, SL2-2, and SL2-3. Each of the first touch electrodes TE1-1, TE1-2, and TE1-3 may include a plurality of first sensing parts SP1 and a plurality of first connecting parts CP1.

The first sensing parts SP1, the first connecting parts CP1, and the second sensing parts SP2 may be disposed on the same layer. Although not shown in the figures, each of the portion "KK" and the portion "LL" may have the structure shown in FIGS. 33B, 33C, 33D, 33E, 33F, 33G, 33H, 33I, and 33J in a cross-sectional view.

Referring to FIG. 36B, second conductive patterns may include a plurality of second connecting parts CP2 of the second touch electrodes TE2-1, TE2-2, and TE2-3. The second connecting parts CP2 may have a bridge function.

Referring to FIGS. 36C and 36D, the second connecting part CP2 may electrically connect two second sensing parts SP2 adjacent to each other in the second direction DR2 among the second sensing parts SP2 through first and second contact holes TS-CH1 and TS-CH2 formed through a color filter layer TS-CF.

Although not shown in FIG. 36C, a third shielding part NCP may be disposed on a base surface BS as shown in FIG. 36D. The third shielding part NCP may overlap with the first and second connecting parts CP1 and CP2. The first over coating layer TS-OC1 may cover the third shielding part NCP.

FIGS. 36C and 36D show a layer structure corresponding to FIGS. 33B and 34B, but the layer structure is not limited thereto. The cross-sectional structure corresponding to the connecting parts CP1 and CP2 of the touch screen TS may be changed to those shown in FIGS. 33C, 33D, 33E, 33F, 33G, 33H, 33I, and to 33J.

Figure 37A:
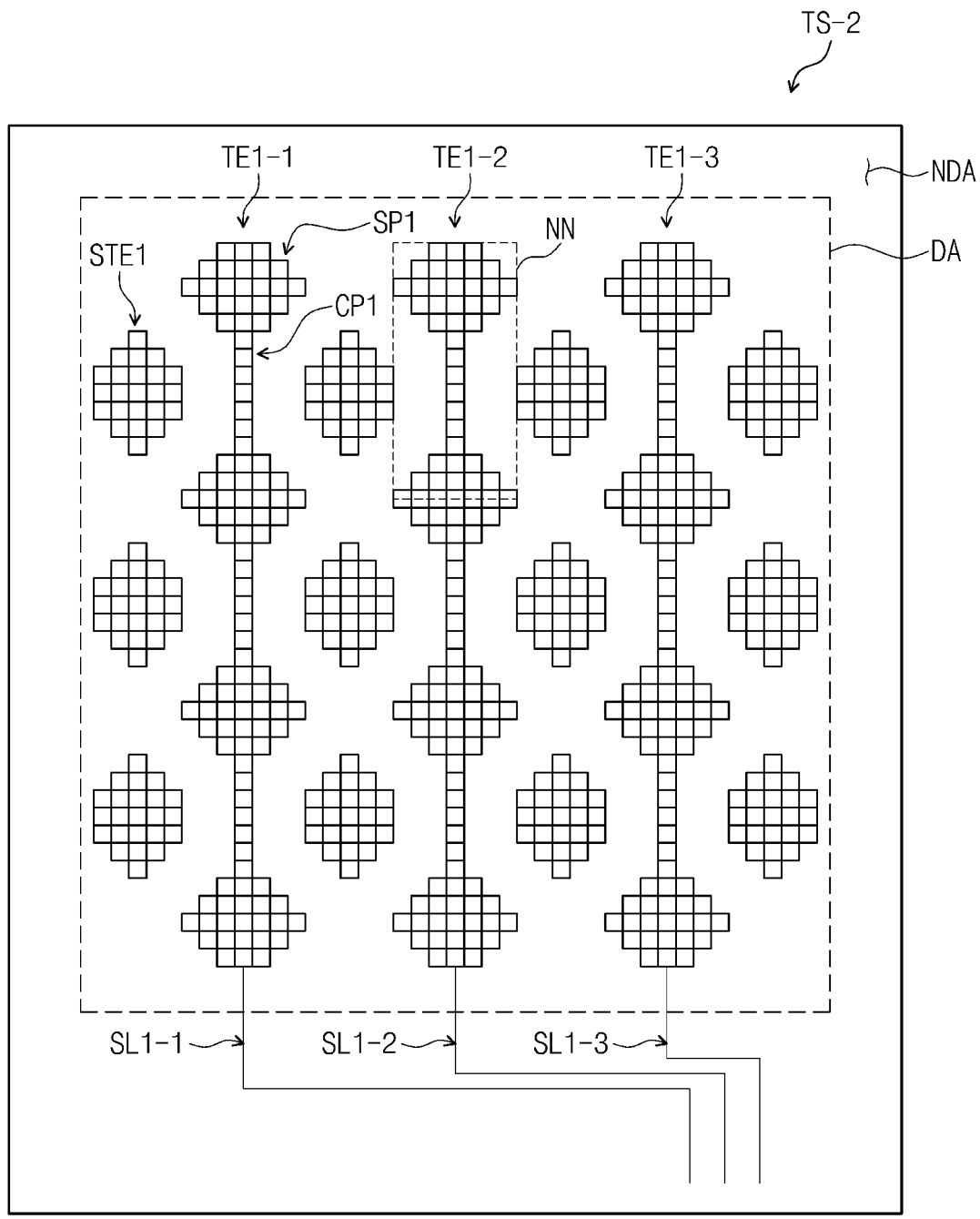
FIGS. 37A and 37B are plan views showing conductive layers of a touch screen according to an exemplary embodiment of the present disclosure.
Figure 37B:
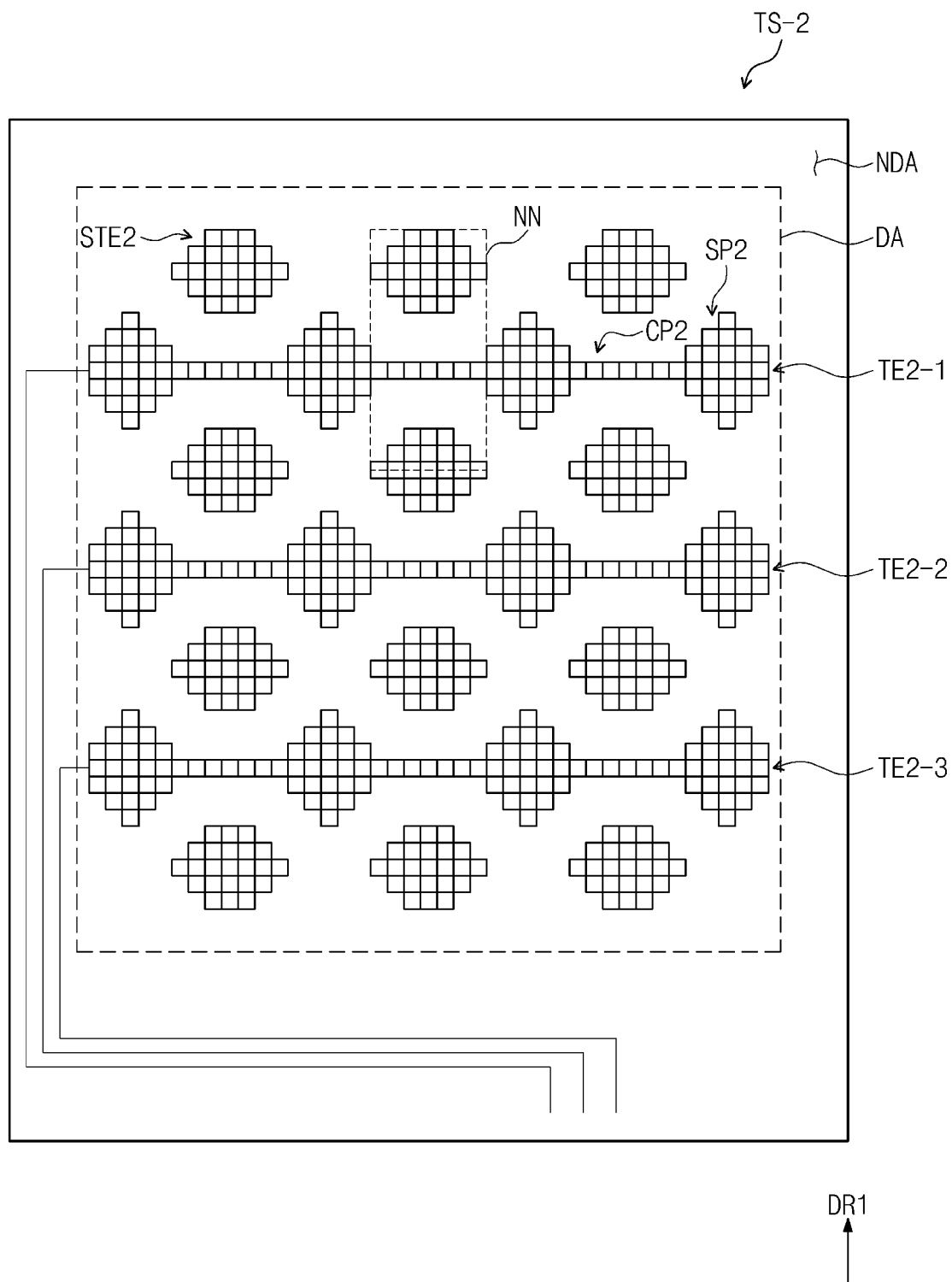
Figure 38A:
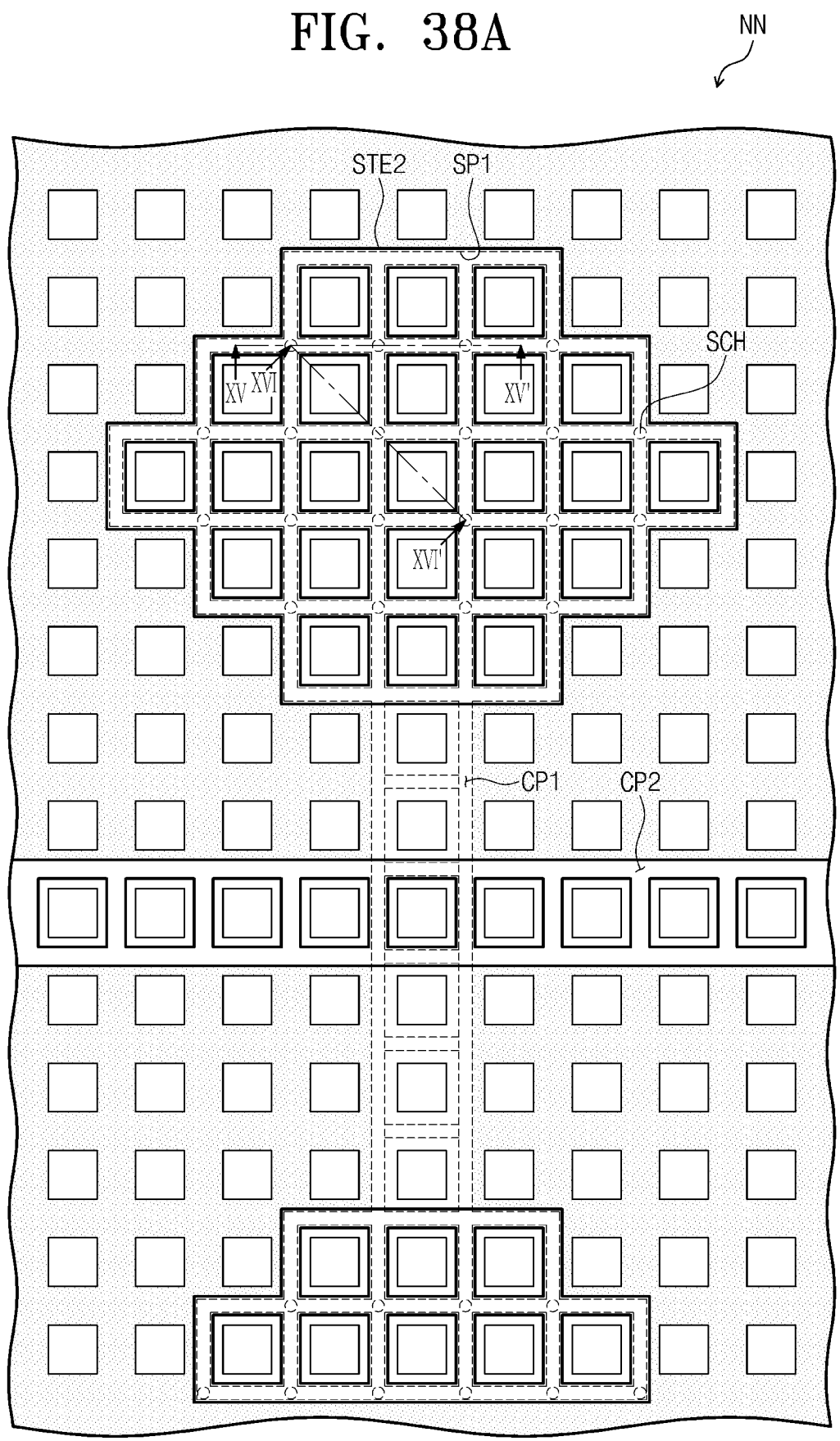
FIG. 38A is a partially enlarged view showing a portion "NN" of FIGS. 37A and 37B.
Figure 38B:
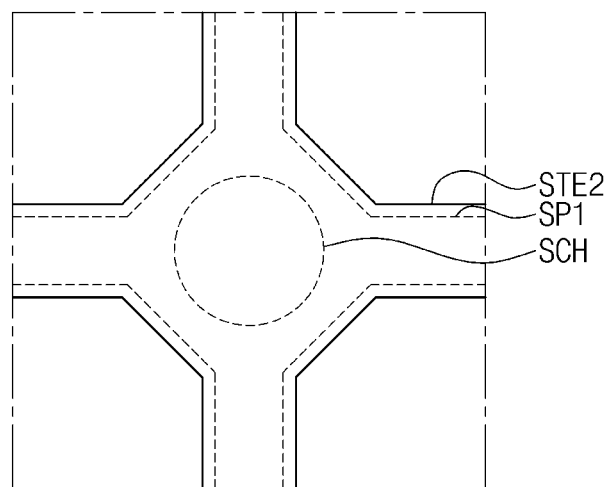
FIG. 38B is a partially enlarged view of FIG. 38A.
Figure 38C:
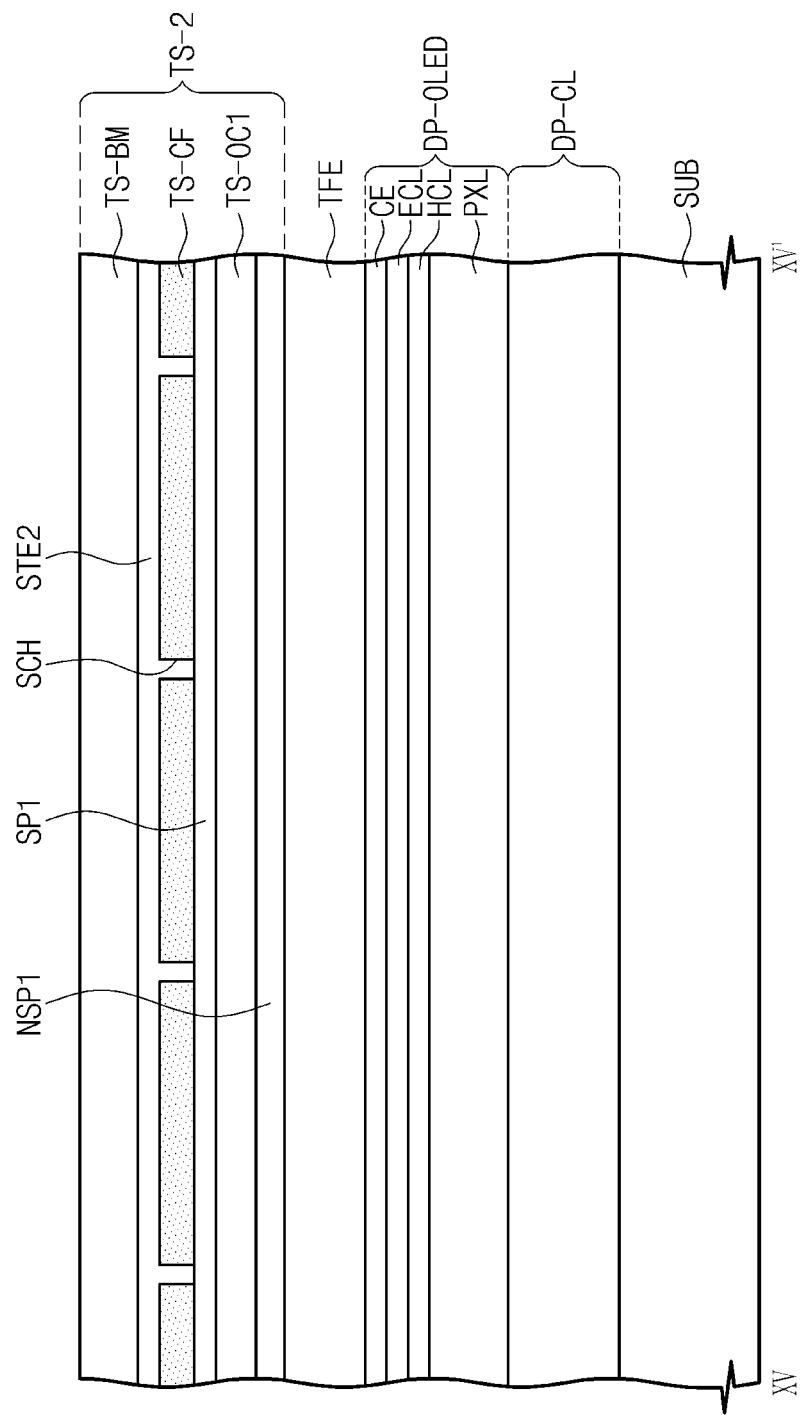
FIGS. 38C and 38D are partially cross-sectional views of FIG. 38A along sectional lines XV-XV' and XVI-XVI', respectively.
Figure 38D:
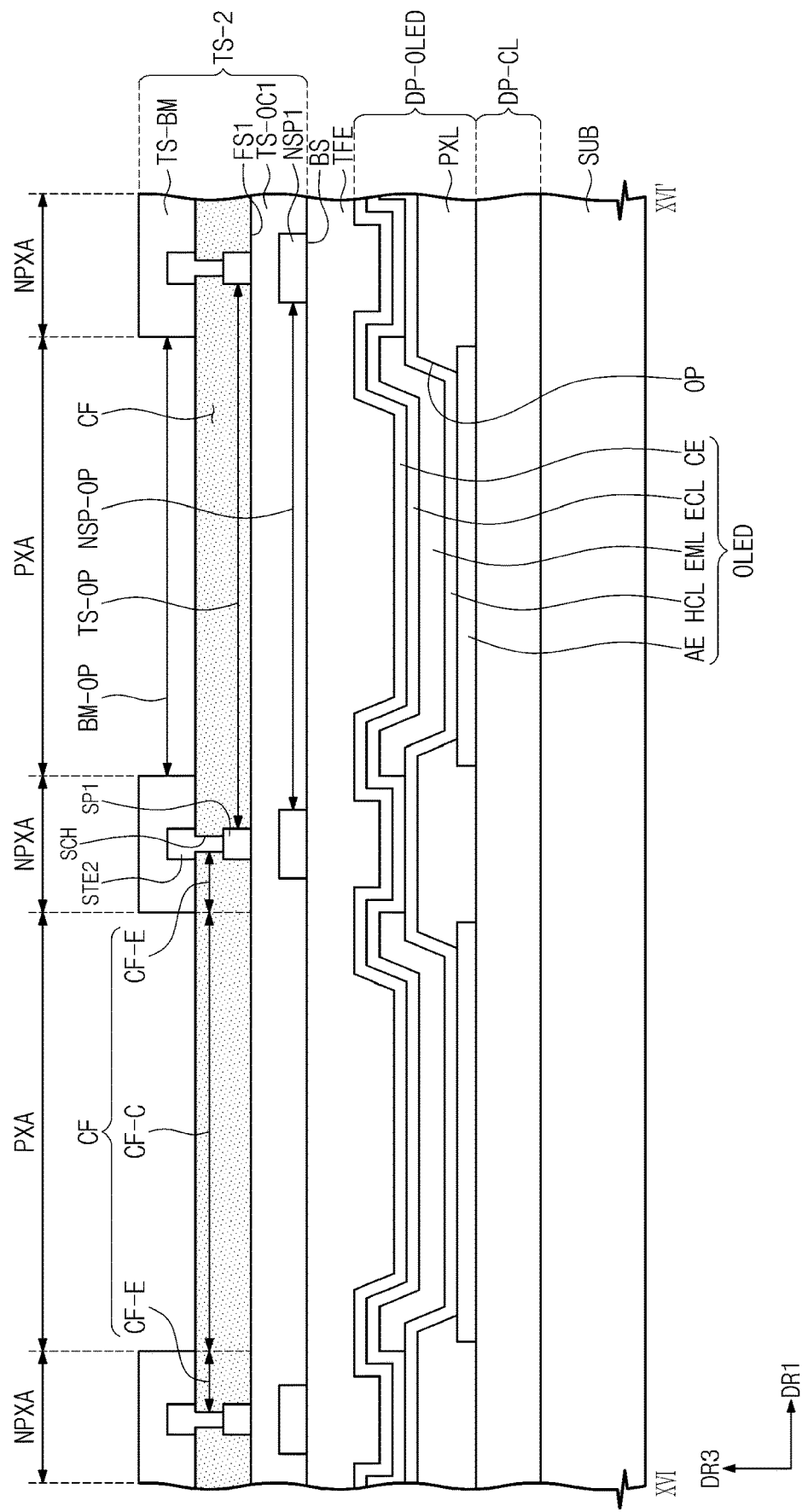

FIGS. 37A and 37B are plan views showing conductive layers of a touch screen according to an exemplary embodiment of the present disclosure. FIG. 38A is a partially enlarged view showing a portion "NN" of FIGS. 37A and 37B. FIG. 38B is a partially enlarged view of FIG. 38A. FIGS. 38C and 38D are partially cross-sectional views of FIG. 38A. In FIGS. 37A, 37B, 38A, 38B, 38C, and 38D, detailed descriptions of the same elements as those described above will be omitted.

Referring to FIGS. 37A and 37B, first conductive patterns may include first touch electrodes TE1-1, TE1-2, and TE1-3 and first auxiliary electrodes STE1. Each of the first touch electrodes TE1-1, TE1-2, and TE1-3 may include a plurality of first sensing parts SP1 and a plurality of first connecting parts CP1. Second conductive patterns may include second touch electrodes TE2-1, TE2-2, and TE2-3 and second auxiliary electrodes STE1. Each of the second touch electrodes TE2-1, TE2-2, and TE2-3 may include a plurality of second sensing parts SP2 and a plurality of second connecting parts CP2.

Each of the first auxiliary electrodes STE1 may overlap with a corresponding second sensing part among the second sensing parts SP2, and each of the second auxiliary electrodes STE2 may overlap with a corresponding first sensing part among the first sensing parts SP1. The first and second auxiliary electrodes STE1 and STE2 may have a mesh shape. Each of the first auxiliary electrodes STE1 may be electrically connected to the corresponding second sensing part, and each of the second auxiliary electrodes STE2 may be electrically connected to the corresponding first sensing part. Accordingly, a resistance of the first touch electrodes TE1-1, TE1-2, and TE1-3 and the second touch electrodes TE2-1, TE2-2, and TE2-3 may be reduced, and the touch sensitivity of the first touch electrodes TE1-1, TE1-2, and TE1-3 and the second touch electrodes TE2-1, TE2-2, and TE2-3 may be improved.

The combination of the first sensing parts SP1, the first connecting parts CP1, and the second auxiliary electrodes STE2 may be defined as the first touch electrode. The first sensing parts SP1 may correspond to a lower sensing part of the first touch electrode, the first connecting parts CP1 may correspond to lower connecting parts, and the second auxiliary electrodes STE2 may correspond to an upper sensing part. Similarly, the combination of the second sensing parts SP2, the second connecting parts CP2, and the first auxiliary electrodes STE1 may be defined as the second touch electrode.

FIGS. 38A and 38B show a connection relation between the second auxiliary electrode STE2 and the first sensing part SP1 in detail. The first sensing part SP1 may be represented by a dotted line, and the second auxiliary electrode STE2 may be represented by a solid line. In FIGS. 38A and 38B, the second auxiliary electrode STE2 may have a line width greater than a line width of the first sensing part SP1, but it is not limited thereto. The second auxiliary electrode STE2 and the first sensing part SP1 may have the same line width. The second auxiliary electrode STE2 may overlap with the first sensing part SP1 and not overlap with the first connecting part CP1.

As shown in FIGS. 38C and 38D, the second auxiliary electrode STE2 and the first sensing part SP1 may be connected to each other through a plurality of contact holes SCH. Although not shown in FIGS. 38A and 38B, a third shielding part NCP may be disposed on a base surface BS as shown in FIGS. 38C and 38D. The third shielding part NCP may overlap with the first sensing part SP1 and the second auxiliary electrode STE2. The first over coating layer TS-OC1 may cover the third shielding part NCP. The first sensing part SP1 may be disposed on the first over coating layer TS-OC1.

FIGS. 38C and 38D show a layer structure corresponding to FIGS. 33B and 34B, but the layer structure is not limited thereto. The cross-sectional structure corresponding to the portion "NN" of the touch screen TS may be changed to those shown in FIGS. 33C, 33D, 33E, 33F, 33G, 33H, 33I, and 33J. As described above, since the noise shielding layer is disposed to overlap with the first and second conductive patterns, the first and second conductive patterns may be prevented from being interfered with by the noise generated from the display panel. In addition, since the touch electrodes may have the mesh shape, the tensile stress and the compressive stress, which are applied to the touch electrodes, may be reduced and the touch electrodes may be prevented from being cracked. Further, the color filters may filter the external light, and thus the reflectance of the external light may be reduced. The insulating layer of the touch screen may include color filters, and thus the display device may become slimmer.

Although certain exemplary embodiments and implementations have been described herein, other embodiments and modifications will be apparent from this description. Accordingly, the inventive concept is not limited to such embodiments, but rather to the broader scope of the presented claims and various obvious modifications and equivalent arrangements.

What is claimed is:
1. A flexible display device, comprising:
a display panel providing a base surface and comprising a plurality of light emitting areas and a non-light emitting area disposed adjacent to the plurality of light emitting areas;
a plurality of conductive patterns disposed on the base surface;
a first insulating layer disposed on the base surface and comprising a plurality of first openings defined to correspond to the plurality of light emitting areas;
a second insulating layer disposed on the first insulating layer and comprising a plurality of second openings defined to correspond to the plurality of light emitting areas.

2. The flexible display device of claim 1, wherein each of the plurality of conductive patterns have a mesh shape through which a plurality of openings is defined.

3. The flexible display device of claim 1, wherein the plurality of conductive patterns comprise a plurality of first touch electrodes extending in a first direction and arranged in a second direction crossing the first direction, and each of the plurality of first touch electrodes comprises a plurality of touch openings defined therein, and
a plurality of second touch electrodes extending in the second direction and arranged in the first direction, and each of the plurality of second touch electrodes comprises a plurality of touch openings defined therein.

4. The flexible display device claim 3, wherein each of the plurality of first touch electrodes comprise a plurality of first sensing parts arranged in the first direction and a plurality of first connecting parts each disposed between two first sensing parts adjacent to each other among the plurality of first sensing parts,
wherein each of the plurality of second touch electrodes comprise a plurality of second sensing parts disposed adjacent to the plurality of first sensing parts and a plurality of second connecting parts disposed between two second sensing parts adjacent to each other in the second direction among the plurality of second sensing parts, and
wherein one of the plurality of first sensing parts and the plurality of second sensing parts is disposed on a layer different from a layer on which the plurality of first sensing parts and the plurality of second sensing parts are disposed.

5. The flexible display device of claim 1, wherein the display panel comprises:
a base substrate;
a circuit layer disposed on the base substrate;
an organic light emitting device layer disposed on the circuit layer; and
a thin film encapsulation layer encapsulating the organic light emitting device layer.

6. The flexible display device of claim 5, wherein the thin film encapsulation layer provides the base surface.

7. The flexible display device of claim 6, wherein the thin film encapsulation layer comprises:
a lower inorganic thin film layer configured to contact with the organic light emitting device layer;
a plurality of organic thin film layers disposed on the lower inorganic thin film layer; and
a plurality of upper inorganic thin film layers alternately stacked with the organic thin film layers.

8. The flexible display device of claim 7, wherein the lower inorganic thin film layer comprises at least a lithium fluoride layer.

9. The flexible display device of claim 7, wherein a thin film layer disposed at an uppermost position among the organic thin film layers and the upper inorganic thin film layers alternately stacked with the organic thin film layers comprise third openings or grooves defined to correspond to the plurality of first openings.

10. The flexible display device of claim 6, wherein the thin film encapsulation layer comprises at least two inorganic thin film layers and an inorganic thin film layer disposed between the two inorganic thin film layers.

11. The flexible display device of claim 5, wherein the display panel further comprises a buffer layer disposed on the thin film encapsulation layer and providing the base surface.

12. The flexible display device of claim 11, wherein the buffer layer comprises a plurality of third openings or grooves defined to correspond to the plurality of first openings.

13. The flexible display device of claim 1, wherein the plurality of conductive patterns comprise:
 a plurality of first touch electrodes comprising a plurality of touch openings defined to correspond to the plurality of first openings;
 a plurality of first auxiliary electrodes spaced apart from the plurality of first touch electrodes,
 a plurality of second touch electrodes crossing the plurality of first touch electrodes, comprising a plurality of touch openings defined to correspond to the plurality of first openings, each of the plurality of second touch electrodes being electrically connected to a corresponding first auxiliary electrode of the plurality of first auxiliary electrodes; and
 a plurality of second auxiliary electrodes, each being electrically connected to a corresponding first touch electrode among the plurality of first touch electrodes.

14. The flexible display device of claim 13, wherein each of the plurality of first touch electrodes comprises a plurality of first sensing parts overlapped with corresponding second auxiliary electrodes among the plurality of second auxiliary electrodes and a plurality of first connecting parts each connecting two first sensing parts adjacent to each other among the plurality of first sensing parts, and each of the plurality of second touch electrodes comprise a plurality of second sensing parts overlapped with corresponding first auxiliary electrodes among the plurality of first auxiliary electrodes and a plurality of second connecting parts each connecting two second sensing parts adjacent to each other among the plurality of second sensing parts.

15. The flexible display device of claim 13, wherein each of the plurality of first auxiliary electrodes has a mesh shape, and each of the plurality of second auxiliary electrodes has a mesh shape.

16. The flexible display device of claim 1, further comprising a plurality of color filters each being disposed inside a corresponding first opening among the plurality of first openings.

17. The flexible display device of claim 16, wherein each of the plurality of color filters extends inside the corresponding second opening among the plurality of second openings.

18. The flexible display device of claim 16, wherein each of the first and second insulating layers is a black matrix.

19. The flexible display device of claim 16, wherein the second insulating layer is overlapped with the plurality of color filters.

20. The flexible display device of claim 16, further comprising a black matrix layer disposed on the second insulating layer and comprising a plurality of transmitting openings defined to correspond to the plurality of light emitting areas.

21. A flexible display device, comprising:
 a display panel providing a base surface and comprising a plurality of light emitting areas and a non-light emitting area disposed adjacent to the plurality of light emitting areas;
 a plurality of first conductive patterns disposed on the base surface;
 a first black matrix disposed on the base surface, covering the first conductive patterns, and comprising a plurality of first openings defined to correspond to the plurality of light emitting areas; and
 a plurality of color filters each being disposed inside a corresponding first opening among the plurality of first openings.

22. The flexible display device of claim 21, further comprising:
 an insulating layer disposed on the first black matrix and the plurality of color filters and overlapped with the plurality of light emitting areas and the non-light emitting area; and
 a plurality of second conductive patterns disposed on the insulating layer.

23. The flexible display device of claim 22, wherein the plurality of second conductive patterns comprise at least one of chromium oxide, chromium nitride, titanium oxide, and titanium nitride.

24. The flexible display device of claim 23, further comprising a second black matrix disposed on the insulating layer, covering the plurality of second conductive patterns, and overlapped with the non-light emitting area.

25. The flexible display device of claim 24, wherein the second black matrix comprises a plurality of second openings defined to correspond to the plurality of light emitting areas.

26. The flexible display device of claim 24, wherein an edge of each of the plurality of color filters is overlapped with the second black matrix.

27. The flexible display device of claim 23, wherein each of the plurality of first conductive patterns and each of the plurality of second conductive patterns have a mesh shape through which a plurality of openings is defined.

28. The flexible display device of claim 22, wherein the plurality of first conductive patterns comprise a plurality of first touch electrodes extending in a first direction and arranged in a second direction crossing the first direction, and each of the plurality of first touch electrodes comprises a plurality of touch openings defined therein.

29. The flexible display device of claim 28, wherein the second conductive patterns comprise a plurality of second touch electrodes extending in the second direction and arranged in the first direction, and each of the plurality of second touch electrodes comprises a plurality of touch openings defined therein.

30. The flexible display device claim 29, wherein each of the plurality of first touch electrodes has a constant width in the first direction, two first touch electrodes adjacent to each other among the plurality of first touch electrodes are spaced apart from each other in the first direction by a first interval, each of the plurality of second touch electrodes has a constant width in the second direction, and two second touch electrodes adjacent to each other among the plurality of second touch electrodes are spaced apart from each other in the second direction by a second interval greater than the first interval.

31. The flexible display device claim 30, wherein each of the plurality of first touch electrodes comprises a plurality of first sensing parts arranged in the first direction and a plurality of first connecting parts each disposed between two first sensing parts adjacent to each other among the plurality of first sensing parts, and the plurality of first conductive patterns further comprise a plurality of second sensing parts disposed adjacent to the plurality of first sensing parts.

32. The flexible display device claim 31, wherein the plurality of second conductive patterns comprise a plurality of second connecting parts each disposed between two second sensing parts adjacent to each other in the second direction among the plurality of second sensing parts through a plurality of contact holes defined by the first black matrix and the insulating layer.

33. The flexible display device of claim 28, wherein:
the plurality of first conductive patterns comprise:
a first touch electrodes comprising a plurality of touch openings defined to correspond to the plurality of first openings; and
a plurality of shielding electrodes spaced apart from the plurality of first touch electrodes; and
the plurality of second conductive patterns comprise:
a plurality of second touch electrodes crossing the plurality of first touch electrodes, comprising a plurality of touch openings defined to correspond to the plurality of first openings, and each being overlapped with a corresponding shielding electrode among the plurality of shielding electrodes.

34. The flexible display device of claim 33, wherein each of the plurality of first touch electrodes comprises a plurality of first sensing parts and a plurality of first connecting parts each connecting two first sensing parts adjacent to each other among the plurality of first sensing parts, and each of the plurality of second touch electrodes comprises a plurality of second sensing parts each being overlapped with corresponding shielding electrodes among the plurality of shielding electrodes and a plurality of second connecting parts each connecting two second sensing parts adjacent to each other among the plurality of second sensing parts.

35. The flexible display device of claim 33, wherein the plurality of shielding electrodes receive a ground voltage.

36. A flexible display device, comprising:
a display panel providing a base surface and comprising a plurality of light emitting areas and a non-light emitting area disposed adjacent to the plurality of light emitting areas;
a plurality of first conductive patterns disposed on the base surface;
a plurality of color filters disposed on the base surface, each of the plurality of color filters comprising a center portion overlapped with a corresponding light emitting area among the plurality of light emitting areas and an edge portion extending from the center portion, overlapped with the non-light emitting area, and overlapped with a corresponding first conductive pattern among the plurality of first conductive patterns; and
a black matrix overlapped with the plurality of non-light emitting area,
wherein the edge portion is disposed between the base surface and the black matrix.

37. The flexible display device of claim 36, further comprising a plurality of second conductive patterns disposed on the plurality of color filters and overlapped with the non-light emitting area.

38. The flexible display device of claim 37, wherein the edge portion of some color filters among the plurality of color filters makes contact with the corresponding first conductive pattern among the plurality of first conductive patterns.

39. The flexible display device of claim 37, wherein the black matrix is disposed on the plurality of color filters and covers the second conductive patterns.

40. The flexible display device of claim 39, further comprising an insulating layer covering the plurality of color filters, the plurality of second conductive patterns disposed on the insulating layer, and the black matrix disposed on the insulating layer and covering the plurality of second conductive patterns.

41. The flexible display device of claim 37, wherein the black matrix comprises:
a first black matrix disposed on the base surface to cover the plurality of first conductive patterns; and
a second black matrix disposed on the plurality of color filters to cover the plurality of second conductive patterns.

42. The flexible display device of claim 41, further comprising an insulating layer covering the plurality of color filters, and
wherein the second black matrix is disposed on the insulating layer.

43. The flexible display device of claim 36, wherein the plurality of color filters comprise at least one of a red color filter, green color filter, and blue color filter.

44. The flexible display device of claim 36, wherein the plurality of color filters comprise a first color filter and a second color filter adjacent to the first color filter, and the edge portion of the first color filter makes contact with the edge portion of the second color filter.

45. The flexible display device of claim 36, wherein the plurality of color filters comprise a first color filter and a second color filter adjacent to the first color filter, and the edge portion of the first color filter is overlapped with the edge portion of the second color filter.

* * * * *